US011299645B2

(12) United States Patent
El-Kady et al.

(10) Patent No.: US 11,299,645 B2
(45) Date of Patent: Apr. 12, 2022

(54) METHODS AND APPLICATIONS FOR CONDUCTIVE GRAPHENE INKS

(71) Applicants: The Regents of the University of California, Oakland, CA (US); Nanotech Energy, Inc., Los Angeles, CA (US)

(72) Inventors: Maher F. El-Kady, Los Angeles, CA (US); Nahla Mohamed, Los Angeles, CA (US); Jack Kavanaugh, Los Angeles, CA (US); Richard B. Kaner, Pacific Palisades, CA (US)

(73) Assignees: The Regents of the University of California, Oakland, CA (US); Nanotech Energy, Inc., Los Angeles, CA (US)

( * ) Notice: Subject to any disclaimer, the term of this patent is extended or adjusted under 35 U.S.C. 154(b) by 771 days.

(21) Appl. No.: 15/956,356

(22) Filed: Apr. 18, 2018

(65) Prior Publication Data

US 2018/0305570 A1 Oct. 25, 2018

Related U.S. Application Data

(60) Provisional application No. 62/488,350, filed on Apr. 21, 2017, provisional application No. 62/509,227,
(Continued)

(51) Int. Cl.
*C09D 11/00* (2014.01)
*C09D 11/52* (2014.01)
(Continued)

(52) U.S. Cl.
CPC ............ *C09D 11/52* (2013.01); *C09D 11/037* (2013.01); *C09D 11/08* (2013.01); *C09D 11/102* (2013.01);
(Continued)

(58) Field of Classification Search
USPC ................................ 106/31.01, 31.13, 31.92
See application file for complete search history.

(56) References Cited

U.S. PATENT DOCUMENTS 6,280,879 B1 * 8/2001 Andersen ............ H01M 4/0404
429/233
10,116,000 B1 * 10/2018 Federici ................ B33Y 30/00
(Continued)

FOREIGN PATENT DOCUMENTS

CN 104693897 A 6/2015
EP 3367479 A1 8/2018
(Continued)

OTHER PUBLICATIONS

International Preliminary Report on Patentability for International Patent Application No. PCT/US2018/028121, dated Oct. 31, 2019, 7 pages.

(Continued)

*Primary Examiner* — James E Mcdonough
(74) *Attorney, Agent, or Firm* — Withrow & Terranova, P.L.L.C.

(57) ABSTRACT

The present disclosure provides for an exemplary energy storage device and methods of forming thereof, comprising an exemplary conductive graphene ink on exemplary substrates to form durable, flexible, and facile graphene films and energy storage devices for use with and within a variety of electronics and devices.

14 Claims, 52 Drawing Sheets

Related U.S. Application Data filed on May 22, 2017, provisional application No. 62/593,397, filed on Dec. 1, 2017.

(51) Int. Cl.

| | |
|---|---|
| ***C09D 11/38*** | (2014.01) |
| ***C09D 11/08*** | (2006.01) |
| ***C09D 11/102*** | (2014.01) |
| ***C09D 11/106*** | (2014.01) |
| ***C09D 11/037*** | (2014.01) |
| ***C09D 11/324*** | (2014.01) |
| *C09D 1/00* | (2006.01) |
| *C09D 4/00* | (2006.01) |
| *C09D 5/00* | (2006.01) |
| *C09K 3/00* | (2006.01) |
| *H05K 1/09* | (2006.01) |
| *C08K 3/04* | (2006.01) |

(52) U.S. Cl.

CPC .......... *C09D 11/106* (2013.01); *C09D 11/324* (2013.01); *C09D 11/38* (2013.01); *C08K 3/042* (2017.05); *C08K 2201/001* (2013.01); *H05K 1/095* (2013.01); *H05K 2201/026* (2013.01); *H05K 2201/0323* (2013.01)

(56) References Cited

U.S. PATENT DOCUMENTS

| | | | | |
|---|---|---|---|---|
| 2012/0170171 | A1* | 7/2012 | Lee | H01G 11/42 361/502 |
| 2015/0072162 | A1* | 3/2015 | Hersam | C09D 11/14 428/473.5 |
| 2015/0123044 | A1 | 5/2015 | Yoshida | |
| 2015/0307730 | A1* | 10/2015 | Hersam | C09D 11/52 430/308 |
| 2016/0064726 | A1* | 3/2016 | Ikenuma | H01M 4/1393 429/231.8 |
| 2017/0081537 | A1* | 3/2017 | Hersam | C09D 11/322 |
| 2017/0141387 | A1* | 5/2017 | Hayner | H01M 4/625 |
| 2017/0184528 | A1* | 6/2017 | Haque | H01L 51/107 |

FOREIGN PATENT DOCUMENTS

| | | | |
|---|---|---|---|
| JP | S63236258 | A | 10/1988 |
| JP | 2000215895 | A | 8/2000 |
| JP | 2012204114 | A | 10/2012 |
| JP | 2013004355 | A | 1/2013 |
| JP | 2013180900 | A | 9/2013 |
| JP | 2015128012 | A | 7/2015 |
| JP | 2016046231 | A | 4/2016 |
| JP | 201676312 | A | 5/2016 |
| JP | 2016186033 | A | 10/2016 |
| WO | 2015109684 | A1 | 7/2015 |
| WO | 2015137761 | A1 | 9/2015 |
| WO | 2015180800 | A1 | 12/2015 |
| WO | 2017025697 | A1 | 2/2017 |

OTHER PUBLICATIONS

International Search Report and Written Opinion for International Patent Application No. PCT/US2018/028121, dated Jul. 5, 2018, 8 pages.

Office Action for Canadian Patent Application No. 3,061,000, dated Apr. 29, 2021, 3 pages.

Examination Report for Indian Patent Application No. 201917044578, dated Apr. 27, 2021, 9 pages.

Kang, Wendong, et al., "Graphene and the related conductive inks for flexible electronics," Journal of Materials Chemistry C, vol. 4, Issue 30, Jul. 2016, pp. 7193-7207.

Extended European Search Report for European Patent Application No. 18788596.7, dated Jan. 20, 2021, 9 pages.

Examination Report for Taiwanese Patent Application No. 107113352, dated Sep. 3, 2021, 16 pages.

First Office Action for Chinese Patent Application No. 201880041020X, dated Nov. 30, 2021, 14 pages.

Notification of Reasons for Rejection for Japanese Patent Application No. 2019-556969, dated Jan. 18, 2022, 8 pages.

* cited by examiner

METHODS AND APPLICATIONS FOR CONDUCTIVE GRAPHENE INKS

PRIORITY CLAIMS

This application claims the benefit of U.S. Provisional Application No. 62/488,350, filed Apr. 21, 2017, U.S. Provisional Application No. 62/509,227, filed May 22, 2017, and U.S. Provisional Application No. 62/593,397, filed Dec. 1, 2017, which applications are hereby incorporated herein by reference in their entireties.

BACKGROUND

As a result of the rapidly growing energy needs of modern life, the development of high-performance electrical energy storage devices has gained significant attention. As such, energy storage devices have been employed with and within a variety of electronics and devices. Some such devices are designed to be flexible for increased durability. Thus, the future growth of this technology depends on further improving the performance of energy storage materials and methods, and the development of devices and methods to better integrate technology within the wide array of products.

SUMMARY

The present disclosure provides a solution to the need for higher performance electrical energy storage devices. Provided herein are graphene materials, compositions of matter, fabrication processes, and devices with improved performance. Features of the subject matter described herein provide for high power density and excellent low-temperature performance including, but not limited to, applications for inkjet printing, screen printing, printed circuit boards, radio frequency identification device chips, smart fabrics, conductive coatings, gravure printing, flexographic printing, batteries, supercapacitors, capacitors, electrodes, electromagnetic interference shielding, printed transistors, memory, sensors, membranes, anti-static coatings, and large area heaters. The applications described herein provide for improvements in the areas of electronics and energy storage systems with high storage capabilities, flexibility, and a high cycling capability. Many conventional supercapacitors, capacitors, and other energy storage devices exhibit low energy and power densities and low cycling and capacitive capabilities. While normal electronic devices have seen very rapid progress following Moore's law, electrical energy storage devices have advanced only slightly because of the lack of new materials with high-charge storage capacity.

A first aspect provided herein is a conductive graphene ink comprising: a binder solution comprising: a binder and a first solvent; a reduced graphene oxide dispersion comprising reduced graphene oxide, and a second solvent; a third solvent; a conductive additive; a surfactant; and a defoamer.

Optionally, in some embodiments, at least one of the first solvent, the second solvent, and the third solvent comprises water and an organic solvent. Optionally, in some embodiments, the organic solvent comprises ethanol, isopropyl alcohol, N-methyl-2-pyrrolidone, cyclohexanone, terpineol, 3-methoxy-3-methyl-1-butanol, 4-hydroxyl-4-methyl-pentan-2-one, methyl isobutyl ketone, or any combination thereof.

Optionally, in some embodiments, a percentage by mass of at least one of the first solvent, the second solvent, and the third solvent in the conductive graphene ink is about 1% to about 99%. Optionally, in some embodiments, a percentage by mass of at least one of the first solvent, the second solvent, and the third solvent in the conductive graphene ink is at least about 1%. Optionally, in some embodiments, a percentage by mass of at least one of the first solvent, the second solvent, and the third solvent in the conductive graphene ink is at most about 99%. Optionally, in some embodiments, a percentage by mass of at least one of the first solvent, the second solvent, and the third solvent in the conductive graphene ink is about 1% to about 2%, about 1% to about 5%, about 1% to about 10%, about 1% to about 20%, about 1% to about 30%, about 1% to about 40%, about 1% to about 50%, about 1% to about 60%, about 1% to about 70%, about 1% to about 80%, about 1% to about 99%, about 2% to about 5%, about 2% to about 10%, about 2% to about 20%, about 2% to about 30%, about 2% to about 40%, about 2% to about 50%, about 2% to about 60%, about 2% to about 70%, about 2% to about 80%, about 2% to about 99%, about 5% to about 10%, about 5% to about 20%, about 5% to about 30%, about 5% to about 40%, about 5% to about 50%, about 5% to about 60%, about 5% to about 70%, about 5% to about 80%, about 5% to about 99%, about 10% to about 20%, about 10% to about 30%, about 10% to about 40%, about 10% to about 50%, about 10% to about 60%, about 10% to about 70%, about 10% to about 80%, about 10% to about 99%, about 20% to about 30%, about 20% to about 40%, about 20% to about 50%, about 20% to about 60%, about 20% to about 70%, about 20% to about 80%, about 20% to about 99%, about 30% to about 40%, about 30% to about 50%, about 30% to about 60%, about 30% to about 70%, about 30% to about 80%, about 30% to about 99%, about 40% to about 50%, about 40% to about 60%, about 40% to about 70%, about 40% to about 80%, about 40% to about 99%, about 50% to about 60%, about 50% to about 70%, about 50% to about 80%, about 50% to about 99%, about 60% to about 70%, about 60% to about 80%, about 60% to about 99%, about 70% to about 80%, about 70% to about 99%, or about 80% to about 99%. Optionally, in some embodiments, a percentage by mass of at least one of the first solvent, the second solvent, and the third solvent in the conductive graphene ink is about 1%, about 2%, about 5%, about 10%, about 20%, about 30%, about 40%, about 50%, about 60%, about 70%, about 80%, or about 99%. Optionally, in some embodiments, a percentage by mass of at least one of the first solvent, the second solvent, and the third solvent in the conductive graphene ink is at least about 1%, about 2%, about 5%, about 10%, about 20%, about 30%, about 40%, about 50%, about 60%, about 70%, or about 80%. Optionally, in some embodiments, a percentage by mass of at least one of the first solvent, the second solvent, and the third solvent in the conductive graphene ink is at most about 2%, about 5%, about 10%, about 20%, about 30%, about 40%, about 50%, about 60%, about 70%, about 80%, or about 99%.

Optionally, in some embodiments, the binder solution comprises a binder and a first solvent. Optionally, in some embodiments, the binder comprises a polymer. Optionally, in some embodiments, the polymer comprises a synthetic polymer. Optionally, in some embodiments, the synthetic polymer comprises carboxymethyl cellulose, polyvinylidene fluoride, poly(vinyl alcohol), poly(vinyl pyrrolidone), poly (ethylene oxide), ethyl cellulose, or any combination thereof. Optionally, in some embodiments, the binder is a dispersant. Optionally, in some embodiments, the binder comprises carboxymethyl cellulose, polyvinylidene fluoride, poly(vinyl alcohol), poly(vinyl pyrrolidone), poly(ethylene oxide), ethyl cellulose, or any combination thereof.

Optionally, in some embodiments, a percentage by mass of the binder solution in the conductive graphene ink is about 0.5% to about 99%. Optionally, in some embodiments, a percentage by mass of the binder solution in the conductive graphene ink is at least about 0.5%. Optionally, in some embodiments, a percentage by mass of the binder solution in the conductive graphene ink is at most about 99%. Optionally, in some embodiments, a percentage by mass of the binder solution in the conductive graphene ink is about 0.5% to about 1%, about 0.5% to about 2%, about 0.5% to about 5%, about 0.5% to about 10%, about 0.5% to about 20%, about 0.5% to about 30%, about 0.5% to about 40%, about 0.5% to about 50%, about 0.5% to about 70%, about 0.5% to about 90%, about 0.5% to about 99%, about 1% to about 2%, about 1% to about 5%, about 1% to about 10%, about 1% to about 20%, about 1% to about 30%, about 1% to about 40%, about 1% to about 50%, about 1% to about 70%, about 1% to about 90%, about 1% to about 99%, about 2% to about 5%, about 2% to about 10%, about 2% to about 20%, about 2% to about 30%, about 2% to about 40%, about 2% to about 50%, about 2% to about 70%, about 2% to about 90%, about 2% to about 99%, about 5% to about 10%, about 5% to about 20%, about 5% to about 30%, about 5% to about 40%, about 5% to about 50%, about 5% to about 70%, about 5% to about 90%, about 5% to about 99%, about 10% to about 20%, about 10% to about 30%, about 10% to about 40%, about 10% to about 50%, about 10% to about 70%, about 10% to about 90%, about 10% to about 99%, about 20% to about 30%, about 20% to about 40%, about 20% to about 50%, about 20% to about 70%, about 20% to about 90%, about 20% to about 99%, about 30% to about 40%, about 30% to about 50%, about 30% to about 70%, about 30% to about 90%, about 30% to about 99%, about 40% to about 50%, about 40% to about 70%, about 40% to about 90%, about 40% to about 99%, about 50% to about 70%, about 50% to about 90%, about 50% to about 99%, about 70% to about 90%, about 70% to about 99%, or about 90% to about 99%. Optionally, in some embodiments, a percentage by mass of the binder solution in the conductive graphene ink is at most about 99%. Optionally, in some embodiments, a percentage by mass of the binder solution in the conductive graphene ink is about 0.5%, about 1%, about 2%, about 5%, about 10%, about 20%, about 30%, about 40%, about 50%, about 70%, about 90%, or about 99%. Optionally, in some embodiments, a percentage by mass of the binder solution in the conductive graphene ink is at least about 0.5%, about 1%, about 2%, about 5%, about 10%, about 20%, about 30%, about 40%, about 50%, about 60%, about 70%, about 80%, about 90%, about 95%, or about 99%. Alternatively or in combination, in some embodiments, a percentage by mass of the binder solution in the conductive graphene ink is no more than about 0.5%, about 1%, about 2%, about 5%, about 10%, about 20%, about 30%, about 40%, about 50%, about 60%, about 70%, about 80%, about 90%, about 95%, or about 99%.

Optionally, in some embodiments, a concentration of the binder solution is about 0.5% to about 2%. Optionally, in some embodiments, a concentration of the binder solution is at least about 0.5%. Optionally, in some embodiments, a concentration of the binder solution is at most about 2%. Optionally, in some embodiments, a concentration of the binder solution is about 0.5% to about 0.625%, about 0.5% to about 0.75%, about 0.5% to about 0.875%, about 0.5% to about 1%, about 0.5% to about 1.25%, about 0.5% to about 1.5%, about 0.5% to about 1.75%, about 0.5% to about 2%, about 0.625% to about 0.75%, about 0.625% to about 0.875%, about 0.625% to about 1%, about 0.625% to about 1.25%, about 0.625% to about 1.5%, about 0.625% to about 1.75%, about 0.625% to about 2%, about 0.75% to about 0.875%, about 0.75% to about 1%, about 0.75% to about 1.25%, about 0.75% to about 1.5%, about 0.75% to about 1.75%, about 0.75% to about 2%, about 0.875% to about 1%, about 0.875% to about 1.25%, about 0.875% to about 1.5%, about 0.875% to about 1.75%, about 0.875% to about 2%, about 1% to about 1.25%, about 1% to about 1.5%, about 1% to about 1.75%, about 1% to about 2%, about 1.25% to about 1.5%, about 1.25% to about 1.75%, about 1.25% to about 2%, about 1.5% to about 1.75%, about 1.5% to about 2%, or about 1.75% to about 2%. Optionally, in some embodiments, a concentration of the binder solution is about 0.5%, about 0.625%, about 0.75%, about 0.875%, about 1%, about 1.25%, about 1.5%, about 1.75%, or about 2%. Optionally, in some embodiments, a concentration of the binder solution is at least about 0.5%, about 0.625%, about 0.75%, about 0.875%, about 1%, about 1.25%, about 1.5%, about 1.75%, or about 2%. Optionally, in some embodiments, a concentration of the binder solution is no more than about 0.5%, about 0.625%, about 0.75%, about 0.875%, about 1%, about 1.25%, about 1.5%, about 1.75%, or about 2%.

Optionally, in some embodiments, the reduced graphene oxide dispersion comprises reduced graphene oxide (RGO) and a second solvent.

Optionally, in some embodiments, a percentage by mass of the RGO dispersion in the conductive graphene ink is about 0.25% to about 1%. Optionally, in some embodiments, a percentage by mass of the RGO dispersion in the conductive graphene ink is at least about 0.25%. Optionally, in some embodiments, a percentage by mass of the RGO dispersion in the conductive graphene ink is at most about 1%. Optionally, in some embodiments, a percentage by mass of the RGO dispersion in the conductive graphene ink is about 0.25% to about 0.375%, about 0.25% to about 0.5%, about 0.25% to about 0.625%, about 0.25% to about 0.75%, about 0.25% to about 1%, about 0.375% to about 0.5%, about 0.375% to about 0.625%, about 0.375% to about 0.75%, about 0.375% to about 1%, about 0.5% to about 0.625%, about 0.5% to about 0.75%, about 0.5% to about 1%, about 0.625% to about 0.75%, about 0.625% to about 1%, or about 0.75% to about 1%. Optionally, in some embodiments, a percentage by mass of the RGO dispersion in the conductive graphene ink is about 0.25%, about 0.375%, about 0.5%, about 0.625%, about 0.75%, or about 1%. Optionally, in some embodiments, a percentage by mass of the RGO dispersion in the conductive graphene ink is at least about 0.25%, about 0.375%, about 0.5%, about 0.625%, about 0.75%, or about 1%. Optionally, in some embodiments, a percentage by mass of the RGO dispersion in the conductive graphene ink is no more than about 0.25%, about 0.375%, about 0.5%, about 0.625%, about 0.75%, or about 1%.

Optionally, in some embodiments, a concentration by mass of the RGO in the RGO dispersion is about 3% to about 12%. Optionally, in some embodiments, a concentration by mass of the RGO in the RGO dispersion is at least about 3%. Optionally, in some embodiments, a concentration by mass of the RGO in the RGO dispersion is at most about 12%. Optionally, in some embodiments, a concentration by mass of the RGO in the RGO dispersion is about 3% to about 4%, about 3% to about 5%, about 3% to about 6%, about 3% to about 7%, about 3% to about 8%, about 3% to about 9%, about 3% to about 10%, about 3% to about 11%, about 3% to about 12%, about 4% to about 5%, about 4% to about 6%, about 4% to about 7%, about 4% to about 8%, about 4% to about 9%, about 4% to about 10%, about 4% to about 11%, about 4% to about 12%, about 5% to about 6%, about 5% to about 7%, about 5% to about 8%, about 5% to about 9%, about 5% to about 10%, about 5% to about 11%, about 5% to about 12%, about 6% to about 7%, about 6% to about 8%, about 6% to about 9%, about 6% to about 10%, about 6% to about 11%, about 6% to about 12%, about 7% to about 8%, about 7% to about 9%, about 7% to about 10%, about 7% to about 11%, about 7% to about 12%, about 8% to about 9%, about 8% to about 10%, about 8% to about 11%, about 8% to about 12%, about 9% to about 10%, about 9% to about 11%, about 9% to about 12%, about 10% to about 11%, about 10% to about 12%, or about 11% to about 12%. Optionally, in some embodiments, a concentration by mass of the RGO in the RGO dispersion is about 3%, about 4%, about 5%, about 6%, about 7%, about 8%, about 9%, about 10%, about 11%, or about 12%. Optionally, in some embodiments, a concentration by mass of the RGO in the RGO dispersion is at least about 3%, about 4%, about 5%, about 6%, about 7%, about 8%, about 9%, about 10%, about 11%, or about 12%. Optionally, in some embodiments, a concentration by mass of the RGO in the RGO dispersion is no more than about 3%, about 4%, about 5%, about 6%, about 7%, about 8%, about 9%, about 10%, about 11%, or about 12%.

Optionally, in some embodiments, a percentage by mass of the RGO in the conductive graphene ink is about 0.1% to about 99%. Optionally, in some embodiments, a percentage by mass of the RGO in the conductive graphene ink is at least about 0.1%. Optionally, in some embodiments, a percentage by mass of the RGO in the conductive graphene ink is at most about 99%. Optionally, in some embodiments, a percentage by mass of the RGO in the conductive graphene ink is about 0.1% to about 0.2%, about 0.1% to about 0.5%, about 0.1% to about 1%, about 0.1% to about 10%, about 0.1% to about 20%, about 0.1% to about 40%, about 0.1% to about 60%, about 0.1% to about 80%, about 0.1% to about 90%, about 0.1% to about 99%, about 0.2% to about 0.5%, about 0.2% to about 1%, about 0.2% to about 10%, about 0.2% to about 20%, about 0.2% to about 40%, about 0.2% to about 60%, about 0.2% to about 80%, about 0.2% to about 90%, about 0.2% to about 99%, about 0.5% to about 1%, about 0.5% to about 10%, about 0.5% to about 20%, about 0.5% to about 40%, about 0.5% to about 60%, about 0.5% to about 80%, about 0.5% to about 90%, about 0.5% to about 99%, about 1% to about 10%, about 1% to about 20%, about 1% to about 40%, about 1% to about 60%, about 1% to about 80%, about 1% to about 90%, about 1% to about 99%, about 10% to about 20%, about 10% to about 40%, about 10% to about 60%, about 10% to about 80%, about 10% to about 90%, about 10% to about 99%, about 20% to about 40%, about 20% to about 60%, about 20% to about 80%, about 20% to about 90%, about 20% to about 99%, about 40% to about 60%, about 40% to about 80%, about 40% to about 90%, about 40% to about 99%, about 60% to about 80%, about 60% to about 90%, about 60% to about 99%, about 80% to about 90%, about 80% to about 99%, or about 90% to about 99%. Optionally, in some embodiments, a percentage by mass of the RGO in the conductive graphene ink is about 0.1%, about 0.2%, about 0.5%, about 1%, about 10%, about 20%, about 40%, about 60%, about 80%, about 90%, or about 99%. Optionally, in some embodiments, a percentage by mass of the RGO in the conductive graphene ink is at least about 0.1%, about 0.2%, about 0.5%, about 1%, about 10%, about 20%, about 40%, about 60%, about 80%, about 90%, or about 99%. Optionally, in some embodiments, a percentage by mass of the RGO in the conductive graphene ink is no more than about 0.1%, about 0.2%, about 0.5%, about 1%, about 10%, about 20%, about 40%, about 60%, about 80%, about 90%, or about 99%.

Optionally, in some embodiments, the conductive additive comprises a carbon-based material. Optionally, in some embodiments, the carbon-based material comprises a paracrystalline carbon. Optionally, in some embodiments, the paracrystalline carbon comprises carbon black, acetylene black, channel black, furnace black, lamp black, thermal black, or any combination thereof.

Optionally, in some embodiments, the conductive additive comprises silver. Optionally, in some embodiments, the silver comprises silver nanoparticles, silver nanorods, silver nanowires, silver nanoflowers, silver nanofibers, silver nanoplatelets, silver nanoribbons, silver nanocubes, silver bipyramids, or any combination thereof.

Optionally, in some embodiments, a percentage by mass of the conductive additive in the conductive graphene ink is about 2% to about 99%. Optionally, in some embodiments, a percentage by mass of the conductive additive in the conductive graphene ink is at least about 2%. Optionally, in some embodiments, a percentage by mass of the conductive additive in the conductive graphene ink is at most about 99%. Optionally, in some embodiments, a percentage by mass of the conductive additive in the conductive graphene ink is about 2% to about 5%, about 2% to about 10%, about 2% to about 20%, about 2% to about 30%, about 2% to about 40%, about 2% to about 50%, about 2% to about 60%, about 2% to about 70%, about 2% to about 80%, about 2% to about 90%, about 2% to about 99%, about 5% to about 10%, about 5% to about 20%, about 5% to about 30%, about 5% to about 40%, about 5% to about 50%, about 5% to about 60%, about 5% to about 70%, about 5% to about 80%, about 5% to about 90%, about 5% to about 99%, about 10% to about 20%, about 10% to about 30%, about 10% to about 40%, about 10% to about 50%, about 10% to about 60%, about 10% to about 70%, about 10% to about 80%, about 10% to about 90%, about 10% to about 99%, about 20% to about 30%, about 20% to about 40%, about 20% to about 50%, about 20% to about 60%, about 20% to about 70%, about 20% to about 80%, about 20% to about 90%, about 20% to about 99%, about 30% to about 40%, about 30% to about 50%, about 30% to about 60%, about 30% to about 70%, about 30% to about 80%, about 30% to about 90%, about 30% to about 99%, about 40% to about 50%, about 40% to about 60%, about 40% to about 70%, about 40% to about 80%, about 40% to about 90%, about 40% to about 99%, about 50% to about 60%, about 50% to about 70%, about 50% to about 80%, about 50% to about 90%, about 50% to about 99%, about 60% to about 70%, about 60% to about 80%, about 60% to about 90%, about 60% to about 99%, about 70% to about 80%, about 70% to about 90%, about 70% to about 99%, about 80% to about 90%, about 80% to about 99%, or about 90% to about 99%. Optionally, in some embodiments, a percentage by mass of the conductive additive in the conductive graphene ink is about 2%, about 5%, about 10%, about 20%, about 30%, about 40%, about 50%, about 60%, about 70%, about 80%, about 90%, or about 99%. Optionally, in some embodiments, a percentage by mass of the conductive additive in the conductive graphene ink is at least about 2%, about 5%, about 10%, about 20%, about 30%, about 40%, about 50%, about 60%, about 70%, about 80%, about 90%, or about 99%. Optionally, in some embodiments, a percentage by mass of the conductive additive in the conductive graphene ink is no more than about 2%, about 5%, about 10%, about 20%, about 30%, about 40%, about 50%, about 60%, about 70%, about 80%, about 90%, or about 99%.

Some embodiments further comprise a surfactant. Optionally, in some embodiments, the surfactant comprises an acid, a nonionic surfactant, or any combination thereof. Optionally, in some embodiments, the acid comprises perfluorooctanoic acid, perfluorooctane sulfonate, perfluorohexane sulfonic acid, perfluorononanoic acid, perfluorodecanoic acid, or any combination thereof. Optionally, in some embodiments, the nonionic surfactant comprises a polyethylene glycol alkyl ether, a octaethylene glycol monododecyl ether, a pentaethylene glycol monododecyl ether, a polypropylene glycol alkyl ether, a glucoside alkyl ether, decyl glucoside, lauryl glucoside, octyl glucoside, a polyethylene glycol octylphenyl ether, dodecyldimethylamine oxide, a polyethylene glycol alkylphenyl ether, a polyethylene glycol octylphenyl ether, Triton X-100, polyethylene glycol alkylphenyl ether, nonoxynol-9, a glycerol alkyl ester polysorbate, sorbitan alkyl ester, polyethoxylated tallow amine, Dynol 604, or any combination thereof.

Optionally, in some embodiments, high quantities of water in water-based conductive graphene inks increase the surface tension of the ink. In some applications, such as in inkjet printing, however, a low, controlled surface tension and viscosity is required to maintain consistent jetting through the print head nozzles. Optionally, in some embodiments, the addition of a surfactant reduces the surface tension of an ink because as the surfactant units move to the water/air interface, their relative force of attraction weakens as the non-polar surfactant heads become exposed.

Optionally, in some embodiments, a percentage by mass of the surfactant in the conductive graphene ink is about 0.5% to about 10%. Optionally, in some embodiments, a percentage by mass of the surfactant in the conductive graphene ink is at least about 0.5%. Optionally, in some embodiments, a percentage by mass of the surfactant in the conductive graphene ink is at most about 10%. Optionally, in some embodiments, a percentage by mass of the surfactant in the conductive graphene ink is about 0.5% to about 1%, about 0.5% to about 2%, about 0.5% to about 3%, about 0.5% to about 4%, about 0.5% to about 5%, about 0.5% to about 6%, about 0.5% to about 7%, about 0.5% to about 8%, about 0.5% to about 9%, about 0.5% to about 10%, about 1% to about 2%, about 1% to about 3%, about 1% to about 4%, about 1% to about 5%, about 1% to about 6%, about 1% to about 7%, about 1% to about 8%, about 1% to about 9%, about 1% to about 10%, about 2% to about 3%, about 2% to about 4%, about 2% to about 5%, about 2% to about 6%, about 2% to about 7%, about 2% to about 8%, about 2% to about 9%, about 2% to about 10%, about 3% to about 4%, about 3% to about 5%, about 3% to about 6%, about 3% to about 7%, about 3% to about 8%, about 3% to about 9%, about 3% to about 10%, about 4% to about 5%, about 4% to about 6%, about 4% to about 7%, about 4% to about 8%, about 4% to about 9%, about 4% to about 10%, about 5% to about 6%, about 5% to about 7%, about 5% to about 8%, about 5% to about 9%, about 5% to about 10%, about 6% to about 7%, about 6% to about 8%, about 6% to about 9%, about 6% to about 10%, about 7% to about 8%, about 7% to about 9%, about 7% to about 10%, about 8% to about 9%, about 8% to about 10%, or about 9% to about 10%. Optionally, in some embodiments, a percentage by mass of the surfactant in the conductive graphene ink is about 0.5%, about 1%, about 2%, about 3%, about 4%, about 5%, about 6%, about 7%, about 8%, about 9%, or about 10%. Optionally, in some embodiments, a percentage by mass of the surfactant in the conductive graphene ink is at least about 0.5%, about 1%, about 2%, about 3%, about 4%, about 5%, about 6%, about 7%, about 8%, about 9%, or about 10%. Optionally, in some embodiments, a percentage by mass of the surfactant in the conductive graphene ink is no more than about 0.5%, about 1%, about 2%, about 3%, about 4%, about 5%, about 6%, about 7%, about 8%, about 9%, or about 10%.

Some embodiments further comprise a defoamer, wherein the defoamer comprises an insoluble oil, a silicone, a glycol, a stearate, an organic solvent, Surfynol DF-1100, alkyl polyacrylate, or any combination thereof. Optionally, in some embodiments, the insoluble oil comprises mineral oil, vegetable oil, white oil, or any combination thereof. Optionally, in some embodiments, the silicone comprises polydimethylsiloxane, silicone glycol, a fluorosilicone, or any combination thereof. Optionally, in some embodiments, the glycol comprises polyethylene glycol, ethylene glycol, propylene glycol, or any combination thereof. Optionally, in some embodiments, the stearate comprises glycol stearate, stearin, or any combination thereof. Optionally, in some embodiments, the organic solvent comprises ethanol, isopropyl alcohol, N-methyl-2-pyrrolidone, cyclohexanone, terpineol, 3-methoxy-3-methyl-1-butanol, 4-hydroxyl-4-methyl-pentan-2-one, methyl isobutyl ketone, or any combination thereof.

Optionally, in some embodiments, a percentage by mass of the defoamer in the conductive graphene ink is about 0.5% to about 10%. Optionally, in some embodiments, a percentage by mass of the defoamer in the conductive graphene ink is at least about 0.5%. Optionally, in some embodiments, a percentage by mass of the defoamer in the conductive graphene ink is at most about 10%. Optionally, in some embodiments, a percentage by mass of the defoamer in the conductive graphene ink is about 0.5% to about 1%, about 0.5% to about 2%, about 0.5% to about 3%, about 0.5% to about 4%, about 0.5% to about 5%, about 0.5% to about 6%, about 0.5% to about 7%, about 0.5% to about 8%, about 0.5% to about 9%, about 0.5% to about 10%, about 1% to about 2%, about 1% to about 3%, about 1% to about 4%, about 1% to about 5%, about 1% to about 6%, about 1% to about 7%, about 1% to about 8%, about 1% to about 9%, about 1% to about 10%, about 2% to about 3%, about 2% to about 4%, about 2% to about 5%, about 2% to about 6%, about 2% to about 7%, about 2% to about 8%, about 2% to about 9%, about 2% to about 10%, about 3% to about 4%, about 3% to about 5%, about 3% to about 6%, about 3% to about 7%, about 3% to about 8%, about 3% to about 9%, about 3% to about 10%, about 4% to about 5%, about 4% to about 6%, about 4% to about 7%, about 4% to about 8%, about 4% to about 9%, about 4% to about 10%, about 5% to about 6%, about 5% to about 7%, about 5% to about 8%, about 5% to about 9%, about 5% to about 10%, about 6% to about 7%, about 6% to about 8%, about 6% to about 9%, about 6% to about 10%, about 7% to about 8%, about 7% to about 9%, about 7% to about 10%, about 8% to about 9%, about 8% to about 10%, or about 9% to about 10%. Optionally, in some embodiments, a percentage by mass of the defoamer in the conductive graphene ink is about 0.5%, about 1%, about 2%, about 3%, about 4%, about 5%, about 6%, about 7%, about 8%, about 9%, or about 10%. Optionally, in some embodiments, a percentage by mass of the defoamer in the conductive graphene ink is at least about 0.5%, about 1%, about 2%, about 3%, about 4%, about 5%, about 6%, about 7%, about 8%, about 9%, or about 10%. Optionally, in some embodiments, a percentage by mass of the defoamer in the conductive graphene ink is no more than about 0.5%, about 1%, about 2%, about 3%, about 4%, about 5%, about 6%, about 7%, about 8%, about 9%, or about 10%.

Optionally, in some embodiments, the solid matter content by mass of the conductive graphene ink is about 2.5% to about 10.5%. Optionally, in some embodiments, the solid matter content by mass of the conductive graphene ink is at least about 2.5%. Optionally, in some embodiments, the solid matter content by mass of the conductive graphene ink is at most about 10.5%. Optionally, in some embodiments, the solid matter content by mass of the conductive graphene ink is about 2.5% to about 3.5%, about 2.5% to about 4.5%, about 2.5% to about 5.5%, about 2.5% to about 6.5%, about 2.5% to about 7.5%, about 2.5% to about 8.5%, about 2.5% to about 9.5%, about 2.5% to about 10.5%, about 3.5% to about 4.5%, about 3.5% to about 5.5%, about 3.5% to about 6.5%, about 3.5% to about 7.5%, about 3.5% to about 8.5%, about 3.5% to about 9.5%, about 3.5% to about 10.5%, about 4.5% to about 5.5%, about 4.5% to about 6.5%, about 4.5% to about 7.5%, about 4.5% to about 8.5%, about 4.5% to about 9.5%, about 4.5% to about 10.5%, about 5.5% to about 6.5%, about 5.5% to about 7.5%, about 5.5% to about 8.5%, about 5.5% to about 9.5%, about 5.5% to about 10.5%, about 6.5% to about 7.5%, about 6.5% to about 8.5%, about 6.5% to about 9.5%, about 6.5% to about 10.5%, about 7.5% to about 8.5%, about 7.5% to about 9.5%, about 7.5% to about 10.5%, about 8.5% to about 9.5%, about 8.5% to about 10.5%, or about 9.5% to about 10.5%. Optionally, in some embodiments, the solid matter content by mass of the conductive graphene ink is about 2.5%, about 3.5%, about 4.5%, about 5.5%, about 6.5%, about 7.5%, about 8.5%, about 9.5%, or about 10.5%. Optionally, in some embodiments, the solid matter content by mass of the conductive graphene ink is at least about 2.5%, about 3.5%, about 4.5%, about 5.5%, about 6.5%, about 7.5%, about 8.5%, about 9.5%, or about 10.5%. Optionally, in some embodiments, the solid matter content by mass of the conductive graphene ink is no more than about 2.5%, about 3.5%, about 4.5%, about 5.5%, about 6.5%, about 7.5%, about 8.5%, about 9.5%, or about 10.5%.

Optionally, in some embodiments, the viscosity of the conductive graphene ink is about 10 centipoise to about 10,000 centipoise. Optionally, in some embodiments, the viscosity of the conductive graphene ink is at least about 10 centipoise. Optionally, in some embodiments, the viscosity of the conductive graphene ink is at most about 10,000 centipoise. Optionally, in some embodiments, the viscosity of the conductive graphene ink is about 10 centipoise to about 20 centipoise, about 10 centipoise to about 50 centipoise, about 10 centipoise to about 100 centipoise, about 10 centipoise to about 200 centipoise, about 10 centipoise to about 500 centipoise, about 10 centipoise to about 1,000 centipoise, about 10 centipoise to about 2,000 centipoise, about 10 centipoise to about 5,000 centipoise, about 10 centipoise to about 10,000 centipoise, about 20 centipoise to about 50 centipoise, about 20 centipoise to about 100 centipoise, about 20 centipoise to about 200 centipoise, about 20 centipoise to about 500 centipoise, about 20 centipoise to about 1,000 centipoise, about 20 centipoise to about 2,000 centipoise, about 20 centipoise to about 5,000 centipoise, about 20 centipoise to about 10,000 centipoise, about 50 centipoise to about 100 centipoise, about 50 centipoise to about 200 centipoise, about 50 centipoise to about 500 centipoise, about 50 centipoise to about 1,000 centipoise, about 50 centipoise to about 2,000 centipoise, about 50 centipoise to about 5,000 centipoise, about 50 centipoise to about 10,000 centipoise, about 100 centipoise to about 200 centipoise, about 100 centipoise to about 500 centipoise, about 100 centipoise to about 1,000 centipoise, about 100 centipoise to about 2,000 centipoise, about 100 centipoise to about 5,000 centipoise, about 100 centipoise to about 10,000 centipoise, about 200 centipoise to about 500 centipoise, about 200 centipoise to about 1,000 centipoise, about 200 centipoise to about 2,000 centipoise, about 200 centipoise to about 5,000 centipoise, about 200 centipoise to about 10,000 centipoise, about 500 centipoise to about 1,000 centipoise, about 500 centipoise to about 2,000 centipoise, about 500 centipoise to about 5,000 centipoise, about 500 centipoise to about 10,000 centipoise, about 1,000 centipoise to about 2,000 centipoise, about 1,000 centipoise to about 5,000 centipoise, about 1,000 centipoise to about 10,000 centipoise, about 2,000 centipoise to about 5,000 centipoise, about 2,000 centipoise to about 10,000 centipoise, or about 5,000 centipoise to about 10,000 centipoise. Optionally, in some embodiments, the viscosity of the conductive graphene ink is about 10 centipoise, about 20 centipoise, about 50 centipoise, about 100 centipoise, about 200 centipoise, about 500 centipoise, about 1,000 centipoise, about 2,000 centipoise, about 5,000 centipoise, or about 10,000 centipoise. Optionally, in some embodiments, the viscosity of the conductive graphene ink is at least about 10 centipoise, about 20 centipoise, about 50 centipoise, about 100 centipoise, about 200 centipoise, about 500 centipoise, about 1,000 centipoise, about 2,000 centipoise, about 5,000 centipoise, or about 10,000 centipoise. Optionally, in some embodiments, the viscosity of the conductive graphene ink is no more than about 10 centipoise, about 20 centipoise, about 50 centipoise, about 100 centipoise, about 200 centipoise, about 500 centipoise, about 1,000 centipoise, about 2,000 centipoise, about 5,000 centipoise, or about 10,000 centipoise.

Optionally, in some embodiments, the conductive graphene ink has a viscosity of about 2,300 centipoise to about 2,400 centipoise. Optionally, in some embodiments, the conductive graphene ink has a viscosity of at least about 2,300 centipoise. Optionally, in some embodiments, the conductive graphene ink has a viscosity of at most about 2,400 centipoise. Optionally, in some embodiments, the conductive graphene ink has a viscosity of about 2,300 centipoise to about 2,310 centipoise, about 2,300 centipoise to about 2,320 centipoise, about 2,300 centipoise to about 2,330 centipoise, about 2,300 centipoise to about 2,340 centipoise, about 2,300 centipoise to about 2,350 centipoise, about 2,300 centipoise to about 2,360 centipoise, about 2,300 centipoise to about 2,370 centipoise, about 2,300 centipoise to about 2,380 centipoise, about 2,300 centipoise to about 2,390 centipoise, about 2,300 centipoise to about 2,400 centipoise, about 2,310 centipoise to about 2,320 centipoise, about 2,310 centipoise to about 2,330 centipoise, about 2,310 centipoise to about 2,340 centipoise, about 2,310 centipoise to about 2,350 centipoise, about 2,310 centipoise to about 2,360 centipoise, about 2,310 centipoise to about 2,370 centipoise, about 2,310 centipoise to about 2,380 centipoise, about 2,310 centipoise to about 2,390 centipoise, about 2,310 centipoise to about 2,400 centipoise, about 2,320 centipoise to about 2,330 centipoise, about 2,320 centipoise to about 2,340 centipoise, about 2,320 centipoise to about 2,350 centipoise, about 2,320 centipoise to about 2,360 centipoise, about 2,320 centipoise to about 2,370 centipoise, about 2,320 centipoise to about 2,380 centipoise, about 2,320 centipoise to about 2,390 centipoise, about 2,320 centipoise to about 2,400 centipoise, about 2,330 centipoise to about 2,340 centipoise, about 2,330 centipoise to about 2,350 centipoise, about 2,330 centipoise to about 2,360 centipoise, about 2,330 centipoise to about 2,370 centipoise, about 2,330 centipoise to about 2,380 centipoise, about 2,330 centipoise to about 2,390 centipoise, about 2,330 centipoise to about 2,400 centipoise, about 2,340 centipoise to about 2,350 centipoise, about 2,340 centipoise to about 2,360 centipoise, about 2,340 centipoise to about 2,370 centipoise, about 2,340 centipoise to about 2,380 centipoise, about 2,340 centipoise to about 2,390 centipoise, about 2,340 centipoise to about 2,400 centipoise, about 2,350 centipoise to about 2,360 centipoise, about 2,350 centipoise to about 2,370 centipoise, about 2,350 centipoise to about 2,380 centipoise, about 2,350 centipoise to about 2,390 centipoise, about 2,350 centipoise to about 2,400 centipoise, about 2,360 centipoise to about 2,370 centipoise, about 2,360 centipoise to about 2,380 centipoise, about 2,360 centipoise to about 2,390 centipoise, about 2,360 centipoise to about 2,400 centipoise, about 2,370 centipoise to about 2,380 centipoise, about 2,370 centipoise to about 2,390 centipoise, about 2,370 centipoise to about 2,400 centipoise, about 2,380 centipoise to about 2,390 centipoise, about 2,380 centipoise to about 2,400 centipoise, or about 2,390 centipoise to about 2,400 centipoise. Optionally, in some embodiments, the conductive graphene ink has a viscosity of about 2,300 centipoise, about 2,310 centipoise, about 2,320 centipoise, about 2,330 centipoise, about 2,340 centipoise, about 2,350 centipoise, about 2,360 centipoise, about 2,370 centipoise, about 2,380 centipoise, about 2,390 centipoise, or about 2,400 centipoise.

Optionally, in some embodiments, the density of the conductive graphene ink at a temperature of about 20° C. is about 2.5 g/cm$^3$ to about 10.5 g/cm$^3$. Optionally, in some embodiments, the density of the conductive graphene ink at a temperature of about 20° C. is at least about 2.5 g/cm$^3$. Optionally, in some embodiments, the density of the conductive graphene ink at a temperature of about 20° C. is at most about 10.5 g/cm$^3$. Optionally, in some embodiments, the density of the conductive graphene ink at a temperature of about 20° C. is about 2.5 g/cm$^3$ to about 3.5 g/cm$^3$, about 2.5 g/cm$^3$ to about 4.5 g/cm$^3$, about 2.5 g/cm$^3$ to about 5.5 g/cm$^3$, about 2.5 g/cm$^3$ to about 6.5 g/cm$^3$, about 2.5 g/cm$^3$ to about 7.5 g/cm$^3$, about 2.5 g/cm$^3$ to about 8.5 g/cm$^3$, about 2.5 g/cm$^3$ to about 9.5 g/cm$^3$, about 2.5 g/cm$^3$ to about 10.5 g/cm$^3$, about 3.5 g/cm$^3$ to about 4.5 g/cm$^3$, about 3.5 g/cm$^3$ to about 5.5 g/cm$^3$, about 3.5 g/cm$^3$ to about 6.5 g/cm$^3$, about 3.5 g/cm$^3$ to about 7.5 g/cm$^3$, about 3.5 g/cm$^3$ to about 8.5 g/cm$^3$, about 3.5 g/cm$^3$ to about 9.5 g/cm$^3$, about 3.5 g/cm$^3$ to about 10.5 g/cm$^3$, about 4.5 g/cm$^3$ to about 5.5 g/cm$^3$, about 4.5 g/cm$^3$ to about 6.5 g/cm$^3$, about 4.5 g/cm$^3$ to about 7.5 g/cm$^3$, about 4.5 g/cm$^3$ to about 8.5 g/cm$^3$, about 4.5 g/cm$^3$ to about 9.5 g/cm$^3$, about 4.5 g/cm$^3$ to about 10.5 g/cm$^3$, about 5.5 g/cm$^3$ to about 6.5 g/cm$^3$, about 5.5 g/cm$^3$ to about 7.5 g/cm$^3$, about 5.5 g/cm$^3$ to about 8.5 g/cm$^3$, about 5.5 g/cm$^3$ to about 9.5 g/cm$^3$, about 5.5 g/cm$^3$ to about 10.5 g/cm$^3$, about 6.5 g/cm$^3$ to about 7.5 g/cm$^3$, about 6.5 g/cm$^3$ to about 8.5 g/cm$^3$, about 6.5 g/cm$^3$ to about 9.5 g/cm$^3$, about 6.5 g/cm$^3$ to about 10.5 g/cm$^3$, about 7.5 g/cm$^3$ to about 8.5 g/cm$^3$, about 7.5 g/cm$^3$ to about 9.5 g/cm$^3$, about 7.5 g/cm$^3$ to about 10.5 g/cm$^3$, about 8.5 g/cm$^3$ to about 9.5 g/cm$^3$, about 8.5 g/cm$^3$ to about 10.5 g/cm$^3$, or about 9.5 g/cm$^3$ to about 10.5 g/cm$^3$. Optionally, in some embodiments, the density of the conductive graphene ink at a temperature of about 20° C. is at most about 10.5 g/cm$^3$. Optionally, in some embodiments, the density of the conductive graphene ink at a temperature of about 20° C. is about 2.5 g/cm$^3$, about 3.5 g/cm$^3$, about 4.5 g/cm$^3$, about 5.5 g/cm$^3$, about 6.5 g/cm$^3$, about 7.5 g/cm$^3$, about 8.5 g/cm$^3$, about 9.5 g/cm$^3$, or about 10.5 g/cm$^3$. Optionally, in some embodiments, the density of the conductive graphene ink at a temperature of at least about 20° C. is about 2.5 g/cm$^3$, about 3.5 g/cm$^3$, about 4.5 g/cm$^3$, about 5.5 g/cm$^3$, about 6.5 g/cm$^3$, about 7.5 g/cm$^3$, about 8.5 g/cm$^3$, about 9.5 g/cm$^3$, or about 10.5 g/cm$^3$. Optionally, in some embodiments, the density of the conductive graphene ink at a temperature of no more than about 20° C. is about 2.5 g/cm$^3$, about 3.5 g/cm$^3$, about 4.5 g/cm$^3$, about 5.5 g/cm$^3$, about 6.5 g/cm$^3$, about 7.5 g/cm$^3$, about 8.5 g/cm$^3$, about 9.5 g/cm$^3$, or about 10.5 g/cm$^3$.

Optionally, in some embodiments the conductive graphene ink has a surface area of about 40 m$^2$/g to about 2,400 m$^2$/g. Optionally, in some embodiments the conductive graphene ink has a surface area of at least about 40 m$^2$/g. Optionally, in some embodiments the conductive graphene ink has a surface area of at most about 2,400 m$^2$/g. Optionally, in some embodiments the conductive graphene ink has a surface area of about 40 m$^2$/g to about 80 m$^2$/g, about 40 m$^2$/g to about 120 m$^2$/g, about 40 m$^2$/g to about 240 m$^2$/g, about 40 m$^2$/g to about 480 m$^2$/g, about 40 m$^2$/g to about 1,000 m$^2$/g, about 40 m$^2$/g to about 1,400 m$^2$/g, about 40 m$^2$/g to about 1,800 m$^2$/g, about 40 m$^2$/g to about 2,200 m$^2$/g, about 40 m$^2$/g to about 2,400 m$^2$/g, about 80 m$^2$/g to about 120 m$^2$/g, about 80 m$^2$/g to about 240 m$^2$/g, about 80 m$^2$/g to about 480 m$^2$/g, about 80 m$^2$/g to about 1,000 m$^2$/g, about 80 m$^2$/g to about 1,400 m$^2$/g, about 80 m$^2$/g to about 1,800 m$^2$/g, about 80 m$^2$/g to about 2,200 m$^2$/g, about 80 m$^2$/g to about 2,400 m$^2$/g, about 120 m$^2$/g to about 240 m$^2$/g, about 120 m$^2$/g to about 480 m$^2$/g, about 120 m$^2$/g to about 1,000 m$^2$/g, about 120 m$^2$/g to about 1,400 m$^2$/g, about 120 m$^2$/g to about 1,800 m$^2$/g, about 120 m$^2$/g to about 2,200 m$^2$/g, about 120 m$^2$/g to about 2,400 m$^2$/g, about 240 m$^2$/g to about 480 m$^2$/g, about 240 m$^2$/g to about 1,000 m$^2$/g, about 240 m$^2$/g to about 1,400 m$^2$/g, about 240 m$^2$/g to about 1,800 m$^2$/g, about 240 m$^2$/g to about 2,200 m$^2$/g, about 240 m$^2$/g to about 2,400 m$^2$/g, about 480 m$^2$/g to about 1,000 m$^2$/g, about 480 m$^2$/g to about 1,400 m$^2$/g, about 480 m$^2$/g to about 1,800 m$^2$/g, about 480 m$^2$/g to about 2,200 m$^2$/g, about 480 m$^2$/g to about 2,400 m$^2$/g, about 1,000 m$^2$/g to about 1,400 m$^2$/g, about 1,000 m$^2$/g to about 1,800 m$^2$/g, about 1,000 m$^2$/g to about 2,200 m$^2$/g, about 1,000 m$^2$/g to about 2,400 m$^2$/g, about 1,400 m$^2$/g to about 1,800 m$^2$/g, about 1,400 m$^2$/g to about 2,200 m$^2$/g, about 1,400 m$^2$/g to about 2,400 m$^2$/g, about 1,800 m$^2$/g to about 2,200 m$^2$/g, about 1,800 m$^2$/g to about 2,400 m$^2$/g, or about 2,200 m$^2$/g to about 2,400 m$^2$/g. Optionally, in some embodiments the conductive graphene ink has a surface area of about 40 m$^2$/g, about 80 m$^2$/g, about 120 m$^2$/g, about 240 m$^2$/g, about 480 m$^2$/g, about 1,000 m$^2$/g, about 1,400 m$^2$/g, about 1,800 m$^2$/g, about 2,200 m$^2$/g, or about 2,400 m$^2$/g. Optionally, in some embodiments the conductive graphene ink has a surface area of at least about 40 m$^2$/g, about 80 m$^2$/g, about 120 m$^2$/g, about 240 m$^2$/g, about 480 m$^2$/g, about 1,000 m$^2$/g, about 1,400 m$^2$/g, about 1,800 m$^2$/g, about 2,200 m$^2$/g, or about 2,400 m$^2$/g. Optionally, in some embodiments the conductive graphene ink has a surface area of no more than about 40 m$^2$/g, about 80 m$^2$/g, about 120 m$^2$/g, about 240 m$^2$/g, about 480 m$^2$/g, about 1,000 m$^2$/g, about 1,400 m$^2$/g, about 1,800 m$^2$/g, about 2,200 m$^2$/g, or about 2,400 m$^2$/g.

Optionally, in some embodiments the conductive graphene ink has a conductivity of about 400 S/m to about 1,600 S/m. Optionally, in some embodiments the conductive graphene ink has a conductivity of at least about 400 S/m. Optionally, in some embodiments the conductive graphene ink has a conductivity of at most about 1,600 S/m. Optionally, in some embodiments the conductive graphene ink has a conductivity of about 400 S/m to about 500 S/m, about 400

S/m to about 600 S/m, about 400 S/m to about 700 S/m, about 400 S/m to about 800 S/m, about 400 S/m to about 900 S/m, about 400 S/m to about 1,000 S/m, about 400 S/m to about 1,200 S/m, about 400 S/m to about 1,400 S/m, about 400 S/m to about 1,600 S/m, about 500 S/m to about 600 S/m, about 500 S/m to about 700 S/m, about 500 S/m to about 800 S/m, about 500 S/m to about 900 S/m, about 500 S/m to about 1,000 S/m, about 500 S/m to about 1,200 S/m, about 500 S/m to about 1,400 S/m, about 500 S/m to about 1,600 S/m, about 600 S/m to about 700 S/m, about 600 S/m to about 800 S/m, about 600 S/m to about 900 S/m, about 600 S/m to about 1,000 S/m, about 600 S/m to about 1,200 S/m, about 600 S/m to about 1,400 S/m, about 600 S/m to about 1,600 S/m, about 700 S/m to about 800 S/m, about 700 S/m to about 900 S/m, about 700 S/m to about 1,000 S/m, about 700 S/m to about 1,200 S/m, about 700 S/m to about 1,400 S/m, about 700 S/m to about 1,600 S/m, about 800 S/m to about 900 S/m, about 800 S/m to about 1,000 S/m, about 800 S/m to about 1,200 S/m, about 800 S/m to about 1,400 S/m, about 800 S/m to about 1,600 S/m, about 900 S/m to about 1,000 S/m, about 900 S/m to about 1,200 S/m, about 900 S/m to about 1,400 S/m, about 900 S/m to about 1,600 S/m, about 1,000 S/m to about 1,200 S/m, about 1,000 S/m to about 1,400 S/m, about 1,000 S/m to about 1,600 S/m, about 1,200 S/m to about 1,400 S/m, about 1,200 S/m to about 1,600 S/m, or about 1,400 S/m to about 1,600 S/m. Optionally, in some embodiments the conductive graphene ink has a conductivity of about 400 S/m, about 500 S/m, about 600 S/m, about 700 S/m, about 800 S/m, about 900 S/m, about 1,000 S/m, about 1,200 S/m, about 1,400 S/m, or about 1,600 S/m. Optionally, in some embodiments the conductive graphene ink has a conductivity of at least about 400 S/m, about 500 S/m, about 600 S/m, about 700 S/m, about 800 S/m, about 900 S/m, about 1,000 S/m, about 1,200 S/m, about 1,400 S/m, or about 1,600 S/m. Optionally, in some embodiments the conductive graphene ink has a conductivity of no more than about 400 S/m, about 500 S/m, about 600 S/m, about 700 S/m, about 800 S/m, about 900 S/m, about 1,000 S/m, about 1,200 S/m, about 1,400 S/m, or about 1,600 S/m.

Optionally, in some embodiments the conductive graphene ink has a C:O mass ratio of about 2:1 to about 40:1. Optionally, in some embodiments the conductive graphene ink has a C:O mass ratio of at least about 2:1. Optionally, in some embodiments the conductive graphene ink has a C:O mass ratio of at most about 40:1. Optionally, in some embodiments the conductive graphene ink has a C:O mass ratio of about 2:1 to about 4:1, about 2:1 to about 6:1, about 2:1 to about 8:1, about 2:1 to about 10:1, about 2:1 to about 15:1, about 2:1 to about 20:1, about 2:1 to about 25:1, about 2:1 to about 30:1, about 2:1 to about 34:1, about 2:1 to about 40:1, about 4:1 to about 6:1, about 4:1 to about 8:1, about 4:1 to about 10:1, about 4:1 to about 15:1, about 4:1 to about 20:1, about 4:1 to about 25:1, about 4:1 to about 30:1, about 4:1 to about 34:1, about 4:1 to about 40:1, about 6:1 to about 8:1, about 6:1 to about 10:1, about 6:1 to about 15:1, about 6:1 to about 20:1, about 6:1 to about 25:1, about 6:1 to about 30:1, about 6:1 to about 34:1, about 6:1 to about 40:1, about 8:1 to about 10:1, about 8:1 to about 15:1, about 8:1 to about 20:1, about 8:1 to about 25:1, about 8:1 to about 30:1, about 8:1 to about 34:1, about 8:1 to about 40:1, about 10:1 to about 15:1, about 10:1 to about 20:1, about 10:1 to about 25:1, about 10:1 to about 30:1, about 10:1 to about 34:1, about 10:1 to about 40:1, about 15:1 to about 20:1, about 15:1 to about 25:1, about 15:1 to about 30:1, about 15:1 to about 34:1, about 15:1 to about 40:1, about 20:1 to about 25:1, about 20:1 to about 30:1, about 20:1 to about 34:1, about 20:1 to about 40:1, about 25:1 to about 30:1, about 25:1 to about 34:1, about 25:1 to about 40:1, about 30:1 to about 34:1, about 30:1 to about 40:1, or about 34:1 to about 40:1. Optionally, in some embodiments the conductive graphene ink has a C:O mass ratio of about 2:1, about 4:1, about 6:1, about 8:1, about 10:1, about 15:1, about 20:1, about 25:1, about 30:1, about 34:1, or about 40:1. Optionally, in some embodiments, one of the conductivity, the surface area, and the C:O ratio of the conductive graphene ink is measured by methylene blue absorption. Optionally, in some embodiments the conductive graphene ink has a C:O mass ratio of at least about 2:1, about 4:1, about 6:1, about 8:1, about 10:1, about 15:1, about 20:1, about 25:1, about 30:1, about 34:1, or about 40:1. Optionally, in some embodiments the conductive graphene ink has a C:O mass ratio of no more than about 2:1, about 4:1, about 6:1, about 8:1, about 10:1, about 15:1, about 20:1, about 25:1, about 30:1, about 34:1, or about 40:1.

Optionally, in some embodiments, the conductive graphene ink is a conductive graphene hydrate.

Optionally, in some embodiments, the graphene ink has a resistivity when dry of about 0.01 ohm/sq/mil to about 60 ohms/sq/mil. Optionally, in some embodiments, the graphene ink has a resistivity when dry of at least about 0.01 ohm/sq/mil. Optionally, in some embodiments, the graphene ink has a resistivity when dry of at most about 60 ohms/sq/mil. Optionally, in some embodiments, the graphene ink has a resistivity when dry of about 0.01 ohm/sq/mil to about 0.05 ohm/sq/mil, about 0.01 ohm/sq/mil to about 0.1 ohm/sq/mil, about 0.01 ohm/sq/mil to about 0.5 ohm/sq/mil, about 0.01 ohm/sq/mil to about 1 ohm/sq/mil, about 0.01 ohm/sq/mil to about 5 ohms/sq/mil, about 0.01 ohm/sq/mil to about 10 ohms/sq/mil, about 0.01 ohm/sq/mil to about 20 ohms/sq/mil, about 0.01 ohm/sq/mil to about 30 ohms/sq/mil, about 0.01 ohm/sq/mil to about 40 ohms/sq/mil, about 0.01 ohm/sq/mil to about 50 ohms/sq/mil, about 0.01 ohm/sq/mil to about 60 ohms/sq/mil, about 0.05 ohm/sq/mil to about 0.1 ohm/sq/mil, about 0.05 ohm/sq/mil to about 0.5 ohm/sq/mil, about 0.05 ohm/sq/mil to about 1 ohm/sq/mil, about 0.05 ohm/sq/mil to about 5 ohms/sq/mil, about 0.05 ohm/sq/mil to about 10 ohms/sq/mil, about 0.05 ohm/sq/mil to about 20 ohms/sq/mil, about 0.05 ohm/sq/mil to about 30 ohms/sq/mil, about 0.05 ohm/sq/mil to about 40 ohms/sq/mil, about 0.05 ohm/sq/mil to about 50 ohms/sq/mil, about 0.05 ohm/sq/mil to about 60 ohms/sq/mil, about 0.1 ohm/sq/mil to about 0.5 ohm/sq/mil, about 0.1 ohm/sq/mil to about 1 ohm/sq/mil, about 0.1 ohm/sq/mil to about 5 ohms/sq/mil, about 0.1 ohm/sq/mil to about 10 ohms/sq/mil, about 0.1 ohm/sq/mil to about 20 ohms/sq/mil, about 0.1 ohm/sq/mil to about 30 ohms/sq/mil, about 0.1 ohm/sq/mil to about 40 ohms/sq/mil, about 0.1 ohm/sq/mil to about 50 ohms/sq/mil, about 0.1 ohm/sq/mil to about 60 ohms/sq/mil, about 0.5 ohm/sq/mil to about 1 ohm/sq/mil, about 0.5 ohm/sq/mil to about 5 ohms/sq/mil, about 0.5 ohm/sq/mil to about 10 ohms/sq/mil, about 0.5 ohm/sq/mil to about 20 ohms/sq/mil, about 0.5 ohm/sq/mil to about 30 ohms/sq/mil, about 0.5 ohm/sq/mil to about 40 ohms/sq/mil, about 0.5 ohm/sq/mil to about 50 ohms/sq/mil, about 0.5 ohm/sq/mil to about 60 ohms/sq/mil, about 1 ohm/sq/mil to about 5 ohms/sq/mil, about 1 ohm/sq/mil to about 10 ohms/sq/mil, about 1 ohm/sq/mil to about 20 ohms/sq/mil, about 1 ohm/sq/mil to about 30 ohms/sq/mil, about 1 ohm/sq/mil to about 40 ohms/sq/mil, about 1 ohm/sq/mil to about 50 ohms/sq/mil, about 1 ohm/sq/mil to about 60 ohms/sq/mil, about 5 ohms/sq/mil to about 10 ohms/sq/mil, about 5 ohms/sq/mil to about 20 ohms/sq/mil, about 5 ohms/sq/mil to about 30 ohms/sq/mil, about 5 ohms/sq/mil to about 40 ohms/sq/mil, about 5 ohms/sq/mil to about 50 ohms/sq/mil, about 5 ohms/sq/mil to about 60 ohms/sq/mil, about 10 ohms/sq/mil to about 20 ohms/sq/mil, about 10 ohms/sq/mil to about 30 ohms/sq/mil, about 10 ohms/sq/mil to about 40 ohms/sq/mil, about 10 ohms/sq/mil to about 50 ohms/sq/mil, about 10 ohms/sq/mil to about 60 ohms/sq/mil, about 20 ohms/sq/mil to about 30 ohms/sq/mil, about 20 ohms/sq/mil to about 40 ohms/sq/mil, about 20 ohms/sq/mil to about 50 ohms/sq/mil, about 20 ohms/sq/mil to about 60 ohms/sq/mil, about 30 ohms/sq/mil to about 40 ohms/sq/mil, about 30 ohms/sq/mil to about 50 ohms/sq/mil, about 30 ohms/sq/mil to about 60 ohms/sq/mil, about 40 ohms/sq/mil to about 50 ohms/sq/mil, about 40 ohms/sq/mil to about 60 ohms/sq/mil, or about 50 ohms/sq/mil to about 60 ohms/sq/mil. Optionally, in some embodiments, the graphene ink has a resistivity when dry of about 0.01 ohms/sq/mil, about 0.05 ohms/sq/mil, about 0.1 ohm/sq/mil, about 0.5 ohm/sq/mil, about 1 ohm/sq/mil, about 5 ohms/sq/mil, about 10 ohms/sq/mil, about 20 ohms/sq/mil, about 30 ohms/sq/mil, about 40 ohms/sq/mil, about 50 ohms/sq/mil, or about 60 ohms/sq/mil. Optionally, in some embodiments, the graphene ink has a resistivity when dry of at least about 0.01 ohm/sq/mil, about 0.05 ohm/sq/mil, about 0.1 ohm/sq/mil, about 0.5 ohm/sq/mil, about 1 ohm/sq/mil, about 5 ohm/sq/mil, about 10 ohms/sq/mil, about 20 ohms/sq/mil, about 30 ohms/sq/mil, about 40 ohms/sq/mil, about 50 ohms/sq/mil, or about 60 ohms/sq/mil. Optionally, in some embodiments, the graphene ink has a resistivity when dry of at most about 0.01 ohm/sq/mil, about 0.05 ohm/sq/mil, about 0.1 ohm/sq/mil, about 0.5 ohm/sq/mil, about 1 ohm/sq/mil, about 5 ohms/sq/mil, about 10 ohms/sq/mil, about 20 ohms/sq/mil, about 30 ohms/sq/mil, about 40 ohms/sq/mil, about 50 ohms/sq/mil, or about 60 ohms/sq/mil.

Another aspect provided herein is a graphene film comprising a substrate and a conductive graphene ink. Optionally, in some embodiments, the conductive graphene ink comprises: a binder solution comprising: a binder and a first solvent; an RGO dispersion comprising RGO, and a second solvent; a third solvent; a conductive additive; a surfactant; and a defoamer.

Optionally, in some embodiments, the substrate comprises metal, wood, glass, paper, organic material, cloths, plastics, fiberglass, carbon cloth, carbon fiber, silicon, or any combination thereof.

Optionally, in some embodiments, at least one of the first solvent, the second solvent, and the third solvent comprises water and an organic solvent. Optionally, in some embodiments, the organic solvent comprises ethanol, isopropyl alcohol, N-methyl-2-pyrrolidone, cyclohexanone, terpineol, 3-methoxy-3-methyl-1-butanol, 4-hydroxyl-4-methyl-pentan-2-one, methyl isobutyl ketone, or any combination thereof. Optionally, in some embodiments, at least one of the first solvent, the second solvent, and the third solvent comprises water, ethanol, isopropyl alcohol, N-methyl-2-pyrrolidone, cyclohexanone, terpineol, 3-methoxy-3-methyl-1-butanol, 4-hydroxyl-4-methyl-pentan-2-one, methyl isobutyl ketone, or any combination thereof.

Optionally, in some embodiments, a percentage by mass of at least one of the first solvent, the second solvent, and the third solvent in the conductive graphene ink is about 1% to about 99%. Optionally, in some embodiments, a percentage by mass of at least one of the first solvent, the second solvent, and the third solvent in the conductive graphene ink is at least about 1%. Optionally, in some embodiments, a percentage by mass of at least one of the first solvent, the second solvent, and the third solvent in the conductive graphene ink is at most about 99%. Optionally, in some embodiments, a percentage by mass of at least one of the first solvent, the second solvent, and the third solvent in the conductive graphene ink is about 1% to about 2%, about 1% to about 5%, about 1% to about 10%, about 1% to about 20%, about 1% to about 30%, about 1% to about 40%, about 1% to about 50%, about 1% to about 60%, about 1% to about 70%, about 1% to about 80%, about 1% to about 99%, about 2% to about 5%, about 2% to about 10%, about 2% to about 20%, about 2% to about 30%, about 2% to about 40%, about 2% to about 50%, about 2% to about 60%, about 2% to about 70%, about 2% to about 80%, about 2% to about 99%, about 5% to about 10%, about 5% to about 20%, about 5% to about 30%, about 5% to about 40%, about 5% to about 50%, about 5% to about 60%, about 5% to about 70%, about 5% to about 80%, about 5% to about 99%, about 10% to about 20%, about 10% to about 30%, about 10% to about 40%, about 10% to about 50%, about 10% to about 60%, about 10% to about 70%, about 10% to about 80%, about 10% to about 99%, about 20% to about 30%, about 20% to about 40%, about 20% to about 50%, about 20% to about 60%, about 20% to about 70%, about 20% to about 80%, about 20% to about 99%, about 30% to about 40%, about 30% to about 50%, about 30% to about 60%, about 30% to about 70%, about 30% to about 80%, about 30% to about 99%, about 40% to about 50%, about 40% to about 60%, about 40% to about 70%, about 40% to about 80%, about 40% to about 99%, about 50% to about 60%, about 50% to about 70%, about 50% to about 80%, about 50% to about 99%, about 60% to about 70%, about 60% to about 80%, about 60% to about 99%, about 70% to about 80%, about 70% to about 99%, or about 80% to about 99%. Optionally, in some embodiments, a percentage by mass of at least one of the first solvent, the second solvent, and the third solvent in the conductive graphene ink is about 1%, about 2%, about 5%, about 10%, about 20%, about 30%, about 40%, about 50%, about 60%, about 70%, about 80%, or about 99%. Optionally, in some embodiments, a percentage by mass of at least one of the first solvent, the second solvent, and the third solvent in the conductive graphene ink is at least about 1%, about 2%, about 5%, about 10%, about 20%, about 30%, about 40%, about 50%, about 60%, about 70%, or about 80%. Optionally, in some embodiments, a percentage by mass of at least one of the first solvent, the second solvent, and the third solvent in the conductive graphene ink is at most about 2%, about 5%, about 10%, about 20%, about 30%, about 40%, about 50%, about 60%, about 70%, about 80%, or about 99%.

Optionally, in some embodiments, the binder solution comprises a binder and a first solvent. Optionally, in some embodiments, the binder comprises a polymer. Optionally, in some embodiments, the polymer comprises a synthetic polymer. Optionally, in some embodiments, the synthetic polymer comprises carboxymethyl cellulose, polyvinylidene fluoride, poly(vinyl alcohol), poly(vinyl pyrrolidone), poly (ethylene oxide), ethyl cellulose, or any combination thereof. Optionally, in some embodiments, the binder is a dispersant.

Optionally, in some embodiments, the second solvent comprises water and an organic solvent. Optionally, in some embodiments, the organic solvent comprises ethanol, isopropyl alcohol, N-methyl-2-pyrrolidone, cyclohexanone, terpineol, 3-methoxy-3-methyl-1-butanol, 4-hydroxyl-4-methyl-pentan-2-one, methyl isobutyl ketone, or any combination thereof.

Optionally, in some embodiments, a percentage by mass of the binder solution in the conductive graphene ink is about 0.5% to about 99%. Optionally, in some embodiments, a percentage by mass of the binder solution in the conductive graphene ink is at least about 0.5%. Optionally, in some embodiments, a percentage by mass of the binder solution in the conductive graphene ink is at most about 99%. Optionally, in some embodiments, a percentage by mass of the binder solution in the conductive graphene ink is about 0.5% to about 1%, about 0.5% to about 2%, about 0.5% to about 5%, about 0.5% to about 10%, about 0.5% to about 20%, about 0.5% to about 30%, about 0.5% to about 40%, about 0.5% to about 50%, about 0.5% to about 70%, about 0.5% to about 90%, about 0.5% to about 99%, about 1% to about 2%, about 1% to about 5%, about 1% to about 10%, about 1% to about 20%, about 1% to about 30%, about 1% to about 40%, about 1% to about 50%, about 1% to about 70%, about 1% to about 90%, about 1% to about 99%, about 2% to about 5%, about 2% to about 10%, about 2% to about 20%, about 2% to about 30%, about 2% to about 40%, about 2% to about 50%, about 2% to about 70%, about 2% to about 90%, about 2% to about 99%, about 5% to about 10%, about 5% to about 20%, about 5% to about 30%, about 5% to about 40%, about 5% to about 50%, about 5% to about 70%, about 5% to about 90%, about 5% to about 99%, about 10% to about 20%, about 10% to about 30%, about 10% to about 40%, about 10% to about 50%, about 10% to about 70%, about 10% to about 90%, about 10% to about 99%, about 20% to about 30%, about 20% to about 40%, about 20% to about 50%, about 20% to about 70%, about 20% to about 90%, about 20% to about 99%, about 30% to about 40%, about 30% to about 50%, about 30% to about 70%, about 30% to about 90%, about 30% to about 99%, about 40% to about 50%, about 40% to about 70%, about 40% to about 90%, about 40% to about 99%, about 50% to about 70%, about 50% to about 90%, about 50% to about 99%, about 70% to about 90%, about 70% to about 99%, or about 90% to about 99%. Optionally, in some embodiments, a percentage by mass of the binder solution in the conductive graphene ink is at most about 99%. Optionally, in some embodiments, a percentage by mass of the binder solution in the conductive graphene ink is about 0.5%, about 1%, about 2%, about 5%, about 10%, about 20%, about 30%, about 40%, about 50%, about 70%, about 90%, or about 99%. Optionally, in some embodiments, a percentage by mass of the binder solution in the conductive graphene ink is at least about 0.5%, about 1%, about 2%, about 5%, about 10%, about 20%, about 30%, about 40%, about 50%, about 60%, about 70%, about 80%, about 90%, about 95%, or about 99%. Alternatively or in combination, in some embodiments, a percentage by mass of the binder solution in the conductive graphene ink is no more than about 0.5%, about 1%, about 2%, about 5%, about 10%, about 20%, about 30%, about 40%, about 50%, about 60%, about 70%, about 80%, about 90%, about 95%, or about 99%.

Optionally, in some embodiments, a concentration of the binder solution by mass is about 0.5% to about 2%. Optionally, in some embodiments, a concentration of the binder solution by mass is at least about 0.5%. Optionally, in some embodiments, a concentration of the binder solution by mass is at most about 2%. Optionally, in some embodiments, a concentration of the binder solution by mass is about 0.5% to about 0.625%, about 0.5% to about 0.75%, about 0.5% to about 0.875%, about 0.5% to about 1%, about 0.5% to about 1.25%, about 0.5% to about 1.5%, about 0.5% to about 1.75%, about 0.5% to about 2%, about 0.625% to about 0.75%, about 0.625% to about 0.875%, about 0.625% to about 1%, about 0.625% to about 1.25%, about 0.625% to about 1.5%, about 0.625% to about 1.75%, about 0.625% to about 2%, about 0.75% to about 0.875%, about 0.75% to about 1%, about 0.75% to about 1.25%, about 0.75% to about 1.5%, about 0.75% to about 1.75%, about 0.75% to about 2%, about 0.875% to about 1%, about 0.875% to about 1.25%, about 0.875% to about 1.5%, about 0.875% to about 1.75%, about 0.875% to about 2%, about 1% to about 1.25%, about 1% to about 1.5%, about 1% to about 1.75%, about 1% to about 2%, about 1.25% to about 1.5%, about 1.25% to about 1.75%, about 1.25% to about 2%, about 1.5% to about 1.75%, about 1.5% to about 2%, or about 1.75% to about 2%. Optionally, in some embodiments, a concentration of the binder solution by mass is about 0.5%, about 0.625%, about 0.75%, about 0.875%, about 1%, about 1.25%, about 1.5%, about 1.75%, or about 2%. Optionally, in some embodiments, a concentration of the binder solution by mass is at least about 0.5%, about 0.625%, about 0.75%, about 0.875%, about 1%, about 1.25%, about 1.5%, about 1.75%, or about 2%. Optionally, in some embodiments, a concentration of the binder solution by mass is no more than about 0.5%, about 0.625%, about 0.75%, about 0.875%, about 1%, about 1.25%, about 1.5%, about 1.75%, or about 2%.

Optionally, in some embodiments, the RGO dispersion comprises RGO and a third solvent. Optionally, in some embodiments, the third solvent comprises water and an organic solvent. Optionally, in some embodiments, the organic solvent comprises ethanol, isopropyl alcohol, N-methyl-2-pyrrolidone, cyclohexanone, terpineol, 3-methoxy-3-methyl-1-butanol, 4-hydroxyl-4-methyl-pentan-2-one, methyl isobutyl ketone, or any combination thereof.

Optionally, in some embodiments, a percentage by mass of the RGO dispersion in the conductive graphene ink is about 0.25% to about 1%. Optionally, in some embodiments, a percentage by mass of the RGO dispersion in the conductive graphene ink is at least about 0.25%. Optionally, in some embodiments, a percentage by mass of the RGO dispersion in the conductive graphene ink is at most about 1%. Optionally, in some embodiments, a percentage by mass of the RGO dispersion in the conductive graphene ink is about 0.25% to about 0.375%, about 0.25% to about 0.5%, about 0.25% to about 0.625%, about 0.25% to about 0.75%, about 0.25% to about 1%, about 0.375% to about 0.5%, about 0.375% to about 0.625%, about 0.375% to about 0.75%, about 0.375% to about 1%, about 0.5% to about 0.625%, about 0.5% to about 0.75%, about 0.5% to about 1%, about 0.625% to about 0.75%, about 0.625% to about 1%, or about 0.75% to about 1%. Optionally, in some embodiments, a percentage by mass of the RGO dispersion in the conductive graphene ink is about 0.25%, about 0.375%, about 0.5%, about 0.625%, about 0.75%, or about 1%. Optionally, in some embodiments, a percentage by mass of the RGO dispersion in the conductive graphene ink is at least about 0.25%, about 0.375%, about 0.5%, about 0.625%, about 0.75%, or about 1%. Optionally, in some embodiments, a percentage by mass of the RGO dispersion in the conductive graphene ink is no more than about 0.25%, about 0.375%, about 0.5%, about 0.625%, about 0.75%, or about 1%.

Optionally, in some embodiments, a concentration by mass of the RGO in the RGO dispersion is about 3% to about 12%. Optionally, in some embodiments, a concentration by mass of the RGO in the RGO dispersion is at least about 3%. Optionally, in some embodiments, a concentration by mass of the RGO in the RGO dispersion is at most about 12%. Optionally, in some embodiments, a concentration by mass of the RGO in the RGO dispersion is about 3% to about 4%, about 3% to about 5%, about 3% to about 6%, about 3% to about 7%, about 3% to about 8%, about 3% to about 9%, about 3% to about 10%, about 3% to about 11%, about 3% to about 12%, about 4% to about 5%, about 4% to about 6%, about 4% to about 7%, about 4% to about 8%, about 4% to about 9%, about 4% to about 10%, about 4% to about 11%, about 4% to about 12%, about 5% to about 6%, about 5% to about 7%, about 5% to about 8%, about 5% to about 9%, about 5% to about 10%, about 5% to about 11%, about 5% to about 12%, about 6% to about 7%, about 6% to about 8%, about 6% to about 9%, about 6% to about 10%, about 6% to about 11%, about 6% to about 12%, about 7% to about 8%, about 7% to about 9%, about 7% to about 10%, about 7% to about 11%, about 7% to about 12%, about 8% to about 9%, about 8% to about 10%, about 8% to about 11%, about 8% to about 12%, about 9% to about 10%, about 9% to about 11%, about 9% to about 12%, about 10% to about 11%, about 10% to about 12%, or about 11% to about 12%. Optionally, in some embodiments, a concentration by mass of the RGO in the RGO dispersion is about 3%, about 4%, about 5%, about 6%, about 7%, about 8%, about 9%, about 10%, about 11%, or about 12%. Optionally, in some embodiments, a concentration by mass of the RGO in the RGO dispersion is at least about 3%, about 4%, about 5%, about 6%, about 7%, about 8%, about 9%, about 10%, about 11%, or about 12%. Optionally, in some embodiments, a concentration by mass of the RGO in the RGO dispersion is no more than about 3%, about 4%, about 5%, about 6%, about 7%, about 8%, about 9%, about 10%, about 11%, or about 12%.

Optionally, in some embodiments, a percentage by mass of the RGO in the conductive graphene ink is about 0.1% to about 99%. Optionally, in some embodiments, a percentage by mass of the RGO in the conductive graphene ink is at least about 0.1%. Optionally, in some embodiments, a percentage by mass of the RGO in the conductive graphene ink is at most about 99%. Optionally, in some embodiments, a percentage by mass of the RGO in the conductive graphene ink is about 0.1% to about 0.2%, about 0.1% to about 0.5%, about 0.1% to about 1%, about 0.1% to about 10%, about 0.1% to about 20%, about 0.1% to about 40%, about 0.1% to about 60%, about 0.1% to about 80%, about 0.1% to about 90%, about 0.1% to about 99%, about 0.2% to about 0.5%, about 0.2% to about 1%, about 0.2% to about 10%, about 0.2% to about 20%, about 0.2% to about 40%, about 0.2% to about 60%, about 0.2% to about 80%, about 0.2% to about 90%, about 0.2% to about 99%, about 0.5% to about 1%, about 0.5% to about 10%, about 0.5% to about 20%, about 0.5% to about 40%, about 0.5% to about 60%, about 0.5% to about 80%, about 0.5% to about 90%, about 0.5% to about 99%, about 1% to about 10%, about 1% to about 20%, about 1% to about 40%, about 1% to about 60%, about 1% to about 80%, about 1% to about 90%, about 1% to about 99%, about 10% to about 20%, about 10% to about 40%, about 10% to about 60%, about 10% to about 80%, about 10% to about 90%, about 10% to about 99%, about 20% to about 40%, about 20% to about 60%, about 20% to about 80%, about 20% to about 90%, about 20% to about 99%, about 40% to about 60%, about 40% to about 80%, about 40% to about 90%, about 40% to about 99%, about 60% to about 80%, about 60% to about 90%, about 60% to about 99%, about 80% to about 90%, about 80% to about 99%, or about 90% to about 99%. Optionally, in some embodiments, a percentage by mass of the RGO in the conductive graphene ink is about 0.1%, about 0.2%, about 0.5%, about 1%, about 10%, about 20%, about 40%, about 60%, about 80%, about 90%, or about 99%. Optionally, in some embodiments, a percentage by mass of the RGO in the conductive graphene ink is at least about 0.1%, about 0.2%, about 0.5%, about 1%, about 10%, about 20%, about 40%, about 60%, about 80%, about 90%, or about 99%. Optionally, in some embodiments, a percentage by mass of the RGO in the conductive graphene ink is no more than about 0.1%, about 0.2%, about 0.5%, about 1%, about 10%, about 20%, about 40%, about 60%, about 80%, about 90%, or about 99%.

Optionally, in some embodiments, the conductive additive comprises a carbon-based material. Optionally, in some embodiments, the carbon-based material comprises a paracrystalline carbon. Optionally, in some embodiments, the paracrystalline carbon comprises carbon black, acetylene black, channel black, furnace black, lamp black, thermal black, or any combination thereof.

Optionally, in some embodiments, the conductive additive comprises silver. Optionally, in some embodiments, the silver comprises silver nanoparticles, silver nanorods, silver nanowires, silver nanoflowers, silver nanofibers, silver nanoplatelets, silver nanoribbons, silver nanocubes, silver bipyramids, or any combination thereof.

Optionally, in some embodiments, a percentage by mass of the conductive additive in the conductive graphene ink is about 2% to about 99%. Optionally, in some embodiments, a percentage by mass of the conductive additive in the conductive graphene ink is at least about 2%. Optionally, in some embodiments, a percentage by mass of the conductive additive in the conductive graphene ink is at most about 99%. Optionally, in some embodiments, a percentage by mass of the conductive additive in the conductive graphene ink is about 2% to about 5%, about 2% to about 10%, about 2% to about 20%, about 2% to about 30%, about 2% to about 40%, about 2% to about 50%, about 2% to about 60%, about 2% to about 70%, about 2% to about 80%, about 2% to about 90%, about 2% to about 99%, about 5% to about 10%, about 5% to about 20%, about 5% to about 30%, about 5% to about 40%, about 5% to about 50%, about 5% to about 60%, about 5% to about 70%, about 5% to about 80%, about 5% to about 90%, about 5% to about 99%, about 10% to about 20%, about 10% to about 30%, about 10% to about 40%, about 10% to about 50%, about 10% to about 60%, about 10% to about 70%, about 10% to about 80%, about 10% to about 90%, about 10% to about 99%, about 20% to about 30%, about 20% to about 40%, about 20% to about 50%, about 20% to about 60%, about 20% to about 70%, about 20% to about 80%, about 20% to about 90%, about 20% to about 99%, about 30% to about 40%, about 30% to about 50%, about 30% to about 60%, about 30% to about 70%, about 30% to about 80%, about 30% to about 90%, about 30% to about 99%, about 40% to about 50%, about 40% to about 60%, about 40% to about 70%, about 40% to about 80%, about 40% to about 90%, about 40% to about 99%, about 50% to about 60%, about 50% to about 70%, about 50% to about 80%, about 50% to about 90%, about 50% to about 99%, about 60% to about 70%, about 60% to about 80%, about 60% to about 90%, about 60% to about 99%, about 70% to about 80%, about 70% to about 90%, about 70% to about 99%, about 80% to about 90%, about 80% to about 99%, or about 90% to about 99%. Optionally, in some embodiments, a percentage by mass of the conductive additive in the conductive graphene ink is about 2%, about 5%, about 10%, about 20%, about 30%, about 40%, about 50%, about 60%, about 70%, about 80%, about 90%, or about 99%. Optionally, in some embodiments, a percentage by mass of the conductive additive in the conductive graphene ink is at least about 2%, about 5%, about 10%, about 20%, about 30%, about 40%, about 50%, about 60%, about 70%, about 80%, about 90%, or about 99%. Optionally, in some embodiments, a percentage by mass of the conductive additive in the conductive graphene ink is no more than about 2%, about 5%, about 10%, about 20%, about 30%, about 40%, about 50%, about 60%, about 70%, about 80%, about 90%, or about 99%.

Some embodiments further comprise a surfactant. Optionally, in some embodiments, the surfactant comprises an acid, a nonionic surfactant, or any combination thereof. Optionally, in some embodiments, the acid comprises perfluorooctanoic acid, perfluorooctane sulfonate, perfluorohexane sulfonic acid, perfluorononanoic acid, perfluorodecanoic acid, or any combination thereof. Optionally, in some embodiments, the nonionic surfactant comprises a polyethylene glycol alkyl ether, a octaethylene glycol monododecyl ether, a pentaethylene glycol monododecyl ether, a polypropylene glycol alkyl ether, a glucoside alkyl ether, decyl glucoside, lauryl glucoside, octyl glucoside, a polyethylene glycol octylphenyl ether, dodecyldimethylamine oxide, a polyethylene glycol alkylphenyl ether, a polyethylene glycol octylphenyl ether, Triton X-100, polyethylene glycol alkylphenyl ether, nonoxynol-9, a glycerol alkyl ester polysorbate, sorbitan alkyl ester, polyethoxylated tallow amine, Dynol 604, or any combination thereof.

Optionally, in some embodiments, a percentage by mass of the surfactant in the conductive graphene ink is about 0.5% to about 10%. Optionally, in some embodiments, a percentage by mass of the surfactant in the conductive graphene ink is at least about 0.5%. Optionally, in some embodiments, a percentage by mass of the surfactant in the conductive graphene ink is at most about 10%. Optionally, in some embodiments, a percentage by mass of the surfactant in the conductive graphene ink is about 0.5% to about 1%, about 0.5% to about 2%, about 0.5% to about 3%, about 0.5% to about 4%, about 0.5% to about 5%, about 0.5% to about 6%, about 0.5% to about 7%, about 0.5% to about 8%, about 0.5% to about 9%, about 0.5% to about 10%, about 1% to about 2%, about 1% to about 3%, about 1% to about 4%, about 1% to about 5%, about 1% to about 6%, about 1% to about 7%, about 1% to about 8%, about 1% to about 9%, about 1% to about 10%, about 2% to about 3%, about 2% to about 4%, about 2% to about 5%, about 2% to about 6%, about 2% to about 7%, about 2% to about 8%, about 2% to about 9%, about 2% to about 10%, about 3% to about 4%, about 3% to about 5%, about 3% to about 6%, about 3% to about 7%, about 3% to about 8%, about 3% to about 9%, about 3% to about 10%, about 4% to about 5%, about 4% to about 6%, about 4% to about 7%, about 4% to about 8%, about 4% to about 9%, about 4% to about 10%, about 5% to about 6%, about 5% to about 7%, about 5% to about 8%, about 5% to about 9%, about 5% to about 10%, about 6% to about 7%, about 6% to about 8%, about 6% to about 9%, about 6% to about 10%, about 7% to about 8%, about 7% to about 9%, about 7% to about 10%, about 8% to about 9%, about 8% to about 10%, or about 9% to about 10%. Optionally, in some embodiments, a percentage by mass of the surfactant in the conductive graphene ink is about 0.5%, about 1%, about 2%, about 3%, about 4%, about 5%, about 6%, about 7%, about 8%, about 9%, or about 10%. Optionally, in some embodiments, a percentage by mass of the surfactant in the conductive graphene ink is at least about 0.5%, about 1%, about 2%, about 3%, about 4%, about 5%, about 6%, about 7%, about 8%, about 9%, or about 10%. Optionally, in some embodiments, a percentage by mass of the surfactant in the conductive graphene ink is no more than about 0.5%, about 1%, about 2%, about 3%, about 4%, about 5%, about 6%, about 7%, about 8%, about 9%, or about 10%.

Some embodiments further comprise a defoamer, wherein the defoamer comprises an insoluble oil, a silicone, a glycol, a stearate, an organic solvent, Surfynol DF-1100, alkyl polyacrylate, or any combination thereof. Optionally, in some embodiments, the insoluble oil comprises mineral oil, vegetable oil, white oil, or any combination thereof. Optionally, in some embodiments, the silicone comprises polydimethylsiloxane, silicone glycol, a fluorosilicone, or any combination thereof. Optionally, in some embodiments, the glycol comprises polyethylene glycol, ethylene glycol, propylene glycol, or any combination thereof. Optionally, in some embodiments, the stearate comprises glycol stearate, stearin, or any combination thereof. Optionally, in some embodiments, the organic solvent comprises ethanol, isopropyl alcohol, N-methyl-2-pyrrolidone, cyclohexanone, terpineol, 3-methoxy-3-methyl-1-butanol, 4-hydroxyl-4-methyl-pentan-2-one, methyl isobutyl ketone, or any combination thereof.

Optionally, in some embodiments, a percentage by mass of the defoamer in the conductive graphene ink is about 0.5% to about 10%. Optionally, in some embodiments, a percentage by mass of the defoamer in the conductive graphene ink is at least about 0.5%. Optionally, in some embodiments, a percentage by mass of the defoamer in the conductive graphene ink is at most about 10%. Optionally, in some embodiments, a percentage by mass of the defoamer in the conductive graphene ink is about 0.5% to about 1%, about 0.5% to about 2%, about 0.5% to about 3%, about 0.5% to about 4%, about 0.5% to about 5%, about 0.5% to about 6%, about 0.5% to about 7%, about 0.5% to about 8%, about 0.5% to about 9%, about 0.5% to about 10%, about 1% to about 2%, about 1% to about 3%, about 1% to about 4%, about 1% to about 5%, about 1% to about 6%, about 1% to about 7%, about 1% to about 8%, about 1% to about 9%, about 1% to about 10%, about 2% to about 3%, about 2% to about 4%, about 2% to about 5%, about 2% to about 6%, about 2% to about 7%, about 2% to about 8%, about 2% to about 9%, about 2% to about 10%, about 3% to about 4%, about 3% to about 5%, about 3% to about 6%, about 3% to about 7%, about 3% to about 8%, about 3% to about 9%, about 3% to about 10%, about 4% to about 5%, about 4% to about 6%, about 4% to about 7%, about 4% to about 8%, about 4% to about 9%, about 4% to about 10%, about 5% to about 6%, about 5% to about 7%, about 5% to about 8%, about 5% to about 9%, about 5% to about 10%, about 6% to about 7%, about 6% to about 8%, about 6% to about 9%, about 6% to about 10%, about 7% to about 8%, about 7% to about 9%, about 7% to about 10%, about 8% to about 9%, about 8% to about 10%, or about 9% to about 10%. Optionally, in some embodiments, a percentage by mass of the defoamer in the conductive graphene ink is about 0.5%, about 1%, about 2%, about 3%, about 4%, about 5%, about 6%, about 7%, about 8%, about 9%, or about 10%. Optionally, in some embodiments, a percentage by mass of the defoamer in the conductive graphene ink is at least about 0.5%, about 1%, about 2%, about 3%, about 4%, about 5%, about 6%, about 7%, about 8%, about 9%, or about 10%. Optionally, in some embodiments, a percentage by mass of the defoamer in the conductive graphene ink is no more than about 0.5%, about 1%, about 2%, about 3%, about 4%, about 5%, about 6%, about 7%, about 8%, about 9%, or about 10%.

Optionally, in some embodiments, the solid matter content by mass of the conductive graphene ink is about 2.5% to about 10.5%. Optionally, in some embodiments, the solid matter content by mass of the conductive graphene ink is at least about 2.5%. Optionally, in some embodiments, the solid matter content by mass of the conductive graphene ink is at most about 10.5%. Optionally, in some embodiments, the solid matter content by mass of the conductive graphene ink is about 2.5% to about 3.5%, about 2.5% to about 4.5%, about 2.5% to about 5.5%, about 2.5% to about 6.5%, about 2.5% to about 7.5%, about 2.5% to about 8.5%, about 2.5% to about 9.5%, about 2.5% to about 10.5%, about 3.5% to about 4.5%, about 3.5% to about 5.5%, about 3.5% to about 6.5%, about 3.5% to about 7.5%, about 3.5% to about 8.5%, about 3.5% to about 9.5%, about 3.5% to about 10.5%, about 4.5% to about 5.5%, about 4.5% to about 6.5%, about 4.5% to about 7.5%, about 4.5% to about 8.5%, about 4.5% to about 9.5%, about 4.5% to about 10.5%, about 5.5% to about 6.5%, about 5.5% to about 7.5%, about 5.5% to about 8.5%, about 5.5% to about 9.5%, about 5.5% to about 10.5%, about 6.5% to about 7.5%, about 6.5% to about 8.5%, about 6.5% to about 9.5%, about 6.5% to about 10.5%, about 7.5% to about 8.5%, about 7.5% to about 9.5%, about 7.5% to about 10.5%, about 8.5% to about 9.5%, about 8.5% to about 10.5%, or about 9.5% to about 10.5%. Optionally, in some embodiments, the solid matter content by mass of the conductive graphene ink is about 2.5%, about 3.5%, about 4.5%, about 5.5%, about 6.5%, about 7.5%, about 8.5%, about 9.5%, or about 10.5%. Optionally, in some embodiments, the solid matter content by mass of the conductive graphene ink is at least about 2.5%, about 3.5%, about 4.5%, about 5.5%, about 6.5%, about 7.5%, about 8.5%, about 9.5%, or about 10.5%. Optionally, in some embodiments, the solid matter content by mass of the conductive graphene ink is no more than about 2.5%, about 3.5%, about 4.5%, about 5.5%, about 6.5%, about 7.5%, about 8.5%, about 9.5%, or about 10.5%.

Optionally, in some embodiments, the viscosity of the conductive graphene ink is about 10 centipoise to about 10,000 centipoise. Optionally, in some embodiments, the viscosity of the conductive graphene ink is at least about 10 centipoise. Optionally, in some embodiments, the viscosity of the conductive graphene ink is at most about 10,000 centipoise. Optionally, in some embodiments, the viscosity of the conductive graphene ink is about 10 centipoise to about 20 centipoise, about 10 centipoise to about 50 centipoise, about 10 centipoise to about 100 centipoise, about 10 centipoise to about 200 centipoise, about 10 centipoise to about 500 centipoise, about 10 centipoise to about 1,000 centipoise, about 10 centipoise to about 2,000 centipoise, about 10 centipoise to about 5,000 centipoise, about 10 centipoise to about 10,000 centipoise, about 20 centipoise to about 50 centipoise, about 20 centipoise to about 100 centipoise, about 20 centipoise to about 200 centipoise, about 20 centipoise to about 500 centipoise, about 20 centipoise to about 1,000 centipoise, about 20 centipoise to about 2,000 centipoise, about 20 centipoise to about 5,000 centipoise, about 20 centipoise to about 10,000 centipoise, about 50 centipoise to about 100 centipoise, about 50 centipoise to about 200 centipoise, about 50 centipoise to about 500 centipoise, about 50 centipoise to about 1,000 centipoise, about 50 centipoise to about 2,000 centipoise, about 50 centipoise to about 5,000 centipoise, about 50 centipoise to about 10,000 centipoise, about 100 centipoise to about 200 centipoise, about 100 centipoise to about 500 centipoise, about 100 centipoise to about 1,000 centipoise, about 100 centipoise to about 2,000 centipoise, about 100 centipoise to about 5,000 centipoise, about 100 centipoise to about 10,000 centipoise, about 200 centipoise to about 500 centipoise, about 200 centipoise to about 1,000 centipoise, about 200 centipoise to about 2,000 centipoise, about 200 centipoise to about 5,000 centipoise, about 200 centipoise to about 10,000 centipoise, about 500 centipoise to about 1,000 centipoise, about 500 centipoise to about 2,000 centipoise, about 500 centipoise to about 5,000 centipoise, about 500 centipoise to about 10,000 centipoise, about 1,000 centipoise to about 2,000 centipoise, about 1,000 centipoise to about 5,000 centipoise, about 1,000 centipoise to about 10,000 centipoise, about 2,000 centipoise to about 5,000 centipoise, about 2,000 centipoise to about 10,000 centipoise, or about 5,000 centipoise to about 10,000 centipoise. Optionally, in some embodiments, the viscosity of the conductive graphene ink is about 10 centipoise, about 20 centipoise, about 50 centipoise, about 100 centipoise, about 200 centipoise, about 500 centipoise, about 1,000 centipoise, about 2,000 centipoise, about 5,000 centipoise, or about 10,000 centipoise. Optionally, in some embodiments, the viscosity of the conductive graphene ink is at least about 10 centipoise, about 20 centipoise, about 50 centipoise, about 100 centipoise, about 200 centipoise, about 500 centipoise, about 1,000 centipoise, about 2,000 centipoise, about 5,000 centipoise, or about 10,000 centipoise. Optionally, in some embodiments, the viscosity of the conductive graphene ink is no more than about 10 centipoise, about 20 centipoise, about 50 centipoise, about 100 centipoise, about 200 centipoise, about 500 centipoise, about 1,000 centipoise, about 2,000 centipoise, about 5,000 centipoise, or about 10,000 centipoise.

Optionally, in some embodiments, the conductive graphene ink has a viscosity of about 2,300 centipoise to about 2,400 centipoise. Optionally, in some embodiments, the conductive graphene ink has a viscosity of at least about 2,300 centipoise. Optionally, in some embodiments, the conductive graphene ink has a viscosity of at most about 2,400 centipoise. Optionally, in some embodiments, the conductive graphene ink has a viscosity of about 2,300 centipoise to about 2,310 centipoise, about 2,300 centipoise to about 2,320 centipoise, about 2,300 centipoise to about 2,330 centipoise, about 2,300 centipoise to about 2,340 centipoise, about 2,300 centipoise to about 2,350 centipoise, about 2,300 centipoise to about 2,360 centipoise, about 2,300 centipoise to about 2,370 centipoise, about 2,300 centipoise to about 2,380 centipoise, about 2,300 centipoise to about 2,390 centipoise, about 2,300 centipoise to about 2,400 centipoise, about 2,310 centipoise to about 2,320 centipoise, about 2,310 centipoise to about 2,330 centipoise, about 2,310 centipoise to about 2,340 centipoise, about 2,310 centipoise to about 2,350 centipoise, about 2,310 centipoise to about 2,360 centipoise, about 2,310 centipoise to about 2,370 centipoise, about 2,310 centipoise to about 2,380 centipoise, about 2,310 centipoise to about 2,390 centipoise, about 2,310 centipoise to about 2,400 centipoise, about 2,320 centipoise to about 2,330 centipoise, about 2,320 centipoise to about 2,340 centipoise, about 2,320 centipoise to about 2,350 centipoise, about 2,320 centipoise to about 2,360 centipoise, about 2,320 centipoise to about 2,370 centipoise, about 2,320 centipoise to about 2,380 centipoise, about 2,320 centipoise to about 2,390 centipoise, about 2,320 centipoise to about 2,400 centipoise, about 2,330 centipoise to about 2,340 centipoise, about 2,330 centipoise to about 2,350 centipoise, about 2,330 centipoise to about 2,360 centipoise, about 2,330 centipoise to about 2,370 centipoise, about 2,330 centipoise to about 2,380 centipoise, about 2,330 centipoise to about 2,390 centipoise, about 2,330 centipoise to about 2,400 centipoise, about 2,340 centipoise to about 2,350 centipoise, about 2,340 centipoise to about 2,360 centipoise, about 2,340 centipoise to about 2,370 centipoise, about 2,340 centipoise to about 2,380 centipoise, about 2,340 centipoise to about 2,390 centipoise, about 2,340 centipoise to about 2,400 centipoise, about 2,350 centipoise to about 2,360 centipoise, about 2,350 centipoise to about 2,370 centipoise, about 2,350 centipoise to about 2,380 centipoise, about 2,350 centipoise to about 2,390 centipoise, about 2,350 centipoise to about 2,400 centipoise, about 2,360 centipoise to about 2,370 centipoise, about 2,360 centipoise to about 2,380 centipoise, about 2,360 centipoise to about 2,390 centipoise, about 2,360 centipoise to about 2,400 centipoise, about 2,370 centipoise to about 2,380 centipoise, about 2,370 centipoise to about 2,390 centipoise, about 2,370 centipoise to about 2,400 centipoise, about 2,380 centipoise to about 2,390 centipoise, about 2,380 centipoise to about 2,400 centipoise, or about 2,390 centipoise to about 2,400 centipoise. Optionally, in some embodiments, the conductive graphene ink has a viscosity of about 2,300 centipoise, about 2,310 centipoise, about 2,320 centipoise, about 2,330 centipoise, about 2,340 centipoise, about 2,350 centipoise, about 2,360 centipoise, about 2,370 centipoise, about 2,380 centipoise, about 2,390 centipoise, or about 2,400 centipoise.

Optionally, in some embodiments, the density of the conductive graphene ink at a temperature of about 20° C. is about 2.5 g/cm$^3$ to about 10.5 g/cm$^3$. Optionally, in some embodiments, the density of the conductive graphene ink at a temperature of about 20° C. is at least about 2.5 g/cm$^3$. Optionally, in some embodiments, the density of the conductive graphene ink at a temperature of about 20° C. is at most about 10.5 g/cm$^3$. Optionally, in some embodiments, the density of the conductive graphene ink at a temperature of about 20° C. is about 2.5 g/cm$^3$ to about 3.5 g/cm$^3$, about 2.5 g/cm$^3$ to about 4.5 g/cm$^3$, about 2.5 g/cm$^3$ to about 5.5 g/cm$^3$, about 2.5 g/cm$^3$ to about 6.5 g/cm$^3$, about 2.5 g/cm$^3$ to about 7.5 g/cm$^3$, about 2.5 g/cm$^3$ to about 8.5 g/cm$^3$, about 2.5 g/cm$^3$ to about 9.5 g/cm$^3$, about 2.5 g/cm$^3$ to about 10.5 g/cm$^3$, about 3.5 g/cm$^3$ to about 4.5 g/cm$^3$, about 3.5 g/cm$^3$ to about 5.5 g/cm$^3$, about 3.5 g/cm$^3$ to about 6.5 g/cm$^3$, about 3.5 g/cm$^3$ to about 7.5 g/cm$^3$, about 3.5 g/cm$^3$ to about 8.5 g/cm$^3$, about 3.5 g/cm$^3$ to about 9.5 g/cm$^3$, about 3.5 g/cm$^3$ to about 10.5 g/cm$^3$, about 4.5 g/cm$^3$ to about 5.5 g/cm$^3$, about 4.5 g/cm$^3$ to about 6.5 g/cm$^3$, about 4.5 g/cm$^3$ to about 7.5 g/cm$^3$, about 4.5 g/cm$^3$ to about 8.5 g/cm$^3$, about 4.5 g/cm$^3$ to about 9.5 g/cm$^3$, about 4.5 g/cm$^3$ to about 10.5 g/cm$^3$, about 5.5 g/cm$^3$ to about 6.5 g/cm$^3$, about 5.5 g/cm$^3$ to about 7.5 g/cm$^3$, about 5.5 g/cm$^3$ to about 8.5 g/cm$^3$, about 5.5 g/cm$^3$ to about 9.5 g/cm$^3$, about 5.5 g/cm$^3$ to about 10.5 g/cm$^3$, about 6.5 g/cm$^3$ to about 7.5 g/cm$^3$, about 6.5 g/cm$^3$ to about 8.5 g/cm$^3$, about 6.5 g/cm$^3$ to about 9.5 g/cm$^3$, about 6.5 g/cm$^3$ to about 10.5 g/cm$^3$, about 7.5 g/cm$^3$ to about 8.5 g/cm$^3$, about 7.5 g/cm$^3$ to about 9.5 g/cm$^3$, about 7.5 g/cm$^3$ to about 10.5 g/cm$^3$, about 8.5 g/cm$^3$ to about 9.5 g/cm$^3$, about 8.5 g/cm$^3$ to about 10.5 g/cm$^3$, or about 9.5 g/cm$^3$ to about 10.5 g/cm$^3$. Optionally, in some embodiments, the density of the conductive graphene ink at a temperature of about 20° C. is at most about 10.5 g/cm$^3$. Optionally, in some embodiments, the density of the conductive graphene ink at a temperature of about 20° C. is about 2.5 g/cm$^3$, about 3.5 g/cm$^3$, about 4.5 g/cm$^3$, about 5.5 g/cm$^3$, about 6.5 g/cm$^3$, about 7.5 g/cm$^3$, about 8.5 g/cm$^3$, about 9.5 g/cm$^3$, or about 10.5 g/cm$^3$. Optionally, in some embodiments, the density of the conductive graphene ink at a temperature of at least about 20° C. is about 2.5 g/cm$^3$, about 3.5 g/cm$^3$, about 4.5 g/cm$^3$, about 5.5 g/cm$^3$, about 6.5 g/cm$^3$, about 7.5 g/cm$^3$, about 8.5 g/cm$^3$, about 9.5 g/cm$^3$, or about 10.5 g/cm$^3$. Optionally, in some embodiments, the density of the conductive graphene ink at a temperature of no more than about 20° C. is about 2.5 g/cm$^3$, about 3.5 g/cm$^3$, about 4.5 g/cm$^3$, about 5.5 g/cm$^3$, about 6.5 g/cm$^3$, about 7.5 g/cm$^3$, about 8.5 g/cm$^3$, about 9.5 g/cm$^3$, or about 10.5 g/cm$^3$.

Optionally, in some embodiments the conductive graphene ink has a surface area of about 40 m$^2$/g to about 2,400 m$^2$/g. Optionally, in some embodiments the conductive graphene ink has a surface area of at least about 40 m$^2$/g. Optionally, in some embodiments the conductive graphene ink has a surface area of at most about 2,400 m$^2$/g. Optionally, in some embodiments the conductive graphene ink has a surface area of about 40 m$^2$/g to about 80 m$^2$/g, about 40 m$^2$/g to about 120 m$^2$/g, about 40 m$^2$/g to about 240 m$^2$/g, about 40 m$^2$/g to about 480 m$^2$/g, about 40 m$^2$/g to about 1,000 m$^2$/g, about 40 m$^2$/g to about 1,400 m$^2$/g, about 40 m$^2$/g to about 1,800 m$^2$/g, about 40 m$^2$/g to about 2,200 m$^2$/g, about 40 m$^2$/g to about 2,400 m$^2$/g, about 80 m$^2$/g to about 120 m$^2$/g, about 80 m$^2$/g to about 240 m$^2$/g, about 80 m$^2$/g to about 480 m$^2$/g, about 80 m$^2$/g to about 1,000 m$^2$/g, about 80 m$^2$/g to about 1,400 m$^2$/g, about 80 m$^2$/g to about 1,800 m$^2$/g, about 80 m$^2$/g to about 2,200 m$^2$/g, about 80 m$^2$/g to about 2,400 m$^2$/g, about 120 m$^2$/g to about 240 m$^2$/g, about 120 m$^2$/g to about 480 m$^2$/g, about 120 m$^2$/g to about 1,000 m$^2$/g, about 120 m$^2$/g to about 1,400 m$^2$/g, about 120 m$^2$/g to about 1,800 m$^2$/g, about 120 m$^2$/g to about 2,200 m$^2$/g, about 120 m$^2$/g to about 2,400 m$^2$/g, about 240 m$^2$/g to about 480 m$^2$/g, about 240 m$^2$/g to about 1,000 m$^2$/g, about 240 m$^2$/g to about 1,400 m$^2$/g, about 240 m$^2$/g to about 1,800 m$^2$/g, about 240 m$^2$/g to about 2,200 m$^2$/g, about 240 m$^2$/g to about 2,400 m$^2$/g, about 480 m$^2$/g to about 1,000 m$^2$/g, about 480 m$^2$/g to about 1,400 m$^2$/g, about 480 m$^2$/g to about 1,800 m$^2$/g, about 480 m$^2$/g to about 2,200 m$^2$/g, about 480 m$^2$/g to about 2,400 m$^2$/g, about 1,000 m$^2$/g to about 1,400 m$^2$/g, about 1,000 m$^2$/g to about 1,800 m$^2$/g, about 1,000 m$^2$/g to about 2,200 m$^2$/g, about 1,000 m$^2$/g to about 2,400 m$^2$/g, about 1,400 m$^2$/g to about 1,800 m$^2$/g, about 1,400 m$^2$/g to about 2,200 m$^2$/g, about 1,400 m$^2$/g to about 2,400 m$^2$/g, about 1,800 m$^2$/g to about 2,200 m$^2$/g, about 1,800 m$^2$/g to about 2,400 m$^2$/g, or about 2,200 m$^2$/g to about 2,400 m$^2$/g. Optionally, in some embodiments the conductive graphene ink has a surface area of about 40 m$^2$/g, about 80 m$^2$/g, about 120 m$^2$/g, about 240 m$^2$/g, about 480 m$^2$/g, about 1,000 m$^2$/g, about 1,400 m$^2$/g, about 1,800 m$^2$/g, about 2,200 m$^2$/g, or about 2,400 m$^2$/g. Optionally, in some embodiments the conductive graphene ink has a surface area of at least about 40 m$^2$/g, about 80 m$^2$/g, about 120 m$^2$/g, about 240 m$^2$/g, about 480 m$^2$/g, about 1,000 m$^2$/g, about 1,400 m$^2$/g, about 1,800 m$^2$/g, about 2,200 m$^2$/g, or about 2,400 m$^2$/g. Optionally, in some embodiments the conductive graphene ink has a surface area of no more than about 40 m$^2$/g, about 80 m$^2$/g, about 120 m$^2$/g, about 240 m$^2$/g, about 480 m$^2$/g, about 1,000 m$^2$/g, about 1,400 m$^2$/g, about 1,800 m$^2$/g, about 2,200 m$^2$/g, or about 2,400 m$^2$/g.

Optionally, in some embodiments the conductive graphene ink has a conductivity of about 400 S/m to about 1,600 S/m. Optionally, in some embodiments the conductive graphene ink has a conductivity of at least about 400 S/m. Optionally, in some embodiments the conductive graphene ink has a conductivity of at most about 1,600 S/m. Optionally, in some embodiments the conductive graphene ink has a conductivity of about 400 S/m to about 500 S/m, about 400 S/m to about 600 S/m, about 400 S/m to about 700 S/m, about 400 S/m to about 800 S/m, about 400 S/m to about 900 S/m, about 400 S/m to about 1,000 S/m, about 400 S/m to about 1,200 S/m, about 400 S/m to about 1,400 S/m, about 400 S/m to about 1,600 S/m, about 500 S/m to about 600 S/m, about 500 S/m to about 700 S/m, about 500 S/m to about 800 S/m, about 500 S/m to about 900 S/m, about 500

S/m to about 1,000 S/m, about 500 S/m to about 1,200 S/m, about 500 S/m to about 1,400 S/m, about 500 S/m to about 1,600 S/m, about 600 S/m to about 700 S/m, about 600 S/m to about 800 S/m, about 600 S/m to about 900 S/m, about 600 S/m to about 1,000 S/m, about 600 S/m to about 1,200 S/m, about 600 S/m to about 1,400 S/m, about 600 S/m to about 1,600 S/m, about 700 S/m to about 800 S/m, about 700 S/m to about 900 S/m, about 700 S/m to about 1,000 S/m, about 700 S/m to about 1,200 S/m, about 700 S/m to about 1,400 S/m, about 700 S/m to about 1,600 S/m, about 800 S/m to about 900 S/m, about 800 S/m to about 1,000 S/m, about 800 S/m to about 1,200 S/m, about 800 S/m to about 1,400 S/m, about 800 S/m to about 1,600 S/m, about 900 S/m to about 1,000 S/m, about 900 S/m to about 1,200 S/m, about 900 S/m to about 1,400 S/m, about 900 S/m to about 1,600 S/m, about 1,000 S/m to about 1,200 S/m, about 1,000 S/m to about 1,400 S/m, about 1,000 S/m to about 1,600 S/m, about 1,200 S/m to about 1,400 S/m, about 1,200 S/m to about 1,600 S/m, or about 1,400 S/m to about 1,600 S/m. Optionally, in some embodiments the conductive graphene ink has a conductivity of about 400 S/m, about 500 S/m, about 600 S/m, about 700 S/m, about 800 S/m, about 900 S/m, about 1,000 S/m, about 1,200 S/m, about 1,400 S/m, or about 1,600 S/m. Optionally, in some embodiments the conductive graphene ink has a conductivity of at least about 400 S/m, about 500 S/m, about 600 S/m, about 700 S/m, about 800 S/m, about 900 S/m, about 1,000 S/m, about 1,200 S/m, about 1,400 S/m, or about 1,600 S/m. Optionally, in some embodiments the conductive graphene ink has a conductivity of no more than about 400 S/m, about 500 S/m, about 600 S/m, about 700 S/m, about 800 S/m, about 900 S/m, about 1,000 S/m, about 1,200 S/m, about 1,400 S/m, or about 1,600 S/m.

Optionally, in some embodiments the conductive graphene ink has a C:O mass ratio of about 2:1 to about 40:1. Optionally, in some embodiments the conductive graphene ink has a C:O mass ratio of at least about 2:1. Optionally, in some embodiments the conductive graphene ink has a C:O mass ratio of at most about 40:1. Optionally, in some embodiments the conductive graphene ink has a C:O mass ratio of about 2:1 to about 4:1, about 2:1 to about 6:1, about 2:1 to about 8:1, about 2:1 to about 10:1, about 2:1 to about 15:1, about 2:1 to about 20:1, about 2:1 to about 25:1, about 2:1 to about 30:1, about 2:1 to about 34:1, about 2:1 to about 40:1, about 4:1 to about 6:1, about 4:1 to about 8:1, about 4:1 to about 10:1, about 4:1 to about 15:1, about 4:1 to about 20:1, about 4:1 to about 25:1, about 4:1 to about 30:1, about 4:1 to about 34:1, about 4:1 to about 40:1, about 6:1 to about 8:1, about 6:1 to about 10:1, about 6:1 to about 15:1, about 6:1 to about 20:1, about 6:1 to about 25:1, about 6:1 to about 30:1, about 6:1 to about 34:1, about 6:1 to about 40:1, about 8:1 to about 10:1, about 8:1 to about 15:1, about 8:1 to about 20:1, about 8:1 to about 25:1, about 8:1 to about 30:1, about 8:1 to about 34:1, about 8:1 to about 40:1, about 10:1 to about 15:1, about 10:1 to about 20:1, about 10:1 to about 25:1, about 10:1 to about 30:1, about 10:1 to about 34:1, about 10:1 to about 40:1, about 15:1 to about 20:1, about 15:1 to about 25:1, about 15:1 to about 30:1, about 15:1 to about 34:1, about 15:1 to about 40:1, about 20:1 to about 25:1, about 20:1 to about 30:1, about 20:1 to about 34:1, about 20:1 to about 40:1, about 25:1 to about 30:1, about 25:1 to about 34:1, about 25:1 to about 40:1, about 30:1 to about 34:1, about 30:1 to about 40:1, or about 34:1 to about 40:1. Optionally, in some embodiments the conductive graphene ink has a C:O mass ratio of about 2:1, about 4:1, about 6:1, about 8:1, about 10:1, about 15:1, about 20:1, about 25:1, about 30:1, about 34:1, or about 40:1. Optionally, in some embodiments, one of the conductivity, the surface area, and the C:O ratio of the conductive graphene ink is measured by methylene blue absorption. Optionally, in some embodiments the conductive graphene ink has a C:O mass ratio of at least about 2:1, about 4:1, about 6:1, about 8:1, about 10:1, about 15:1, about 20:1, about 25:1, about 30:1, about 34:1, or about 40:1. Optionally, in some embodiments the conductive graphene ink has a C:O mass ratio of no more than about 2:1, about 4:1, about 6:1, about 8:1, about 10:1, about 15:1, about 20:1, about 25:1, about 30:1, about 34:1, or about 40:1.

Optionally, in some embodiments, one of the conductivity, the surface area, and the C:O ratio, of the conductive graphene ink is measured by methylene blue absorption.

Optionally, in some embodiments, the conductive graphene ink is a conductive graphene hydrate.

Optionally, in some embodiments, the graphene film has a thickness of about 0.2 nanometer to about 40 nanometers. Optionally, in some embodiments, the graphene film has a thickness of at least about 0.2 nanometer. Optionally, in some embodiments, the graphene film has a thickness of at most about 40 nanometers. Optionally, in some embodiments, the graphene film has a thickness of about 0.2 nanometer to about 0.4 nanometers, about 0.2 nanometer to about 0.8 nanometer, about 0.2 nanometer to about 1 nanometer, about 0.2 nanometer to about 2 nanometers, about 0.2 nanometer to about 5 nanometers, about 0.2 nanometer to about 10 nanometers, about 0.2 nanometer to about 15 nanometers, about 0.2 nanometer to about 20 nanometers, about 0.2 nanometer to about 30 nanometers, about 0.2 nanometer to about 40 nanometers, about 0.4 nanometer to about 0.8 nanometer, about 0.4 nanometer to about 1 nanometer, about 0.4 nanometer to about 2 nanometers, about 0.4 nanometer to about 5 nanometers, about 0.4 nanometer to about 10 nanometers, about 0.4 nanometer to about 15 nanometers, about 0.4 nanometer to about 20 nanometers, about 0.4 nanometer to about 30 nanometers, about 0.4 nanometer to about 40 nanometers, about 0.8 nanometer to about 1 nanometer, about 0.8 nanometer to about 2 nanometers, about 0.8 nanometer to about 5 nanometers, about 0.8 nanometer to about 10 nanometers, about 0.8 nanometer to about 15 nanometers, about 0.8 nanometer to about 20 nanometers, about 0.8 nanometer to about 30 nanometers, about 0.8 nanometer to about 40 nanometers, about 1 nanometer to about 2 nanometers, about 1 nanometer to about 5 nanometers, about 1 nanometer to about 10 nanometers, about 1 nanometer to about 15 nanometers, about 1 nanometer to about 20 nanometers, about 1 nanometer to about 30 nanometers, about 1 nanometer to about 40 nanometers, about 2 nanometers to about 5 nanometers, about 2 nanometers to about 10 nanometers, about 2 nanometers to about 15 nanometers, about 2 nanometers to about 20 nanometers, about 2 nanometers to about 30 nanometers, about 2 nanometers to about 40 nanometers, about 5 nanometers to about 10 nanometers, about 5 nanometers to about 15 nanometers, about 5 nanometers to about 20 nanometers, about 5 nanometers to about 30 nanometers, about 5 nanometers to about 40 nanometers, about 10 nanometers to about 15 nanometers, about 10 nanometers to about 20 nanometers, about 10 nanometers to about 30 nanometers, about 10 nanometers to about 40 nanometers, about 15 nanometers to about 20 nanometers, about 15 nanometers to about 30 nanometers, about 15 nanometers to about 40 nanometers, about 20 nanometers to about 30 nanometers, about 20 nanometers to about 40 nanometers, or about 30 nanometers to about 40 nanometers. Optionally, in some embodiments, the graphene film has a thickness of about 0.2 nanometer, about 0.4 nanometer, about 0.8 nanometer, about 1 nanometer, about 2 nanometers, about 5 nanometers, about 10 nanometers, about 15 nanometers, about 20 nanometers, about 30 nanometers, or about 40 nanometers. Optionally, in some embodiments, the graphene film has a thickness of at least about 0.2 nanometer, about 0.4 nanometer, about 0.8 nanometer, about 1 nanometer, about 2 nanometers, about 5 nanometers, about 10 nanometers, about 15 nanometers, about 20 nanometers, about 30 nanometers, or about 40 nanometers. Optionally, in some embodiments, the graphene film has a thickness of no more than about 0.2 nanometer, about 0.4 nanometer, about 0.8 nanometer, about 1 nanometer, about 2 nanometers, about 5 nanometers, about 10 nanometers, about 15 nanometers, about 20 nanometers, about 30 nanometers, or about 40 nanometers.

Optionally, in some embodiments, the graphene film has a lateral size of about 0.05 micrometer to about 200 micrometers. Optionally, in some embodiments, the graphene film has a lateral size of at least about 0.05 micrometer. Optionally, in some embodiments, the graphene film has a lateral size of at most about 200 micrometers. Optionally, in some embodiments, the graphene film has a lateral size of about 0.05 micrometer to about 0.1 micrometer, about 0.05 micrometer to about 0.5 micrometer, about 0.05 micrometer to about 1 micrometer, about 0.05 micrometer to about 5 micrometers, about 0.05 micrometer to about 10 micrometers, about 0.05 micrometer to about 50 micrometers, about 0.05 micrometer to about 100 micrometers, about 0.05 micrometer to about 200 micrometers, about 0.1 micrometer to about 0.5 micrometer, about 0.1 micrometer to about 1 micrometer, about 0.1 micrometer to about 5 micrometers, about 0.1 micrometer to about 10 micrometers, about 0.1 micrometer to about 50 micrometers, about 0.1 micrometer to about 100 micrometers, about 0.1 micrometer to about 200 micrometers, about 0.5 micrometer to about 1 micrometer, about 0.5 micrometer to about 5 micrometers, about 0.5 micrometer to about 10 micrometers, about 0.5 micrometer to about 50 micrometers, about 0.5 micrometer to about 100 micrometers, about 0.5 micrometer to about 200 micrometers, about 1 micrometer to about 5 micrometers, about 1 micrometer to about 10 micrometers, about 1 micrometer to about 50 micrometers, about 1 micrometer to about 100 micrometers, about 1 micrometer to about 200 micrometers, about 5 micrometers to about 10 micrometers, about 5 micrometers to about 50 micrometers, about 5 micrometers to about 100 micrometers, about 5 micrometers to about 200 micrometers, about 10 micrometers to about 50 micrometers, about 10 micrometers to about 100 micrometers, about 10 micrometers to about 200 micrometers, about 50 micrometers to about 100 micrometers, about 50 micrometers to about 200 micrometers, or about 100 micrometers to about 200 micrometers. Optionally, in some embodiments, the graphene film has a lateral size of about 0.05 micrometer, about 0.1 micrometer, about 0.5 micrometer, about 1 micrometer, about 5 micrometers, about 10 micrometers, about 50 micrometers, about 100 micrometers, or about 200 micrometers. Optionally, in some embodiments, the graphene film has a lateral size of at least about 0.05 micrometer, about 0.1 micrometer, about 0.5 micrometer, about 1 micrometer, about 5 micrometers, about 10 micrometers, about 50 micrometers, about 100 micrometers, or about 200 micrometers. Optionally, in some embodiments, the graphene film has a lateral size of no more than about 0.05 micrometer, about 0.1 micrometer, about 0.5 micrometer, about 1 micrometer, about 5 micrometers, about 10 micrometers, about 50 micrometers, about 100 micrometers, or about 200 micrometers.

Optionally, in some embodiments the graphene film has a surface area of about 40 $m^2/g$ to about 2,400 $m^2/g$. Optionally, in some embodiments the graphene film has a surface area of at least about 40 $m^2/g$. Optionally, in some embodiments the graphene film has a surface area of at most about 2,400 $m^2/g$. Optionally, in some embodiments the graphene film has a surface area of about 40 $m^2/g$ to about 80 $m^2/g$, about 40 $m^2/g$ to about 120 $m^2/g$, about 40 $m^2/g$ to about 240 $m^2/g$, about 40 $m^2/g$ to about 480 $m^2/g$, about 40 $m^2/g$ to about 1,000 $m^2/g$, about 40 $m^2/g$ to about 1,400 $m^2/g$, about 40 $m^2/g$ to about 1,800 $m^2/g$, about 40 $m^2/g$ to about 2,200 $m^2/g$, about 40 $m^2/g$ to about 2,400 $m^2/g$, about 80 $m^2/g$ to about 120 $m^2/g$, about 80 $m^2/g$ to about 240 $m^2/g$, about 80 $m^2/g$ to about 480 $m^2/g$, about 80 $m^2/g$ to about 1,000 $m^2/g$, about 80 $m^2/g$ to about 1,400 $m^2/g$, about 80 $m^2/g$ to about 1,800 $m^2/g$, about 80 $m^2/g$ to about 2,200 $m^2/g$, about 80 $m^2/g$ to about 2,400 $m^2/g$, about 120 $m^2/g$ to about 240 $m^2/g$, about 120 $m^2/g$ to about 480 $m^2/g$, about 120 $m^2/g$ to about 1,000 $m^2/g$, about 120 $m^2/g$ to about 1,400 $m^2/g$, about 120 $m^2/g$ to about 1,800 $m^2/g$, about 120 $m^2/g$ to about 2,200 $m^2/g$, about 120 $m^2/g$ to about 2,400 $m^2/g$, about 240 $m^2/g$ to about 480 $m^2/g$, about 240 $m^2/g$ to about 1,000 $m^2/g$, about 240 $m^2/g$ to about 1,400 $m^2/g$, about 240 $m^2/g$ to about 1,800 $m^2/g$, about 240 $m^2/g$ to about 2,200 $m^2/g$, about 240 $m^2/g$ to about 2,400 $m^2/g$, about 480 $m^2/g$ to about 1,000 $m^2/g$, about 480 $m^2/g$ to about 1,400 $m^2/g$, about 480 $m^2/g$ to about 1,800 $m^2/g$, about 480 $m^2/g$ to about 2,200 $m^2/g$, about 480 $m^2/g$ to about 2,400 $m^2/g$, about 1,000 $m^2/g$ to about 1,400 $m^2/g$, about 1,000 $m^2/g$ to about 1,800 $m^2/g$, about 1,000 $m^2/g$ to about 2,200 $m^2/g$, about 1,000 $m^2/g$ to about 2,400 $m^2/g$, about 1,400 $m^2/g$ to about 1,800 $m^2/g$, about 1,400 $m^2/g$ to about 2,200 $m^2/g$, about 1,400 $m^2/g$ to about 2,400 $m^2/g$, about 1,800 $m^2/g$ to about 2,200 $m^2/g$, about 1,800 $m^2/g$ to about 2,400 $m^2/g$, or about 2,200 $m^2/g$ to about 2,400 $m^2/g$. Optionally, in some embodiments the graphene film has a surface area of about 40 $m^2/g$, about 80 $m^2/g$, about 120 $m^2/g$, about 240 $m^2/g$, about 480 $m^2/g$, about 1,000 $m^2/g$, about 1,400 $m^2/g$, about 1,800 $m^2/g$, about 2,200 $m^2/g$, or about 2,400 $m^2/g$. Optionally, in some embodiments the graphene film has a surface area of at least about 40 $m^2/g$, about 80 $m^2/g$, about 120 $m^2/g$, about 240 $m^2/g$, about 480 $m^2/g$, about 1,000 $m^2/g$, about 1,400 $m^2/g$, about 1,800 $m^2/g$, about 2,200 $m^2/g$, or about 2,400 $m^2/g$. Optionally, in some embodiments the graphene film has a surface area of no more than about 40 $m^2/g$, about 80 $m^2/g$, about 120 $m^2/g$, about 240 $m^2/g$, about 480 $m^2/g$, about 1,000 $m^2/g$, about 1,400 $m^2/g$, about 1,800 $m^2/g$, about 2,200 $m^2/g$, or about 2,400 $m^2/g$.

Optionally, in some embodiments, the graphene film has a sheet resistance about 12 ohms/sq to about 240 ohms/sq. Optionally, in some embodiments, the graphene film has a sheet resistance at least about 12 ohms/sq. Optionally, in some embodiments, the graphene film has a sheet resistance at most about 240 ohms/sq. Optionally, in some embodiments, the graphene film has a sheet resistance about 12 ohms/sq to about 24 ohms/sq, about 12 ohms/sq to about 36 ohms/sq, about 12 ohms/sq to about 48 ohms/sq, about 12 ohms/sq to about 60 ohms/sq, about 12 ohms/sq to about 80 ohms/sq, about 12 ohms/sq to about 100 ohms/sq, about 12 ohms/sq to about 120 ohms/sq, about 12 ohms/sq to about 150 ohms/sq, about 12 ohms/sq to about 175 ohms/sq, about 12 ohms/sq to about 200 ohms/sq, about 12 ohms/sq to about 240 ohms/sq, about 24 ohms/sq to about 36 ohms/sq, about 24 ohms/sq to about 48 ohms/sq, about 24 ohms/sq to about 60 ohms/sq, about 24 ohms/sq to about 80 ohms/sq, about 24 ohms/sq to about 100 ohms/sq, about 24 ohms/sq to about 120 ohms/sq, about 24 ohms/sq to about 150 ohms/sq, about 24 ohms/sq to about 175 ohms/sq, about 24 ohms/sq to about 200 ohms/sq, about 24 ohms/sq to about 240 ohms/sq, about 36 ohms/sq to about 48 ohms/sq, about 36 ohms/sq to about 60 ohms/sq, about 36 ohms/sq to about 80 ohms/sq, about 36 ohms/sq to about 100 ohms/sq, about 36 ohms/sq to about 120 ohms/sq, about 36 ohms/sq to about 150 ohms/sq, about 36 ohms/sq to about 175 ohms/sq, about 36 ohms/sq to about 200 ohms/sq, about 36 ohms/sq to about 240 ohms/sq, about 48 ohms/sq to about 60 ohms/sq, about 48 ohms/sq to about 80 ohms/sq, about 48 ohms/sq to about 100 ohms/sq, about 48 ohms/sq to about 120 ohms/sq, about 48 ohms/sq to about 150 ohms/sq, about 48 ohms/sq to about 175 ohms/sq, about 48 ohms/sq to about 200 ohms/sq, about 48 ohms/sq to about 240 ohms/sq, about 60 ohms/sq to about 80 ohms/sq, about 60 ohms/sq to about 100 ohms/sq, about 60 ohms/sq to about 120 ohms/sq, about 60 ohms/sq to about 150 ohms/sq, about 60 ohms/sq to about 175 ohms/sq, about 60 ohms/sq to about 200 ohms/sq, about 60 ohms/sq to about 240 ohms/sq, about 80 ohms/sq to about 100 ohms/sq, about 80 ohms/sq to about 120 ohms/sq, about 80 ohms/sq to about 150 ohms/sq, about 80 ohms/sq to about 175 ohms/sq, about 80 ohms/sq to about 200 ohms/sq, about 80 ohms/sq to about 240 ohms/sq, about 100 ohms/sq to about 120 ohms/sq, about 100 ohms/sq to about 150 ohms/sq, about 100 ohms/sq to about 175 ohms/sq, about 100 ohms/sq to about 200 ohms/sq, about 100 ohms/sq to about 240 ohms/sq, about 120 ohms/sq to about 150 ohms/sq, about 120 ohms/sq to about 175 ohms/sq, about 120 ohms/sq to about 200 ohms/sq, about 120 ohms/sq to about 240 ohms/sq, about 150 ohms/sq to about 175 ohms/sq, about 150 ohms/sq to about 200 ohms/sq, about 150 ohms/sq to about 240 ohms/sq, about 175 ohms/sq to about 200 ohms/sq, about 175 ohms/sq to about 240 ohms/sq, or about 200 ohms/sq to about 240 ohms/sq. Optionally, in some embodiments, the graphene film has a sheet resistance about 12 ohms/sq, about 24 ohms/sq, about 36 ohms/sq, about 48 ohms/sq, about 60 ohms/sq, about 80 ohms/sq, about 100 ohms/sq, about 120 ohms/sq, about 150 ohms/sq, about 175 ohms/sq, about 200 ohms/sq, or about 240 ohms/sq. Optionally, in some embodiments, the graphene film has a sheet resistance at least about 12 ohms/sq, about 24 ohms/sq, about 36 ohms/sq, about 48 ohms/sq, about 60 ohms/sq, about 80 ohms/sq, about 100 ohms/sq, about 120 ohms/sq, about 150 ohms/sq, about 175 ohms/sq, about 200 ohms/sq, or about 240 ohms/sq. Optionally, in some embodiments, the graphene film has a sheet resistance no more than about 12 ohms/sq, about 24 ohms/sq, about 36 ohms/sq, about 48 ohms/sq, about 60 ohms/sq, about 80 ohms/sq, about 100 ohms/sq, about 120 ohms/sq, about 150 ohms/sq, about 175 ohms/sq, about 200 ohms/sq, or about 240 ohms/sq.

Optionally, in some embodiments, the graphene film has a thickness of about 5 micrometers and has a sheet resistance of about 50 ohms/sq to about 240 ohms/sq. Optionally, in some embodiments, the graphene film has a thickness of about 5 micrometers and has a sheet resistance of at least about 50 ohms/sq. Optionally, in some embodiments, the graphene film has a thickness of about 5 micrometers and has a sheet resistance of at most about 240 ohms/sq. Optionally, in some embodiments, the graphene film has a thickness of about 5 micrometers and has a sheet resistance of about 50 ohms/sq to about 70 ohms/sq, about 50 ohms/sq to about 90 ohms/sq, about 50 ohms/sq to about 120 ohms/sq, about 50 ohms/sq to about 150 ohms/sq, about 50 ohms/sq to about 180 ohms/sq, about 50 ohms/sq to about 210 ohms/sq, about 50 ohms/sq to about 240 ohms/sq, about 70 ohms/sq to about 90 ohms/sq, about 70 ohms/sq to about 120 ohms/sq, about 70 ohms/sq to about 150 ohms/sq, about 70 ohms/sq to about 180 ohms/sq, about 70 ohms/sq to about 210 ohms/sq, about 70 ohms/sq to about 240 ohms/sq, about 90 ohms/sq to about 120 ohms/sq, about 90 ohms/sq to about 150 ohms/sq, about 90 ohms/sq to about 180 ohms/sq, about 90 ohms/sq to about 210 ohms/sq, about 90 ohms/sq to about 240 ohms/sq, about 120 ohms/sq to about 150 ohms/sq, about 120 ohms/sq to about 180 ohms/sq, about 120 ohms/sq to about 210 ohms/sq, about 120 ohms/sq to about 240 ohms/sq, about 150 ohms/sq to about 180 ohms/sq, about 150 ohms/sq to about 210 ohms/sq, about 150 ohms/sq to about 240 ohms/sq, about 180 ohms/sq to about 210 ohms/sq, about 180 ohms/sq to about 240 ohms/sq, or about 210 ohms/sq to about 240 ohms/sq. Optionally, in some embodiments, the graphene film has a thickness of about 5 micrometers and has a sheet resistance of about 50 ohms/sq, about 70 ohms/sq, about 90 ohms/sq, about 120 ohms/sq, about 150 ohms/sq, about 180 ohms/sq, about 210 ohms/sq, or about 240 ohms/sq. Optionally, in some embodiments, the graphene film has a thickness of about 5 micrometers and has a sheet resistance of at least about 50 ohms/sq, about 70 ohms/sq, about 90 ohms/sq, about 120 ohms/sq, about 150 ohms/sq, about 180 ohms/sq, about 210 ohms/sq, or about 240 ohms/sq. Optionally, in some embodiments, the graphene film has a thickness of about 5 micrometers and has a sheet resistance of no more than about 50 ohms/sq, about 70 ohms/sq, about 90 ohms/sq, about 120 ohms/sq, about 150 ohms/sq, about 180 ohms/sq, about 210 ohms/sq, or about 240 ohms/sq.

Optionally, in some embodiments, the graphene film has a thickness of about 15 micrometers and has a sheet resistance of about 25 ohms/sq to about 120 ohms/sq. Optionally, in some embodiments, the graphene film has a thickness of about 15 micrometers and has a sheet resistance of at least about 25 ohms/sq. Optionally, in some embodiments, the graphene film has a thickness of about 15 micrometers and has a sheet resistance of at most about 120 ohms/sq. Optionally, in some embodiments, the graphene film has a thickness of about 15 micrometers and has a sheet resistance of about 25 ohms/sq to about 35 ohms/sq, about 25 ohms/sq to about 45 ohms/sq, about 25 ohms/sq to about 55 ohms/sq, about 25 ohms/sq to about 70 ohms/sq, about 25 ohms/sq to about 80 ohms/sq, about 25 ohms/sq to about 90 ohms/sq, about 25 ohms/sq to about 100 ohms/sq, about 25 ohms/sq to about 120 ohms/sq, about 35 ohms/sq to about 45 ohms/sq, about 35 ohms/sq to about 55 ohms/sq, about 35 ohms/sq to about 70 ohms/sq, about 35 ohms/sq to about 80 ohms/sq, about 35 ohms/sq to about 90 ohms/sq, about 35 ohms/sq to about 100 ohms/sq, about 35 ohms/sq to about 120 ohms/sq, about 45 ohms/sq to about 55 ohms/sq, about 45 ohms/sq to about 70 ohms/sq, about 45 ohms/sq to about 80 ohms/sq, about 45 ohms/sq to about 90 ohms/sq, about 45 ohms/sq to about 100 ohms/sq, about 45 ohms/sq to about 120 ohms/sq, about 55 ohms/sq to about 70 ohms/sq, about 55 ohms/sq to about 80 ohms/sq, about 55 ohms/sq to about 90 ohms/sq, about 55 ohms/sq to about 100 ohms/sq, about 55 ohms/sq to about 120 ohms/sq, about 70 ohms/sq to about 80 ohms/sq, about 70 ohms/sq to about 90 ohms/sq, about 70 ohms/sq to about 100 ohms/sq, about 70 ohms/sq to about 120 ohms/sq, about 80 ohms/sq to about 90 ohms/sq, about 80 ohms/sq to about 100 ohms/sq, about 80 ohms/sq to about 120 ohms/sq, about 90 ohms/sq to about 100 ohms/sq, about 90 ohms/sq to about 120 ohms/sq, or about 100 ohms/sq to about 120 ohms/sq. Optionally, in some embodiments, the graphene film has a thickness of about 15 micrometers and has a sheet resistance of about 25 ohms/sq, about 35 ohms/sq, about 45 ohms/sq, about 55 ohms/sq, about 70 ohms/sq, about 80 ohms/sq, about 90 ohms/sq, about 100 ohms/sq, or about 120 ohms/sq. Optionally, in some embodiments, the graphene film has a thickness of about 15 micrometers and has a sheet resistance of at least about 25 ohms/sq, about 35 ohms/sq, about 45 ohms/sq, about 55 ohms/sq, about 70 ohms/sq, about 80 ohms/sq, about 90 ohms/sq, about 100 ohms/sq, or about 120 ohms/sq. Optionally, in some embodiments, the graphene film has a thickness of about 15 micrometers and has a sheet resistance of no more than about 25 ohms/sq, about 35 ohms/sq, about 45 ohms/sq, about 55 ohms/sq, about 70 ohms/sq, about 80 ohms/sq, about 90 ohms/sq, about 100 ohms/sq, or about 120 ohms/sq.

Optionally, in some embodiments, the graphene film has a thickness of about 30 micrometers and has a sheet resistance of about 15 ohms/sq to about 70 ohms/sq. Optionally, in some embodiments, the graphene film has a thickness of about 30 micrometers and has a sheet resistance of at least about 15 ohms/sq. Optionally, in some embodiments, the graphene film has a thickness of about 30 micrometers and has a sheet resistance of at most about 70 ohms/sq. Optionally, in some embodiments, the graphene film has a thickness of about 30 micrometers and has a sheet resistance of about 15 ohms/sq to about 20 ohms/sq, about 15 ohms/sq to about 25 ohms/sq, about 15 ohms/sq to about 30 ohms/sq, about 15 ohms/sq to about 35 ohms/sq, about 15 ohms/sq to about 40 ohms/sq, about 15 ohms/sq to about 45 ohms/sq, about 15 ohms/sq to about 50 ohms/sq, about 15 ohms/sq to about 55 ohms/sq, about 15 ohms/sq to about 60 ohms/sq, about 15 ohms/sq to about 65 ohms/sq, about 15 ohms/sq to about 70 ohms/sq, about 20 ohms/sq to about 25 ohms/sq, about 20 ohms/sq to about 30 ohms/sq, about 20 ohms/sq to about 35 ohms/sq, about 20 ohms/sq to about 40 ohms/sq, about 20 ohms/sq to about 45 ohms/sq, about 20 ohms/sq to about 50 ohms/sq, about 20 ohms/sq to about 55 ohms/sq, about 20 ohms/sq to about 60 ohms/sq, about 20 ohms/sq to about 65 ohms/sq, about 20 ohms/sq to about 70 ohms/sq, about 25 ohms/sq to about 30 ohms/sq, about 25 ohms/sq to about 35 ohms/sq, about 25 ohms/sq to about 40 ohms/sq, about 25 ohms/sq to about 45 ohms/sq, about 25 ohms/sq to about 50 ohms/sq, about 25 ohms/sq to about 55 ohms/sq, about 25 ohms/sq to about 60 ohms/sq, about 25 ohms/sq to about 65 ohms/sq, about 25 ohms/sq to about 70 ohms/sq, about 30 ohms/sq to about 35 ohms/sq, about 30 ohms/sq to about 40 ohms/sq, about 30 ohms/sq to about 45 ohms/sq, about 30 ohms/sq to about 50 ohms/sq, about 30 ohms/sq to about 55 ohms/sq, about 30 ohms/sq to about 60 ohms/sq, about 30 ohms/sq to about 65 ohms/sq, about 30 ohms/sq to about 70 ohms/sq, about 35 ohms/sq to about 40 ohms/sq, about 35 ohms/sq to about 45 ohms/sq, about 35 ohms/sq to about 50 ohms/sq, about 35 ohms/sq to about 55 ohms/sq, about 35 ohms/sq to about 60 ohms/sq, about 35 ohms/sq to about 65 ohms/sq, about 35 ohms/sq to about 70 ohms/sq, about 40 ohms/sq to about 45 ohms/sq, about 40 ohms/sq to about 50 ohms/sq, about 40 ohms/sq to about 55 ohms/sq, about 40 ohms/sq to about 60 ohms/sq, about 40 ohms/sq to about 65 ohms/sq, about 40 ohms/sq to about 70 ohms/sq, about 45 ohms/sq to about 50 ohms/sq, about 45 ohms/sq to about 55 ohms/sq, about 45 ohms/sq to about 60 ohms/sq, about 45 ohms/sq to about 65 ohms/sq, about 45 ohms/sq to about 70 ohms/sq, about 50 ohms/sq to about 55 ohms/sq, about 50 ohms/sq to about 60 ohms/sq, about 50 ohms/sq to about 65 ohms/sq, about 50 ohms/sq to about 70 ohms/sq, about 55 ohms/sq to about 60 ohms/sq, about 55 ohms/sq to about 65 ohms/sq, about 55 ohms/sq to about 70 ohms/sq, about 60 ohms/sq to about 65 ohms/sq, about 60 ohms/sq to about 70 ohms/sq, or about 65 ohms/sq to about 70 ohms/sq. Optionally, in some embodiments, the graphene film has a thickness of about 30 micrometers and has a sheet resistance of about 15 ohms/sq, about 20 ohms/sq, about 25 ohms/sq, about 30 ohms/sq, about 35 ohms/sq, about 40 ohms/sq, about 45 ohms/sq, about 50 ohms/sq, about 55 ohms/sq, about 60 ohms/sq, about 65 ohms/sq, or about 70 ohms/sq. Optionally, in some embodiments, the graphene film has a thickness of about 30 micrometers and has a sheet resistance of at least about 15 ohms/sq, about 20 ohms/sq, about 25 ohms/sq, about 30 ohms/sq, about 35 ohms/sq, about 40 ohms/sq, about 45 ohms/sq, about 50 ohms/sq, about 55 ohms/sq, about 60 ohms/sq, about 65 ohms/sq, or about 70 ohms/sq. Optionally, in some embodiments, the graphene film has a thickness of about 30 micrometers and has a sheet resistance of no more than about 15 ohms/sq, about 20 ohms/sq, about 25 ohms/sq, about 30 ohms/sq, about 35 ohms/sq, about 40 ohms/sq, about 45 ohms/sq, about 50 ohms/sq, about 55 ohms/sq, about 60 ohms/sq, about 65 ohms/sq, or about 70 ohms/sq.

Optionally, in some embodiments, the graphene film has a thickness of about 40 micrometers and has a sheet resistance of about 12 ohms/sq to about 50 ohms/sq. Optionally, in some embodiments, the graphene film has a thickness of about 40 micrometers and has a sheet resistance of at least about 12 ohms/sq. Optionally, in some embodiments, the graphene film has a thickness of about 40 micrometers and has a sheet resistance of at most about 50 ohms/sq. Optionally, in some embodiments, the graphene film has a thickness of about 40 micrometers and has a sheet resistance of about 12 ohms/sq to about 15 ohms/sq, about 12 ohms/sq to about 20 ohms/sq, about 12 ohms/sq to about 25 ohms/sq, about 12 ohms/sq to about 30 ohms/sq, about 12 ohms/sq to about 35 ohms/sq, about 12 ohms/sq to about 40 ohms/sq, about 12 ohms/sq to about 45 ohms/sq, about 12 ohms/sq to about 50 ohms/sq, about 15 ohms/sq to about 20 ohms/sq, about 15 ohms/sq to about 25 ohms/sq, about 15 ohms/sq to about 30 ohms/sq, about 15 ohms/sq to about 35 ohms/sq, about 15 ohms/sq to about 40 ohms/sq, about 15 ohms/sq to about 45 ohms/sq, about 15 ohms/sq to about 50 ohms/sq, about 20 ohms/sq to about 25 ohms/sq, about 20 ohms/sq to about 30 ohms/sq, about 20 ohms/sq to about 35 ohms/sq, about 20 ohms/sq to about 40 ohms/sq, about 20 ohms/sq to about 45 ohms/sq, about 20 ohms/sq to about 50 ohms/sq, about 25 ohms/sq to about 30 ohms/sq, about 25 ohms/sq to about 35 ohms/sq, about 25 ohms/sq to about 40 ohms/sq, about 25 ohms/sq to about 45 ohms/sq, about 25 ohms/sq to about 50 ohms/sq, about 30 ohms/sq to about 35 ohms/sq, about 30 ohms/sq to about 40 ohms/sq, about 30 ohms/sq to about 45 ohms/sq, about 30 ohms/sq to about 50 ohms/sq, about 35 ohms/sq to about 40 ohms/sq, about 35 ohms/sq to about 45 ohms/sq, about 35 ohms/sq to about 50 ohms/sq, about 40 ohms/sq to about 45 ohms/sq, about 40 ohms/sq to about 50 ohms/sq, or about 45 ohms/sq to about 50 ohms/sq. Optionally, in some embodiments, the graphene film has a thickness of about 40 micrometers and has a sheet resistance of about 12 ohms/sq, about 15 ohms/sq, about 20 ohms/sq, about 25 ohms/sq, about 30 ohms/sq, about 35 ohms/sq, about 40 ohms/sq, about 45 ohms/sq, or about 50 ohms/sq. Optionally, in some embodiments, the graphene film has a thickness of about 40 micrometers and has a sheet resistance of at least about 12 ohms/sq, about 15 ohms/sq, about 20 ohms/sq, about 25 ohms/sq, about 30 ohms/sq, about 35 ohms/sq, about 40 ohms/sq, about 45 ohms/sq, or about 50 ohms/sq. Optionally, in some embodiments, the graphene film has a thickness of about 40 micrometers and has a sheet resistance of no more than about 12 ohms/sq, about 15 ohms/sq, about 20 ohms/sq, about 25 ohms/sq, about 30 ohms/sq, about 35 ohms/sq, about 40 ohms/sq, about 45 ohms/sq, or about 50 ohms/sq.

Optionally, in some embodiments, the binder comprises polyvinylidene fluoride (PVDF), wherein the solvent comprises N-methyl-2-pyrrolidone (NMP), and wherein the graphene film has a thickness of about 200 micrometers, the graphene film has a sheet resistance of about 35 ohms/sq to about 140 ohms/sq. Optionally, in some embodiments, wherein the binder comprises PVDF, wherein the solvent comprises NMP, and wherein the graphene film has a thickness of about 200 micrometers, the graphene film has a sheet resistance of at least about 35 ohms/sq. Optionally, in some embodiments, wherein the binder comprises PVDF, wherein the solvent comprises NMP, and wherein the graphene film has a thickness of about 200 micrometers, the graphene film has a sheet resistance of at most about 140 ohms/sq. Optionally, in some embodiments, wherein the binder comprises PVDF, wherein the solvent comprises NMP, and wherein the graphene film has a thickness of about 200 micrometers, the graphene film has a sheet resistance of about 35 ohms/sq to about 40 ohms/sq, about 35 ohms/sq to about 45 ohms/sq, about 35 ohms/sq to about 50 ohms/sq, about 35 ohms/sq to about 70 ohms/sq, about 35 ohms/sq to about 80 ohms/sq, about 35 ohms/sq to about 90 ohms/sq, about 35 ohms/sq to about 100 ohms/sq, about 35 ohms/sq to about 110 ohms/sq, about 35 ohms/sq to about 120 ohms/sq, about 35 ohms/sq to about 130 ohms/sq, about 35 ohms/sq to about 140 ohms/sq, about 40 ohms/sq to about 45 ohms/sq, about 40 ohms/sq to about 50 ohms/sq, about 40 ohms/sq to about 70 ohms/sq, about 40 ohms/sq to about 80 ohms/sq, about 40 ohms/sq to about 90 ohms/sq, about 40 ohms/sq to about 100 ohms/sq, about 40 ohms/sq to about 110 ohms/sq, about 40 ohms/sq to about 120 ohms/sq, about 40 ohms/sq to about 130 ohms/sq, about 40 ohms/sq to about 140 ohms/sq, about 45 ohms/sq to about 50 ohms/sq, about 45 ohms/sq to about 70 ohms/sq, about 45 ohms/sq to about 80 ohms/sq, about 45 ohms/sq to about 90 ohms/sq, about 45 ohms/sq to about 100 ohms/sq, about 45 ohms/sq to about 110 ohms/sq, about 45 ohms/sq to about 120 ohms/sq, about 45 ohms/sq to about 130 ohms/sq, about 45 ohms/sq to about 140 ohms/sq, about 50 ohms/sq to about 70 ohms/sq, about 50 ohms/sq to about 80 ohms/sq, about 50 ohms/sq to about 90 ohms/sq, about 50 ohms/sq to about 100 ohms/sq, about 50 ohms/sq to about 110 ohms/sq, about 50 ohms/sq to about 120 ohms/sq, about 50 ohms/sq to about 130 ohms/sq, about 50 ohms/sq to about 140 ohms/sq, about 70 ohms/sq to about 80 ohms/sq, about 70 ohms/sq to about 90 ohms/sq, about 70 ohms/sq to about 100 ohms/sq, about 70 ohms/sq to about 110 ohms/sq, about 70 ohms/sq to about 120 ohms/sq, about 70 ohms/sq to about 130 ohms/sq, about 70 ohms/sq to about 140 ohms/sq, about 80 ohms/sq to about 90 ohms/sq, about 80 ohms/sq to about 100 ohms/sq, about 80 ohms/sq to about 110 ohms/sq, about 80 ohms/sq to about 120 ohms/sq, about 80 ohms/sq to about 130 ohms/sq, about 80 ohms/sq to about 140 ohms/sq, about 90 ohms/sq to about 100 ohms/sq, about 90 ohms/sq to about 110 ohms/sq, about 90 ohms/sq to about 120 ohms/sq, about 90 ohms/sq to about 130 ohms/sq, about 90 ohms/sq to about 140 ohms/sq, about 100 ohms/sq to about 110 ohms/sq, about 100 ohms/sq to about 120 ohms/sq, about 100 ohms/sq to about 130 ohms/sq, about 100 ohms/sq to about 140 ohms/sq, about 110 ohms/sq to about 120 ohms/sq, about 110 ohms/sq to about 130 ohms/sq, about 110 ohms/sq to about 140 ohms/sq, about 120 ohms/sq to about 130 ohms/sq, about 120 ohms/sq to about 140 ohms/sq, or about 130 ohms/sq to about 140 ohms/sq. Optionally, in some embodiments, wherein the binder comprises PVDF, wherein the solvent comprises NMP, and wherein the graphene film has a thickness of about 200 micrometers, the graphene film has a sheet resistance of about 35 ohms/sq, about 40 ohms/sq, about 45 ohms/sq, about 50 ohms/sq, about 70 ohms/sq, about 80 ohms/sq, about 90 ohms/sq, about 100 ohms/sq, about 110 ohms/sq, about 120 ohms/sq, about 130 ohms/sq, or about 140 ohms/sq. Optionally, in some embodiments, wherein the binder comprises PVDF, wherein the solvent comprises NMP, and wherein the graphene film has a thickness of about 200 micrometers, the graphene film has a sheet resistance of at least about 35 ohms/sq, about 40 ohms/sq, about 45 ohms/sq, about 50 ohms/sq, about 70 ohms/sq, about 80 ohms/sq, about 90 ohms/sq, about 100 ohms/sq, about 110 ohms/sq, about 120 ohms/sq, about 130 ohms/sq, or about 140 ohms/sq. Optionally, in some embodiments, wherein the binder comprises PVDF, wherein the solvent comprises NMP, and wherein the graphene film has a thickness of about 200 micrometers, the graphene film has a sheet resistance of no more than about 35 ohms/sq, about 40 ohms/sq, about 45 ohms/sq, about 50 ohms/sq, about 70 ohms/sq, about 80 ohms/sq, about 90 ohms/sq, about 100 ohms/sq, about 110 ohms/sq, about 120 ohms/sq, about 130 ohms/sq, or about 140 ohms/sq.

Optionally, in some embodiments, the graphene film has a resistivity of about 0.01 ohm/sq/mil to about 60 ohms/sq/mil. Optionally, in some embodiments, the graphene film has a resistivity of at least about 0.01 ohm/sq/mil. Optionally, in some embodiments, the graphene film has a resistivity of at most about 60 ohm/sq/mil. Optionally, in some embodiments, the graphene film has a resistivity of about 0.01 ohm/sq/mil to about 0.05 ohm/sq/mil, about 0.01 ohm/sq/mil to about 0.1 ohm/sq/mil, about 0.01 ohm/sq/mil to about 0.5 ohm/sq/mil, about 0.01 ohm/sq/mil to about 1 ohm/sq/mil, about 0.01 ohm/sq/mil to about 5 ohms/sq/mil, about 0.01 ohm/sq/mil to about 10 ohms/sq/mil, about 0.01 ohm/sq/mil to about 20 ohms/sq/mil, about 0.01 ohm/sq/mil to about 30 ohms/sq/mil, about 0.01 ohm/sq/mil to about 40 ohms/sq/mil, about 0.01 ohm/sq/mil to about 50 ohms/sq/mil, about 0.01 ohm/sq/mil to about 60 ohms/sq/mil, about 0.05 ohm/sq/mil to about 0.1 ohm/sq/mil, about 0.05 ohm/sq/mil to about 0.5 ohm/sq/mil, about 0.05 ohm/sq/mil to about 1 ohm/sq/mil, about 0.05 ohm/sq/mil to about 5 ohms/sq/mil, about 0.05 ohm/sq/mil to about 10 ohms/sq/mil, about 0.05 ohm/sq/mil to about 20 ohms/sq/mil, about 0.05 ohm/sq/mil to about 30 ohms/sq/mil, about 0.05 ohm/sq/mil to about 40 ohms/sq/mil, about 0.05 ohm/sq/mil to about 50 ohms/sq/mil, about 0.05 ohm/sq/mil to about 60 ohms/sq/mil, about 0.1 ohm/sq/mil to about 0.5 ohm/sq/mil, about 0.1 ohm/sq/mil to about 1 ohm/sq/mil, about 0.1 ohm/sq/mil to about 5 ohms/sq/mil, about 0.1 ohm/sq/mil to about 10 ohms/sq/mil, about 0.1 ohm/sq/mil to about 20 ohms/sq/mil, about 0.1 ohm/sq/mil to about 30 ohms/sq/mil, about 0.1 ohm/sq/mil to about 40 ohms/sq/mil, about 0.1 ohm/sq/mil to about 50 ohms/sq/mil, about 0.1 ohm/sq/mil to about 60 ohms/sq/mil, about 0.5 ohm/sq/mil to about 1 ohm/sq/mil, about 0.5 ohm/sq/mil to about 5 ohms/sq/mil, about 0.5 ohm/sq/mil to about 10 ohms/sq/mil, about 0.5 ohm/sq/mil to about 20 ohms/sq/mil, about 0.5 ohm/sq/mil to about 30 ohms/sq/mil, about 0.5 ohm/sq/mil to about 40 ohms/sq/mil, about 0.5 ohm/sq/mil to about 50 ohms/sq/mil, about 0.5 ohm/sq/mil to about 60 ohms/sq/mil, about 1 ohm/sq/mil to about 5 ohms/sq/mil, about 1 ohm/sq/mil to about 10 ohms/sq/mil, about 1 ohm/sq/mil to about 20 ohms/sq/mil, about 1 ohm/sq/mil to about 30 ohms/sq/mil, about 1 ohm/sq/mil to about 40 ohms/sq/mil, about 1 ohm/sq/mil to about 50 ohms/sq/mil, about 1 ohm/sq/mil to about 60 ohms/sq/mil, about 5 ohms/sq/mil to about 10 ohms/sq/ mil, about 5 ohms/sq/mil to about 20 ohms/sq/mil, about 5 ohms/sq/mil to about 30 ohms/sq/mil, about 5 ohms/sq/mil to about 40 ohms/sq/mil, about 5 ohms/sq/mil to about 50 ohms/sq/mil, about 5 ohms/sq/mil to about 60 ohms/sq/mil, about 10 ohms/sq/mil to about 20 ohms/sq/mil, about 10 ohms/sq/mil to about 30 ohms/sq/mil, about 10 ohms/sq/mil to about 40 ohms/sq/mil, about 10 ohms/sq/mil to about 50 ohms/sq/mil, about 10 ohms/sq/mil to about 60 ohms/sq/mil, about 20 ohms/sq/mil to about 30 ohms/sq/mil, about 20 ohms/sq/mil to about 40 ohms/sq/mil, about 20 ohms/sq/mil to about 50 ohms/sq/mil, about 20 ohms/sq/mil to about 60 ohms/sq/mil, about 30 ohms/sq/mil to about 40 ohms/sq/mil, about 30 ohms/sq/mil to about 50 ohms/sq/mil, about 30 ohms/sq/mil to about 60 ohms/sq/mil, about 40 ohms/sq/mil to about 50 ohms/sq/mil, about 40 ohms/sq/mil to about 60 ohms/sq/mil, or about 50 ohms/sq/mil to about 60 ohms/sq/mil. Optionally, in some embodiments, the graphene film has a resistivity of about 0.01 ohms/sq/mil, about 0.05 ohms/sq/mil, about 0.1 ohms/sq/mil, about 0.5 ohms/sq/mil, about 1 ohm/sq/mil, about 5 ohms/sq/mil, about 10 ohms/sq/mil, about 20 ohms/sq/mil, about 30 ohms/sq/mil, about 40 ohms/sq/mil, about 50 ohms/sq/mil, or about 60 ohms/sq/mil. Optionally, in some embodiments, the graphene film has a resistivity of at least about 0.01 ohms/sq/mil, about 0.05 ohms/sq/mil, about 0.1 ohms/sq/mil, about 0.5 ohms/sq/mil, about 1 ohm/sq/mil, about 5 ohms/sq/mil, about 10 ohms/sq/mil, about 20 ohms/sq/mil, about 30 ohms/sq/mil, about 40 ohms/sq/mil, about 50 ohms/sq/mil, or about 60 ohms/sq/mil. Optionally, in some embodiments, the graphene film has a resistivity of at most about 0.01 ohms/sq/mil, about 0.05 ohms/sq/mil, about 0.1 ohms/sq/mil, about 0.5 ohms/sq/mil, about 1 ohm/sq/mil, about 5 ohms/sq/mil, about 10 ohms/sq/mil, about 20 ohms/sq/mil, about 30 ohms/sq/mil, about 40 ohms/sq/mil, about 50 ohms/sq/mil, or about 60 ohms/sq/mil.

Optionally, in some embodiments, the resistance of the graphene film changes while bent by about 0.2% to about 0.8%. Optionally, in some embodiments, the resistance of the graphene film changes while bent by at least about 0.2%. Optionally, in some embodiments, the resistance of the graphene film changes while bent by at most about 0.8%. Optionally, in some embodiments, the resistance of the graphene film changes while bent by about 0.2% to about 0.3%, about 0.2% to about 0.4%, about 0.2% to about 0.5%, about 0.2% to about 0.6%, about 0.2% to about 0.7%, about 0.2% to about 0.8%, about 0.3% to about 0.4%, about 0.3% to about 0.5%, about 0.3% to about 0.6%, about 0.3% to about 0.7%, about 0.3% to about 0.8%, about 0.4% to about 0.5%, about 0.4% to about 0.6%, about 0.4% to about 0.7%, about 0.4% to about 0.8%, about 0.5% to about 0.6%, about 0.5% to about 0.7%, about 0.5% to about 0.8%, about 0.6% to about 0.7%, about 0.6% to about 0.8%, or about 0.7% to about 0.8%. Optionally, in some embodiments, the resistance of the graphene film changes while bent by about 0.2%, about 0.3%, about 0.4%, about 0.5%, about 0.6%, about 0.7%, or about 0.8%. Optionally, in some embodiments, the resistance of the graphene film changes while bent by at least about 0.2%, about 0.3%, about 0.4%, about 0.5%, about 0.6%, about 0.7%, or about 0.8%. Optionally, in some embodiments, the resistance of the graphene film changes while bent by no more than about 0.2%, about 0.3%, about 0.4%, about 0.5%, about 0.6%, about 0.7%, or about 0.8%.

Optionally, in some embodiments, the resistance of the graphene film changes while twisted in a spiral with a bending degree of about 18 by about 0.7% to about 3.2%. Optionally, in some embodiments, the resistance of the graphene film changes while twisted in a spiral with a bending degree of about 18 by at least about 0.7%. Optionally, in some embodiments, the resistance of the graphene film changes while twisted in a spiral with a bending degree of about 18 by at most about 3.2%. Optionally, in some embodiments, the resistance of the graphene film changes while twisted in a spiral with a bending degree of about 18 by about 0.7% to about 0.9%, about 0.7% to about 1.2%, about 0.7% to about 1.5%, about 0.7% to about 1.8%, about 0.7% to about 2.1%, about 0.7% to about 2.4%, about 0.7% to about 2.7%, about 0.7% to about 3%, about 0.7% to about 3.2%, about 0.9% to about 1.2%, about 0.9% to about 1.5%, about 0.9% to about 1.8%, about 0.9% to about 2.1%, about 0.9% to about 2.4%, about 0.9% to about 2.7%, about 0.9% to about 3%, about 0.9% to about 3.2%, about 1.2% to about 1.5%, about 1.2% to about 1.8%, about 1.2% to about 2.1%, about 1.2% to about 2.4%, about 1.2% to about 2.7%, about 1.2% to about 3%, about 1.2% to about 3.2%, about 1.5% to about 1.8%, about 1.5% to about 2.1%, about 1.5% to about 2.4%, about 1.5% to about 2.7%, about 1.5% to about 3%, about 1.5% to about 3.2%, about 1.8% to about 2.1%, about 1.8% to about 2.4%, about 1.8% to about 2.7%, about 1.8% to about 3%, about 1.8% to about 3.2%, about 2.1% to about 2.4%, about 2.1% to about 2.7%, about 2.1% to about 3%, about 2.1% to about 3.2%, about 2.4% to about 2.7%, about 2.4% to about 3%, about 2.4% to about 3.2%, about 2.7% to about 3%, about 2.7% to about 3.2%, or about 3% to about 3.2%. Optionally, in some embodiments, the resistance of the graphene film changes while twisted in a spiral with a bending degree of about 18 by about 0.7%, about 0.9%, about 1.2%, about 1.5%, about 1.8%, about 2.1%, about 2.4%, about 2.7%, about 3%, or about 3.2%. Optionally, in some embodiments, the resistance of the graphene film changes while twisted in a spiral with a bending degree of about 18 by at least about 0.7%, about 0.9%, about 1.2%, about 1.5%, about 1.8%, about 2.1%, about 2.4%, about 2.7%, about 3%, or about 3.2%. Optionally, in some embodiments, the resistance of the graphene film changes while twisted in a spiral with a bending degree of about 18 by no more than about 0.7%, about 0.9%, about 1.2%, about 1.5%, about 1.8%, about 2.1%, about 2.4%, about 2.7%, about 3%, or about 3.2%.

Optionally, in some embodiments, bending the graphene film at an angle of about 180 degrees and at a concave radius of about 2 millimeters changes the resistance of the graphene film by about 0.05% to about 0.2%. Optionally, in some embodiments, bending the graphene film at an angle of about 180 degrees and at a concave radius of about 2 millimeters changes the resistance of the graphene film by at least about 0.05%. Optionally, in some embodiments, bending the graphene film at an angle of about 180 degrees and at a concave radius of about 2 millimeters changes the resistance of the graphene film by at most about 0.2%. Optionally, in some embodiments, bending the graphene film at an angle of about 180 degrees and at a concave radius of about 2 millimeters changes the resistance of the graphene film by about 0.05% to about 0.0625%, about 0.05% to about 0.075%, about 0.05% to about 0.1%, about 0.05% to about 0.1125%, about 0.05% to about 0.125%, about 0.05% to about 0.1375%, about 0.05% to about 0.15%, about 0.05% to about 0.1625%, about 0.05% to about 0.175%, about 0.05% to about 0.1875%, about 0.05% to about 0.2%, about 0.0625% to about 0.075%, about 0.0625% to about 0.1%, about 0.0625% to about 0.1125%, about 0.0625% to about 0.125%, about 0.0625% to about 0.1375%, about 0.0625% to about 0.15%, about 0.0625% to about 0.1625%, about 0.0625% to about 0.175%, about 0.0625% to about 0.1875%, about 0.0625% to about 0.2%, about 0.075% to about 0.1%, about 0.075% to about 0.1125%, about 0.075% to about 0.125%, about 0.075% to about 0.1375%, about 0.075% to about 0.15%, about 0.075% to about 0.1625%, about 0.075% to about 0.175%, about 0.075% to about 0.1875%, about 0.075% to about 0.2%, about 0.1% to about 0.1125%, about 0.1% to about 0.125%, about 0.1% to about 0.1375%, about 0.1% to about 0.15%, about 0.1% to about 0.1625%, about 0.1% to about 0.175%, about 0.1% to about 0.1875%, about 0.1% to about 0.2%, about 0.1125% to about 0.125%, about 0.1125% to about 0.1375%, about 0.1125% to about 0.15%, about 0.1125% to about 0.1625%, about 0.1125% to about 0.175%, about 0.1125% to about 0.1875%, about 0.1125% to about 0.2%, about 0.125% to about 0.1375%, about 0.125% to about 0.15%, about 0.125% to about 0.1625%, about 0.125% to about 0.175%, about 0.125% to about 0.1875%, about 0.125% to about 0.2%, about 0.1375% to about 0.15%, about 0.1375% to about 0.1625%, about 0.1375% to about 0.175%, about 0.1375% to about 0.1875%, about 0.1375% to about 0.2%, about 0.15% to about 0.1625%, about 0.15% to about 0.175%, about 0.15% to about 0.1875%, about 0.15% to about 0.2%, about 0.1625% to about 0.175%, about 0.1625% to about 0.1875%, about 0.1625% to about 0.2%, about 0.175% to about 0.1875%, about 0.175% to about 0.2%, or about 0.1875% to about 0.2%. Optionally, in some embodiments, bending the graphene film at an angle of about 180 degrees and at a concave radius of about 2 millimeters changes the resistance of the graphene film by about 0.05%, about 0.0625%, about 0.075%, about 0.1%, about 0.1125%, about 0.125%, about 0.1375%, about 0.15%, about 0.1625%, about 0.175%, about 0.1875%, or about 0.2%. Optionally, in some embodiments, bending the graphene film at an angle of about 180 degrees and at a concave radius of about 2 millimeters changes the resistance of the graphene film by at least about 0.05%, about 0.0625%, about 0.075%, about 0.1%, about 0.1125%, about 0.125%, about 0.1375%, about 0.15%, about 0.1625%, about 0.175%, about 0.1875%, or about 0.2%. Optionally, in some embodiments, bending the graphene film at an angle of about 180 degrees and at a concave radius of about 2 millimeters changes the resistance of the graphene film by no more than about 0.05%, about 0.0625%, about 0.075%, about 0.1%, about 0.1125%, about 0.125%, about 0.1375%, about 0.15%, about 0.1625%, about 0.175%, about 0.1875%, or about 0.2%.

Optionally, in some embodiments, bending the graphene film at an angle of about 180 degrees and at a convex radius of about 1.75 millimeters changes the resistance of the graphene film by about 0.2% to about 1.25%. Optionally, in some embodiments, bending the graphene film at an angle of about 180 degrees and at a convex radius of about 1.75 millimeters changes the resistance of the graphene film by at least about 0.2%. Optionally, in some embodiments, bending the graphene film at an angle of about 180 degrees and at a convex radius of about 1.75 millimeters changes the resistance of the graphene film by at most about 1.25%. Optionally, in some embodiments, bending the graphene film at an angle of about 180 degrees and at a convex radius of about 1.75 millimeters changes the resistance of the graphene film by about 0.375% to about 0.5%, about 0.375% to about 0.625%, about 0.375% to about 0.75%, about 0.375% to about 0.875%, about 0.375% to about 1%, about 0.375% to about 1.125%, about 0.375% to about 1.25%, about 0.375% to about 0.2%, about 0.5% to about 0.625%, about 0.5% to about 0.75%, about 0.5% to about 0.875%, about 0.5% to about 1%, about 0.5% to about 1.125%, about 0.5% to about 1.25%, about 0.5% to about 0.2%, about 0.625% to about 0.75%, about 0.625% to about 0.875%, about 0.625% to about 1%, about 0.625% to about 1.125%, about 0.625% to about 1.25%, about 0.625% to about 0.2%, about 0.75% to about 0.875%, about 0.75% to about 1%, about 0.75% to about 1.125%, about 0.75% to about 1.25%, about 0.75% to about 0.2%, about 0.875% to about 1%, about 0.875% to about 1.125%, about 0.875% to about 1.25%, about 0.875% to about 0.2%, about 1% to about 1.125%, about 1% to about 1.25%, about 1% to about 0.2%, about 1.125% to about 1.25%, about 1.125% to about 0.2%, or about 1.25% to about 0.2%. Optionally, in some embodiments, bending the graphene film at an angle of about 180 degrees and at a convex radius of about 1.75 millimeters changes the resistance of the graphene film by about 0.375%, about 0.5%, about 0.625%, about 0.75%, about 0.875%, about 1%, about 1.125%, or about 1.25%. Optionally, in some embodiments, bending the graphene film at an angle of about 180 degrees and at a convex radius of about 1.75 millimeters changes the resistance of the graphene film by at least about 0.375%, about 0.5%, about 0.625%, about 0.75%, about 0.875%, about 1%, about 1.125%, or about 1.25%. Optionally, in some embodiments, bending the graphene film at an angle of about 180 degrees and at a convex radius of about 1.75 millimeters changes the resistance of the graphene film by no more than about 0.375%, about 0.5%, about 0.625%, about 0.75%, about 0.875%, about 1%, about 1.125%, or about 1.25%.

Optionally, in some embodiments, the resistance of the graphene changes after about 500 cycles of bending at a bending radius of about 10 millimeters by about 0.8% to about 2.6%. Optionally, in some embodiments, the resistance of the graphene changes after about 500 cycles of bending at a bending radius of about 10 millimeters by at least about 0.8%. Optionally, in some embodiments, the resistance of the graphene changes after about 500 cycles of bending at a bending radius of about 10 millimeters by at most about 2.6%. Optionally, in some embodiments, the resistance of the graphene changes after about 500 cycles of bending at a bending radius of about 10 millimeters by about 0.8% to about 1%, about 0.8% to about 1.2%, about 0.8% to about 1.4%, about 0.8% to about 1.6%, about 0.8% to about 1.8%, about 0.8% to about 2%, about 0.8% to about 2.2%, about 0.8% to about 2.4%, about 0.8% to about 2.6%, about 1% to about 1.2%, about 1% to about 1.4%, about 1% to about 1.6%, about 1% to about 1.8%, about 1% to about 2%, about 1% to about 2.2%, about 1% to about 2.4%, about 1% to about 2.6%, about 1.2% to about 1.4%, about 1.2% to about 1.6%, about 1.2% to about 1.8%, about 1.2% to about 2%, about 1.2% to about 2.2%, about 1.2% to about 2.4%, about 1.2% to about 2.6%, about 1.4% to about 1.6%, about 1.4% to about 1.8%, about 1.4% to about 2%, about 1.4% to about 2.2%, about 1.4% to about 2.4%, about 1.4% to about 2.6%, about 1.6% to about 1.8%, about 1.6% to about 2%, about 1.6% to about 2.2%, about 1.6% to about 2.4%, about 1.6% to about 2.6%, about 1.8% to about 2%, about 1.8% to about 2.2%, about 1.8% to about 2.4%, about 1.8% to about 2.6%, about 2% to about 2.2%, about 2% to about 2.4%, about 2% to about 2.6%, about 2.2% to about 2.4%, about 2.2% to about 2.6%, or about 2.4% to about 2.6%. Optionally, in some embodiments, the resistance of the graphene changes after about 500 cycles of bending at a bending radius of about 10 millimeters by about 0.8%, about 1%, about 1.2%, about 1.4%, about 1.6%, about 1.8%, about 2%, about 2.2%, about 2.4%, or about 2.6%. Optionally, in some embodiments, the resistance of the graphene changes after about 500 cycles of bending at a bending radius of about 10 millimeters by at least about 0.8%, about 1%, about 1.2%, about 1.4%, about 1.6%, about 1.8%, about 2%, about 2.2%, about 2.4%, or about 2.6%. Optionally, in some embodiments, the resistance of the graphene changes after about 500 cycles of bending at a bending radius of about 10 millimeters by no more than about 0.8%, about 1%, about 1.2%, about 1.4%, about 1.6%, about 1.8%, about 2%, about 2.2%, about 2.4%, or about 2.6%.

Optionally, in some embodiments, the resistance of the graphene changes after about 1,000 cycles of bending at a bending radius of about 10 millimeters by about 0.8% to about 2.6%. Optionally, in some embodiments, the resistance of the graphene changes after about 1,000 cycles of bending at a bending radius of about 10 millimeters by at least about 0.8%. Optionally, in some embodiments, the resistance of the graphene changes after about 1,000 cycles of bending at a bending radius of about 10 millimeters by at most about 2.6%. Optionally, in some embodiments, the resistance of the graphene changes after about 1,000 cycles of bending at a bending radius of about 10 millimeters by about 0.8% to about 1%, about 0.8% to about 1.2%, about 0.8% to about 1.4%, about 0.8% to about 1.6%, about 0.8% to about 1.8%, about 0.8% to about 2%, about 0.8% to about 2.2%, about 0.8% to about 2.4%, about 0.8% to about 2.6%, about 1% to about 1.2%, about 1% to about 1.4%, about 1% to about 1.6%, about 1% to about 1.8%, about 1% to about 2%, about 1% to about 2.2%, about 1% to about 2.4%, about 1% to about 2.6%, about 1.2% to about 1.4%, about 1.2% to about 1.6%, about 1.2% to about 1.8%, about 1.2% to about 2%, about 1.2% to about 2.2%, about 1.2% to about 2.4%, about 1.2% to about 2.6%, about 1.4% to about 1.6%, about 1.4% to about 1.8%, about 1.4% to about 2%, about 1.4% to about 2.2%, about 1.4% to about 2.4%, about 1.4% to about 2.6%, about 1.6% to about 1.8%, about 1.6% to about 2%, about 1.6% to about 2.2%, about 1.6% to about 2.4%, about 1.6% to about 2.6%, about 1.8% to about 2%, about 1.8% to about 2.2%, about 1.8% to about 2.4%, about 1.8% to about 2.6%, about 2% to about 2.2%, about 2% to about 2.4%, about 2% to about 2.6%, about 2.2% to about 2.4%, about 2.2% to about 2.6%, or about 2.4% to about 2.6%. Optionally, in some embodiments, the resistance of the graphene changes after about 1,000 cycles of bending at a bending radius of about 10 millimeters by about 0.8%, about 1%, about 1.2%, about 1.4%, about 1.6%, about 1.8%, about 2%, about 2.2%, about 2.4%, or about 2.6%. Optionally, in some embodiments, the resistance of the graphene changes after about 1,000 cycles of bending at a bending radius of about 10 millimeters by at least about 0.8%, about 1%, about 1.2%, about 1.4%, about 1.6%, about 1.8%, about 2%, about 2.2%, about 2.4%, or about 2.6%. Optionally, in some embodiments, the resistance of the graphene changes after about 1,000 cycles of bending at a bending radius of about 10 millimeters by no more than about 0.8%, about 1%, about 1.2%, about 1.4%, about 1.6%, about 1.8%, about 2%, about 2.2%, about 2.4%, or about 2.6%.

Optionally, in some embodiments, the resistance of the graphene changes after about 2,000 cycles of bending at a bending radius of about 10 millimeters by about 0.8% to about 2.6%. Optionally, in some embodiments, the resistance of the graphene changes after about 2,000 cycles of bending at a bending radius of about 10 millimeters by at least about 0.8%. Optionally, in some embodiments, the resistance of the graphene changes after about 2,000 cycles of bending at a bending radius of about 10 millimeters by at most about 2.6%. Optionally, in some embodiments, the resistance of the graphene changes after about 2,000 cycles of bending at a bending radius of about 10 millimeters by about 0.8% to about 1%, about 0.8% to about 1.2%, about 0.8% to about 1.4%, about 0.8% to about 1.6%, about 0.8% to about 1.8%, about 0.8% to about 2%, about 0.8% to about 2.2%, about 0.8% to about 2.4%, about 0.8% to about 2.6%, about 1% to about 1.2%, about 1% to about 1.4%, about 1% to about 1.6%, about 1% to about 1.8%, about 1% to about 2%, about 1% to about 2.2%, about 1% to about 2.4%, about 1% to about 2.6%, about 1.2% to about 1.4%, about 1.2% to about 1.6%, about 1.2% to about 1.8%, about 1.2% to about 2%, about 1.2% to about 2.2%, about 1.2% to about 2.4%, about 1.2% to about 2.6%, about 1.4% to about 1.6%, about 1.4% to about 1.8%, about 1.4% to about 2%, about 1.4% to about 2.2%, about 1.4% to about 2.4%, about 1.4% to about 2.6%, about 1.6% to about 1.8%, about 1.6% to about 2%, about 1.6% to about 2.2%, about 1.6% to about 2.4%, about 1.6% to about 2.6%, about 1.8% to about 2%, about 1.8% to about 2.2%, about 1.8% to about 2.4%, about 1.8% to about 2.6%, about 2% to about 2.2%, about 2% to about 2.4%, about 2% to about 2.6%, about 2.2% to about 2.4%, about 2.2% to about 2.6%, or about 2.4% to about 2.6%. Optionally, in some embodiments, the resistance of the graphene changes after about 2,000 cycles of bending at a bending radius of about 10 millimeters by about 0.8%, about 1%, about 1.2%, about 1.4%, about 1.6%, about 1.8%, about 2%, about 2.2%, about 2.4%, or about 2.6%. Optionally, in some embodiments, the resistance of the graphene changes after about 2,000 cycles of bending at a bending radius of about 10 millimeters by at least about 0.8%, about 1%, about 1.2%, about 1.4%, about 1.6%, about 1.8%, about 2%, about 2.2%, about 2.4%, or about 2.6%. Optionally, in some embodiments, the resistance of the graphene changes after about 2,000 cycles of bending at a bending radius of about 10 millimeters by no more than about 0.8%, about 1%, about 1.2%, about 1.4%, about 1.6%, about 1.8%, about 2%, about 2.2%, about 2.4%, or about 2.6%.

Another aspect provided herein is a method of forming a conductive graphene ink comprising: forming a binder solution comprising: heating a first solvent, adding a binder to the first solvent, mixing the binder and the first solvent, and cooling the binder and the first solvent; forming an RGO dispersion comprising a second solvent and RGO; and forming a graphene solution comprising the binder solution, the reduced graphene dispersion a third solvent, a conductive additive, a surfactant, a defoamer; and mixing the graphene solution to form a conductive graphene ink.

Optionally, in some embodiments, at least one of the first solvent, the second solvent, and the third solvent comprises water and an organic solvent. Optionally, in some embodiments, the organic solvent comprises ethanol, isopropyl alcohol, NMP, cyclohexanone, terpineol, 3-methoxy-3-methyl-1-butanol, 4-hydroxyl-4-methyl-pentan-2-one, methyl isobutyl ketone, or any combination thereof. Optionally, in some embodiments, at least one of the first solvent, the second solvent, and the third solvent comprises water, ethanol, isopropyl alcohol, NMP, cyclohexanone, terpineol, 3-methoxy-3-methyl-1-butanol, 4-hydroxyl-4-methyl-pentan-2-one, methyl isobutyl ketone, or any combination thereof.

Optionally, in some embodiments, a percentage by mass of at least one of the first solvent, the second solvent, and the third solvent in the conductive graphene ink is about 1% to about 99%. Optionally, in some embodiments, a percentage by mass of at least one of the first solvent, the second solvent, and the third solvent in the conductive graphene ink is at least about 1%. Optionally, in some embodiments, a percentage by mass of at least one of the first solvent, the second solvent, and the third solvent in the conductive graphene ink is at most about 99%. Optionally, in some embodiments, a percentage by mass of at least one of the first solvent, the second solvent, and the third solvent in the conductive graphene ink is about 1% to about 2%, about 1% to about 5%, about 1% to about 10%, about 1% to about 20%, about 1% to about 30%, about 1% to about 40%, about 1% to about 50%, about 1% to about 60%, about 1% to about 70%, about 1% to about 80%, about 1% to about 99%, about 2% to about 5%, about 2% to about 10%, about 2% to about 20%, about 2% to about 30%, about 2% to about 40%, about 2% to about 50%, about 2% to about 60%, about 2% to about 70%, about 2% to about 80%, about 2% to about 99%, about 5% to about 10%, about 5% to about 20%, about 5% to about 30%, about 5% to about 40%, about 5% to about 50%, about 5% to about 60%, about 5% to about 70%, about 5% to about 80%, about 5% to about 99%, about 10% to about 20%, about 10% to about 30%, about 10% to about 40%, about 10% to about 50%, about 10% to about 60%, about 10% to about 70%, about 10% to about 80%, about 10% to about 99%, about 20% to about 30%, about 20% to about 40%, about 20% to about 50%, about 20% to about 60%, about 20% to about 70%, about 20% to about 80%, about 20% to about 99%, about 30% to about 40%, about 30% to about 50%, about 30% to about 60%, about 30% to about 70%, about 30% to about 80%, about 30% to about 99%, about 40% to about 50%, about 40% to about 60%, about 40% to about 70%, about 40% to about 80%, about 40% to about 99%, about 50% to about 60%, about 50% to about 70%, about 50% to about 80%, about 50% to about 99%, about 60% to about 70%, about 60% to about 80%, about 60% to about 99%, about 70% to about 80%, about 70% to about 99%, or about 80% to about 99%. Optionally, in some embodiments, a percentage by mass of at least one of the first solvent, the second solvent, and the third solvent in the conductive graphene ink is about 1%, about 2%, about 5%, about 10%, about 20%, about 30%, about 40%, about 50%, about 60%, about 70%, about 80%, or about 99%. Optionally, in some embodiments, a percentage by mass of at least one of the first solvent, the second solvent, and the third solvent in the conductive graphene ink is at least about 1%, about 2%, about 5%, about 10%, about 20%, about 30%, about 40%, about 50%, about 60%, about 70%, or about 80%. Optionally, in some embodiments, a percentage by mass of at least one of the first solvent, the second solvent, and the third solvent in the conductive graphene ink is at most about 2%, about 5%, about 10%, about 20%, about 30%, about 40%, about 50%, about 60%, about 70%, about 80%, or about 99%.

Optionally, in some embodiments, the binder solution comprises a binder and a first solvent. Optionally, in some embodiments, the binder comprises a polymer. Optionally, in some embodiments, the polymer comprises a synthetic polymer. Optionally, in some embodiments, the synthetic polymer comprises carboxymethyl cellulose, PVDF, poly (vinyl alcohol), poly(vinyl pyrrolidone), poly(ethylene oxide), ethyl cellulose, or any combination thereof. Optionally, in some embodiments, the binder is a dispersant.

Optionally, in some embodiments, a percentage by mass of the binder solution in the conductive graphene ink is about 0.5% to about 99%. Optionally, in some embodiments, a percentage by mass of the binder solution in the conductive graphene ink is at least about 0.5%. Optionally, in some embodiments, a percentage by mass of the binder solution in the conductive graphene ink is at most about 99%. Optionally, in some embodiments, a percentage by mass of the binder solution in the conductive graphene ink is about 0.5% to about 1%, about 0.5% to about 2%, about 0.5% to about 5%, about 0.5% to about 10%, about 0.5% to about 20%, about 0.5% to about 30%, about 0.5% to about 40%, about 0.5% to about 50%, about 0.5% to about 70%, about 0.5% to about 90%, about 0.5% to about 99%, about 1% to about 2%, about 1% to about 5%, about 1% to about 10%, about 1% to about 20%, about 1% to about 30%, about 1% to about 40%, about 1% to about 50%, about 1% to about 70%, about 1% to about 90%, about 1% to about 99%, about 2% to about 5%, about 2% to about 10%, about 2% to about 20%, about 2% to about 30%, about 2% to about 40%, about 2% to about 50%, about 2% to about 70%, about 2% to about 90%, about 2% to about 99%, about 5% to about 10%, about 5% to about 20%, about 5% to about 30%, about 5% to about 40%, about 5% to about 50%, about 5% to about 70%, about 5% to about 90%, about 5% to about 99%, about 10% to about 20%, about 10% to about 30%, about 10% to about 40%, about 10% to about 50%, about 10% to about 70%, about 10% to about 90%, about 10% to about 99%, about 20% to about 30%, about 20% to about 40%, about 20% to about 50%, about 20% to about 70%, about 20% to about 90%, about 20% to about 99%, about 30% to about 40%, about 30% to about 50%, about 30% to about 70%, about 30% to about 90%, about 30% to about 99%, about 40% to about 50%, about 40% to about 70%, about 40% to about 90%, about 40% to about 99%, about 50% to about 70%, about 50% to about 90%, about 50% to about 99%, about 70% to about 90%, about 70% to about 99%, or about 90% to about 99%. Optionally, in some embodiments, a percentage by mass of the binder solution in the conductive graphene ink is at most about 99%. Optionally, in some embodiments, a percentage by mass of the binder solution in the conductive graphene ink is about 0.5%, about 1%, about 2%, about 5%, about 10%, about 20%, about 30%, about 40%, about 50%, about 70%, about 90%, or about 99%. Optionally, in some embodiments, a percentage by mass of the binder solution in the conductive graphene ink is at least about 0.5%, about 1%, about 2%, about 5%, about 10%, about 20%, about 30%, about 40%, about 50%, about 60%, about 70%, about 80%, about 90%, about 95%, or about 99%. Alternatively or in combination, in some embodiments, a percentage by mass of the binder solution in the conductive graphene ink is no more than about 0.5%, about 1%, about 2%, about 5%, about 10%, about 20%, about 30%, about 40%, about 50%, about 60%, about 70%, about 80%, about 90%, about 95%, or about 99%.

Optionally, in some embodiments, a concentration of the binder solution by mass is about 0.5% to about 2%. Optionally, in some embodiments, a concentration of the binder solution by mass is at least about 0.5%. Optionally, in some embodiments, a concentration of the binder solution by mass is at most about 2%. Optionally, in some embodiments, a concentration of the binder solution by mass is about 0.5% to about 0.625%, about 0.5% to about 0.75%, about 0.5% to about 0.875%, about 0.5% to about 1%, about 0.5% to about 1.25%, about 0.5% to about 1.5%, about 0.5% to about 1.75%, about 0.5% to about 2%, about 0.625% to about 0.75%, about 0.625% to about 0.875%, about 0.625% to about 1%, about 0.625% to about 1.25%, about 0.625% to about 1.5%, about 0.625% to about 1.75%, about 0.625% to about 2%, about 0.75% to about 0.875%, about 0.75% to about 1%, about 0.75% to about 1.25%, about 0.75% to about 1.5%, about 0.75% to about 1.75%, about 0.75% to about 2%, about 0.875% to about 1%, about 0.875% to about 1.25%, about 0.875% to about 1.5%, about 0.875% to about 1.75%, about 0.875% to about 2%, about 1% to about 1.25%, about 1% to about 1.5%, about 1% to about 1.75%, about 1% to about 2%, about 1.25% to about 1.5%, about 1.25% to about 1.75%, about 1.25% to about 2%, about 1.5% to about 1.75%, about 1.5% to about 2%, or about 1.75% to about 2%. Optionally, in some embodiments, a concentration of the binder solution by mass is about 0.5%, about 0.625%, about 0.75%, about 0.875%, about 1%, about 1.25%, about 1.5%, about 1.75%, or about 2%. Optionally, in some embodiments, a concentration of the binder solution by mass is at least about 0.5%, about 0.625%, about 0.75%, about 0.875%, about 1%, about 1.25%, about 1.5%, about 1.75%, or about 2%. Optionally, in some embodiments, a concentration of the binder solution by mass is no more than about 0.5%, about 0.625%, about 0.75%, about 0.875%, about 1%, about 1.25%, about 1.5%, about 1.75%, or about 2%.

Optionally, in some embodiments, a percentage by mass of the RGO dispersion in the conductive graphene ink is about 0.25% to about 1%. Optionally, in some embodiments, a percentage by mass of the RGO dispersion in the conductive graphene ink is at least about 0.25%. Optionally, in some embodiments, a percentage by mass of the RGO dispersion in the conductive graphene ink is at most about 1%. Optionally, in some embodiments, a percentage by mass of the RGO dispersion in the conductive graphene ink is about 0.25% to about 0.375%, about 0.25% to about 0.5%, about 0.25% to about 0.625%, about 0.25% to about 0.75%, about 0.25% to about 1%, about 0.375% to about 0.5%, about 0.375% to about 0.625%, about 0.375% to about 0.75%, about 0.375% to about 1%, about 0.5% to about 0.625%, about 0.5% to about 0.75%, about 0.5% to about 1%, about 0.625% to about 0.75%, about 0.625% to about 1%, or about 0.75% to about 1%. Optionally, in some embodiments, a percentage by mass of the RGO dispersion in the conductive graphene ink is about 0.25%, about 0.375%, about 0.5%, about 0.625%, about 0.75%, or about 1%. Optionally, in some embodiments, a percentage by mass of the RGO dispersion in the conductive graphene ink is at least about 0.25%, about 0.375%, about 0.5%, about 0.625%, about 0.75%, or about 1%. Optionally, in some embodiments, a percentage by mass of the RGO dispersion in the conductive graphene ink is no more than about 0.25%, about 0.375%, about 0.5%, about 0.625%, about 0.75%, or about 1%.

Optionally, in some embodiments, a concentration by mass of the RGO in the RGO dispersion is about 3% to about 12%. Optionally, in some embodiments, a concentration by mass of the RGO in the RGO dispersion is at least about 3%. Optionally, in some embodiments, a concentration by mass of the RGO in the RGO dispersion is at most about 12%. Optionally, in some embodiments, a concentration by mass of the RGO in the RGO dispersion is about 3% to about 4%, about 3% to about 5%, about 3% to about 6%, about 3% to about 7%, about 3% to about 8%, about 3% to about 9%, about 3% to about 10%, about 3% to about 11%, about 3% to about 12%, about 4% to about 5%, about 4% to about 6%, about 4% to about 7%, about 4% to about 8%, about 4% to about 9%, about 4% to about 10%, about 4% to about 11%, about 4% to about 12%, about 5% to about 6%, about 5% to about 7%, about 5% to about 8%, about 5% to about 9%, about 5% to about 10%, about 5% to about 11%, about 5% to about 12%, about 6% to about 7%, about 6% to about 8%, about 6% to about 9%, about 6% to about 10%, about 6% to about 11%, about 6% to about 12%, about 7% to about 8%, about 7% to about 9%, about 7% to about 10%, about 7% to about 11%, about 7% to about 12%, about 8% to about 9%, about 8% to about 10%, about 8% to about 11%, about 8% to about 12%, about 9% to about 10%, about 9% to about 11%, about 9% to about 12%, about 10% to about 11%, about 10% to about 12%, or about 11% to about 12%. Optionally, in some embodiments, a concentration by mass of the RGO in the RGO dispersion is about 3%, about 4%, about 5%, about 6%, about 7%, about 8%, about 9%, about 10%, about 11%, or about 12%. Optionally, in some embodiments, a concentration by mass of the RGO in the RGO dispersion is at least about 3%, about 4%, about 5%, about 6%, about 7%, about 8%, about 9%, about 10%, about 11%, or about 12%. Optionally, in some embodiments, a concentration by mass of the RGO in the RGO dispersion is no more than about 3%, about 4%, about 5%, about 6%, about 7%, about 8%, about 9%, about 10%, about 11%, or about 12%.

Optionally, in some embodiments, a percentage by mass of the RGO in the conductive graphene ink is about 0.1% to about 99%. Optionally, in some embodiments, a percentage by mass of the RGO in the conductive graphene ink is at least about 0.1%. Optionally, in some embodiments, a percentage by mass of the RGO in the conductive graphene ink is at most about 99%. Optionally, in some embodiments, a percentage by mass of the RGO in the conductive graphene ink is about 0.1% to about 0.2%, about 0.1% to about 0.5%, about 0.1% to about 1%, about 0.1% to about 10%, about 0.1% to about 20%, about 0.1% to about 40%, about 0.1% to about 60%, about 0.1% to about 80%, about 0.1% to about 90%, about 0.1% to about 99%, about 0.2% to about 0.5%, about 0.2% to about 1%, about 0.2% to about 10%, about 0.2% to about 20%, about 0.2% to about 40%, about 0.2% to about 60%, about 0.2% to about 80%, about 0.2% to about 90%, about 0.2% to about 99%, about 0.5% to about 1%, about 0.5% to about 10%, about 0.5% to about 20%, about 0.5% to about 40%, about 0.5% to about 60%, about 0.5% to about 80%, about 0.5% to about 90%, about 0.5% to about 99%, about 1% to about 10%, about 1% to about 20%, about 1% to about 40%, about 1% to about 60%, about 1% to about 80%, about 1% to about 90%, about 1% to about 99%, about 10% to about 20%, about 10% to about 40%, about 10% to about 60%, about 10% to about 80%, about 10% to about 90%, about 10% to about 99%, about 20% to about 40%, about 20% to about 60%, about 20% to about 80%, about 20% to about 90%, about 20% to about 99%, about 40% to about 60%, about 40% to about 80%, about 40% to about 90%, about 40% to about 99%, about 60% to about 80%, about 60% to about 90%, about 60% to about 99%, about 80% to about 90%, about 80% to about 99%, or about 90% to about 99%. Optionally, in some embodiments, a percentage by mass of the RGO in the conductive graphene ink is about 0.1%, about 0.2%, about 0.5%, about 1%, about 10%, about 20%, about 40%, about 60%, about 80%, about 90%, or about 99%. Optionally, in some embodiments, a percentage by mass of the RGO in the conductive graphene ink is at least about 0.1%, about 0.2%, about 0.5%, about 1%, about 10%, about 20%, about 40%, about 60%, about 80%, about 90%, or about 99%. Optionally, in some embodiments, a percentage by mass of the RGO in the conductive graphene ink is no more than about 0.1%, about 0.2%, about 0.5%, about 1%, about 10%, about 20%, about 40%, about 60%, about 80%, about 90%, or about 99%.

Optionally, in some embodiments, the conductive additive comprises a carbon-based material. Optionally, in some embodiments, the carbon-based material comprises a paracrystalline carbon. Optionally, in some embodiments, the paracrystalline carbon comprises carbon black, acetylene black, channel black, furnace black, lamp black, thermal black, or any combination thereof.

Optionally, in some embodiments, the conductive additive comprises silver. Optionally, in some embodiments, the silver comprises silver nanoparticles, silver nanorods, silver nanowires, silver nanoflowers, silver nanofibers, silver nanoplatelets, silver nanoribbons, silver nanocubes, silver bipyramids, or any combination thereof.

Optionally, in some embodiments, a percentage by mass of the conductive additive in the conductive graphene ink is about 2% to about 99%. Optionally, in some embodiments, a percentage by mass of the conductive additive in the conductive graphene ink is at least about 2%. Optionally, in some embodiments, a percentage by mass of the conductive additive in the conductive graphene ink is at most about 99%. Optionally, in some embodiments, a percentage by mass of the conductive additive in the conductive graphene ink is about 2% to about 5%, about 2% to about 10%, about 2% to about 20%, about 2% to about 30%, about 2% to about 40%, about 2% to about 50%, about 2% to about 60%, about 2% to about 70%, about 2% to about 80%, about 2% to about 90%, about 2% to about 99%, about 5% to about 10%, about 5% to about 20%, about 5% to about 30%, about 5% to about 40%, about 5% to about 50%, about 5% to about 60%, about 5% to about 70%, about 5% to about 80%, about 5% to about 90%, about 5% to about 99%, about 10% to about 20%, about 10% to about 30%, about 10% to about 40%, about 10% to about 50%, about 10% to about 60%, about 10% to about 70%, about 10% to about 80%, about 10% to about 90%, about 10% to about 99%, about 20% to about 30%, about 20% to about 40%, about 20% to about 50%, about 20% to about 60%, about 20% to about 70%, about 20% to about 80%, about 20% to about 90%, about 20% to about 99%, about 30% to about 40%, about 30% to about 50%, about 30% to about 60%, about 30% to about 70%, about 30% to about 80%, about 30% to about 90%, about 30% to about 99%, about 40% to about 50%, about 40% to about 60%, about 40% to about 70%, about 40% to about 80%, about 40% to about 90%, about 40% to about 99%, about 50% to about 60%, about 50% to about 70%, about 50% to about 80%, about 50% to about 90%, about 50% to about 99%, about 60% to about 70%, about 60% to about 80%, about 60% to about 90%, about 60% to about 99%, about 70% to about 80%, about 70% to about 90%, about 70% to about 99%, about 80% to about 90%, about 80% to about 99%, or about 90% to about 99%. Optionally, in some embodiments, a percentage by mass of the conductive additive in the conductive graphene ink is about 2%, about 5%, about 10%, about 20%, about 30%, about 40%, about 50%, about 60%, about 70%, about 80%, about 90%, or about 99%. Optionally, in some embodiments, a percentage by mass of the conductive additive in the conductive graphene ink is at least about 2%, about 5%, about 10%, about 20%, about 30%, about 40%, about 50%, about 60%, about 70%, about 80%, about 90%, or about 99%. Optionally, in some embodiments, a percentage by mass of the conductive additive in the conductive graphene ink is no more than about 2%, about 5%, about 10%, about 20%, about 30%, about 40%, about 50%, about 60%, about 70%, about 80%, about 90%, or about 99%.

Some embodiments further comprise a surfactant. Optionally, in some embodiments, the surfactant comprises an acid, a nonionic surfactant, or any combination thereof. Optionally, in some embodiments, the acid comprises perfluorooctanoic acid, perfluorooctane sulfonate, perfluorohexane sulfonic acid, perfluorononanoic acid, perfluorodecanoic acid, or any combination thereof. Optionally, in some embodiments, the nonionic surfactant comprises a polyethylene glycol alkyl ether, a octaethylene glycol monododecyl ether, a pentaethylene glycol monododecyl ether, a polypropylene glycol alkyl ether, a glucoside alkyl ether, decyl glucoside, lauryl glucoside, octyl glucoside, a polyethylene glycol octylphenyl ether, dodecyldimethylamine oxide, a polyethylene glycol alkylphenyl ether, a polyethylene glycol octylphenyl ether, Triton X-100, polyethylene glycol alkylphenyl ether, nonoxynol-9, a glycerol alkyl ester polysorbate, sorbitan alkyl ester, polyethoxylated tallow amine, Dynol 604, or any combination thereof.

Optionally, in some embodiments, a percentage by mass of the surfactant in the conductive graphene ink is about 0.5% to about 10%. Optionally, in some embodiments, a percentage by mass of the surfactant in the conductive graphene ink is at least about 0.5%. Optionally, in some embodiments, a percentage by mass of the surfactant in the conductive graphene ink is at most about 10%. Optionally, in some embodiments, a percentage by mass of the surfactant in the conductive graphene ink is about 0.5% to about 1%, about 0.5% to about 2%, about 0.5% to about 3%, about 0.5% to about 4%, about 0.5% to about 5%, about 0.5% to about 6%, about 0.5% to about 7%, about 0.5% to about 8%, about 0.5% to about 9%, about 0.5% to about 10%, about 1% to about 2%, about 1% to about 3%, about 1% to about 4%, about 1% to about 5%, about 1% to about 6%, about 1% to about 7%, about 1% to about 8%, about 1% to about 9%, about 1% to about 10%, about 2% to about 3%, about 2% to about 4%, about 2% to about 5%, about 2% to about 6%, about 2% to about 7%, about 2% to about 8%, about 2% to about 9%, about 2% to about 10%, about 3% to about 4%, about 3% to about 5%, about 3% to about 6%, about 3% to about 7%, about 3% to about 8%, about 3% to about 9%, about 3% to about 10%, about 4% to about 5%, about 4% to about 6%, about 4% to about 7%, about 4% to about 8%, about 4% to about 9%, about 4% to about 10%, about 5% to about 6%, about 5% to about 7%, about 5% to about 8%, about 5% to about 9%, about 5% to about 10%, about 6% to about 7%, about 6% to about 8%, about 6% to about 9%, about 6% to about 10%, about 7% to about 8%, about 7% to about 9%, about 7% to about 10%, about 8% to about 9%, about 8% to about 10%, or about 9% to about 10%. Optionally, in some embodiments, a percentage by mass of the surfactant in the conductive graphene ink is about 0.5%, about 1%, about 2%, about 3%, about 4%, about 5%, about 6%, about 7%, about 8%, about 9%, or about 10%. Optionally, in some embodiments, a percentage by mass of the surfactant in the conductive graphene ink is at least about 0.5%, about 1%, about 2%, about 3%, about 4%, about 5%, about 6%, about 7%, about 8%, about 9%, or about 10%. Optionally, in some embodiments, a percentage by mass of the surfactant in the conductive graphene ink is no more than about 0.5%, about 1%, about 2%, about 3%, about 4%, about 5%, about 6%, about 7%, about 8%, about 9%, or about 10%.

Some embodiments further comprise a defoamer, wherein the defoamer comprises an insoluble oil, a silicone, a glycol, a stearate, an organic solvent, Surfynol DF-1100, alkyl polyacrylate, or any combination thereof. Optionally, in some embodiments, the insoluble oil comprises mineral oil, vegetable oil, white oil, or any combination thereof. Optionally, in some embodiments, the silicone comprises polydimethylsiloxane, silicone glycol, a fluorosilicone, or any combination thereof. Optionally, in some embodiments, the glycol comprises polyethylene glycol, ethylene glycol, propylene glycol, or any combination thereof. Optionally, in some embodiments, the stearate comprises glycol stearate, stearin, or any combination thereof. Optionally, in some embodiments, the organic solvent comprises ethanol, isopropyl alcohol, NMP, cyclohexanone, terpineol, 3-methoxy- 3-methyl-1-butanol, 4-hydroxyl-4-methyl-pentan-2-one, methyl isobutyl ketone, or any combination thereof.

Optionally, in some embodiments, a percentage by mass of the defoamer in the conductive graphene ink is about 0.5% to about 10%. Optionally, in some embodiments, a percentage by mass of the defoamer in the conductive graphene ink is at least about 0.5%. Optionally, in some embodiments, a percentage by mass of the defoamer in the conductive graphene ink is at most about 10%. Optionally, in some embodiments, a percentage by mass of the defoamer in the conductive graphene ink is about 0.5% to about 1%, about 0.5% to about 2%, about 0.5% to about 3%, about 0.5% to about 4%, about 0.5% to about 5%, about 0.5% to about 6%, about 0.5% to about 7%, about 0.5% to about 8%, about 0.5% to about 9%, about 0.5% to about 10%, about 1% to about 2%, about 1% to about 3%, about 1% to about 4%, about 1% to about 5%, about 1% to about 6%, about 1% to about 7%, about 1% to about 8%, about 1% to about 9%, about 1% to about 10%, about 2% to about 3%, about 2% to about 4%, about 2% to about 5%, about 2% to about 6%, about 2% to about 7%, about 2% to about 8%, about 2% to about 9%, about 2% to about 10%, about 3% to about 4%, about 3% to about 5%, about 3% to about 6%, about 3% to about 7%, about 3% to about 8%, about 3% to about 9%, about 3% to about 10%, about 4% to about 5%, about 4% to about 6%, about 4% to about 7%, about 4% to about 8%, about 4% to about 9%, about 4% to about 10%, about 5% to about 6%, about 5% to about 7%, about 5% to about 8%, about 5% to about 9%, about 5% to about 10%, about 6% to about 7%, about 6% to about 8%, about 6% to about 9%, about 6% to about 10%, about 7% to about 8%, about 7% to about 9%, about 7% to about 10%, about 8% to about 9%, about 8% to about 10%, or about 9% to about 10%. Optionally, in some embodiments, a percentage by mass of the defoamer in the conductive graphene ink is about 0.5%, about 1%, about 2%, about 3%, about 4%, about 5%, about 6%, about 7%, about 8%, about 9%, or about 10%. Optionally, in some embodiments, a percentage by mass of the defoamer in the conductive graphene ink is at least about 0.5%, about 1%, about 2%, about 3%, about 4%, about 5%, about 6%, about 7%, about 8%, about 9%, or about 10%. Optionally, in some embodiments, a percentage by mass of the defoamer in the conductive graphene ink is no more than about 0.5%, about 1%, about 2%, about 3%, about 4%, about 5%, about 6%, about 7%, about 8%, about 9%, or about 10%.

Optionally, in some embodiments, the solid matter content by mass of the conductive graphene ink is about 2.5% to about 10.5%. Optionally, in some embodiments, the solid matter content by mass of the conductive graphene ink is at least about 2.5%. Optionally, in some embodiments, the solid matter content by mass of the conductive graphene ink is at most about 10.5%. Optionally, in some embodiments, the solid matter content by mass of the conductive graphene ink is about 2.5% to about 3.5%, about 2.5% to about 4.5%, about 2.5% to about 5.5%, about 2.5% to about 6.5%, about 2.5% to about 7.5%, about 2.5% to about 8.5%, about 2.5% to about 9.5%, about 2.5% to about 10.5%, about 3.5% to about 4.5%, about 3.5% to about 5.5%, about 3.5% to about 6.5%, about 3.5% to about 7.5%, about 3.5% to about 8.5%, about 3.5% to about 9.5%, about 3.5% to about 10.5%, about 4.5% to about 5.5%, about 4.5% to about 6.5%, about 4.5% to about 7.5%, about 4.5% to about 8.5%, about 4.5% to about 9.5%, about 4.5% to about 10.5%, about 5.5% to about 6.5%, about 5.5% to about 7.5%, about 5.5% to about 8.5%, about 5.5% to about 9.5%, about 5.5% to about 10.5%, about 6.5% to about 7.5%, about 6.5% to about 8.5%, about 6.5% to about 9.5%, about 6.5% to about 10.5%, about 7.5% to about 8.5%, about 7.5% to about 9.5%, about 7.5% to about 10.5%, about 8.5% to about 9.5%, about 8.5% to about 10.5%, or about 9.5% to about 10.5%. Optionally, in some embodiments, the solid matter content by mass of the conductive graphene ink is about 2.5%, about 3.5%, about 4.5%, about 5.5%, about 6.5%, about 7.5%, about 8.5%, about 9.5%, or about 10.5%. Optionally, in some embodiments, the solid matter content by mass of the conductive graphene ink is at least about 2.5%, about 3.5%, about 4.5%, about 5.5%, about 6.5%, about 7.5%, about 8.5%, about 9.5%, or about 10.5%. Optionally, in some embodiments, the solid matter content by mass of the conductive graphene ink is no more than about 2.5%, about 3.5%, about 4.5%, about 5.5%, about 6.5%, about 7.5%, about 8.5%, about 9.5%, or about 10.5%.

Optionally, in some embodiments, the first solvent is heated to a temperature of about 35° C. to about 125° C. Optionally, in some embodiments, the first solvent is heated to a temperature of at least about 35° C. Optionally, in some embodiments, the first solvent is heated to a temperature of at most about 125° C. Optionally, in some embodiments, the first solvent is heated to a temperature of about 35° C. to about 40° C., about 35° C. to about 50° C., about 35° C. to about 60° C., about 35° C. to about 70° C., about 35° C. to about 80° C., about 35° C. to about 90° C., about 35° C. to about 100° C., about 35° C. to about 125° C., about 40° C. to about 50° C., about 40° C. to about 60° C., about 40° C. to about 70° C., about 40° C. to about 80° C., about 40° C. to about 90° C., about 40° C. to about 100° C., about 40° C. to about 125° C., about 50° C. to about 60° C., about 50° C. to about 70° C., about 50° C. to about 80° C., about 50° C. to about 90° C., about 50° C. to about 100° C., about 50° C. to about 125° C., about 60° C. to about 70° C., about 60° C. to about 80° C., about 60° C. to about 90° C., about 60° C. to about 100° C., about 60° C. to about 125° C., about 70° C. to about 80° C., about 70° C. to about 90° C., about 70° C. to about 100° C., about 70° C. to about 125° C., about 80° C. to about 90° C., about 80° C. to about 100° C., about 80° C. to about 125° C., about 90° C. to about 100° C., about 90° C. to about 125° C., or about 100° C. to about 125° C. Optionally, in some embodiments, the first solvent is heated to a temperature of about 35° C., about 40° C., about 50° C., about 60° C., about 70° C., about 80° C., about 90° C., about 100° C., or about 125° C. Optionally, in some embodiments, the first solvent is heated to a temperature of at least about 35° C., about 40° C., about 50° C., about 60° C., about 70° C., about 80° C., about 90° C., about 100° C., or about 125° C. Optionally, in some embodiments, the first solvent is heated to a temperature of no more than about 35° C., about 40° C., about 50° C., about 60° C., about 70° C., about 80° C., about 90° C., about 100° C., or about 125° C.

Optionally, in some embodiments, the process of adding a binder to the first solvent and the process of mixing the binder and the first solvent are preformed simultaneously.

Optionally, in some embodiments, the binder is added to the first solvent over a period of time of about 45 minutes to about 240 minutes. Optionally, in some embodiments, the binder is added to the first solvent over a period of time of at least about 45 minutes. Optionally, in some embodiments, the binder is added to the first solvent over a period of time of at most about 240 minutes. Optionally, in some embodiments, the binder is added to the first solvent over a period of time of about 45 minutes to about 60 minutes, about 45 minutes to about 90 minutes, about 45 minutes to about 120 minutes, about 45 minutes to about 150 minutes, about 45 minutes to about 180 minutes, about 45 minutes to about 210 minutes, about 45 minutes to about 240 minutes, about 60 minutes to about 90 minutes, about 60 minutes to about 120 minutes, about 60 minutes to about 150 minutes, about 60 minutes to about 180 minutes, about 60 minutes to about 210 minutes, about 60 minutes to about 240 minutes, about 90 minutes to about 120 minutes, about 90 minutes to about 150 minutes, about 90 minutes to about 180 minutes, about 90 minutes to about 210 minutes, about 90 minutes to about 240 minutes, about 120 minutes to about 150 minutes, about 120 minutes to about 180 minutes, about 120 minutes to about 210 minutes, about 120 minutes to about 240 minutes, about 150 minutes to about 180 minutes, about 150 minutes to about 210 minutes, about 150 minutes to about 240 minutes, about 180 minutes to about 210 minutes, about 180 minutes to about 240 minutes, or about 210 minutes to about 240 minutes. Optionally, in some embodiments, the binder is added to the first solvent over a period of time of about 45 minutes, about 60 minutes, about 90 minutes, about 120 minutes, about 150 minutes, about 180 minutes, about 210 minutes, or about 240 minutes. Optionally, in some embodiments, the binder is added to the first solvent over a period of time of at least about 45 minutes, about 60 minutes, about 90 minutes, about 120 minutes, about 150 minutes, about 180 minutes, about 210 minutes, or about 240 minutes. Optionally, in some embodiments, the binder is added to the first solvent over a period of time of no more than about 45 minutes, about 60 minutes, about 90 minutes, about 120 minutes, about 150 minutes, about 180 minutes, about 210 minutes, or about 240 minutes.

Optionally, in some embodiments, after the binder is fully added to the first solvent, the binder and the first solvent are mixed for a period of time of about 7 minutes to about 30 minutes. Optionally, in some embodiments, after the binder is fully added to the first solvent, the binder and the first solvent are mixed for a period of time of at least about 7 minutes. Optionally, in some embodiments, after the binder is fully added to the first solvent, the binder and the first solvent are mixed for a period of time of at most about 30 minutes. Optionally, in some embodiments, after the binder is fully added to the first solvent, the binder and the first solvent are mixed for a period of time of about 7 minutes to about 9 minutes, about 7 minutes to about 11 minutes, about 7 minutes to about 13 minutes, about 7 minutes to about 15 minutes, about 7 minutes to about 20 minutes, about 7 minutes to about 25 minutes, about 7 minutes to about 30 minutes, about 9 minutes to about 11 minutes, about 9 minutes to about 13 minutes, about 9 minutes to about 15 minutes, about 9 minutes to about 20 minutes, about 9 minutes to about 25 minutes, about 9 minutes to about 30 minutes, about 11 minutes to about 13 minutes, about 11 minutes to about 15 minutes, about 11 minutes to about 20 minutes, about 11 minutes to about 25 minutes, about 11 minutes to about 30 minutes, about 13 minutes to about 15 minutes, about 13 minutes to about 20 minutes, about 13 minutes to about 25 minutes, about 13 minutes to about 30 minutes, about 15 minutes to about 20 minutes, about 15 minutes to about 25 minutes, about 15 minutes to about 30 minutes, about 20 minutes to about 25 minutes, about 20 minutes to about 30 minutes, or about 25 minutes to about 30 minutes. Optionally, in some embodiments, after the binder is fully added to the first solvent, the binder and the first solvent are mixed for a period of time of about 7 minutes, about 9 minutes, about 11 minutes, about 13 minutes, about 15 minutes, about 20 minutes, about 25 minutes, or about 30 minutes. Optionally, in some embodiments, after the binder is fully added to the first solvent, the binder and the first solvent are mixed for a period of time of at least about 7 minutes, about 9 minutes, about 11 minutes, about 13 minutes, about 15 minutes, about 20 minutes, about 25 minutes, or about 30 minutes. Optionally, in some embodiments, after the binder is fully added to the first solvent, the binder and the first solvent are mixed for a period of time of no more than about 7 minutes, about 9 minutes, about 11 minutes, about 13 minutes, about 15 minutes, about 20 minutes, about 25 minutes, or about 30 minutes.

Optionally, in some embodiments, the mixing of the binder solution, the first solvent, the conductive additive, and the RGO dispersion is performed by a second mechanical mixer.

Optionally, in some embodiments, the mixing of the binder and the first solvent is performed by a first mechanical mixer.

Optionally, in some embodiments, the second mechanical mixer mixes the graphene solution at a stirring speed of about 15 rpm to about 125 rpm. Optionally, in some embodiments, the second mechanical mixer mixes the graphene solution at a stirring speed of at least about 15 rpm. Optionally, in some embodiments, the second mechanical mixer mixes the graphene solution at a stirring speed of at most about 125 rpm. Optionally, in some embodiments, the second mechanical mixer mixes the graphene solution at a stirring speed of about 15 rpm to about 20 rpm, about 15 rpm to about 25 rpm, about 15 rpm to about 30 rpm, about 15 rpm to about 40 rpm, about 15 rpm to about 50 rpm, about 15 rpm to about 75 rpm, about 15 rpm to about 100 rpm, about 15 rpm to about 125 rpm, about 20 rpm to about 25 rpm, about 20 rpm to about 30 rpm, about 20 rpm to about 40 rpm, about 20 rpm to about 50 rpm, about 20 rpm to about 75 rpm, about 20 rpm to about 100 rpm, about 20 rpm to about 125 rpm, about 25 rpm to about 30 rpm, about 25 rpm to about 40 rpm, about 25 rpm to about 50 rpm, about 25 rpm to about 75 rpm, about 25 rpm to about 100 rpm, about 25 rpm to about 125 rpm, about 30 rpm to about 40 rpm, about 30 rpm to about 50 rpm, about 30 rpm to about 75 rpm, about 30 rpm to about 100 rpm, about 30 rpm to about 125 rpm, about 40 rpm to about 50 rpm, about 40 rpm to about 75 rpm, about 40 rpm to about 100 rpm, about 40 rpm to about 125 rpm, about 50 rpm to about 75 rpm, about 50 rpm to about 100 rpm, about 50 rpm to about 125 rpm, about 75 rpm to about 100 rpm, about 75 rpm to about 125 rpm, or about 100 rpm to about 125 rpm. Optionally, in some embodiments, the second mechanical mixer mixes the graphene solution at a stirring speed of about 15 rpm, about 20 rpm, about 25 rpm, about 30 rpm, about 40 rpm, about 50 rpm, about 75 rpm, about 100 rpm, or about 125 rpm. Optionally, in some embodiments, the second mechanical mixer mixes the graphene solution at a stirring speed of at least about 15 rpm, about 20 rpm, about 25 rpm, about 30 rpm, about 40 rpm, about 50 rpm, about 75 rpm, about 100 rpm, or about 125 rpm. Optionally, in some embodiments, the second mechanical mixer mixes the graphene solution at a stirring speed of no more than about 15 rpm, about 20 rpm, about 25 rpm, about 30 rpm, about 40 rpm, about 50 rpm, about 75 rpm, about 100 rpm, or about 125 rpm.

Optionally, in some embodiments, the second mechanical mixer mixes the graphene solution at a dispersing speed of about 50 rpm to about 4,500 rpm. Optionally, in some embodiments, the second mechanical mixer mixes the graphene solution at a dispersing speed of at least about 50 rpm. Optionally, in some embodiments, the second mechanical mixer mixes the graphene solution at a dispersing speed of at most about 4,500 rpm. Optionally, in some embodiments, the second mechanical mixer mixes the graphene solution at a dispersing speed of about 50 rpm to about 100 rpm, about 50 rpm to about 200 rpm, about 50 rpm to about 500 rpm, about 50 rpm to about 1,000 rpm, about 50 rpm to about 1,500 rpm, about 50 rpm to about 2,000 rpm, about 50 rpm to about 2,500 rpm, about 50 rpm to about 3,000 rpm, about 50 rpm to about 3,500 rpm, about 50 rpm to about 4,000 rpm, about 50 rpm to about 4,500 rpm, about 100 rpm to about 200 rpm, about 100 rpm to about 500 rpm, about 100 rpm to about 1,000 rpm, about 100 rpm to about 1,500 rpm, about 100 rpm to about 2,000 rpm, about 100 rpm to about 2,500 rpm, about 100 rpm to about 3,000 rpm, about 100 rpm to about 3,500 rpm, about 100 rpm to about 4,000 rpm, about 100 rpm to about 4,500 rpm, about 200 rpm to about 500 rpm, about 200 rpm to about 1,000 rpm, about 200 rpm to about 1,500 rpm, about 200 rpm to about 2,000 rpm, about 200 rpm to about 2,500 rpm, about 200 rpm to about 3,000 rpm, about 200 rpm to about 3,500 rpm, about 200 rpm to about 4,000 rpm, about 200 rpm to about 4,500 rpm, about 500 rpm to about 1,000 rpm, about 500 rpm to about 1,500 rpm, about 500 rpm to about 2,000 rpm, about 500 rpm to about 2,500 rpm, about 500 rpm to about 3,000 rpm, about 500 rpm to about 3,500 rpm, about 500 rpm to about 4,000 rpm, about 500 rpm to about 4,500 rpm, about 1,000 rpm to about 1,500 rpm, about 1,000 rpm to about 2,000 rpm, about 1,000 rpm to about 2,500 rpm, about 1,000 rpm to about 3,000 rpm, about 1,000 rpm to about 3,500 rpm, about 1,000 rpm to about 4,000 rpm, about 1,000 rpm to about 4,500 rpm, about 1,500 rpm to about 2,000 rpm, about 1,500 rpm to about 2,500 rpm, about 1,500 rpm to about 3,000 rpm, about 1,500 rpm to about 3,500 rpm, about 1,500 rpm to about 4,000 rpm, about 1,500 rpm to about 4,500 rpm, about 2,000 rpm to about 2,500 rpm, about 2,000 rpm to about 3,000 rpm, about 2,000 rpm to about 3,500 rpm, about 2,000 rpm to about 4,000 rpm, about 2,000 rpm to about 4,500 rpm, about 2,500 rpm to about 3,000 rpm, about 2,500 rpm to about 3,500 rpm, about 2,500 rpm to about 4,000 rpm, about 2,500 rpm to about 4,500 rpm, about 3,000 rpm to about 3,500 rpm, about 3,000 rpm to about 4,000 rpm, about 3,000 rpm to about 4,500 rpm, about 3,500 rpm to about 4,000 rpm, about 3,500 rpm to about 4,500 rpm, or about 4,000 rpm to about 4,500 rpm. Optionally, in some embodiments, the second mechanical mixer mixes the graphene solution at a dispersing speed of about 50 rpm, about 100 rpm, about 200 rpm, about 500 rpm, about 1,000 rpm, about 1,500 rpm, about 2,000 rpm, about 2,500 rpm, about 3,000 rpm, about 3,500 rpm, about 4,000 rpm, about 4,500 rpm, about 100 rpm to about 200 rpm, about 100 rpm to about 500 rpm, about 100 rpm to about 1,000 rpm, about 100 rpm to about 1,500 rpm, about 100 rpm to about 2,000 rpm, about 100 rpm to about 2,500 rpm, about 100 rpm to about 3,000 rpm, about 100 rpm to about 3,500 rpm, about 100 rpm to about 4,000 rpm, about 100 rpm to about 4,500 rpm. Optionally, in some embodiments, the second mechanical mixer mixes the graphene solution at a dispersing speed of at least about 50 rpm, about 100 rpm, about 200 rpm, about 500 rpm, about 1,000 rpm, about 1,500 rpm, about 2,000 rpm, about 2,500 rpm, about 3,000 rpm, about 3,500 rpm, about 4,000 rpm, or about 4,500 rpm. Optionally, in some embodiments, the second mechanical mixer mixes the graphene solution at a dispersing speed of no more than about 50 rpm, about 100 rpm, about 200 rpm, about 500 rpm, about 1,000 rpm, about 1,500 rpm, about 2,000 rpm, about 2,500 rpm, about 3,000 rpm, about 3,500 rpm, about 4,000 rpm, or about 4,500 rpm.

Optionally, in some embodiments, the second mechanical mixer mixes the graphene solution under a vacuum degree, and wherein the vacuum degree is equal to the ambient pressure.

Optionally, in some embodiments, the second mechanical mixer mixes the graphene solution under a vacuum degree, and wherein the vacuum degree is about −0.05 MPa to about −0.2 MPa. Optionally, in some embodiments, the second mechanical mixer mixes the graphene solution under a vacuum degree, and wherein the vacuum degree is at least about −0.05 MPa. Optionally, in some embodiments, the second mechanical mixer mixes the graphene solution under a vacuum degree, and wherein the vacuum degree is at most about −0.2 MPa. Optionally, in some embodiments, the second mechanical mixer mixes the graphene solution under a vacuum degree, and wherein the vacuum degree is about −0.05 MPa to about −0.0625 MPa, about −0.05 MPa to about −0.0875 MPa, about −0.05 MPa to about −0.1 MPa, about −0.05 MPa to about −0.1125 MPa, about −0.05 MPa to about −0.125 MPa, about −0.05 MPa to about −0.1375 MPa, about −0.05 MPa to about −0.15 MPa, about −0.05 MPa to about −0.1625 MPa, about −0.05 MPa to about −0.1875 MPa, about −0.05 MPa to about −0.2 MPa, about −0.0625 MPa to about −0.0875 MPa, about −0.0625 MPa to about −0.1 MPa, about −0.0625 MPa to about −0.1125 MPa, about −0.0625 MPa to about −0.125 MPa, about −0.0625 MPa to about −0.1375 MPa, about −0.0625 MPa to about −0.15 MPa, about −0.0625 MPa to about −0.1625 MPa, about −0.0625 MPa to about −0.1875 MPa, about −0.0625 MPa to about −0.2 MPa, about −0.0875 MPa to about −0.1 MPa, about −0.0875 MPa to about −0.1125 MPa, about −0.0875 MPa to about −0.125 MPa, about −0.0875 MPa to about −0.1375 MPa, about −0.0875 MPa to about −0.15 MPa, about −0.0875 MPa to about −0.1625 MPa, about −0.0875 MPa to about −0.1875 MPa, about −0.0875 MPa to about −0.2 MPa, about −0.1 MPa to about −0.1125 MPa, about −0.1 MPa to about −0.125 MPa, about −0.1 MPa to about −0.1375 MPa, about −0.1 MPa to about −0.15 MPa, about −0.1 MPa to about −0.1625 MPa, about −0.1 MPa to about −0.1875 MPa, about −0.1 MPa to about −0.2 MPa, about −0.1125 MPa to about −0.125 MPa, about −0.1125 MPa to about −0.1375 MPa, about −0.1125 MPa to about −0.15 MPa, about −0.1125 MPa to about −0.1625 MPa, about −0.1125 MPa to about −0.1875 MPa, about −0.1125 MPa to about −0.2 MPa, about −0.125 MPa to about −0.1375 MPa, about −0.125 MPa to about −0.15 MPa, about −0.125 MPa to about −0.1625 MPa, about −0.125 MPa to about −0.1875 MPa, about −0.125 MPa to about −0.2 MPa, about −0.1375 MPa to about −0.15 MPa, about −0.1375 MPa to about −0.1625 MPa, about −0.1375 MPa to about −0.1875 MPa, about −0.1375 MPa to about −0.2 MPa, about −0.15 MPa to about −0.1625 MPa, about −0.15 MPa to about −0.1875 MPa, about −0.15 MPa to about −0.2 MPa, about −0.1625 MPa to about −0.1875 MPa, about −0.1625 MPa to about −0.2 MPa, or about −0.1875 MPa to about −0.2 MPa. Optionally, in some embodiments, the second mechanical mixer mixes the graphene solution under a vacuum degree, and wherein the vacuum degree is about −0.05 MPa, about −0.0625 MPa, about −0.0875 MPa, about −0.1 MPa, about −0.1125 MPa, about −0.125 MPa, about −0.1375 MPa, about −0.15 MPa, about −0.1625 MPa, about −0.1875 MPa, or about −0.2 MPa. Optionally, in some embodiments, the second mechanical mixer mixes the graphene solution under a vacuum degree, and wherein the vacuum degree is at least about −0.05 MPa, about −0.0625 MPa, about −0.0875 MPa, about −0.1 MPa, about −0.1125 MPa, about −0.125 MPa, about −0.1375 MPa, about −0.15

MPa, about −0.1625 MPa, about −0.1875 MPa, or about −0.2 MPa. Optionally, in some embodiments, the second mechanical mixer mixes the graphene solution under a vacuum degree, and wherein the vacuum degree is no more than about −0.05 MPa, about −0.0625 MPa, about −0.0875 MPa, about −0.1 MPa, about −0.1125 MPa, about −0.125 MPa, about −0.1375 MPa, about −0.15 MPa, about −0.1625 MPa, about −0.1875 MPa, or about −0.2 MPa.

Optionally, in some embodiments, the second mechanical mixer mixes the graphene solution during one or more intervals, wherein each interval comprises a period of time of about 0.5 minute to about 30 minutes. Optionally, in some embodiments, the second mechanical mixer mixes the graphene solution during one or more intervals, wherein each interval comprises a period of time of at least about 0.5 minute. Optionally, in some embodiments, the second mechanical mixer mixes the graphene solution during one or more intervals, wherein each interval comprises a period of time of at most about 30 minutes. Optionally, in some embodiments, the second mechanical mixer mixes the graphene solution during one or more intervals, wherein each interval comprises a period of time of about 0.5 minute to about 1 minute, about 0.5 minute to about 2 minutes, about 0.5 minute to about 3 minutes, about 0.5 minute to about 4 minutes, about 0.5 minute to about 5 minutes, about 0.5 minute to about 10 minutes, about 0.5 minute to about 15 minutes, about 0.5 minute to about 20 minutes, about 0.5 minute to about 25 minutes, about 0.5 minute to about 30 minutes, about 1 minute to about 2 minutes, about 1 minute to about 3 minutes, about 1 minute to about 4 minutes, about 1 minute to about 5 minutes, about 1 minute to about 10 minutes, about 1 minute to about 15 minutes, about 1 minute to about 20 minutes, about 1 minute to about 25 minutes, about 1 minute to about 30 minutes, about 2 minutes to about 3 minutes, about 2 minutes to about 4 minutes, about 2 minutes to about 5 minutes, about 2 minutes to about 10 minutes, about 2 minutes to about 15 minutes, about 2 minutes to about 20 minutes, about 2 minutes to about 25 minutes, about 2 minutes to about 30 minutes, about 3 minutes to about 4 minutes, about 3 minutes to about 5 minutes, about 3 minutes to about 10 minutes, about 3 minutes to about 15 minutes, about 3 minutes to about 20 minutes, about 3 minutes to about 25 minutes, about 3 minutes to about 30 minutes, about 4 minutes to about 5 minutes, about 4 minutes to about 10 minutes, about 4 minutes to about 15 minutes, about 4 minutes to about 20 minutes, about 4 minutes to about 25 minutes, about 4 minutes to about 30 minutes, about 5 minutes to about 10 minutes, about 5 minutes to about 15 minutes, about 5 minutes to about 20 minutes, about 5 minutes to about 25 minutes, about 5 minutes to about 30 minutes, about 10 minutes to about 15 minutes, about 10 minutes to about 20 minutes, about 10 minutes to about 25 minutes, about 10 minutes to about 30 minutes, about 15 minutes to about 20 minutes, about 15 minutes to about 25 minutes, about 15 minutes to about 30 minutes, about 20 minutes to about 25 minutes, about 20 minutes to about 30 minutes, or about 25 minutes to about 30 minutes. Optionally, in some embodiments, the second mechanical mixer mixes the graphene solution during one or more intervals, wherein each interval comprises a period of time of about 0.5 minute, about 1 minute, about 2 minutes, about 3 minutes, about 4 minutes, about 5 minutes, about 10 minutes, about 15 minutes, about 20 minutes, about 25 minutes, or about 30 minutes. Optionally, in some embodiments, the second mechanical mixer mixes the graphene solution during one or more intervals, wherein each interval comprises a period of time of at least about 0.5 minute, about 1 minute, about 2 minutes, about 3 minutes, about 4 minutes, about 5 minutes, about 10 minutes, about 15 minutes, about 20 minutes, about 25 minutes, or about 30 minutes. Optionally, in some embodiments, the second mechanical mixer mixes the graphene solution during one or more intervals, wherein each interval comprises a period of time of no more than about 0.5 minute, about 1 minute, about 2 minutes, about 3 minutes, about 4 minutes, about 5 minutes, about 10 minutes, about 15 minutes, about 20 minutes, about 25 minutes, or about 30 minutes.

Optionally, in some embodiments, the number of intervals is about 1 to about 60. Optionally, in some embodiments, the number of intervals is at least about 1. Optionally, in some embodiments, the number of intervals is at most about 60. Optionally, in some embodiments, the number of intervals is about 1 to about 2, about 1 to about 5, about 1 to about 10, about 1 to about 20, about 1 to about 30, about 1 to about 40, about 1 to about 50, about 1 to about 60, about 2 to about 5, about 2 to about 10, about 2 to about 20, about 2 to about 30, about 2 to about 40, about 2 to about 50, about 2 to about 60, about 5 to about 10, about 5 to about 20, about 5 to about 30, about 5 to about 40, about 5 to about 50, about 5 to about 60, about 10 to about 20, about 10 to about 30, about 10 to about 40, about 10 to about 50, about 10 to about 60, about 20 to about 30, about 20 to about 40, about 20 to about 50, about 20 to about 60, about 30 to about 40, about 30 to about 50, about 30 to about 60, about 40 to about 50, about 40 to about 60, or about 50 to about 60. Optionally, in some embodiments, the number of intervals is about 1, about 2, about 5, about 10, about 20, about 30, about 40, about 50, or about 60. Optionally, in some embodiments, the number of intervals is at least about 1, about 2, about 5, about 10, about 20, about 30, about 40, about 50, or about 60. Optionally, in some embodiments, the number of intervals is no more than about 1, about 2, about 5, about 10, about 20, about 30, about 40, about 50, or about 60.

Optionally, in some embodiments, the RGO dispersion is added after the first, second, third, fourth, fifth, sixth, seventh, eighth, ninth, tenth, eleventh, twelfth, thirteenth, fourteenth, or the fifteenth interval, or any combination thereof.

Optionally, in some embodiments, a period of time of a first interval is about 5 minutes, and wherein the stirring speed is about 30 rpm. Optionally, in some embodiments, a period of time of a second interval is about 5 minutes, and wherein the stirring speed is about 50 rpm. Optionally, in some embodiments, a period of time of a third interval is about 5 minutes, wherein the stirring speed is about 75 rpm, and wherein the dispersing speed is about 100 rpm. Optionally, in some embodiments, a period of time of a fourth interval is about 5 minutes, wherein the stirring speed is about 75 rpm, and wherein the dispersing speed is about 300 rpm. Optionally, in some embodiments, a period of time of a fifth interval is about 5 minutes, wherein the stirring speed is about 75 rpm, and wherein the dispersing speed is about 500 rpm. Optionally, in some embodiments, a period of time of a sixth interval is about 1 minute, and wherein the stirring speed is about 30 rpm. Optionally, in some embodiments, a period of time of a seventh interval is about 1 minute, wherein the stirring speed is about 100 rpm, and wherein the dispersing speed is about 50 rpm. Optionally, in some embodiments, a period of time of an eighth interval is about 5 minutes, wherein the stirring speed is about 75 rpm, and wherein the dispersing speed is about 500 rpm. Optionally, in some embodiments, a period of time of a ninth interval is about 10 minutes, wherein the stirring speed is about 75 rpm, and wherein the dispersing speed is about 1,000 rpm.

Optionally, in some embodiments, a period of time of a tenth interval is about 5 minutes, wherein the stirring speed is about 75 rpm, and wherein the dispersing speed is about 3,000 rpm. Optionally, in some embodiments, a period of time of an eleventh interval is about 5 minutes, wherein the stirring speed is about 30 rpm, and wherein the dispersing speed is about 100 rpm. Optionally, in some embodiments, a period of time of a twelfth interval is about 5 minutes, wherein the stirring speed is about 50 rpm, and wherein the dispersing speed is about 500 rpm. Optionally, in some embodiments, a period of time of a thirteenth interval is about 5 minutes, wherein the stirring speed is about 750 rpm, and wherein the dispersing speed is about 1,000 rpm. Optionally, in some embodiments, a period of time of a fourteenth interval is about 5 minutes, wherein the stirring speed is about 750 rpm, and wherein the dispersing speed is about 3,000 rpm. Optionally, in some embodiments, a period of time of a fifteenth interval is about 30 minutes, wherein the stirring speed is about 750 rpm, and wherein the dispersing speed is about 3,000 rpm.

Optionally, in some embodiments, the binder and the first solvent are cooled to a temperature of about 10° C. to about 40° C. Optionally, in some embodiments, the binder and the first solvent are cooled to a temperature of at least about 10° C. Optionally, in some embodiments, the binder and the first solvent are cooled to a temperature of at most about 40° C. Optionally, in some embodiments, the binder and the first solvent are cooled to a temperature of about 10° C. to about 15° C., about 10° C. to about 20° C., about 10° C. to about 25° C., about 10° C. to about 30° C., about 10° C. to about 35° C., about 10° C. to about 40° C., about 15° C. to about 20° C., about 15° C. to about 25° C., about 15° C. to about 30° C., about 15° C. to about 35° C., about 15° C. to about 40° C., about 20° C. to about 25° C., about 20° C. to about 30° C., about 20° C. to about 35° C., about 20° C. to about 40° C., about 25° C. to about 30° C., about 25° C. to about 35° C., about 25° C. to about 40° C., about 30° C. to about 35° C., about 30° C. to about 40° C., or about 35° C. to about 40° C. Optionally, in some embodiments, the binder and the first solvent are cooled to a temperature of about 10° C., about 15° C., about 20° C., about 25° C., about 30° C., about 35° C., or about 40° C. Optionally, in some embodiments, the binder and the first solvent are cooled to a temperature of at least about 10° C., about 15° C., about 20° C., about 25° C., about 30° C., about 35° C., or about 40° C. Optionally, in some embodiments, the binder and the first solvent are cooled to a temperature of no more than about 10° C., about 15° C., about 20° C., about 25° C., about 30° C., about 35° C., or about 40° C.

Optionally, in some embodiments, the viscosity of the conductive graphene ink is about 10 centipoise to about 10,000 centipoise. Optionally, in some embodiments, the viscosity of the conductive graphene ink is at least about 10 centipoise. Optionally, in some embodiments, the viscosity of the conductive graphene ink is at most about 10,000 centipoise. Optionally, in some embodiments, the viscosity of the conductive graphene ink is about 10 centipoise to about 20 centipoise, about 10 centipoise to about 50 centipoise, about 10 centipoise to about 100 centipoise, about 10 centipoise to about 200 centipoise, about 10 centipoise to about 500 centipoise, about 10 centipoise to about 1,000 centipoise, about 10 centipoise to about 2,000 centipoise, about 10 centipoise to about 5,000 centipoise, about 10 centipoise to about 10,000 centipoise, about 20 centipoise to about 50 centipoise, about 20 centipoise to about 100 centipoise, about 20 centipoise to about 200 centipoise, about 20 centipoise to about 500 centipoise, about 20 centipoise to about 1,000 centipoise, about 20 centipoise to about 2,000 centipoise, about 20 centipoise to about 5,000 centipoise, about 20 centipoise to about 10,000 centipoise, about 50 centipoise to about 100 centipoise, about 50 centipoise to about 200 centipoise, about 50 centipoise to about 500 centipoise, about 50 centipoise to about 1,000 centipoise, about 50 centipoise to about 2,000 centipoise, about 50 centipoise to about 5,000 centipoise, about 50 centipoise to about 10,000 centipoise, about 100 centipoise to about 200 centipoise, about 100 centipoise to about 500 centipoise, about 100 centipoise to about 1,000 centipoise, about 100 centipoise to about 2,000 centipoise, about 100 centipoise to about 5,000 centipoise, about 100 centipoise to about 10,000 centipoise, about 200 centipoise to about 500 centipoise, about 200 centipoise to about 1,000 centipoise, about 200 centipoise to about 2,000 centipoise, about 200 centipoise to about 5,000 centipoise, about 200 centipoise to about 10,000 centipoise, about 500 centipoise to about 1,000 centipoise, about 500 centipoise to about 2,000 centipoise, about 500 centipoise to about 5,000 centipoise, about 500 centipoise to about 10,000 centipoise, about 1,000 centipoise to about 2,000 centipoise, about 1,000 centipoise to about 5,000 centipoise, about 1,000 centipoise to about 10,000 centipoise, about 2,000 centipoise to about 5,000 centipoise, about 2,000 centipoise to about 10,000 centipoise, or about 5,000 centipoise to about 10,000 centipoise. Optionally, in some embodiments, the viscosity of the conductive graphene ink is about 10 centipoise, about 20 centipoise, about 50 centipoise, about 100 centipoise, about 200 centipoise, about 500 centipoise, about 1,000 centipoise, about 2,000 centipoise, about 5,000 centipoise, or about 10,000 centipoise. Optionally, in some embodiments, the viscosity of the conductive graphene ink is at least about 10 centipoise, about 20 centipoise, about 50 centipoise, about 100 centipoise, about 200 centipoise, about 500 centipoise, about 1,000 centipoise, about 2,000 centipoise, about 5,000 centipoise, or about 10,000 centipoise. Optionally, in some embodiments, the viscosity of the conductive graphene ink is no more than about 10 centipoise, about 20 centipoise, about 50 centipoise, about 100 centipoise, about 200 centipoise, about 500 centipoise, about 1,000 centipoise, about 2,000 centipoise, about 5,000 centipoise, or about 10,000 centipoise.

Optionally, in some embodiments, the conductive graphene ink has a viscosity of about 2,300 centipoise to about 2,400 centipoise. Optionally, in some embodiments, the conductive graphene ink has a viscosity of at least about 2,300 centipoise. Optionally, in some embodiments, the conductive graphene ink has a viscosity of at most about 2,400 centipoise. Optionally, in some embodiments, the conductive graphene ink has a viscosity of about 2,300 centipoise to about 2,310 centipoise, about 2,300 centipoise to about 2,320 centipoise, about 2,300 centipoise to about 2,330 centipoise, about 2,300 centipoise to about 2,340 centipoise, about 2,300 centipoise to about 2,350 centipoise, about 2,300 centipoise to about 2,360 centipoise, about 2,300 centipoise to about 2,370 centipoise, about 2,300 centipoise to about 2,380 centipoise, about 2,300 centipoise to about 2,390 centipoise, about 2,300 centipoise to about 2,400 centipoise, about 2,310 centipoise to about 2,320 centipoise, about 2,310 centipoise to about 2,330 centipoise, about 2,310 centipoise to about 2,340 centipoise, about 2,310 centipoise to about 2,350 centipoise, about 2,310 centipoise to about 2,360 centipoise, about 2,310 centipoise to about 2,370 centipoise, about 2,310 centipoise to about 2,380 centipoise, about 2,310 centipoise to about 2,390 centipoise, about 2,310 centipoise to about 2,400 centipoise, about 2,320 centipoise to about 2,330 centipoise, about 2,320 centipoise to about 2,340 centipoise, about 2,320 centipoise to about 2,350 centipoise, about 2,320 centipoise to about 2,360 centipoise, about 2,320 centipoise to about 2,370 centipoise, about 2,320 centipoise to about 2,380 centipoise, about 2,320 centipoise to about 2,390 centipoise, about 2,320 centipoise to about 2,400 centipoise, about 2,330 centipoise to about 2,340 centipoise, about 2,330 centipoise to about 2,350 centipoise, about 2,330 centipoise to about 2,360 centipoise, about 2,330 centipoise to about 2,370 centipoise, about 2,330 centipoise to about 2,380 centipoise, about 2,330 centipoise to about 2,390 centipoise, about 2,330 centipoise to about 2,400 centipoise, about 2,340 centipoise to about 2,350 centipoise, about 2,340 centipoise to about 2,360 centipoise, about 2,340 centipoise to about 2,370 centipoise, about 2,340 centipoise to about 2,380 centipoise, about 2,340 centipoise to about 2,390 centipoise, about 2,340 centipoise to about 2,400 centipoise, about 2,350 centipoise to about 2,360 centipoise, about 2,350 centipoise to about 2,370 centipoise, about 2,350 centipoise to about 2,380 centipoise, about 2,350 centipoise to about 2,390 centipoise, about 2,350 centipoise to about 2,400 centipoise, about 2,360 centipoise to about 2,370 centipoise, about 2,360 centipoise to about 2,380 centipoise, about 2,360 centipoise to about 2,390 centipoise, about 2,360 centipoise to about 2,400 centipoise, about 2,370 centipoise to about 2,380 centipoise, about 2,370 centipoise to about 2,390 centipoise, about 2,370 centipoise to about 2,400 centipoise, about 2,380 centipoise to about 2,390 centipoise, about 2,380 centipoise to about 2,400 centipoise, or about 2,390 centipoise to about 2,400 centipoise. Optionally, in some embodiments, the conductive graphene ink has a viscosity of about 2,300 centipoise, about 2,310 centipoise, about 2,320 centipoise, about 2,330 centipoise, about 2,340 centipoise, about 2,350 centipoise, about 2,360 centipoise, about 2,370 centipoise, about 2,380 centipoise, about 2,390 centipoise, or about 2,400 centipoise.

Optionally, in some embodiments, the solid matter content of the conductive graphene ink is about 2.5% to about 10.5%. Optionally, in some embodiments, the solid matter content of the conductive graphene ink is at least about 2.5%. Optionally, in some embodiments, the solid matter content of the conductive graphene ink is at most about 10.5%. Optionally, in some embodiments, the solid matter content of the conductive graphene ink is about 2.5% to about 3.5%, about 2.5% to about 4.5%, about 2.5% to about 5.5%, about 2.5% to about 6.5%, about 2.5% to about 7.5%, about 2.5% to about 8.5%, about 2.5% to about 9.5%, about 2.5% to about 10.5%, about 3.5% to about 4.5%, about 3.5% to about 5.5%, about 3.5% to about 6.5%, about 3.5% to about 7.5%, about 3.5% to about 8.5%, about 3.5% to about 9.5%, about 3.5% to about 10.5%, about 4.5% to about 5.5%, about 4.5% to about 6.5%, about 4.5% to about 7.5%, about 4.5% to about 8.5%, about 4.5% to about 9.5%, about 4.5% to about 10.5%, about 5.5% to about 6.5%, about 5.5% to about 7.5%, about 5.5% to about 8.5%, about 5.5% to about 9.5%, about 5.5% to about 10.5%, about 6.5% to about 7.5%, about 6.5% to about 8.5%, about 6.5% to about 9.5%, about 6.5% to about 10.5%, about 7.5% to about 8.5%, about 7.5% to about 9.5%, about 7.5% to about 10.5%, about 8.5% to about 9.5%, about 8.5% to about 10.5%, or about 9.5% to about 10.5%. Optionally, in some embodiments, the solid matter content of the conductive graphene ink is about 2.5%, about 3.5%, about 4.5%, about 5.5%, about 6.5%, about 7.5%, about 8.5%, about 9.5%, or about 10.5%. Optionally, in some embodiments, the solid matter content of the conductive graphene ink is at least about 2.5%, about 3.5%, about 4.5%, about 5.5%, about 6.5%, about 7.5%, about 8.5%, about 9.5%, or about 10.5%. Optionally, in some embodiments, the solid matter content of the conductive graphene ink is no more than about 2.5%, about 3.5%, about 4.5%, about 5.5%, about 6.5%, about 7.5%, about 8.5%, about 9.5%, or about 10.5%.

Optionally, in some embodiments, the density of the conductive graphene ink at a temperature of about 20° C. is about 2.5 g/cm$^3$ to about 10.5 g/cm$^3$. Optionally, in some embodiments, the density of the conductive graphene ink at a temperature of about 20° C. is at least about 2.5 g/cm$^3$. Optionally, in some embodiments, the density of the conductive graphene ink at a temperature of about 20° C. is at most about 10.5 g/cm$^3$. Optionally, in some embodiments, the density of the conductive graphene ink at a temperature of about 20° C. is about 2.5 g/cm$^3$ to about 3.5 g/cm$^3$, about 2.5 g/cm$^3$ to about 4.5 g/cm$^3$, about 2.5 g/cm$^3$ to about 5.5 g/cm$^3$, about 2.5 g/cm$^3$ to about 6.5 g/cm$^3$, about 2.5 g/cm$^3$ to about 7.5 g/cm$^3$, about 2.5 g/cm$^3$ to about 8.5 g/cm$^3$, about 2.5 g/cm$^3$ to about 9.5 g/cm$^3$, about 2.5 g/cm$^3$ to about 10.5 g/cm$^3$, about 3.5 g/cm$^3$ to about 4.5 g/cm$^3$, about 3.5 g/cm$^3$ to about 5.5 g/cm$^3$, about 3.5 g/cm$^3$ to about 6.5 g/cm$^3$, about 3.5 g/cm$^3$ to about 7.5 g/cm$^3$, about 3.5 g/cm$^3$ to about 8.5 g/cm$^3$, about 3.5 g/cm$^3$ to about 9.5 g/cm$^3$, about 3.5 g/cm$^3$ to about 10.5 g/cm$^3$, about 4.5 g/cm$^3$ to about 5.5 g/cm$^3$, about 4.5 g/cm$^3$ to about 6.5 g/cm$^3$, about 4.5 g/cm$^3$ to about 7.5 g/cm$^3$, about 4.5 g/cm$^3$ to about 8.5 g/cm$^3$, about 4.5 g/cm$^3$ to about 9.5 g/cm$^3$, about 4.5 g/cm$^3$ to about 10.5 g/cm$^3$, about 5.5 g/cm$^3$ to about 6.5 g/cm$^3$, about 5.5 g/cm$^3$ to about 7.5 g/cm$^3$, about 5.5 g/cm$^3$ to about 8.5 g/cm$^3$, about 5.5 g/cm$^3$ to about 9.5 g/cm$^3$, about 5.5 g/cm$^3$ to about 10.5 g/cm$^3$, about 6.5 g/cm$^3$ to about 7.5 g/cm$^3$, about 6.5 g/cm$^3$ to about 8.5 g/cm$^3$, about 6.5 g/cm$^3$ to about 9.5 g/cm$^3$, about 6.5 g/cm$^3$ to about 10.5 g/cm$^3$, about 7.5 g/cm$^3$ to about 8.5 g/cm$^3$, about 7.5 g/cm$^3$ to about 9.5 g/cm$^3$, about 7.5 g/cm$^3$ to about 10.5 g/cm$^3$, about 8.5 g/cm$^3$ to about 9.5 g/cm$^3$, about 8.5 g/cm$^3$ to about 10.5 g/cm$^3$, or about 9.5 g/cm$^3$ to about 10.5 g/cm$^3$. Optionally, in some embodiments, the density of the conductive graphene ink at a temperature of about 20° C. is at most about 10.5 g/cm$^3$. Optionally, in some embodiments, the density of the conductive graphene ink at a temperature of about 20° C. is about 2.5 g/cm$^3$, about 3.5 g/cm$^3$, about 4.5 g/cm$^3$, about 5.5 g/cm$^3$, about 6.5 g/cm$^3$, about 7.5 g/cm$^3$, about 8.5 g/cm$^3$, about 9.5 g/cm$^3$, or about 10.5 g/cm$^3$. Optionally, in some embodiments, the density of the conductive graphene ink at a temperature of at least about 20° C. is about 2.5 g/cm$^3$, about 3.5 g/cm$^3$, about 4.5 g/cm$^3$, about 5.5 g/cm$^3$, about 6.5 g/cm$^3$, about 7.5 g/cm$^3$, about 8.5 g/cm$^3$, about 9.5 g/cm$^3$, or about 10.5 g/cm$^3$. Optionally, in some embodiments, the density of the conductive graphene ink at a temperature of no more than about 20° C. is about 2.5 g/cm$^3$, about 3.5 g/cm$^3$, about 4.5 g/cm$^3$, about 5.5 g/cm$^3$, about 6.5 g/cm$^3$, about 7.5 g/cm$^3$, about 8.5 g/cm$^3$, about 9.5 g/cm$^3$, or about 10.5 g/cm$^3$.

Optionally, in some embodiments the conductive graphene ink has a surface area of about 40 m$^2$/g to about 2,400 m$^2$/g. Optionally, in some embodiments the conductive graphene ink has a surface area of at least about 40 m$^2$/g. Optionally, in some embodiments the conductive graphene ink has a surface area of at most about 2,400 m$^2$/g. Optionally, in some embodiments the conductive graphene ink has a surface area of about 40 m$^2$/g to about 80 m$^2$/g, about 40 m$^2$/g to about 120 m$^2$/g, about 40 m$^2$/g to about 240 m$^2$/g, about 40 m$^2$/g to about 480 m$^2$/g, about 40 m$^2$/g to about 1,000 m$^2$/g, about 40 m$^2$/g to about 1,400 m$^2$/g, about 40 m$^2$/g to about 1,800 m$^2$/g, about 40 m$^2$/g to about 2,200

$m^2/g$, about 40 $m^2/g$ to about 2,400 $m^2/g$, about 80 $m^2/g$ to about 120 $m^2/g$, about 80 $m^2/g$ to about 240 $m^2/g$, about 80 $m^2/g$ to about 480 $m^2/g$, about 80 $m^2/g$ to about 1,000 $m^2/g$, about 80 $m^2/g$ to about 1,400 $m^2/g$, about 80 $m^2/g$ to about 1,800 $m^2/g$, about 80 $m^2/g$ to about 2,200 $m^2/g$, about 80 $m^2/g$ to about 2,400 $m^2/g$, about 120 $m^2/g$ to about 240 $m^2/g$, about 120 $m^2/g$ to about 480 $m^2/g$, about 120 $m^2/g$ to about 1,000 $m^2/g$, about 120 $m^2/g$ to about 1,400 $m^2/g$, about 120 $m^2/g$ to about 1,800 $m^2/g$, about 120 $m^2/g$ to about 2,200 $m^2/g$, about 120 $m^2/g$ to about 2,400 $m^2/g$, about 240 $m^2/g$ to about 480 $m^2/g$, about 240 $m^2/g$ to about 1,000 $m^2/g$, about 240 $m^2/g$ to about 1,400 $m^2/g$, about 240 $m^2/g$ to about 1,800 $m^2/g$, about 240 $m^2/g$ to about 2,200 $m^2/g$, about 240 $m^2/g$ to about 2,400 $m^2/g$, about 480 $m^2/g$ to about 1,000 $m^2/g$, about 480 $m^2/g$ to about 1,400 $m^2/g$, about 480 $m^2/g$ to about 1,800 $m^2/g$, about 480 $m^2/g$ to about 2,200 $m^2/g$, about 480 $m^2/g$ to about 2,400 $m^2/g$, about 1,000 $m^2/g$ to about 1,400 $m^2/g$, about 1,000 $m^2/g$ to about 1,800 $m^2/g$, about 1,000 $m^2/g$ to about 2,200 $m^2/g$, about 1,000 $m^2/g$ to about 2,400 $m^2/g$, about 1,400 $m^2/g$ to about 1,800 $m^2/g$, about 1,400 $m^2/g$ to about 2,200 $m^2/g$, about 1,400 $m^2/g$ to about 2,400 $m^2/g$, about 1,800 $m^2/g$ to about 2,200 $m^2/g$, about 1,800 $m^2/g$ to about 2,400 $m^2/g$, or about 2,200 $m^2/g$ to about 2,400 $m^2/g$. Optionally, in some embodiments the conductive graphene ink has a surface area of about 40 $m^2/g$, about 80 $m^2/g$, about 120 $m^2/g$, about 240 $m^2/g$, about 480 $m^2/g$, about 1,000 $m^2/g$, about 1,400 $m^2/g$, about 1,800 $m^2/g$, about 2,200 $m^2/g$, or about 2,400 $m^2/g$. Optionally, in some embodiments the conductive graphene ink has a surface area of at least about 40 $m^2/g$, about 80 $m^2/g$, about 120 $m^2/g$, about 240 $m^2/g$, about 480 $m^2/g$, about 1,000 $m^2/g$, about 1,400 $m^2/g$, about 1,800 $m^2/g$, about 2,200 $m^2/g$, or about 2,400 $m^2/g$. Optionally, in some embodiments the conductive graphene ink has a surface area of no more than about 40 $m^2/g$, about 80 $m^2/g$, about 120 $m^2/g$, about 240 $m^2/g$, about 480 $m^2/g$, about 1,000 $m^2/g$, about 1,400 $m^2/g$, about 1,800 $m^2/g$, about 2,200 $m^2/g$, or about 2,400 $m^2/g$.

Optionally, in some embodiments the conductive graphene ink has a conductivity of about 400 S/m to about 1,600 S/m. Optionally, in some embodiments the conductive graphene ink has a conductivity of at least about 400 S/m. Optionally, in some embodiments the conductive graphene ink has a conductivity of at most about 1,600 S/m. Optionally, in some embodiments the conductive graphene ink has a conductivity of about 400 S/m to about 500 S/m, about 400 S/m to about 600 S/m, about 400 S/m to about 700 S/m, about 400 S/m to about 800 S/m, about 400 S/m to about 900 S/m, about 400 S/m to about 1,000 S/m, about 400 S/m to about 1,200 S/m, about 400 S/m to about 1,400 S/m, about 400 S/m to about 1,600 S/m, about 500 S/m to about 600 S/m, about 500 S/m to about 700 S/m, about 500 S/m to about 800 S/m, about 500 S/m to about 900 S/m, about 500 S/m to about 1,000 S/m, about 500 S/m to about 1,200 S/m, about 500 S/m to about 1,400 S/m, about 500 S/m to about 1,600 S/m, about 600 S/m to about 700 S/m, about 600 S/m to about 800 S/m, about 600 S/m to about 900 S/m, about 600 S/m to about 1,000 S/m, about 600 S/m to about 1,200 S/m, about 600 S/m to about 1,400 S/m, about 600 S/m to about 1,600 S/m, about 700 S/m to about 800 S/m, about 700 S/m to about 900 S/m, about 700 S/m to about 1,000 S/m, about 700 S/m to about 1,200 S/m, about 700 S/m to about 1,400 S/m, about 700 S/m to about 1,600 S/m, about 800 S/m to about 900 S/m, about 800 S/m to about 1,000 S/m, about 800 S/m to about 1,200 S/m, about 800 S/m to about 1,400 S/m, about 800 S/m to about 1,600 S/m, about 900 S/m to about 1,000 S/m, about 900 S/m to about 1,200 S/m, about 900 S/m to about 1,400 S/m, about 900 S/m to about 1,600 S/m, about 1,000 S/m to about 1,200 S/m, about 1,000 S/m to about 1,400 S/m, about 1,000 S/m to about 1,600 S/m, about 1,200 S/m to about 1,400 S/m, about 1,200 S/m to about 1,600 S/m, or about 1,400 S/m to about 1,600 S/m. Optionally, in some embodiments the conductive graphene ink has a conductivity of about 400 S/m, about 500 S/m, about 600 S/m, about 700 S/m, about 800 S/m, about 900 S/m, about 1,000 S/m, about 1,200 S/m, about 1,400 S/m, or about 1,600 S/m. Optionally, in some embodiments the conductive graphene ink has a conductivity of at least about 400 S/m, about 500 S/m, about 600 S/m, about 700 S/m, about 800 S/m, about 900 S/m, about 1,000 S/m, about 1,200 S/m, about 1,400 S/m, or about 1,600 S/m. Optionally, in some embodiments the conductive graphene ink has a conductivity of no more than about 400 S/m, about 500 S/m, about 600 S/m, about 700 S/m, about 800 S/m, about 900 S/m, about 1,000 S/m, about 1,200 S/m, about 1,400 S/m, or about 1,600 S/m.

Optionally, in some embodiments the conductive graphene ink has a C:O mass ratio of about 2:1 to about 40:1. Optionally, in some embodiments the conductive graphene ink has a C:O mass ratio of at least about 2:1. Optionally, in some embodiments the conductive graphene ink has a C:O mass ratio of at most about 40:1. Optionally, in some embodiments the conductive graphene ink has a C:O mass ratio of about 2:1 to about 4:1, about 2:1 to about 6:1, about 2:1 to about 8:1, about 2:1 to about 10:1, about 2:1 to about 15:1, about 2:1 to about 20:1, about 2:1 to about 25:1, about 2:1 to about 30:1, about 2:1 to about 34:1, about 2:1 to about 40:1, about 4:1 to about 6:1, about 4:1 to about 8:1, about 4:1 to about 10:1, about 4:1 to about 15:1, about 4:1 to about 20:1, about 4:1 to about 25:1, about 4:1 to about 30:1, about 4:1 to about 34:1, about 4:1 to about 40:1, about 6:1 to about 8:1, about 6:1 to about 10:1, about 6:1 to about 15:1, about 6:1 to about 20:1, about 6:1 to about 25:1, about 6:1 to about 30:1, about 6:1 to about 34:1, about 6:1 to about 40:1, about 8:1 to about 10:1, about 8:1 to about 15:1, about 8:1 to about 20:1, about 8:1 to about 25:1, about 8:1 to about 30:1, about 8:1 to about 34:1, about 8:1 to about 40:1, about 10:1 to about 15:1, about 10:1 to about 20:1, about 10:1 to about 25:1, about 10:1 to about 30:1, about 10:1 to about 34:1, about 10:1 to about 40:1, about 15:1 to about 20:1, about 15:1 to about 25:1, about 15:1 to about 30:1, about 15:1 to about 34:1, about 15:1 to about 40:1, about 20:1 to about 25:1, about 20:1 to about 30:1, about 20:1 to about 34:1, about 20:1 to about 40:1, about 25:1 to about 30:1, about 25:1 to about 34:1, about 25:1 to about 40:1, about 30:1 to about 34:1, about 30:1 to about 40:1, or about 34:1 to about 40:1. Optionally, in some embodiments the conductive graphene ink has a C:O mass ratio of about 2:1, about 4:1, about 6:1, about 8:1, about 10:1, about 15:1, about 20:1, about 25:1, about 30:1, about 34:1, or about 40:1. Optionally, in some embodiments, one of the conductivity, the surface area, and the C:O ratio of the conductive graphene ink is measured by methylene blue absorption. Optionally, in some embodiments the conductive graphene ink has a C:O mass ratio of at least about 2:1, about 4:1, about 6:1, about 8:1, about 10:1, about 15:1, about 20:1, about 25:1, about 30:1, about 34:1, or about 40:1. Optionally, in some embodiments the conductive graphene ink has a C:O mass ratio of no more than about 2:1, about 4:1, about 6:1, about 8:1, about 10:1, about 15:1, about 20:1, about 25:1, about 30:1, about 34:1, or about 40:1.

Optionally, in some embodiments, one of the conductivity, the surface area, and the C:O ratio, of the conductive graphene ink is measured by methylene blue absorption.

Optionally, in some embodiments, the conductive graphene ink is a conductive graphene hydrate.

Another aspect provided herein is a method of forming a graphene film comprising, forming a conductive graphene ink; coating a substrate with the conductive graphene ink to form a coating of the conductive graphene ink on the substrate.

Optionally, in some embodiments, the thickness of the coating of the conductive graphene ink is about 0.05 micrometer to about 200 micrometers. Optionally, in some embodiments, the thickness of the coating of the conductive graphene ink is at least about 0.05 micrometers. Optionally, in some embodiments, the thickness of the coating of the conductive graphene ink is at most about 200 micrometers. Optionally, in some embodiments, the thickness of the coating of the conductive graphene ink is about 0.05 micrometers to about 0.1 micrometer, about 0.05 micrometer to about 0.5 micrometer, about 0.05 micrometer to about 1 micrometer, about 0.05 micrometer to about 10 micrometers, about 0.05 micrometer to about 50 micrometers, about 0.05 micrometer to about 100 micrometers, about 0.05 micrometer to about 150 micrometers, about 0.05 micrometer to about 200 micrometers, about 0.1 micrometer to about 0.5 micrometer, about 0.1 micrometer to about 1 micrometer, about 0.1 micrometer to about 10 micrometers, about 0.1 micrometer to about 50 micrometers, about 0.1 micrometer to about 100 micrometers, about 0.1 micrometer to about 150 micrometers, about 0.1 micrometer to about 200 micrometers, about 0.5 micrometer to about 1 micrometer, about 0.5 micrometer to about 10 micrometers, about 0.5 micrometer to about 50 micrometers, about 0.5 micrometer to about 100 micrometers, about 0.5 micrometer to about 150 micrometers, about 0.5 micrometer to about 200 micrometers, about 1 micrometer to about 10 micrometers, about 1 micrometer to about 50 micrometers, about 1 micrometer to about 100 micrometers, about 1 micrometer to about 150 micrometers, about 1 micrometer to about 200 micrometers, about 10 micrometers to about 50 micrometers, about 10 micrometers to about 100 micrometers, about 10 micrometers to about 150 micrometers, about 10 micrometers to about 200 micrometers, about 50 micrometers to about 100 micrometers, about 50 micrometers to about 150 micrometers, about 50 micrometers to about 200 micrometers, about 100 micrometers to about 150 micrometers, about 100 micrometers to about 200 micrometers, or about 150 micrometers to about 200 micrometers. Optionally, in some embodiments, the thickness of the coating of the conductive graphene ink is about 0.05 micrometer, about 0.1 micrometer, about 0.5 micrometer, about 1 micrometer, about 10 micrometers, about 50 micrometers, about 100 micrometers, about 150 micrometers, or about 200 micrometers. Optionally, in some embodiments, the thickness of the coating of the conductive graphene ink is at least about 0.05 micrometer, about 0.1 micrometer, about 0.5 micrometer, about 1 micrometer, about 10 micrometers, about 50 micrometers, about 100 micrometers, about 150 micrometers, or about 200 micrometers. Optionally, in some embodiments, the thickness of the coating of the conductive graphene ink is no more than about 0.05 micrometer, about 0.1 micrometer, about 0.5 micrometer, about 1 micrometer, about 10 micrometers, about 50 micrometers, about 100 micrometers, about 150 micrometers, or about 200 micrometers.

Optionally, in some embodiments, the substrate comprises metal, plastic, paper, wood, silicon, metal, glass, fiberglass, carbon fiber, ceramics, fabric, or any combination thereof.

Optionally, in some embodiments, the coating of the substrate with a conductive graphene ink is performed by hand. Optionally, in some embodiments, the coating of the substrate with a conductive graphene ink is performed with a brush. Optionally, in some embodiments, the coating of the substrate with a conductive graphene ink is performed by a doctor blade. Optionally, in some embodiments, the coating of the substrate with a conductive graphene ink is performed by a screen printer. Optionally, in some embodiments, the coating of the substrate with a conductive graphene ink is performed by a roll-to-roll process.

Optionally, in some embodiments, the process of forming a conductive graphene ink comprises: forming a binder solution comprising: heating a first solvent, adding a binder to the first solvent, mixing the binder and the first solvent, and cooling the binder and the first solvent; forming a RGO dispersion comprising a second solvent and RGO; and forming a graphene solution comprising the binder solution, the reduced graphene dispersion a third solvent, a conductive additive, a surfactant, a defoamer; and mixing the graphene solution to form a conductive graphene ink.

Optionally, in some embodiments, at least one of the first solvent, the second solvent, and the third solvent comprises water and an organic solvent. Optionally, in some embodiments, the organic solvent comprises ethanol, isopropyl alcohol, NMP, cyclohexanone, terpineol, 3-methoxy-3-methyl-1-butanol, 4-hydroxyl-4-methyl-pentan-2-one, methyl isobutyl ketone, or any combination thereof. Optionally, in some embodiments, at least one of the first solvent, the second solvent, and the third solvent comprises water, ethanol, isopropyl alcohol, NMP, cyclohexanone, terpineol, 3-methoxy-3-methyl-1-butanol, 4-hydroxyl-4-methyl-pentan-2-one, methyl isobutyl ketone, or any combination thereof.

Optionally, in some embodiments, a percentage by mass of at least one of the first solvent, the second solvent, and the third solvent in the conductive graphene ink is about 1% to about 99%. Optionally, in some embodiments, a percentage by mass of at least one of the first solvent, the second solvent, and the third solvent in the conductive graphene ink is at least about 1%. Optionally, in some embodiments, a percentage by mass of at least one of the first solvent, the second solvent, and the third solvent in the conductive graphene ink is at most about 99%. Optionally, in some embodiments, a percentage by mass of at least one of the first solvent, the second solvent, and the third solvent in the conductive graphene ink is about 1% to about 2%, about 1% to about 5%, about 1% to about 10%, about 1% to about 20%, about 1% to about 30%, about 1% to about 40%, about 1% to about 50%, about 1% to about 60%, about 1% to about 70%, about 1% to about 80%, about 1% to about 99%, about 2% to about 5%, about 2% to about 10%, about 2% to about 20%, about 2% to about 30%, about 2% to about 40%, about 2% to about 50%, about 2% to about 60%, about 2% to about 70%, about 2% to about 80%, about 2% to about 99%, about 5% to about 10%, about 5% to about 20%, about 5% to about 30%, about 5% to about 40%, about 5% to about 50%, about 5% to about 60%, about 5% to about 70%, about 5% to about 80%, about 5% to about 99%, about 10% to about 20%, about 10% to about 30%, about 10% to about 40%, about 10% to about 50%, about 10% to about 60%, about 10% to about 70%, about 10% to about 80%, about 10% to about 99%, about 20% to about 30%, about 20% to about 40%, about 20% to about 50%, about 20% to about 60%, about 20% to about 70%, about 20% to about 80%, about 20% to about 99%, about 30% to about 40%, about 30% to about 50%, about 30% to about 60%, about 30% to about 70%, about 30% to about 80%, about 30% to about 99%, about 40% to about 50%, about 40% to about 60%, about 40% to about 70%, about 40% to about 80%, about 40% to about 99%, about 50% to about 60%, about 50% to about 70%, about 50% to about 80%, about 50% to about 99%, about 60% to about 70%, about 60% to about 80%, about 60% to about 99%, about 70% to about 80%, about 70% to about 99%, or about 80% to about 99%. Optionally, in some embodiments, a percentage by mass of at least one of the first solvent, the second solvent, and the third solvent in the conductive graphene ink is about 1%, about 2%, about 5%, about 10%, about 20%, about 30%, about 40%, about 50%, about 60%, about 70%, about 80%, or about 99%. Optionally, in some embodiments, a percentage by mass of at least one of the first solvent, the second solvent, and the third solvent in the conductive graphene ink is at least about 1%, about 2%, about 5%, about 10%, about 20%, about 30%, about 40%, about 50%, about 60%, about 70%, or about 80%. Optionally, in some embodiments, a percentage by mass of at least one of the first solvent, the second solvent, and the third solvent in the conductive graphene ink is at most about 2%, about 5%, about 10%, about 20%, about 30%, about 40%, about 50%, about 60%, about 70%, about 80%, or about 99%.

Optionally, in some embodiments, the binder solution comprises a binder and a first solvent. Optionally, in some embodiments, the binder comprises a polymer. Optionally, in some embodiments, the polymer comprises a synthetic polymer. Optionally, in some embodiments, the synthetic polymer comprises carboxymethyl cellulose, PVDF, poly (vinyl alcohol), poly(vinyl pyrrolidone), poly(ethylene oxide), ethyl cellulose, or any combination thereof. Optionally, in some embodiments, the binder is a dispersant.

Optionally, in some embodiments, the first solvent comprises water, an organic solvent, or any combination thereof. Optionally, in some embodiments, the organic solvent comprises: ethanol, isopropyl alcohol, NMP, cyclohexanone, terpineol, 3-methoxy-3-methyl-1-butanol, 4-hydroxyl-4-methyl-pentan-2-one, methyl isobutyl ketone, or any combination thereof.

Optionally, in some embodiments, a percentage by mass of the binder solution in the conductive graphene ink is about 0.5% to about 99%. Optionally, in some embodiments, a percentage by mass of the binder solution in the conductive graphene ink is at least about 0.5%. Optionally, in some embodiments, a percentage by mass of the binder solution in the conductive graphene ink is at most about 99%. Optionally, in some embodiments, a percentage by mass of the binder solution in the conductive graphene ink is about 0.5% to about 1%, about 0.5% to about 2%, about 0.5% to about 5%, about 0.5% to about 10%, about 0.5% to about 20%, about 0.5% to about 30%, about 0.5% to about 40%, about 0.5% to about 50%, about 0.5% to about 70%, about 0.5% to about 90%, about 0.5% to about 99%, about 1% to about 2%, about 1% to about 5%, about 1% to about 10%, about 1% to about 20%, about 1% to about 30%, about 1% to about 40%, about 1% to about 50%, about 1% to about 70%, about 1% to about 90%, about 1% to about 99%, about 2% to about 5%, about 2% to about 10%, about 2% to about 20%, about 2% to about 30%, about 2% to about 40%, about 2% to about 50%, about 2% to about 70%, about 2% to about 90%, about 2% to about 99%, about 5% to about 10%, about 5% to about 20%, about 5% to about 30%, about 5% to about 40%, about 5% to about 50%, about 5% to about 70%, about 5% to about 90%, about 5% to about 99%, about 10% to about 20%, about 10% to about 30%, about 10% to about 40%, about 10% to about 50%, about 10% to about 70%, about 10% to about 90%, about 10% to about 99%, about 20% to about 30%, about 20% to about 40%, about 20% to about 50%, about 20% to about 70%, about 20% to about 90%, about 20% to about 99%, about 30% to about 40%, about 30% to about 50%, about 30% to about 70%, about 30% to about 90%, about 30% to about 99%, about 40% to about 50%, about 40% to about 70%, about 40% to about 90%, about 40% to about 99%, about 50% to about 70%, about 50% to about 90%, about 50% to about 99%, about 70% to about 90%, about 70% to about 99%, or about 90% to about 99%. Optionally, in some embodiments, a percentage by mass of the binder solution in the conductive graphene ink is at most about 99%. Optionally, in some embodiments, a percentage by mass of the binder solution in the conductive graphene ink is about 0.5%, about 1%, about 2%, about 5%, about 10%, about 20%, about 30%, about 40%, about 50%, about 70%, about 90%, or about 99%. Optionally, in some embodiments, a percentage by mass of the binder solution in the conductive graphene ink is at least about 0.5%, about 1%, about 2%, about 5%, about 10%, about 20%, about 30%, about 40%, about 50%, about 60%, about 70%, about 80%, about 90%, about 95%, or about 99%. Alternatively or in combination, in some embodiments, a percentage by mass of the binder solution in the conductive graphene ink is no more than about 0.5%, about 1%, about 2%, about 5%, about 10%, about 20%, about 30%, about 40%, about 50%, about 60%, about 70%, about 80%, about 90%, about 95%, or about 99%.

Optionally, in some embodiments, a concentration of the binder solution by mass is about 0.5% to about 2%. Optionally, in some embodiments, a concentration of the binder solution by mass is at least about 0.5%. Optionally, in some embodiments, a concentration of the binder solution by mass is at most about 2%. Optionally, in some embodiments, a concentration of the binder solution by mass is about 0.5% to about 0.625%, about 0.5% to about 0.75%, about 0.5% to about 0.875%, about 0.5% to about 1%, about 0.5% to about 1.25%, about 0.5% to about 1.5%, about 0.5% to about 1.75%, about 0.5% to about 2%, about 0.625% to about 0.75%, about 0.625% to about 0.875%, about 0.625% to about 1%, about 0.625% to about 1.25%, about 0.625% to about 1.5%, about 0.625% to about 1.75%, about 0.625% to about 2%, about 0.75% to about 0.875%, about 0.75% to about 1%, about 0.75% to about 1.25%, about 0.75% to about 1.5%, about 0.75% to about 1.75%, about 0.75% to about 2%, about 0.875% to about 1%, about 0.875% to about 1.25%, about 0.875% to about 1.5%, about 0.875% to about 1.75%, about 0.875% to about 2%, about 1% to about 1.25%, about 1% to about 1.5%, about 1% to about 1.75%, about 1% to about 2%, about 1.25% to about 1.5%, about 1.25% to about 1.75%, about 1.25% to about 2%, about 1.5% to about 1.75%, about 1.5% to about 2%, or about 1.75% to about 2%. Optionally, in some embodiments, a concentration of the binder solution by mass is about 0.5%, about 0.625%, about 0.75%, about 0.875%, about 1%, about 1.25%, about 1.5%, about 1.75%, or about 2%. Optionally, in some embodiments, a concentration of the binder solution by mass is at least about 0.5%, about 0.625%, about 0.75%, about 0.875%, about 1%, about 1.25%, about 1.5%, about 1.75%, or about 2%. Optionally, in some embodiments, a concentration of the binder solution by mass is no more than about 0.5%, about 0.625%, about 0.75%, about 0.875%, about 1%, about 1.25%, about 1.5%, about 1.75%, or about 2%.

Optionally, in some embodiments, the RGO dispersion comprises RGO and a second solvent.

Optionally, in some embodiments, the second solvent comprises water, an organic solvent, or any combination thereof. Optionally, in some embodiments, the organic solvent comprises: ethanol, isopropyl alcohol, NMP, cyclohexanone, terpineol, 3-methoxy-3-methyl-1-butanol, 4-hydroxyl-4-methyl-pentan-2-one, methyl isobutyl ketone, or any combination thereof.

Optionally, in some embodiments, a percentage by mass of the RGO dispersion in the conductive graphene ink is about 0.25% to about 1%. Optionally, in some embodiments, a percentage by mass of the RGO dispersion in the conductive graphene ink is at least about 0.25%. Optionally, in some embodiments, a percentage by mass of the RGO dispersion in the conductive graphene ink is at most about 1%. Optionally, in some embodiments, a percentage by mass of the RGO dispersion in the conductive graphene ink is about 0.25% to about 0.375%, about 0.25% to about 0.5%, about 0.25% to about 0.625%, about 0.25% to about 0.75%, about 0.25% to about 1%, about 0.375% to about 0.5%, about 0.375% to about 0.625%, about 0.375% to about 0.75%, about 0.375% to about 1%, about 0.5% to about 0.625%, about 0.5% to about 0.75%, about 0.5% to about 1%, about 0.625% to about 0.75%, about 0.625% to about 1%, or about 0.75% to about 1%. Optionally, in some embodiments, a percentage by mass of the RGO dispersion in the conductive graphene ink is about 0.25%, about 0.375%, about 0.5%, about 0.625%, about 0.75%, or about 1%. Optionally, in some embodiments, a percentage by mass of the RGO dispersion in the conductive graphene ink is at least about 0.25%, about 0.375%, about 0.5%, about 0.625%, about 0.75%, or about 1%. Optionally, in some embodiments, a percentage by mass of the RGO dispersion in the conductive graphene ink is no more than about 0.25%, about 0.375%, about 0.5%, about 0.625%, about 0.75%, or about 1%.

Optionally, in some embodiments, a concentration by mass of the RGO in the RGO dispersion is about 3% to about 12%. Optionally, in some embodiments, a concentration by mass of the RGO in the RGO dispersion is at least about 3%. Optionally, in some embodiments, a concentration by mass of the RGO in the RGO dispersion is at most about 12%. Optionally, in some embodiments, a concentration by mass of the RGO in the RGO dispersion is about 3% to about 4%, about 3% to about 5%, about 3% to about 6%, about 3% to about 7%, about 3% to about 8%, about 3% to about 9%, about 3% to about 10%, about 3% to about 11%, about 3% to about 12%, about 4% to about 5%, about 4% to about 6%, about 4% to about 7%, about 4% to about 8%, about 4% to about 9%, about 4% to about 10%, about 4% to about 11%, about 4% to about 12%, about 5% to about 6%, about 5% to about 7%, about 5% to about 8%, about 5% to about 9%, about 5% to about 10%, about 5% to about 11%, about 5% to about 12%, about 6% to about 7%, about 6% to about 8%, about 6% to about 9%, about 6% to about 10%, about 6% to about 11%, about 6% to about 12%, about 7% to about 8%, about 7% to about 9%, about 7% to about 10%, about 7% to about 11%, about 7% to about 12%, about 8% to about 9%, about 8% to about 10%, about 8% to about 11%, about 8% to about 12%, about 9% to about 10%, about 9% to about 11%, about 9% to about 12%, about 10% to about 11%, about 10% to about 12%, or about 11% to about 12%. Optionally, in some embodiments, a concentration by mass of the RGO in the RGO dispersion is about 3%, about 4%, about 5%, about 6%, about 7%, about 8%, about 9%, about 10%, about 11%, or about 12%. Optionally, in some embodiments, a concentration by mass of the RGO in the RGO dispersion is at least about 3%, about 4%, about 5%, about 6%, about 7%, about 8%, about 9%, about 10%, about 11%, or about 12%. Optionally, in some embodiments, a concentration by mass of the RGO in the RGO dispersion is no more than about 3%, about 4%, about 5%, about 6%, about 7%, about 8%, about 9%, about 10%, about 11%, or about 12%.

Optionally, in some embodiments, a percentage by mass of the RGO in the conductive graphene ink is about 0.1% to about 99%. Optionally, in some embodiments, a percentage by mass of the RGO in the conductive graphene ink is at least about 0.1%. Optionally, in some embodiments, a percentage by mass of the RGO in the conductive graphene ink is at most about 99%. Optionally, in some embodiments, a percentage by mass of the RGO in the conductive graphene ink is about 0.1% to about 0.2%, about 0.1% to about 0.5%, about 0.1% to about 1%, about 0.1% to about 10%, about 0.1% to about 20%, about 0.1% to about 40%, about 0.1% to about 60%, about 0.1% to about 80%, about 0.1% to about 90%, about 0.1% to about 99%, about 0.2% to about 0.5%, about 0.2% to about 1%, about 0.2% to about 10%, about 0.2% to about 20%, about 0.2% to about 40%, about 0.2% to about 60%, about 0.2% to about 80%, about 0.2% to about 90%, about 0.2% to about 99%, about 0.5% to about 1%, about 0.5% to about 10%, about 0.5% to about 20%, about 0.5% to about 40%, about 0.5% to about 60%, about 0.5% to about 80%, about 0.5% to about 90%, about 0.5% to about 99%, about 1% to about 10%, about 1% to about 20%, about 1% to about 40%, about 1% to about 60%, about 1% to about 80%, about 1% to about 90%, about 1% to about 99%, about 10% to about 20%, about 10% to about 40%, about 10% to about 60%, about 10% to about 80%, about 10% to about 90%, about 10% to about 99%, about 20% to about 40%, about 20% to about 60%, about 20% to about 80%, about 20% to about 90%, about 20% to about 99%, about 40% to about 60%, about 40% to about 80%, about 40% to about 90%, about 40% to about 99%, about 60% to about 80%, about 60% to about 90%, about 60% to about 99%, about 80% to about 90%, about 80% to about 99%, or about 90% to about 99%. Optionally, in some embodiments, a percentage by mass of the RGO in the conductive graphene ink is about 0.1%, about 0.2%, about 0.5%, about 1%, about 10%, about 20%, about 40%, about 60%, about 80%, about 90%, or about 99%. Optionally, in some embodiments, a percentage by mass of the RGO in the conductive graphene ink is at least about 0.1%, about 0.2%, about 0.5%, about 1%, about 10%, about 20%, about 40%, about 60%, about 80%, about 90%, or about 99%. Optionally, in some embodiments, a percentage by mass of the RGO in the conductive graphene ink is no more than about 0.1%, about 0.2%, about 0.5%, about 1%, about 10%, about 20%, about 40%, about 60%, about 80%, about 90%, or about 99%.

Optionally, in some embodiments, the conductive additive comprises a carbon-based material. Optionally, in some embodiments, the carbon-based material comprises a paracrystalline carbon. Optionally, in some embodiments, the paracrystalline carbon comprises carbon black, acetylene black, channel black, furnace black, lamp black, thermal black, or any combination thereof.

Optionally, in some embodiments, the conductive additive comprises silver. Optionally, in some embodiments, the silver comprises silver nanoparticles, silver nanorods, silver nanowires, silver nanoflowers, silver nanofibers, silver nanoplatelets, silver nanoribbons, silver nanocubes, silver bipyramids, or any combination thereof.

Optionally, in some embodiments, a percentage by mass of the conductive additive in the conductive graphene ink is about 2% to about 99%. Optionally, in some embodiments, a percentage by mass of the conductive additive in the conductive graphene ink is at least about 2%. Optionally, in some embodiments, a percentage by mass of the conductive additive in the conductive graphene ink is at most about 99%. Optionally, in some embodiments, a percentage by mass of the conductive additive in the conductive graphene ink is about 2% to about 5%, about 2% to about 10%, about 2% to about 20%, about 2% to about 30%, about 2% to about 40%, about 2% to about 50%, about 2% to about 60%, about 2% to about 70%, about 2% to about 80%, about 2% to about 90%, about 2% to about 99%, about 5% to about 10%, about 5% to about 20%, about 5% to about 30%, about 5% to about 40%, about 5% to about 50%, about 5% to about 60%, about 5% to about 70%, about 5% to about 80%, about 5% to about 90%, about 5% to about 99%, about 10% to about 20%, about 10% to about 30%, about 10% to about 40%, about 10% to about 50%, about 10% to about 60%, about 10% to about 70%, about 10% to about 80%, about 10% to about 90%, about 10% to about 99%, about 20% to about 30%, about 20% to about 40%, about 20% to about 50%, about 20% to about 60%, about 20% to about 70%, about 20% to about 80%, about 20% to about 90%, about 20% to about 99%, about 30% to about 40%, about 30% to about 50%, about 30% to about 60%, about 30% to about 70%, about 30% to about 80%, about 30% to about 90%, about 30% to about 99%, about 40% to about 50%, about 40% to about 60%, about 40% to about 70%, about 40% to about 80%, about 40% to about 90%, about 40% to about 99%, about 50% to about 60%, about 50% to about 70%, about 50% to about 80%, about 50% to about 90%, about 50% to about 99%, about 60% to about 70%, about 60% to about 80%, about 60% to about 90%, about 60% to about 99%, about 70% to about 80%, about 70% to about 90%, about 70% to about 99%, about 80% to about 90%, about 80% to about 99%, or about 90% to about 99%. Optionally, in some embodiments, a percentage by mass of the conductive additive in the conductive graphene ink is about 2%, about 5%, about 10%, about 20%, about 30%, about 40%, about 50%, about 60%, about 70%, about 80%, about 90%, or about 99%. Optionally, in some embodiments, a percentage by mass of the conductive additive in the conductive graphene ink is at least about 2%, about 5%, about 10%, about 20%, about 30%, about 40%, about 50%, about 60%, about 70%, about 80%, about 90%, or about 99%. Optionally, in some embodiments, a percentage by mass of the conductive additive in the conductive graphene ink is no more than about 2%, about 5%, about 10%, about 20%, about 30%, about 40%, about 50%, about 60%, about 70%, about 80%, about 90%, or about 99%.

Some embodiments further comprise a surfactant. Optionally, in some embodiments, the surfactant comprises an acid, a nonionic surfactant, or any combination thereof. Optionally, in some embodiments, the acid comprises perfluorooctanoic acid, perfluorooctane sulfonate, perfluorohexane sulfonic acid, perfluorononanoic acid, perfluorodecanoic acid, or any combination thereof. Optionally, in some embodiments, the nonionic surfactant comprises a polyethylene glycol alkyl ether, a octaethylene glycol monododecyl ether, a pentaethylene glycol monododecyl ether, a polypropylene glycol alkyl ether, a glucoside alkyl ether, decyl glucoside, lauryl glucoside, octyl glucoside, a polyethylene glycol octylphenyl ether, dodecyldimethylamine oxide, a polyethylene glycol alkylphenyl ether, a polyethylene glycol octylphenyl ether, Triton X-100, polyethylene glycol alkylphenyl ether, nonoxynol-9, a glycerol alkyl ester polysorbate, sorbitan alkyl ester, polyethoxylated tallow amine, Dynol 604, or any combination thereof.

Optionally, in some embodiments, a percentage by mass of the surfactant in the conductive graphene ink is about 0.5% to about 10%. Optionally, in some embodiments, a percentage by mass of the surfactant in the conductive graphene ink is at least about 0.5%. Optionally, in some embodiments, a percentage by mass of the surfactant in the conductive graphene ink is at most about 10%. Optionally, in some embodiments, a percentage by mass of the surfactant in the conductive graphene ink is about 0.5% to about 1%, about 0.5% to about 2%, about 0.5% to about 3%, about 0.5% to about 4%, about 0.5% to about 5%, about 0.5% to about 6%, about 0.5% to about 7%, about 0.5% to about 8%, about 0.5% to about 9%, about 0.5% to about 10%, about 1% to about 2%, about 1% to about 3%, about 1% to about 4%, about 1% to about 5%, about 1% to about 6%, about 1% to about 7%, about 1% to about 8%, about 1% to about 9%, about 1% to about 10%, about 2% to about 3%, about 2% to about 4%, about 2% to about 5%, about 2% to about 6%, about 2% to about 7%, about 2% to about 8%, about 2% to about 9%, about 2% to about 10%, about 3% to about 4%, about 3% to about 5%, about 3% to about 6%, about 3% to about 7%, about 3% to about 8%, about 3% to about 9%, about 3% to about 10%, about 4% to about 5%, about 4% to about 6%, about 4% to about 7%, about 4% to about 8%, about 4% to about 9%, about 4% to about 10%, about 5% to about 6%, about 5% to about 7%, about 5% to about 8%, about 5% to about 9%, about 5% to about 10%, about 6% to about 7%, about 6% to about 8%, about 6% to about 9%, about 6% to about 10%, about 7% to about 8%, about 7% to about 9%, about 7% to about 10%, about 8% to about 9%, about 8% to about 10%, or about 9% to about 10%. Optionally, in some embodiments, a percentage by mass of the surfactant in the conductive graphene ink is about 0.5%, about 1%, about 2%, about 3%, about 4%, about 5%, about 6%, about 7%, about 8%, about 9%, or about 10%. Optionally, in some embodiments, a percentage by mass of the surfactant in the conductive graphene ink is at least about 0.5%, about 1%, about 2%, about 3%, about 4%, about 5%, about 6%, about 7%, about 8%, about 9%, or about 10%. Optionally, in some embodiments, a percentage by mass of the surfactant in the conductive graphene ink is no more than about 0.5%, about 1%, about 2%, about 3%, about 4%, about 5%, about 6%, about 7%, about 8%, about 9%, or about 10%.

Some embodiments further comprise a defoamer, wherein the defoamer comprises an insoluble oil, a silicone, a glycol, a stearate, an organic solvent, Surfynol DF-1100, alkyl polyacrylate, or any combination thereof. Optionally, in some embodiments, the insoluble oil comprises mineral oil, vegetable oil, white oil, or any combination thereof. Optionally, in some embodiments, the silicone comprises polydimethylsiloxane, silicone glycol, a fluorosilicone, or any combination thereof. Optionally, in some embodiments, the glycol comprises polyethylene glycol, ethylene glycol, propylene glycol, or any combination thereof. Optionally, in some embodiments, the stearate comprises glycol stearate, stearin, or any combination thereof. Optionally, in some embodiments, the organic solvent comprises ethanol, isopropyl alcohol, NMP, cyclohexanone, terpineol, 3-methoxy-3-methyl-1-butanol, 4-hydroxyl-4-methyl-pentan-2-one, methyl isobutyl ketone, or any combination thereof.

Optionally, in some embodiments, a percentage by mass of the defoamer in the conductive graphene ink is about 0.5% to about 10%. Optionally, in some embodiments, a percentage by mass of the defoamer in the conductive graphene ink is at least about 0.5%. Optionally, in some embodiments, a percentage by mass of the defoamer in the conductive graphene ink is at most about 10%. Optionally, in some embodiments, a percentage by mass of the defoamer in the conductive graphene ink is about 0.5% to about 1%, about 0.5% to about 2%, about 0.5% to about 3%, about 0.5% to about 4%, about 0.5% to about 5%, about 0.5% to about 6%, about 0.5% to about 7%, about 0.5% to about 8%, about 0.5% to about 9%, about 0.5% to about 10%, about 1% to about 2%, about 1% to about 3%, about 1% to about 4%, about 1% to about 5%, about 1% to about 6%, about 1% to about 7%, about 1% to about 8%, about 1% to about 9%, about 1% to about 10%, about 2% to about 3%, about 2% to about 4%, about 2% to about 5%, about 2% to about 6%, about 2% to about 7%, about 2% to about 8%, about 2% to about 9%, about 2% to about 10%, about 3% to about 4%, about 3% to about 5%, about 3% to about 6%, about 3% to about 7%, about 3% to about 8%, about 3% to about 9%, about 3% to about 10%, about 4% to about 5%, about 4% to about 6%, about 4% to about 7%, about 4% to about 8%, about 4% to about 9%, about 4% to about 10%, about 5% to about 6%, about 5% to about 7%, about 5% to about 8%, about 5% to about 9%, about 5% to about 10%, about 6% to about 7%, about 6% to about 8%, about 6% to about 9%, about 6% to about 10%, about 7% to about 8%, about 7% to about 9%, about 7% to about 10%, about 8% to about 9%, about 8% to about 10%, or about 9% to about 10%. Optionally, in some embodiments, a percentage by mass of the defoamer in the conductive graphene ink is about 0.5%, about 1%, about 2%, about 3%, about 4%, about 5%, about 6%, about 7%, about 8%, about 9%, or about 10%. Optionally, in some embodiments, a percentage by mass of the defoamer in the conductive graphene ink is at least about 0.5%, about 1%, about 2%, about 3%, about 4%, about 5%, about 6%, about 7%, about 8%, about 9%, or about 10%. Optionally, in some embodiments, a percentage by mass of the defoamer in the conductive graphene ink is no more than about 0.5%, about 1%, about 2%, about 3%, about 4%, about 5%, about 6%, about 7%, about 8%, about 9%, or about 10%.

Optionally, in some embodiments, the solid matter content by mass of the conductive graphene ink is about 2.5% to about 10.5%. Optionally, in some embodiments, the solid matter content by mass of the conductive graphene ink is at least about 2.5%. Optionally, in some embodiments, the solid matter content by mass of the conductive graphene ink is at most about 10.5%. Optionally, in some embodiments, the solid matter content by mass of the conductive graphene ink is about 2.5% to about 3.5%, about 2.5% to about 4.5%, about 2.5% to about 5.5%, about 2.5% to about 6.5%, about 2.5% to about 7.5%, about 2.5% to about 8.5%, about 2.5% to about 9.5%, about 2.5% to about 10.5%, about 3.5% to about 4.5%, about 3.5% to about 5.5%, about 3.5% to about 6.5%, about 3.5% to about 7.5%, about 3.5% to about 8.5%, about 3.5% to about 9.5%, about 3.5% to about 10.5%, about 4.5% to about 5.5%, about 4.5% to about 6.5%, about 4.5% to about 7.5%, about 4.5% to about 8.5%, about 4.5% to about 9.5%, about 4.5% to about 10.5%, about 5.5% to about 6.5%, about 5.5% to about 7.5%, about 5.5% to about 8.5%, about 5.5% to about 9.5%, about 5.5% to about 10.5%, about 6.5% to about 7.5%, about 6.5% to about 8.5%, about 6.5% to about 9.5%, about 6.5% to about 10.5%, about 7.5% to about 8.5%, about 7.5% to about 9.5%, about 7.5% to about 10.5%, about 8.5% to about 9.5%, about 8.5% to about 10.5%, or about 9.5% to about 10.5%. Optionally, in some embodiments, the solid matter content by mass of the conductive graphene ink is about 2.5%, about 3.5%, about 4.5%, about 5.5%, about 6.5%, about 7.5%, about 8.5%, about 9.5%, or about 10.5%. Optionally, in some embodiments, the solid matter content by mass of the conductive graphene ink is at least about 2.5%, about 3.5%, about 4.5%, about 5.5%, about 6.5%, about 7.5%, about 8.5%, about 9.5%, or about 10.5%. Optionally, in some embodiments, the solid matter content by mass of the conductive graphene ink is no more than about 2.5%, about 3.5%, about 4.5%, about 5.5%, about 6.5%, about 7.5%, about 8.5%, about 9.5%, or about 10.5%.

Optionally, in some embodiments, the first solvent is heated to a temperature of about 35° C. to about 125° C. Optionally, in some embodiments, the first solvent is heated to a temperature of at least about 35° C. Optionally, in some embodiments, the first solvent is heated to a temperature of at most about 125° C. Optionally, in some embodiments, the first solvent is heated to a temperature of about 35° C. to about 40° C., about 35° C. to about 50° C., about 35° C. to about 60° C., about 35° C. to about 70° C., about 35° C. to about 80° C., about 35° C. to about 90° C., about 35° C. to about 100° C., about 35° C. to about 125° C., about 40° C. to about 50° C., about 40° C. to about 60° C., about 40° C. to about 70° C., about 40° C. to about 80° C., about 40° C. to about 90° C., about 40° C. to about 100° C., about 40° C. to about 125° C., about 50° C. to about 60° C., about 50° C. to about 70° C., about 50° C. to about 80° C., about 50° C. to about 90° C., about 50° C. to about 100° C., about 50° C. to about 125° C., about 60° C. to about 70° C., about 60° C. to about 80° C., about 60° C. to about 90° C., about 60° C. to about 100° C., about 60° C. to about 125° C., about 70° C. to about 80° C., about 70° C. to about 90° C., about 70° C. to about 100° C., about 70° C. to about 125° C., about 80° C. to about 90° C., about 80° C. to about 100° C., about 80° C. to about 125° C., about 90° C. to about 100° C., about 90° C. to about 125° C., or about 100° C. to about 125° C. Optionally, in some embodiments, the first solvent is heated to a temperature of about 35° C., about 40° C., about 50° C., about 60° C., about 70° C., about 80° C., about 90° C., about 100° C., or about 125° C. Optionally, in some embodiments, the first solvent is heated to a temperature of at least about 35° C., about 40° C., about 50° C., about 60° C., about 70° C., about 80° C., about 90° C., about 100° C., or about 125° C. Optionally, in some embodiments, the first solvent is heated to a temperature of no more than about 35° C., about 40° C., about 50° C., about 60° C., about 70° C., about 80° C., about 90° C., about 100° C., or about 125° C.

Optionally, in some embodiments, the process of adding a binder to the first solvent and the process of mixing the binder and the first solvent are preformed simultaneously.

Optionally, in some embodiments, the binder is added to the first solvent over a period of time of about 45 minutes to about 240 minutes. Optionally, in some embodiments, the binder is added to the first solvent over a period of time of at least about 45 minutes. Optionally, in some embodiments, the binder is added to the first solvent over a period of time of at most about 240 minutes. Optionally, in some embodiments, the binder is added to the first solvent over a period of time of about 45 minutes to about 60 minutes, about 45 minutes to about 90 minutes, about 45 minutes to about 120 minutes, about 45 minutes to about 150 minutes, about 45 minutes to about 180 minutes, about 45 minutes to about 210 minutes, about 45 minutes to about 240 minutes, about 60 minutes to about 90 minutes, about 60 minutes to about 120 minutes, about 60 minutes to about 150 minutes, about 60 minutes to about 180 minutes, about 60 minutes to about 210 minutes, about 60 minutes to about 240 minutes, about 90 minutes to about 120 minutes, about 90 minutes to about 150 minutes, about 90 minutes to about 180 minutes, about 90 minutes to about 210 minutes, about 90 minutes to about 240 minutes, about 120 minutes to about 150 minutes, about 120 minutes to about 180 minutes, about 120 minutes to about 210 minutes, about 120 minutes to about 240 minutes, about 150 minutes to about 180 minutes, about 150 minutes to about 210 minutes, about 150 minutes to about 240 minutes, about 180 minutes to about 210 minutes, about 180 minutes to about 240 minutes, or about 210 minutes to about 240 minutes. Optionally, in some embodiments, the binder is added to the first solvent over a period of time of about 45 minutes, about 60 minutes, about 90 minutes, about 120 minutes, about 150 minutes, about 180 minutes, about 210 minutes, or about 240 minutes. Optionally, in some embodiments, the binder is added to the first solvent over a period of time of at least about 45 minutes, about 60 minutes, about 90 minutes, about 120 minutes, about 150 minutes, about 180 minutes, about 210 minutes, or about 240 minutes. Optionally, in some embodiments, the binder is added to the first solvent over a period of time of no more than about 45 minutes, about 60 minutes, about 90 minutes, about 120 minutes, about 150 minutes, about 180 minutes, about 210 minutes, or about 240 minutes.

Optionally, in some embodiments, after the binder is fully added to the first solvent, the binder and the first solvent are mixed for a period of time of about 7 minutes to about 30 minutes. Optionally, in some embodiments, after the binder is fully added to the first solvent, the binder and the first solvent are mixed for a period of time of at least about 7 minutes. Optionally, in some embodiments, after the binder is fully added to the first solvent, the binder and the first solvent are mixed for a period of time of at most about 30 minutes. Optionally, in some embodiments, after the binder is fully added to the first solvent, the binder and the first solvent are mixed for a period of time of about 7 minutes to about 9 minutes, about 7 minutes to about 11 minutes, about 7 minutes to about 13 minutes, about 7 minutes to about 15 minutes, about 7 minutes to about 20 minutes, about 7 minutes to about 25 minutes, about 7 minutes to about 30 minutes, about 9 minutes to about 11 minutes, about 9 minutes to about 13 minutes, about 9 minutes to about 15 minutes, about 9 minutes to about 20 minutes, about 9 minutes to about 25 minutes, about 9 minutes to about 30 minutes, about 11 minutes to about 13 minutes, about 11 minutes to about 15 minutes, about 11 minutes to about 20 minutes, about 11 minutes to about 25 minutes, about 11 minutes to about 30 minutes, about 13 minutes to about 15 minutes, about 13 minutes to about 20 minutes, about 13 minutes to about 25 minutes, about 13 minutes to about 30 minutes, about 15 minutes to about 20 minutes, about 15 minutes to about 25 minutes, about 15 minutes to about 30 minutes, about 20 minutes to about 25 minutes, about 20 minutes to about 30 minutes, or about 25 minutes to about 30 minutes. Optionally, in some embodiments, after the binder is fully added to the first solvent, the binder and the first solvent are mixed for a period of time of about 7 minutes, about 9 minutes, about 11 minutes, about 13 minutes, about 15 minutes, about 20 minutes, about 25 minutes, or about 30 minutes. Optionally, in some embodiments, after the binder is fully added to the first solvent, the binder and the first solvent are mixed for a period of time of at least about 7 minutes, about 9 minutes, about 11 minutes, about 13 minutes, about 15 minutes, about 20 minutes, about 25 minutes, or about 30 minutes. Optionally, in some embodiments, after the binder is fully added to the first solvent, the binder and the first solvent are mixed for a period of time of no more than about 7 minutes, about 9 minutes, about 11 minutes, about 13 minutes, about 15 minutes, about 20 minutes, about 25 minutes, or about 30 minutes.

Optionally, in some embodiments, the mixing of the binder solution, the binder solution, the reduced graphene dispersion, the third solvent, the conductive additive, a surfactant, and the defoamer is performed by a first mechanical mixer. Optionally, in some embodiments, the mixing of the binder and the first solvent is performed by a second mechanical mixer.

Optionally, in some embodiments, the second mechanical mixer mixes the graphene solution at a stirring speed of about 15 rpm to about 125 rpm. Optionally, in some embodiments, the second mechanical mixer mixes the graphene solution at a stirring speed of at least about 15 rpm. Optionally, in some embodiments, the second mechanical mixer mixes the graphene solution at a stirring speed of at most about 125 rpm. Optionally, in some embodiments, the second mechanical mixer mixes the graphene solution at a stirring speed of about 15 rpm to about 20 rpm, about 15 rpm to about 25 rpm, about 15 rpm to about 30 rpm, about 15 rpm to about 40 rpm, about 15 rpm to about 50 rpm, about 15 rpm to about 75 rpm, about 15 rpm to about 100 rpm, about 15 rpm to about 125 rpm, about 20 rpm to about 25 rpm, about 20 rpm to about 30 rpm, about 20 rpm to about 40 rpm, about 20 rpm to about 50 rpm, about 20 rpm to about 75 rpm, about 20 rpm to about 100 rpm, about 20 rpm to about 125 rpm, about 25 rpm to about 30 rpm, about 25 rpm to about 40 rpm, about 25 rpm to about 50 rpm, about 25 rpm to about 75 rpm, about 25 rpm to about 100 rpm, about 25 rpm to about 125 rpm, about 30 rpm to about 40 rpm, about 30 rpm to about 50 rpm, about 30 rpm to about 75 rpm, about 30 rpm to about 100 rpm, about 30 rpm to about 125 rpm, about 40 rpm to about 50 rpm, about 40 rpm to about 75 rpm, about 40 rpm to about 100 rpm, about 40 rpm to about 125 rpm, about 50 rpm to about 75 rpm, about 50 rpm to about 100 rpm, about 50 rpm to about 125 rpm, about 75 rpm to about 100 rpm, about 75 rpm to about 125 rpm, or about 100 rpm to about 125 rpm. Optionally, in some embodiments, the second mechanical mixer mixes the graphene solution at a stirring speed of about 15 rpm, about 20 rpm, about 25 rpm, about 30 rpm, about 40 rpm, about 50 rpm, about 75 rpm, about 100 rpm, or about 125 rpm. Optionally, in some embodiments, the second mechanical mixer mixes the graphene solution at a stirring speed of at least about 15 rpm, about 20 rpm, about 25 rpm, about 30 rpm, about 40 rpm, about 50 rpm, about 75 rpm, about 100 rpm, or about 125 rpm. Optionally, in some embodiments, the second mechanical mixer mixes the graphene solution at a stirring speed of no more than about 15 rpm, about 20 rpm, about 25 rpm, about 30 rpm, about 40 rpm, about 50 rpm, about 75 rpm, about 100 rpm, or about 125 rpm.

Optionally, in some embodiments, the second mechanical mixer mixes the graphene solution at a dispersing speed of about 50 rpm to about 4,500 rpm. Optionally, in some embodiments, the second mechanical mixer mixes the graphene solution at a dispersing speed of at least about 50 rpm. Optionally, in some embodiments, the second mechanical mixer mixes the graphene solution at a dispersing speed of at most about 4,500 rpm. Optionally, in some embodiments, the second mechanical mixer mixes the graphene solution at a dispersing speed of about 50 rpm to about 100 rpm, about 50 rpm to about 200 rpm, about 50 rpm to about 500 rpm, about 50 rpm to about 1,000 rpm, about 50 rpm to about 1,500 rpm, about 50 rpm to about 2,000 rpm, about 50 rpm to about 2,500 rpm, about 50 rpm to about 3,000 rpm, about 50 rpm to about 3,500 rpm, about 50 rpm to about 4,000 rpm, about 50 rpm to about 4,500 rpm, about 100 rpm to about 200 rpm, about 100 rpm to about 500 rpm, about 100 rpm to about 1,000 rpm, about 100 rpm to about 1,500 rpm, about 100 rpm to about 2,000 rpm, about 100 rpm to about 2,500 rpm, about 100 rpm to about 3,000 rpm, about 100 rpm to about 3,500 rpm, about 100 rpm to about 4,000 rpm, about 100 rpm to about 4,500 rpm, about 200 rpm to about 500 rpm, about 200 rpm to about 1,000 rpm, about 200 rpm to about 1,500 rpm, about 200 rpm to about 2,000 rpm, about 200 rpm to about 2,500 rpm, about 200 rpm to about 3,000 rpm, about 200 rpm to about 3,500 rpm, about 200 rpm to about 4,000 rpm, about 200 rpm to about 4,500 rpm, about 500 rpm to about 1,000 rpm, about 500 rpm to about 1,500 rpm, about 500 rpm to about 2,000 rpm, about 500 rpm to about 2,500 rpm, about 500 rpm to about 3,000 rpm, about 500 rpm to about 3,500 rpm, about 500 rpm to about 4,000 rpm, about 500 rpm to about 4,500 rpm, about 1,000 rpm to about 1,500 rpm, about 1,000 rpm to about 2,000 rpm, about 1,000 rpm to about 2,500 rpm, about 1,000 rpm to about 3,000 rpm, about 1,000 rpm to about 3,500 rpm, about 1,000 rpm to about 4,000 rpm, about 1,000 rpm to about 4,500 rpm, about 1,500 rpm to about 2,000 rpm, about 1,500 rpm to about 2,500 rpm, about 1,500 rpm to about 3,000 rpm, about 1,500 rpm to about 3,500 rpm, about 1,500 rpm to about 4,000 rpm, about 1,500 rpm to about 4,500 rpm, about 2,000 rpm to about 2,500 rpm, about 2,000 rpm to about 3,000 rpm, about 2,000 rpm to about 3,500 rpm, about 2,000 rpm to about 4,000 rpm, about 2,000 rpm to about 4,500 rpm, about 2,500 rpm to about 3,000 rpm, about 2,500 rpm to about 3,500 rpm, about 2,500 rpm to about 4,000 rpm, about 2,500 rpm to about 4,500 rpm, about 3,000 rpm to about 3,500 rpm, about 3,000 rpm to about 4,000 rpm, about 3,000 rpm to about 4,500 rpm, about 3,500 rpm to about 4,000 rpm, about 3,500 rpm to about 4,500 rpm, or about 4,000 rpm to about 4,500 rpm. Optionally, in some embodiments, the second mechanical mixer mixes the graphene solution at a dispersing speed of about 50 rpm, about 100 rpm, about 200 rpm, about 500 rpm, about 1,000 rpm, about 1,500 rpm, about 2,000 rpm, about 2,500 rpm, about 3,000 rpm, about 3,500 rpm, about 4,000 rpm, about 4,500 rpm, about 100 rpm to about 200 rpm, about 100 rpm to about 500 rpm, about 100 rpm to about 1,000 rpm, about 100 rpm to about 1,500 rpm, about 100 rpm to about 2,000 rpm, about 100 rpm to about 2,500 rpm, about 100 rpm to about 3,000 rpm, about 100 rpm to about 3,500 rpm, about 100 rpm to about 4,000 rpm, about 100 rpm to about 4,500 rpm. Optionally, in some embodiments, the second mechanical mixer mixes the graphene solution at a dispersing speed of at least about 50 rpm, about 100 rpm, about 200 rpm, about 500 rpm, about 1,000 rpm, about 1,500 rpm, about 2,000 rpm, about 2,500 rpm, about 3,000 rpm, about 3,500 rpm, about 4,000 rpm, or about 4,500 rpm. Optionally, in some embodiments, the second mechanical mixer mixes the graphene solution at a dispersing speed of no more than about 50 rpm, about 100 rpm, about 200 rpm, about 500 rpm, about 1,000 rpm, about 1,500 rpm, about 2,000 rpm, about 2,500 rpm, about 3,000 rpm, about 3,500 rpm, about 4,000 rpm, or about 4,500 rpm.

Optionally, in some embodiments, the second mechanical mixer mixes graphene solution under a vacuum degree, and wherein the vacuum degree is equal to the ambient pressure.

Optionally, in some embodiments, the second mechanical mixer mixes graphene solution under a vacuum degree, and wherein the vacuum degree is about −0.05 MPa to about −0.2 MPa. Optionally, in some embodiments, the second mechanical mixer mixes graphene solution under a vacuum degree, and wherein the vacuum degree is at least about −0.05 MPa. Optionally, in some embodiments, the second mechanical mixer mixes graphene solution under a vacuum degree, and wherein the vacuum degree is at most about −0.2 MPa. Optionally, in some embodiments, the second mechanical mixer mixes graphene solution under a vacuum degree, and wherein the vacuum degree is about −0.05 MPa to about −0.0625 MPa, about −0.05 MPa to about −0.0875 MPa, about −0.05 MPa to about −0.1 MPa, about −0.05 MPa to about −0.1125 MPa, about −0.05 MPa to about −0.125 MPa, about −0.05 MPa to about −0.1375 MPa, about −0.05 MPa to about −0.15 MPa, about −0.05 MPa to about −0.1625 MPa, about −0.05 MPa to about −0.1875 MPa, about −0.05 MPa to about −0.2 MPa, about −0.0625 MPa to about −0.0875 MPa, about −0.0625 MPa to about −0.1 MPa, about −0.0625 MPa to about −0.1125 MPa, about −0.0625 MPa to about −0.125 MPa, about −0.0625 MPa to about −0.1375 MPa, about −0.0625 MPa to about −0.15 MPa, about −0.0625 MPa to about −0.1625 MPa, about −0.0625 MPa to about −0.1875 MPa, about −0.0625 MPa to about −0.2 MPa, about −0.0875 MPa to about −0.1 MPa, about −0.0875 MPa to about −0.1125 MPa, about −0.0875 MPa to about −0.125 MPa, about −0.0875 MPa to about −0.1375 MPa, about −0.0875 MPa to about −0.15 MPa, about −0.0875 MPa to about −0.1625 MPa, about −0.0875 MPa to about −0.1875 MPa, about −0.0875 MPa to about −0.2 MPa, about −0.1 MPa to about −0.1125 MPa, about −0.1 MPa to about −0.125 MPa, about −0.1 MPa to about −0.1375 MPa, about −0.1 MPa to about −0.15 MPa, about −0.1 MPa to about −0.1625 MPa, about −0.1 MPa to about −0.1875 MPa, about −0.1 MPa to about −0.2 MPa, about −0.1125 MPa to about −0.125 MPa, about −0.1125 MPa to about −0.1375 MPa, about −0.1125 MPa to about −0.15 MPa, about −0.1125 MPa to about −0.1625 MPa, about −0.1125 MPa to about −0.1875 MPa, about −0.1125 MPa to about −0.2 MPa, about −0.125 MPa to about −0.1375 MPa, about −0.125 MPa to about −0.15 MPa, about −0.125 MPa to about −0.1625 MPa, about −0.125 MPa to about −0.1875 MPa, about −0.125 MPa to about −0.2 MPa, about −0.1375 MPa to about −0.15 MPa, about −0.1375 MPa to about −0.1625 MPa, about −0.1375 MPa to about −0.1875 MPa, about −0.1375 MPa to about −0.2 MPa, about −0.15 MPa to about −0.1625 MPa, about −0.15 MPa to about −0.1875 MPa, about −0.15 MPa to about −0.2 MPa, about −0.1625 MPa to about −0.1875 MPa, about −0.1625 MPa to about −0.2 MPa, or about −0.1875 MPa to about −0.2 MPa. Optionally, in some embodiments, the second mechanical mixer mixes graphene solution under a vacuum degree, and wherein the vacuum degree is about −0.05 MPa, about −0.0625 MPa, about −0.0875 MPa, about −0.1 MPa, about −0.1125 MPa, about −0.125 MPa, about −0.1375 MPa, about −0.15 MPa, about −0.1625 MPa, about −0.1875 MPa, or about −0.2 MPa. Optionally, in some embodiments, the second mechanical mixer mixes graphene solution under a vacuum degree, and wherein the vacuum degree is at least about −0.05 MPa, about −0.0625 MPa, about −0.0875 MPa, about −0.1 MPa, about −0.1125 MPa, about −0.125 MPa, about −0.1375 MPa, about −0.15 MPa, about −0.1625 MPa, about −0.1875 MPa, or about −0.2 MPa. Optionally, in some embodiments, the second mechanical mixer mixes graphene solution under a vacuum degree, and wherein the vacuum degree is no more than about −0.05 MPa, about −0.0625 MPa, about −0.0875 MPa, about −0.1 MPa, about −0.1125 MPa, about −0.125 MPa, about −0.1375 MPa, about −0.15 MPa, about −0.1625 MPa, about −0.1875 MPa, or about −0.2 MPa.

Optionally, in some embodiments, the second mechanical mixer mixes the graphene solution during one or more intervals, wherein each interval comprises a period of time of about 0.5 minute to about 30 minutes. Optionally, in some embodiments, the second mechanical mixer mixes the graphene solution during one or more intervals, wherein each interval comprises a period of time of at least about 0.5 minute. Optionally, in some embodiments, the second mechanical mixer mixes the graphene solution during one or more intervals, wherein each interval comprises a period of time of at most about 30 minutes. Optionally, in some embodiments, the second mechanical mixer mixes the graphene solution during one or more intervals, wherein each interval comprises a period of time of about 0.5 minute to about 1 minute, about 0.5 minute to about 2 minutes, about 0.5 minute to about 3 minutes, about 0.5 minute to about 4 minutes, about 0.5 minute to about 5 minutes, about 0.5 minute to about 10 minutes, about 0.5 minute to about 15 minutes, about 0.5 minute to about 20 minutes, about 0.5 minute to about 25 minutes, about 0.5 minute to about 30 minutes, about 1 minute to about 2 minutes, about 1 minute to about 3 minutes, about 1 minute to about 4 minutes, about 1 minute to about 5 minutes, about 1 minute to about 10 minutes, about 1 minute to about 15 minutes, about 1 minute to about 20 minutes, about 1 minute to about 25 minutes, about 1 minute to about 30 minutes, about 2 minutes to about 3 minutes, about 2 minutes to about 4 minutes, about 2 minutes to about 5 minutes, about 2 minutes to about 10 minutes, about 2 minutes to about 15 minutes, about 2 minutes to about 20 minutes, about 2 minutes to about 25 minutes, about 2 minutes to about 30 minutes, about 3 minutes to about 4 minutes, about 3 minutes to about 5 minutes, about 3 minutes to about 10 minutes, about 3 minutes to about 15 minutes, about 3 minutes to about 20 minutes, about 3 minutes to about 25 minutes, about 3 minutes to about 30 minutes, about 4 minutes to about 5 minutes, about 4 minutes to about 10 minutes, about 4 minutes to about 15 minutes, about 4 minutes to about 20 minutes, about 4 minutes to about 25 minutes, about 4 minutes to about 30 minutes, about 5 minutes to about 10 minutes, about 5 minutes to about 15 minutes, about 5 minutes to about 20 minutes, about 5 minutes to about 25 minutes, about 5 minutes to about 30 minutes, about 10 minutes to about 15 minutes, about 10 minutes to about 20 minutes, about 10 minutes to about 25 minutes, about 10 minutes to about 30 minutes, about 15 minutes to about 20 minutes, about 15 minutes to about 25 minutes, about 15 minutes to about 30 minutes, about 20 minutes to about 25 minutes, about 20 minutes to about 30 minutes, or about 25 minutes to about 30 minutes. Optionally, in some embodiments, the second mechanical mixer mixes the graphene solution during one or more intervals, wherein each interval comprises a period of time of about 0.5 minute, about 1 minute, about 2 minutes, about 3 minutes, about 4 minutes, about 5 minutes, about 10 minutes, about 15 minutes, about 20 minutes, about 25 minutes, or about 30 minutes. Optionally, in some embodiments, the second mechanical mixer mixes the graphene solution during one or more intervals, wherein each interval comprises a period of time of at least about 0.5 minute, about 1 minute, about 2 minutes, about 3 minutes, about 4 minutes, about 5 minutes, about 10 minutes, about 15 minutes, about 20 minutes, about 25 minutes, or about 30 minutes. Optionally, in some embodiments, the second mechanical mixer mixes the graphene solution during one or more intervals, wherein each interval comprises a period of time of no more than about 0.5 minute, about 1 minute, about 2 minutes, about 3 minutes, about 4 minutes, about 5 minutes, about 10 minutes, about 15 minutes, about 20 minutes, about 25 minutes, or about 30 minutes.

Optionally, in some embodiments, the number of intervals is about 1 to about 60. Optionally, in some embodiments, the number of intervals is at least about 1. Optionally, in some embodiments, the number of intervals is at most about 60. Optionally, in some embodiments, the number of intervals is about 1 to about 2, about 1 to about 5, about 1 to about 10, about 1 to about 20, about 1 to about 30, about 1 to about 40, about 1 to about 50, about 1 to about 60, about 2 to about 5, about 2 to about 10, about 2 to about 20, about 2 to about 30, about 2 to about 40, about 2 to about 50, about 2 to about 60, about 5 to about 10, about 5 to about 20, about 5 to about 30, about 5 to about 40, about 5 to about 50, about 5 to about 60, about 10 to about 20, about 10 to about 30, about 10 to about 40, about 10 to about 50, about 10 to about 60, about 20 to about 30, about 20 to about 40, about 20 to about 50, about 20 to about 60, about 30 to about 40, about 30 to about 50, about 30 to about 60, about 40 to about 50, about 40 to about 60, or about 50 to about 60. Optionally, in some embodiments, the number of intervals is about 1, about 2, about 5, about 10, about 20, about 30, about 40, about 50, or about 60. Optionally, in some embodiments, the number of intervals is at least about 1, about 2, about 5, about 10, about 20, about 30, about 40, about 50, or about 60. Optionally, in some embodiments, the number of intervals is no more than about 1, about 2, about 5, about 10, about 20, about 30, about 40, about 50, or about 60.

Optionally, in some embodiments, the RGO dispersion is added after the first, second, third, fourth, fifth, sixth, seventh, eighth, ninth, tenth, eleventh, twelfth, thirteenth, fourteenth, or the fifteenth interval, or any combination thereof.

Optionally, in some embodiments, a period of time of a first interval is about 5 minutes, wherein the stirring speed is about 30 rpm. Optionally, in some embodiments, a period of time of a second interval is about 5 minutes, and wherein the stirring speed is about 50 rpm. Optionally, in some embodiments, a period of time of a third interval is about 5 minutes, wherein the stirring speed is about 75 rpm, wherein the dispersing speed is about 100 rpm. Optionally, in some embodiments, a period of time of a fourth interval is about 5 minutes, wherein the stirring speed is about 75 rpm, and wherein the dispersing speed is about 300 rpm. Optionally, in some embodiments, a period of time of a fifth interval is about 5 minutes, wherein the stirring speed is about 75 rpm, and wherein the dispersing speed is about 500 rpm. Optionally, in some embodiments, a period of time of a sixth interval is about 1 minute, and wherein the stirring speed is about 30 rpm. Optionally, in some embodiments, a period of time of a seventh interval is about 1 minute, wherein the stirring speed is about 100 rpm, and wherein the dispersing speed is about 50 rpm. Optionally, in some embodiments, a period of time of an eighth interval is about 5 minutes, wherein the stirring speed is about 75 rpm, and wherein the dispersing speed is about 500 rpm. Optionally, in some embodiments, a period of time of a ninth interval is about 10 minutes, wherein the stirring speed is about 75 rpm, and wherein the dispersing speed is about 1,000 rpm. Optionally, in some embodiments, a period of time of a tenth interval is about 5 minutes, wherein the stirring speed is about 75 rpm, and wherein the dispersing speed is about 3,000 rpm. Optionally, in some embodiments, a period of time of an eleventh interval is about 5 minutes, wherein the stirring speed is about 30 rpm, and wherein the dispersing speed is about 100 rpm. Optionally, in some embodiments, a period of time of a twelfth interval is about 5 minutes, wherein the stirring speed is about 50 rpm, and wherein the dispersing speed is about 500 rpm. Optionally, in some embodiments, a period of time of a thirteenth interval is about 5 minutes, wherein the stirring speed is about 750 rpm, and wherein the dispersing speed is about 1,000 rpm. Optionally, in some embodiments, a period of time of a fourteenth interval is about 5 minutes, wherein the stirring speed is about 750 rpm, and wherein the dispersing speed is about 3,000 rpm. Optionally, in some embodiments, a period of time of a fifteenth interval is about 30 minutes, wherein the stirring speed is about 750 rpm, and wherein the dispersing speed is about 3,000 rpm.

Optionally, in some embodiments, the binder and the first solvent are cooled to a temperature of about 10° C. to about 40° C. Optionally, in some embodiments, the binder and the first solvent are cooled to a temperature of at least about 10° C. Optionally, in some embodiments, the binder and the first solvent are cooled to a temperature of at most about 40° C. Optionally, in some embodiments, the binder and the first solvent are cooled to a temperature of about 10° C. to about 15° C., about 10° C. to about 20° C., about 10° C. to about 25° C., about 10° C. to about 30° C., about 10° C. to about 35° C., about 10° C. to about 40° C., about 15° C. to about 20° C., about 15° C. to about 25° C., about 15° C. to about 30° C., about 15° C. to about 35° C., about 15° C. to about 40° C., about 20° C. to about 25° C., about 20° C. to about 30° C., about 20° C. to about 35° C., about 20° C. to about 40° C., about 25° C. to about 30° C., about 25° C. to about 35° C., about 25° C. to about 40° C., about 30° C. to about 35° C., about 30° C. to about 40° C., or about 35° C. to about 40° C. Optionally, in some embodiments, the binder and the first solvent are cooled to a temperature of about 10° C., about 15° C., about 20° C., about 25° C., about 30° C., about 35° C., or about 40° C. Optionally, in some embodiments, the binder and the first solvent are cooled to a temperature of at least about 10° C., about 15° C., about 20° C., about 25° C., about 30° C., about 35° C., or about 40° C. Optionally, in some embodiments, the binder and the first are cooled to a temperature of no more than about 10° C., about 15° C., about 20° C., about 25° C., about 30° C., about 35° C., or about 40° C.

Optionally, in some embodiments, the viscosity of the conductive graphene ink is about 10 centipoise to about 10,000 centipoise. Optionally, in some embodiments, the viscosity of the conductive graphene ink is at least about 10 centipoise. Optionally, in some embodiments, the viscosity of the conductive graphene ink is at most about 10,000 centipoise. Optionally, in some embodiments, the viscosity of the conductive graphene ink is about 10 centipoise to about 20 centipoise, about 10 centipoise to about 50 centipoise, about 10 centipoise to about 100 centipoise, about 10 centipoise to about 200 centipoise, about 10 centipoise to about 500 centipoise, about 10 centipoise to about 1,000 centipoise, about 10 centipoise to about 2,000 centipoise, about 10 centipoise to about 5,000 centipoise, about 10 centipoise to about 10,000 centipoise, about 20 centipoise to about 50 centipoise, about 20 centipoise to about 100 centipoise, about 20 centipoise to about 200 centipoise, about 20 centipoise to about 500 centipoise, about 20 centipoise to about 1,000 centipoise, about 20 centipoise to about 2,000 centipoise, about 20 centipoise to about 5,000 centipoise, about 20 centipoise to about 10,000 centipoise, about 50 centipoise to about 100 centipoise, about 50 centipoise to about 200 centipoise, about 50 centipoise to about 500 centipoise, about 50 centipoise to about 1,000 centipoise, about 50 centipoise to about 2,000 centipoise, about 50 centipoise to about 5,000 centipoise, about 50 centipoise to about 10,000 centipoise, about 100 centipoise to about 200 centipoise, about 100 centipoise to about 500 centipoise, about 100 centipoise to about 1,000 centipoise, about 100 centipoise to about 2,000 centipoise, about 100 centipoise to about 5,000 centipoise, about 100 centipoise to about 10,000 centipoise, about 200 centipoise to about 500 centipoise, about 200 centipoise to about 1,000 centipoise, about 200 centipoise to about 2,000 centipoise, about 200 centipoise to about 5,000 centipoise, about 200 centipoise to about 10,000 centipoise, about 500 centipoise to about 1,000 centipoise, about 500 centipoise to about 2,000 centipoise, about 500 centipoise to about 5,000 centipoise, about 500 centipoise to about 10,000 centipoise, about 1,000 centipoise to about 2,000 centipoise, about 1,000 centipoise to about 5,000 centipoise, about 1,000 centipoise to about 10,000 centipoise, about 2,000 centipoise to about 5,000 centipoise, about 2,000 centipoise to about 10,000 centipoise, or about 5,000 centipoise to about 10,000 centipoise. Optionally, in some embodiments, the viscosity of the conductive graphene ink is about 10 centipoise, about 20 centipoise, about 50 centipoise, about 100 centipoise, about 200 centipoise, about 500 centipoise, about 1,000 centipoise, about 2,000 centipoise, about 5,000 centipoise, or about 10,000 centipoise. Optionally, in some embodiments, the viscosity of the conductive graphene ink is at least about 10 centipoise, about 20 centipoise, about 50 centipoise, about 100 centipoise, about 200 centipoise, about 500 centipoise, about 1,000 centipoise, about 2,000 centipoise, about 5,000 centipoise, or about 10,000 centipoise. Optionally, in some embodiments, the viscosity of the conductive graphene ink is no more than about 10 centipoise, about 20 centipoise, about 50 centipoise, about 100 centipoise, about 200 centipoise, about 500 centipoise, about 1,000 centipoise, about 2,000 centipoise, about 5,000 centipoise, or about 10,000 centipoise.

Optionally, in some embodiments, the conductive graphene ink has a viscosity of about 2,300 centipoise to about 2,400 centipoise. Optionally, in some embodiments, the conductive graphene ink has a viscosity of at least about 2,300 centipoise. Optionally, in some embodiments, the conductive graphene ink has a viscosity of at most about 2,400 centipoise. Optionally, in some embodiments, the conductive graphene ink has a viscosity of about 2,300 centipoise to about 2,310 centipoise, about 2,300 centipoise to about 2,320 centipoise, about 2,300 centipoise to about 2,330 centipoise, about 2,300 centipoise to about 2,340 centipoise, about 2,300 centipoise to about 2,350 centipoise, about 2,300 centipoise to about 2,360 centipoise, about 2,300 centipoise to about 2,370 centipoise, about 2,300 centipoise to about 2,380 centipoise, about 2,300 centipoise to about 2,390 centipoise, about 2,300 centipoise to about 2,400 centipoise, about 2,310 centipoise to about 2,320 centipoise, about 2,310 centipoise to about 2,330 centipoise, about 2,310 centipoise to about 2,340 centipoise, about 2,310 centipoise to about 2,350 centipoise, about 2,310 centipoise to about 2,360 centipoise, about 2,310 centipoise to about 2,370 centipoise, about 2,310 centipoise to about 2,380 centipoise, about 2,310 centipoise to about 2,390 centipoise, about 2,310 centipoise to about 2,400 centipoise, about 2,320 centipoise to about 2,330 centipoise, about 2,320 centipoise to about 2,340 centipoise, about 2,320 centipoise to about 2,350 centipoise, about 2,320 centipoise to about 2,360 centipoise, about 2,320 centipoise to about 2,370 centipoise, about 2,320 centipoise to about 2,380 centipoise, about 2,320 centipoise to about 2,390 centipoise, about 2,320 centipoise to about 2,400 centipoise, about 2,330 centipoise to about 2,340 centipoise, about 2,330 centipoise to about 2,350 centipoise, about 2,330 centipoise to about 2,360 centipoise, about 2,330 centipoise to about 2,370 centipoise, about 2,330 centipoise to about 2,380 centipoise, about 2,330 centipoise to about 2,390 centipoise, about 2,330 centipoise to about 2,400 centipoise, about 2,340 centipoise to about 2,350 centipoise, about 2,340 centipoise to about 2,360 centipoise, about 2,340 centipoise to about 2,370 centipoise, about 2,340 centipoise to about 2,380 centipoise, about 2,340 centipoise to about 2,390 centipoise, about 2,340 centipoise to about 2,400 centipoise, about 2,350 centipoise to about 2,360 centipoise, about 2,350 centipoise to about 2,370 centipoise, about 2,350 centipoise to about 2,380 centipoise, about 2,350 centipoise to about 2,390 centipoise, about 2,350 centipoise to about 2,400 centipoise, about 2,360 centipoise to about 2,370 centipoise, about 2,360 centipoise to about 2,380 centipoise, about 2,360 centipoise to about 2,390 centipoise, about 2,360 centipoise to about 2,400 centipoise, about 2,370 centipoise to about 2,380 centipoise, about 2,370 centipoise to about 2,390 centipoise, about 2,370 centipoise to about 2,400 centipoise, about 2,380 centipoise to about 2,390 centipoise, about 2,380 centipoise to about 2,400 centipoise, or about 2,390 centipoise to about 2,400 centipoise. Optionally, in some embodiments, the conductive graphene ink has a viscosity of about 2,300 centipoise, about 2,310 centipoise, about 2,320 centipoise, about 2,330 centipoise, about 2,340 centipoise, about 2,350 centipoise, about 2,360 centipoise, about 2,370 centipoise, about 2,380 centipoise, about 2,390 centipoise, or about 2,400 centipoise.

Optionally, in some embodiments, the solid matter content of the conductive graphene ink is about 2.5% to about 10.5%. Optionally, in some embodiments, the solid matter content of the conductive graphene ink is at least about 2.5%. Optionally, in some embodiments, the solid matter content of the conductive graphene ink is at most about 10.5%. Optionally, in some embodiments, the solid matter content of the conductive graphene ink is about 2.5% to about 3.5%, about 2.5% to about 4.5%, about 2.5% to about 5.5%, about 2.5% to about 6.5%, about 2.5% to about 7.5%, about 2.5% to about 8.5%, about 2.5% to about 9.5%, about 2.5% to about 10.5%, about 3.5% to about 4.5%, about 3.5% to about 5.5%, about 3.5% to about 6.5%, about 3.5% to about 7.5%, about 3.5% to about 8.5%, about 3.5% to about 9.5%, about 3.5% to about 10.5%, about 4.5% to about 5.5%, about 4.5% to about 6.5%, about 4.5% to about 7.5%, about 4.5% to about 8.5%, about 4.5% to about 9.5%, about 4.5% to about 10.5%, about 5.5% to about 6.5%, about 5.5% to about 7.5%, about 5.5% to about 8.5%, about 5.5% to about 9.5%, about 5.5% to about 10.5%, about 6.5% to about 7.5%, about 6.5% to about 8.5%, about 6.5% to about 9.5%, about 6.5% to about 10.5%, about 7.5% to about 8.5%, about 7.5% to about 9.5%, about 7.5% to about 10.5%, about 8.5% to about 9.5%, about 8.5% to about 10.5%, or about 9.5% to about 10.5%. Optionally, in some embodiments, the solid matter content of the conductive graphene ink is about 2.5%, about 3.5%, about 4.5%, about 5.5%, about 6.5%, about 7.5%, about 8.5%, about 9.5%, or about 10.5%. Optionally, in some embodiments, the solid matter content of the conductive graphene ink is at least about 2.5%, about 3.5%, about 4.5%, about 5.5%, about 6.5%, about 7.5%, about 8.5%, about 9.5%, or about 10.5%. Optionally, in some embodiments, the solid matter content of the conductive graphene ink is no more than about 2.5%, about 3.5%, about 4.5%, about 5.5%, about 6.5%, about 7.5%, about 8.5%, about 9.5%, or about 10.5%.

Optionally, in some embodiments, the density of the conductive graphene ink at a temperature of about 20° C. is about 2.5 g/cm$^3$ to about 10.5 g/cm$^3$. Optionally, in some embodiments, the density of the conductive graphene ink at a temperature of about 20° C. is at least about 2.5 g/cm$^3$. Optionally, in some embodiments, the density of the conductive graphene ink at a temperature of about 20° C. is at most about 10.5 g/cm$^3$. Optionally, in some embodiments, the density of the conductive graphene ink at a temperature of about 20° C. is about 2.5 g/cm$^3$ to about 3.5 g/cm$^3$, about 2.5 g/cm$^3$ to about 4.5 g/cm$^3$, about 2.5 g/cm$^3$ to about 5.5 g/cm$^3$, about 2.5 g/cm$^3$ to about 6.5 g/cm$^3$, about 2.5 g/cm$^3$ to about 7.5 g/cm$^3$, about 2.5 g/cm$^3$ to about 8.5 g/cm$^3$, about 2.5 g/cm$^3$ to about 9.5 g/cm$^3$, about 2.5 g/cm$^3$ to about 10.5 g/cm$^3$, about 3.5 g/cm$^3$ to about 4.5 g/cm$^3$, about 3.5 g/cm$^3$ to about 5.5 g/cm$^3$, about 3.5 g/cm$^3$ to about 6.5 g/cm$^3$, about 3.5 g/cm$^3$ to about 7.5 g/cm$^3$, about 3.5 g/cm$^3$ to about 8.5 g/cm$^3$, about 3.5 g/cm$^3$ to about 9.5 g/cm$^3$, about 3.5 g/cm$^3$ to about 10.5 g/cm$^3$, about 4.5 g/cm$^3$ to about 5.5 g/cm$^3$, about 4.5 g/cm$^3$ to about 6.5 g/cm$^3$, about 4.5 g/cm$^3$ to about 7.5 g/cm$^3$, about 4.5 g/cm$^3$ to about 8.5 g/cm$^3$, about 4.5 g/cm$^3$ to about 9.5 g/cm$^3$, about 4.5 g/cm$^3$ to about 10.5 g/cm$^3$, about 5.5 g/cm$^3$ to about 6.5 g/cm$^3$, about 5.5 g/cm$^3$ to about 7.5 g/cm$^3$, about 5.5 g/cm$^3$ to about 8.5 g/cm$^3$, about 5.5 g/cm$^3$ to about 9.5 g/cm$^3$, about 5.5 g/cm$^3$ to about 10.5 g/cm$^3$, about 6.5 g/cm$^3$ to about 7.5 g/cm$^3$, about 6.5 g/cm$^3$ to about 8.5 g/cm$^3$, about 6.5 g/cm$^3$ to about 9.5 g/cm$^3$, about 6.5 g/cm$^3$ to about 10.5 g/cm$^3$, about 7.5 g/cm$^3$ to about 8.5 g/cm$^3$, about 7.5 g/cm$^3$ to about 9.5 g/cm$^3$, about 7.5 g/cm$^3$ to about 10.5 g/cm$^3$, about 8.5 g/cm$^3$ to about 9.5 g/cm$^3$, about 8.5 g/cm$^3$ to about 10.5 g/cm$^3$, or about 9.5 g/cm$^3$ to about 10.5 g/cm$^3$. Optionally, in some embodiments, the density of the conductive graphene ink at a temperature of about 20° C. is at most about 10.5 g/cm$^3$. Optionally, in some embodiments, the density of the conductive graphene ink at a temperature of about 20° C. is about 2.5 g/cm$^3$, about 3.5 g/cm$^3$, about 4.5 g/cm$^3$, about 5.5 g/cm$^3$, about 6.5 g/cm$^3$, about 7.5 g/cm$^3$, about 8.5 g/cm$^3$, about 9.5 g/cm$^3$, or about 10.5 g/cm$^3$. Optionally, in some embodiments, the density of the conductive graphene ink at a temperature of at least about 20° C. is about 2.5 g/cm$^3$, about 3.5 g/cm$^3$, about 4.5 g/cm$^3$, about 5.5 g/cm$^3$, about 6.5 g/cm$^3$, about 7.5 g/cm$^3$, about 8.5 g/cm$^3$, about 9.5 g/cm$^3$, or about 10.5 g/cm$^3$. Optionally, in some embodiments, the density of the conductive graphene ink at a temperature of no more than about 20° C. is about 2.5 g/cm$^3$, about 3.5 g/cm$^3$, about 4.5 g/cm$^3$, about 5.5 g/cm$^3$, about 6.5 g/cm$^3$, about 7.5 g/cm$^3$, about 8.5 g/cm$^3$, about 9.5 g/cm$^3$, or about 10.5 g/cm$^3$.

Optionally, in some embodiments the conductive graphene ink has a surface area of about 40 m$^2$/g to about 2,400 m$^2$/g. Optionally, in some embodiments the conductive graphene ink has a surface area of at least about 40 m$^2$/g. Optionally, in some embodiments the conductive graphene ink has a surface area of at most about 2,400 m$^2$/g. Optionally, in some embodiments the conductive graphene ink has a surface area of about 40 m$^2$/g to about 80 m$^2$/g, about 40 m$^2$/g to about 120 m$^2$/g, about 40 m$^2$/g to about 240 m$^2$/g, about 40 m$^2$/g to about 480 m$^2$/g, about 40 m$^2$/g to about 1,000 m$^2$/g, about 40 m$^2$/g to about 1,400 m$^2$/g, about 40 m$^2$/g to about 1,800 m$^2$/g, about 40 m$^2$/g to about 2,200 m$^2$/g, about 40 m$^2$/g to about 2,400 m$^2$/g, about 80 m$^2$/g to about 120 m$^2$/g, about 80 m$^2$/g to about 240 m$^2$/g, about 80 m$^2$/g to about 480 m$^2$/g, about 80 m$^2$/g to about 1,000 m$^2$/g, about 80 m$^2$/g to about 1,400 m$^2$/g, about 80 m$^2$/g to about 1,800 m$^2$/g, about 80 m$^2$/g to about 2,200 m$^2$/g, about 80 m$^2$/g to about 2,400 m$^2$/g, about 120 m$^2$/g to about 240 m$^2$/g, about 120 m$^2$/g to about 480 m$^2$/g, about 120 m$^2$/g to about 1,000 m$^2$/g, about 120 m$^2$/g to about 1,400 m$^2$/g, about 120 m$^2$/g to about 1,800 m$^2$/g, about 120 m$^2$/g to about 2,200 m$^2$/g, about 120 m$^2$/g to about 2,400 m$^2$/g, about 240 m$^2$/g to about 480 $m^2/g$, about 240 $m^2/g$ to about 1,000 $m^2/g$, about 240 $m^2/g$ to about 1,400 $m^2/g$, about 240 $m^2/g$ to about 1,800 $m^2/g$, about 240 $m^2/g$ to about 2,200 $m^2/g$, about 240 $m^2/g$ to about 2,400 $m^2/g$, about 480 $m^2/g$ to about 1,000 $m^2/g$, about 480 $m^2/g$ to about 1,400 $m^2/g$, about 480 $m^2/g$ to about 1,800 $m^2/g$, about 480 $m^2/g$ to about 2,200 $m^2/g$, about 480 $m^2/g$ to about 2,400 $m^2/g$, about 1,000 $m^2/g$ to about 1,400 $m^2/g$, about 1,000 $m^2/g$ to about 1,800 $m^2/g$, about 1,000 $m^2/g$ to about 2,200 $m^2/g$, about 1,000 $m^2/g$ to about 2,400 $m^2/g$, about 1,400 $m^2/g$ to about 1,800 $m^2/g$, about 1,400 $m^2/g$ to about 2,200 $m^2/g$, about 1,400 $m^2/g$ to about 2,400 $m^2/g$, about 1,800 $m^2/g$ to about 2,200 $m^2/g$, about 1,800 $m^2/g$ to about 2,400 $m^2/g$, or about 2,200 $m^2/g$ to about 2,400 $m^2/g$. Optionally, in some embodiments the conductive graphene ink has a surface area of about 40 $m^2/g$, about 80 $m^2/g$, about 120 $m^2/g$, about 240 $m^2/g$, about 480 $m^2/g$, about 1,000 $m^2/g$, about 1,400 $m^2/g$, about 1,800 $m^2/g$, about 2,200 $m^2/g$, or about 2,400 $m^2/g$. Optionally, in some embodiments the conductive graphene ink has a surface area of at least about 40 $m^2/g$, about 80 $m^2/g$, about 120 $m^2/g$, about 240 $m^2/g$, about 480 $m^2/g$, about 1,000 $m^2/g$, about 1,400 $m^2/g$, about 1,800 $m^2/g$, about 2,200 $m^2/g$, or about 2,400 $m^2/g$. Optionally, in some embodiments the conductive graphene ink has a surface area of no more than about 40 $m^2/g$, about 80 $m^2/g$, about 120 $m^2/g$, about 240 $m^2/g$, about 480 $m^2/g$, about 1,000 $m^2/g$, about 1,400 $m^2/g$, about 1,800 $m^2/g$, about 2,200 $m^2/g$, or about 2,400 $m^2/g$.

Optionally, in some embodiments the conductive graphene ink has a conductivity of about 400 S/m to about 1,600 S/m. Optionally, in some embodiments the conductive graphene ink has a conductivity of at least about 400 S/m. Optionally, in some embodiments the conductive graphene ink has a conductivity of at most about 1,600 S/m. Optionally, in some embodiments the conductive graphene ink has a conductivity of about 400 S/m to about 500 S/m, about 400 S/m to about 600 S/m, about 400 S/m to about 700 S/m, about 400 S/m to about 800 S/m, about 400 S/m to about 900 S/m, about 400 S/m to about 1,000 S/m, about 400 S/m to about 1,200 S/m, about 400 S/m to about 1,400 S/m, about 400 S/m to about 1,600 S/m, about 500 S/m to about 600 S/m, about 500 S/m to about 700 S/m, about 500 S/m to about 800 S/m, about 500 S/m to about 900 S/m, about 500 S/m to about 1,000 S/m, about 500 S/m to about 1,200 S/m, about 500 S/m to about 1,400 S/m, about 500 S/m to about 1,600 S/m, about 600 S/m to about 700 S/m, about 600 S/m to about 800 S/m, about 600 S/m to about 900 S/m, about 600 S/m to about 1,000 S/m, about 600 S/m to about 1,200 S/m, about 600 S/m to about 1,400 S/m, about 600 S/m to about 1,600 S/m, about 700 S/m to about 800 S/m, about 700 S/m to about 900 S/m, about 700 S/m to about 1,000 S/m, about 700 S/m to about 1,200 S/m, about 700 S/m to about 1,400 S/m, about 700 S/m to about 1,600 S/m, about 800 S/m to about 900 S/m, about 800 S/m to about 1,000 S/m, about 800 S/m to about 1,200 S/m, about 800 S/m to about 1,400 S/m, about 800 S/m to about 1,600 S/m, about 900 S/m to about 1,000 S/m, about 900 S/m to about 1,200 S/m, about 900 S/m to about 1,400 S/m, about 900 S/m to about 1,600 S/m, about 1,000 S/m to about 1,200 S/m, about 1,000 S/m to about 1,400 S/m, about 1,000 S/m to about 1,600 S/m, about 1,200 S/m to about 1,400 S/m, about 1,200 S/m to about 1,600 S/m, or about 1,400 S/m to about 1,600 S/m. Optionally, in some embodiments the conductive graphene ink has a conductivity of about 400 S/m, about 500 S/m, about 600 S/m, about 700 S/m, about 800 S/m, about 900 S/m, about 1,000 S/m, about 1,200 S/m, about 1,400 S/m, or about 1,600 S/m. Optionally, in some embodiments the conductive graphene ink has a conductivity of at least about 400 S/m, about 500 S/m, about 600 S/m, about 700 S/m, about 800 S/m, about 900 S/m, about 1,000 S/m, about 1,200 S/m, about 1,400 S/m, or about 1,600 S/m. Optionally, in some embodiments the conductive graphene ink has a conductivity of no more than about 400 S/m, about 500 S/m, about 600 S/m, about 700 S/m, about 800 S/m, about 900 S/m, about 1,000 S/m, about 1,200 S/m, about 1,400 S/m, or about 1,600 S/m.

Optionally, in some embodiments the conductive graphene ink has a C:O mass ratio of about 2:1 to about 40:1. Optionally, in some embodiments the conductive graphene ink has a C:O mass ratio of at least about 2:1. Optionally, in some embodiments the conductive graphene ink has a C:O mass ratio of at most about 40:1. Optionally, in some embodiments the conductive graphene ink has a C:O mass ratio of about 2:1 to about 4:1, about 2:1 to about 6:1, about 2:1 to about 8:1, about 2:1 to about 10:1, about 2:1 to about 15:1, about 2:1 to about 20:1, about 2:1 to about 25:1, about 2:1 to about 30:1, about 2:1 to about 34:1, about 2:1 to about 40:1, about 4:1 to about 6:1, about 4:1 to about 8:1, about 4:1 to about 10:1, about 4:1 to about 15:1, about 4:1 to about 20:1, about 4:1 to about 25:1, about 4:1 to about 30:1, about 4:1 to about 34:1, about 4:1 to about 40:1, about 6:1 to about 8:1, about 6:1 to about 10:1, about 6:1 to about 15:1, about 6:1 to about 20:1, about 6:1 to about 25:1, about 6:1 to about 30:1, about 6:1 to about 34:1, about 6:1 to about 40:1, about 8:1 to about 10:1, about 8:1 to about 15:1, about 8:1 to about 20:1, about 8:1 to about 25:1, about 8:1 to about 30:1, about 8:1 to about 34:1, about 8:1 to about 40:1, about 10:1 to about 15:1, about 10:1 to about 20:1, about 10:1 to about 25:1, about 10:1 to about 30:1, about 10:1 to about 34:1, about 10:1 to about 40:1, about 15:1 to about 20:1, about 15:1 to about 25:1, about 15:1 to about 30:1, about 15:1 to about 34:1, about 15:1 to about 40:1, about 20:1 to about 25:1, about 20:1 to about 30:1, about 20:1 to about 34:1, about 20:1 to about 40:1, about 25:1 to about 30:1, about 25:1 to about 34:1, about 25:1 to about 40:1, about 30:1 to about 34:1, about 30:1 to about 40:1, or about 34:1 to about 40:1. Optionally, in some embodiments the conductive graphene ink has a C:O mass ratio of about 2:1, about 4:1, about 6:1, about 8:1, about 10:1, about 15:1, about 20:1, about 25:1, about 30:1, about 34:1, or about 40:1. Optionally, in some embodiments, one of the conductivity, the surface area, and the C:O ratio of the conductive graphene ink is measured by methylene blue absorption. Optionally, in some embodiments the conductive graphene ink has a C:O mass ratio of at least about 2:1, about 4:1, about 6:1, about 8:1, about 10:1, about 15:1, about 20:1, about 25:1, about 30:1, about 34:1, or about 40:1. Optionally, in some embodiments the conductive graphene ink has a C:O mass ratio of no more than about 2:1, about 4:1, about 6:1, about 8:1, about 10:1, about 15:1, about 20:1, about 25:1, about 30:1, about 34:1, or about 40:1.

Another aspect provided herein is a method of forming silver nanowires comprising: heating a secondary solvent; adding a catalyst solution and a polymer solution to the secondary solvent to form a first solution; injecting a silver-based solution into the first solution to form a second solution; centrifuging the second solution; and washing the second solution with a washing solution to extract the silver nanowires. Alternatively, in some embodiments, the methods herein are configured form at least one of a silver nanoparticle, a silver nanorod, a silver nanoflower, a silver nanofiber, a silver nanoplatelet, a silver nanoribbon, a silver nanocube, a silver bipyramid. In some embodiments, the silver nanowires are configured to be used in a conductive silver-based ink. Alternatively, in some embodiments, the silver nanowires are configured to be used as a conductive additive in a conductive graphene ink.

Optionally, in some embodiments, the secondary solvent comprises a glycol. Optionally, in some embodiments the glycol comprises ethylene glycol, polyethylene glycol 200, polyethylene glycol 400, propylene glycol, or any combination thereof.

Optionally, in some embodiments, the polymer solution comprises a polymer comprising polyvinyl pyrrolidone, sodium dodecyl sulfonate, vitamin B2, poly(vinyl alcohol), dextrin, poly(methyl vinyl ether), or any combination thereof.

Optionally, in some embodiments, the polymer has a molecular weight of about 10,000 to about 40,000. Optionally, in some embodiments, the polymer has a molecular weight of at least about 10,000. Optionally, in some embodiments, the polymer has a molecular weight of at most about 40,000. Optionally, in some embodiments, the polymer has a molecular weight of about 10,000 to about 12,500, about 10,000 to about 15,000, about 10,000 to about 17,500, about 10,000 to about 20,000, about 10,000 to about 22,500, about 10,000 to about 25,000, about 10,000 to about 27,500, about 10,000 to about 30,000, about 10,000 to about 35,000, about 10,000 to about 40,000, about 12,500 to about 15,000, about 12,500 to about 17,500, about 12,500 to about 20,000, about 12,500 to about 22,500, about 12,500 to about 25,000, about 12,500 to about 27,500, about 12,500 to about 30,000, about 12,500 to about 35,000, about 12,500 to about 40,000, about 15,000 to about 17,500, about 15,000 to about 20,000, about 15,000 to about 22,500, about 15,000 to about 25,000, about 15,000 to about 27,500, about 15,000 to about 30,000, about 15,000 to about 35,000, about 15,000 to about 40,000, about 17,500 to about 20,000, about 17,500 to about 22,500, about 17,500 to about 25,000, about 17,500 to about 27,500, about 17,500 to about 30,000, about 17,500 to about 35,000, about 17,500 to about 40,000, about 20,000 to about 22,500, about 20,000 to about 25,000, about 20,000 to about 27,500, about 20,000 to about 30,000, about 20,000 to about 35,000, about 20,000 to about 40,000, about 22,500 to about 25,000, about 22,500 to about 27,500, about 22,500 to about 30,000, about 22,500 to about 35,000, about 22,500 to about 40,000, about 25,000 to about 27,500, about 25,000 to about 30,000, about 25,000 to about 35,000, about 25,000 to about 40,000, about 27,500 to about 30,000, about 27,500 to about 35,000, about 27,500 to about 40,000, about 30,000 to about 35,000, about 30,000 to about 40,000, or about 35,000 to about 40,000. Optionally, in some embodiments, the polymer has a molecular weight of about 10,000, about 12,500, about 15,000, about 17,500, about 20,000, about 22,500, about 25,000, about 27,500, about 30,000, about 35,000, or about 40,000. Optionally, in some embodiments, the polymer has a molecular weight of at least about 10,000, about 12,500, about 15,000, about 17,500, about 20,000, about 22,500, about 25,000, about 27,500, about 30,000, about 35,000, or about 40,000. Optionally, in some embodiments, the polymer has a molecular weight of no more than about 10,000, about 12,500, about 15,000, about 17,500, about 20,000, about 22,500, about 25,000, about 27,500, about 30,000, about 35,000, or about 40,000.

Optionally, in some embodiments, the polymer solution has a concentration of about 0.075 M to about 0.25 M. Optionally, in some embodiments, the polymer solution has a concentration of at least about 0.075 M. Optionally, in some embodiments, the polymer solution has a concentration of at most about 0.25 M. Optionally, in some embodiments, the polymer solution has a concentration of about 0.075 M to about 0.1 M, about 0.075 M to about 0.125 M, about 0.075 M to about 0.15 M, about 0.075 M to about 0.175 M, about 0.075 M to about 0.2 M, about 0.075 M to about 0.225 M, about 0.075 M to about 0.25 M, about 0.1 M to about 0.125 M, about 0.1 M to about 0.15 M, about 0.1 M to about 0.175 M, about 0.1 M to about 0.2 M, about 0.1 M to about 0.225 M, about 0.1 M to about 0.25 M, about 0.125 M to about 0.15 M, about 0.125 M to about 0.175 M, about 0.125 M to about 0.2 M, about 0.125 M to about 0.225 M, about 0.125 M to about 0.25 M, about 0.15 M to about 0.175 M, about 0.15 M to about 0.2 M, about 0.15 M to about 0.225 M, about 0.15 M to about 0.25 M, about 0.175 M to about 0.2 M, about 0.175 M to about 0.225 M, about 0.175 M to about 0.25 M, about 0.2 M to about 0.225 M, about 0.2 M to about 0.25 M, or about 0.225 M to about 0.25 M. Optionally, in some embodiments, the polymer solution has a concentration of about 0.075 M, about 0.1 M, about 0.125 M, about 0.15 M, about 0.175 M, about 0.2 M, about 0.225 M, or about 0.25 M. Optionally, in some embodiments, the polymer solution has a concentration of at least about 0.075 M, about 0.1 M, about 0.125 M, about 0.15 M, about 0.175 M, about 0.2 M, about 0.225 M, or about 0.25 M. Optionally, in some embodiments, the polymer solution has a concentration of no more than about 0.075 M, about 0.1 M, about 0.125 M, about 0.15 M, about 0.175 M, about 0.2 M, about 0.225 M, or about 0.25 M.

Optionally, in some embodiments, the secondary solvent is heated to a temperature of about 75° C. to about 300° C. Optionally, in some embodiments, the secondary solvent is heated to a temperature of at least about 75° C. Optionally, in some embodiments, the secondary solvent is heated to a temperature of at most about 300° C. Optionally, in some embodiments, the secondary solvent is heated to a temperature of about 75° C. to about 100° C., about 75° C. to about 125° C., about 75° C. to about 150° C., about 75° C. to about 175° C., about 75° C. to about 200° C., about 75° C. to about 225° C., about 75° C. to about 250° C., about 75° C. to about 275° C., about 75° C. to about 300° C., about 100° C. to about 125° C., about 100° C. to about 150° C., about 100° C. to about 175° C., about 100° C. to about 200° C., about 100° C. to about 225° C., about 100° C. to about 250° C., about 100° C. to about 275° C., about 100° C. to about 300° C., about 125° C. to about 150° C., about 125° C. to about 175° C., about 125° C. to about 200° C., about 125° C. to about 225° C., about 125° C. to about 250° C., about 125° C. to about 275° C., about 125° C. to about 300° C., about 150° C. to about 175° C., about 150° C. to about 200° C., about 150° C. to about 225° C., about 150° C. to about 250° C., about 150° C. to about 275° C., about 150° C. to about 300° C., about 175° C. to about 200° C., about 175° C. to about 225° C., about 175° C. to about 250° C., about 175° C. to about 275° C., about 175° C. to about 300° C., about 200° C. to about 225° C., about 200° C. to about 250° C., about 200° C. to about 275° C., about 200° C. to about 300° C., about 225° C. to about 250° C., about 225° C. to about 275° C., about 225° C. to about 300° C., about 250° C. to about 275° C., about 250° C. to about 300° C., or about 275° C. to about 300° C. Optionally, in some embodiments, the secondary solvent is heated to a temperature of about 75° C., about 100° C., about 125° C., about 150° C., about 175° C., about 200° C., about 225° C., about 250° C., about 275° C., or about 300° C. Optionally, in some embodiments, the secondary solvent is heated to a temperature of at least about 75° C., about 100° C., about 125° C., about 150° C., about 175° C., about 200° C., about 225° C., about 250° C., about 275° C., or about 300° C. Optionally, in some embodiments, the secondary solvent is heated to a temperature of no more than about 75° C., about 100° C., about 125° C., about 150°

C., about 175° C., about 200° C., about 225° C., about 250° C., about 275° C., or about 300° C.

Optionally, in some embodiments, the secondary solvent is heated for a period of time of about 30 minutes to about 120 minutes. Optionally, in some embodiments, the secondary solvent is heated for a period of time of at least about 30 minutes. Optionally, in some embodiments, the secondary solvent is heated for a period of time of at most about 120 minutes. Optionally, in some embodiments, the secondary solvent is heated for a period of time of about 30 minutes to about 40 minutes, about 30 minutes to about 50 minutes, about 30 minutes to about 60 minutes, about 30 minutes to about 70 minutes, about 30 minutes to about 80 minutes, about 30 minutes to about 90 minutes, about 30 minutes to about 100 minutes, about 30 minutes to about 110 minutes, about 30 minutes to about 120 minutes, about 40 minutes to about 50 minutes, about 40 minutes to about 60 minutes, about 40 minutes to about 70 minutes, about 40 minutes to about 80 minutes, about 40 minutes to about 90 minutes, about 40 minutes to about 100 minutes, about 40 minutes to about 110 minutes, about 40 minutes to about 120 minutes, about 50 minutes to about 60 minutes, about 50 minutes to about 70 minutes, about 50 minutes to about 80 minutes, about 50 minutes to about 90 minutes, about 50 minutes to about 100 minutes, about 50 minutes to about 110 minutes, about 50 minutes to about 120 minutes, about 60 minutes to about 70 minutes, about 60 minutes to about 80 minutes, about 60 minutes to about 90 minutes, about 60 minutes to about 100 minutes, about 60 minutes to about 110 minutes, about 60 minutes to about 120 minutes, about 70 minutes to about 80 minutes, about 70 minutes to about 90 minutes, about 70 minutes to about 100 minutes, about 70 minutes to about 110 minutes, about 70 minutes to about 120 minutes, about 80 minutes to about 90 minutes, about 80 minutes to about 100 minutes, about 80 minutes to about 110 minutes, about 80 minutes to about 120 minutes, about 90 minutes to about 100 minutes, about 90 minutes to about 110 minutes, about 90 minutes to about 120 minutes, about 100 minutes to about 110 minutes, about 100 minutes to about 120 minutes, or about 110 minutes to about 120 minutes. Optionally, in some embodiments, the secondary solvent is heated for a period of time of about 30 minutes, about 40 minutes, about 50 minutes, about 60 minutes, about 70 minutes, about 80 minutes, about 90 minutes, about 100 minutes, about 110 minutes, or about 120 minutes. Optionally, in some embodiments, the secondary solvent is heated for a period of time of at least about 30 minutes, about 40 minutes, about 50 minutes, about 60 minutes, about 70 minutes, about 80 minutes, about 90 minutes, about 100 minutes, about 110 minutes, or about 120 minutes. Optionally, in some embodiments, the secondary solvent is heated for a period of time of no more than about 30 minutes, about 40 minutes, about 50 minutes, about 60 minutes, about 70 minutes, about 80 minutes, about 90 minutes, about 100 minutes, about 110 minutes, or about 120 minutes.

Optionally, in some embodiments, the secondary solvent is stirred while being heated. Optionally, in some embodiments, the stirring is performed by a magnetic stir bar.

Optionally, in some embodiments, the stirring is performed at a rate of about 100 rpm to about 400 rpm. Optionally, in some embodiments, the stirring is performed at a rate of at least about 100 rpm. Optionally, in some embodiments, the stirring is performed at a rate of at most about 400 rpm. Optionally, in some embodiments, the stirring is performed at a rate of about 100 rpm to about 125 rpm, about 100 rpm to about 150 rpm, about 100 rpm to about 175 rpm, about 100 rpm to about 200 rpm, about 100 rpm to about 225 rpm, about 100 rpm to about 250 rpm, about 100 rpm to about 275 rpm, about 100 rpm to about 300 rpm, about 100 rpm to about 350 rpm, about 100 rpm to about 400 rpm, about 125 rpm to about 150 rpm, about 125 rpm to about 175 rpm, about 125 rpm to about 200 rpm, about 125 rpm to about 225 rpm, about 125 rpm to about 250 rpm, about 125 rpm to about 275 rpm, about 125 rpm to about 300 rpm, about 125 rpm to about 350 rpm, about 125 rpm to about 400 rpm, about 150 rpm to about 175 rpm, about 150 rpm to about 200 rpm, about 150 rpm to about 225 rpm, about 150 rpm to about 250 rpm, about 150 rpm to about 275 rpm, about 150 rpm to about 300 rpm, about 150 rpm to about 350 rpm, about 150 rpm to about 400 rpm, about 175 rpm to about 200 rpm, about 175 rpm to about 225 rpm, about 175 rpm to about 250 rpm, about 175 rpm to about 275 rpm, about 175 rpm to about 300 rpm, about 175 rpm to about 350 rpm, about 175 rpm to about 400 rpm, about 200 rpm to about 225 rpm, about 200 rpm to about 250 rpm, about 200 rpm to about 275 rpm, about 200 rpm to about 300 rpm, about 200 rpm to about 350 rpm, about 200 rpm to about 400 rpm, about 225 rpm to about 250 rpm, about 225 rpm to about 275 rpm, about 225 rpm to about 300 rpm, about 225 rpm to about 350 rpm, about 225 rpm to about 400 rpm, about 250 rpm to about 275 rpm, about 250 rpm to about 300 rpm, about 250 rpm to about 350 rpm, about 250 rpm to about 400 rpm, about 275 rpm to about 300 rpm, about 275 rpm to about 350 rpm, about 275 rpm to about 400 rpm, about 300 rpm to about 350 rpm, about 300 rpm to about 400 rpm, or about 350 rpm to about 400 rpm. Optionally, in some embodiments, the stirring is performed at a rate of about 100 rpm, about 125 rpm, about 150 rpm, about 175 rpm, about 200 rpm, about 225 rpm, about 250 rpm, about 275 rpm, about 300 rpm, about 350 rpm, or about 400 rpm. Optionally, in some embodiments, the stirring is performed at a rate of at least about 100 rpm, about 125 rpm, about 150 rpm, about 175 rpm, about 200 rpm, about 225 rpm, about 250 rpm, about 275 rpm, about 300 rpm, about 350 rpm, or about 400 rpm. Optionally, in some embodiments, the stirring is performed at a rate of no more than about 100 rpm, about 125 rpm, about 150 rpm, about 175 rpm, about 200 rpm, about 225 rpm, about 250 rpm, about 275 rpm, about 300 rpm, about 350 rpm, or about 400 rpm.

Optionally, in some embodiments, the catalyst solution comprises a catalyst comprising a chloride. Optionally, in some embodiments, the catalyst solution comprises a catalyst comprising $CuCl_2$, CuCl, NaCl, $PtCl_2$, AgCl, $FeCl_2$, $FeCl_3$, tetrapropylammonium chloride, tetrapropylammonium bromide, or any combination thereof.

Optionally, in some embodiments, the catalyst solution has a concentration of about 2 mM to about 8 mM. Optionally, in some embodiments, the catalyst solution has a concentration of at least about 2 mM. Optionally, in some embodiments, the catalyst solution has a concentration of at most about 8 mM. Optionally, in some embodiments, the catalyst solution has a concentration of about 2 mM to about 2.5 mM, about 2 mM to about 3 mM, about 2 mM to about 3.5 mM, about 2 mM to about 4 mM, about 2 mM to about 4.5 mM, about 2 mM to about 5 mM, about 2 mM to about 5.5 mM, about 2 mM to about 6 mM, about 2 mM to about 6.5 mM, about 2 mM to about 7 mM, about 2 mM to about 8 mM, about 2.5 mM to about 3 mM, about 2.5 mM to about 3.5 mM, about 2.5 mM to about 4 mM, about 2.5 mM to about 4.5 mM, about 2.5 mM to about 5 mM, about 2.5 mM to about 5.5 mM, about 2.5 mM to about 6 mM, about 2.5 mM to about 6.5 mM, about 2.5 mM to about 7 mM, about 2.5 mM to about 8 mM, about 3 mM to about 3.5 mM, about 3 mM to about 4 mM, about 3 mM to about 4.5 mM, about 3 mM to about 5 mM, about 3 mM to about 5.5 mM, about 3 mM to about 6 mM, about 3 mM to about 6.5 mM, about 3 mM to about 7 mM, about 3 mM to about 8 mM, about 3.5 mM to about 4 mM, about 3.5 mM to about 4.5 mM, about 3.5 mM to about 5 mM, about 3.5 mM to about 5.5 mM, about 3.5 mM to about 6 mM, about 3.5 mM to about 6.5 mM, about 3.5 mM to about 7 mM, about 3.5 mM to about 8 mM, about 4 mM to about 4.5 mM, about 4 mM to about 5 mM, about 4 mM to about 5.5 mM, about 4 mM to about 6 mM, about 4 mM to about 6.5 mM, about 4 mM to about 7 mM, about 4 mM to about 8 mM, about 4.5 mM to about 5 mM, about 4.5 mM to about 5.5 mM, about 4.5 mM to about 6 mM, about 4.5 mM to about 6.5 mM, about 4.5 mM to about 7 mM, about 4.5 mM to about 8 mM, about 5 mM to about 5.5 mM, about 5 mM to about 6 mM, about 5 mM to about 6.5 mM, about 5 mM to about 7 mM, about 5 mM to about 8 mM, about 5.5 mM to about 6 mM, about 5.5 mM to about 6.5 mM, about 5.5 mM to about 7 mM, about 5.5 mM to about 8 mM, about 6 mM to about 6.5 mM, about 6 mM to about 7 mM, about 6 mM to about 8 mM, about 6.5 mM to about 7 mM, about 6.5 mM to about 8 mM, or about 7 mM to about 8 mM. Optionally, in some embodiments, the catalyst solution has a concentration of about 2 mM, about 2.5 mM, about 3 mM, about 3.5 mM, about 4 mM, about 4.5 mM, about 5 mM, about 5.5 mM, about 6 mM, about 6.5 mM, about 7 mM, or about 8 mM. Optionally, in some embodiments, the catalyst solution has a concentration of at least about 2 mM, about 2.5 mM, about 3 mM, about 3.5 mM, about 4 mM, about 4.5 mM, about 5 mM, about 5.5 mM, about 6 mM, about 6.5 mM, about 7 mM, or about 8 mM. Optionally, in some embodiments, the catalyst solution has a concentration of no more than about 2 mM, about 2.5 mM, about 3 mM, about 3.5 mM, about 4 mM, about 4.5 mM, about 5 mM, about 5.5 mM, about 6 mM, about 6.5 mM, about 7 mM, or about 8 mM.

Optionally, in some embodiments, the volume of the secondary solvent is greater than the volume of the catalyst solution by a factor of about 75 to about 250. Optionally, in some embodiments, the volume of the secondary solvent is greater than the volume of the catalyst solution by a factor of at least about 75. Optionally, in some embodiments, the volume of the secondary solvent is greater than the volume of the catalyst solution by a factor of at most about 250. Optionally, in some embodiments, the volume of the secondary solvent is greater than the volume of the catalyst solution by a factor of about 75 to about 100, about 75 to about 125, about 75 to about 150, about 75 to about 175, about 75 to about 200, about 75 to about 225, about 75 to about 250, about 100 to about 125, about 100 to about 150, about 100 to about 175, about 100 to about 200, about 100 to about 225, about 100 to about 250, about 125 to about 150, about 125 to about 175, about 125 to about 200, about 125 to about 225, about 125 to about 250, about 150 to about 175, about 150 to about 200, about 150 to about 225, about 150 to about 250, about 175 to about 200, about 175 to about 225, about 175 to about 250, about 200 to about 225, about 200 to about 250, or about 225 to about 250. Optionally, in some embodiments, the volume of the secondary solvent is greater than the volume of the catalyst solution by a factor of about 75, about 100, about 125, about 150, about 175, about 200, about 225, or about 250. Optionally, in some embodiments, the volume of the secondary solvent is greater than the volume of the catalyst solution by a factor of at least about 75, about 100, about 125, about 150, about 175, about 200, about 225, or about 250. Optionally, in some embodiments, the volume of the secondary solvent is greater than the volume of the catalyst solution by a factor of no more than about 75, about 100, about 125, about 150, about 175, about 200, about 225, or about 250.

Optionally, in some embodiments, the volume of the secondary solvent is greater than the volume of the polymer solution by a factor of about 1.5 to about 6.5. Optionally, in some embodiments, the volume of the secondary solvent is greater than the volume of the polymer solution by a factor of at least about 1.5. Optionally, in some embodiments, the volume of the secondary solvent is greater than the volume of the polymer solution by a factor of at most about 6.5. Optionally, in some embodiments, the volume of the secondary solvent is greater than the volume of the polymer solution by a factor of about 1.5 to about 2, about 1.5 to about 2.5, about 1.5 to about 3, about 1.5 to about 3.5, about 1.5 to about 4, about 1.5 to about 4.5, about 1.5 to about 5, about 1.5 to about 5.5, about 1.5 to about 6, about 1.5 to about 6.5, about 2 to about 2.5, about 2 to about 3, about 2 to about 3.5, about 2 to about 4, about 2 to about 4.5, about 2 to about 5, about 2 to about 5.5, about 2 to about 6, about 2 to about 6.5, about 2.5 to about 3, about 2.5 to about 3.5, about 2.5 to about 4, about 2.5 to about 4.5, about 2.5 to about 5, about 2.5 to about 5.5, about 2.5 to about 6, about 2.5 to about 6.5, about 3 to about 3.5, about 3 to about 4, about 3 to about 4.5, about 3 to about 5, about 3 to about 5.5, about 3 to about 6, about 3 to about 6.5, about 3.5 to about 4, about 3.5 to about 4.5, about 3.5 to about 5, about 3.5 to about 5.5, about 3.5 to about 6, about 3.5 to about 6.5, about 4 to about 4.5, about 4 to about 5, about 4 to about 5.5, about 4 to about 6, about 4 to about 6.5, about 4.5 to about 5, about 4.5 to about 5.5, about 4.5 to about 6, about 4.5 to about 6.5, about 5 to about 5.5, about 5 to about 6, about 5 to about 6.5, about 5.5 to about 6, about 5.5 to about 6.5, or about 6 to about 6.5. Optionally, in some embodiments, the volume of the secondary solvent is greater than the volume of the polymer solution by a factor of about 1.5, about 2, about 2.5, about 3, about 3.5, about 4, about 4.5, about 5, about 5.5, about 6, or about 6.5. Optionally, in some embodiments, the volume of the secondary solvent is greater than the volume of the polymer solution by a factor of at least about 1.5, about 2, about 2.5, about 3, about 3.5, about 4, about 4.5, about 5, about 5.5, about 6, or about 6.5. Optionally, in some embodiments, the volume of the secondary solvent is greater than the volume of the polymer solution by a factor of no more than about 1.5, about 2, about 2.5, about 3, about 3.5, about 4, about 4.5, about 5, about 5.5, about 6, or about 6.5.

Optionally, in some embodiments, the silver-based solution comprises a silver-based material comprising $AgNO_3$. Optionally, in some embodiments, the silver-based solution has a concentration of about 0.05 M to about 0.2 M. Optionally, in some embodiments, the silver-based solution has a concentration of at least about 0.05 M. Optionally, in some embodiments, the silver-based solution has a concentration of at most about 0.2 M. Optionally, in some embodiments, the silver-based solution has a concentration of about 0.05 M to about 0.075 M, about 0.05 M to about 0.1 M, about 0.05 M to about 0.125 M, about 0.05 M to about 0.15 M, about 0.05 M to about 0.175 M, about 0.05 M to about 0.2 M, about 0.075 M to about 0.1 M, about 0.075 M to about 0.125 M, about 0.075 M to about 0.15 M, about 0.075 M to about 0.175 M, about 0.075 M to about 0.2 M, about 0.1 M to about 0.125 M, about 0.1 M to about 0.15 M, about 0.1 M to about 0.175 M, about 0.1 M to about 0.2 M, about 0.125 M to about 0.15 M, about 0.125 M to about 0.175 M, about 0.125 M to about 0.2 M, about 0.15 M to about 0.175 M, about 0.15 M to about 0.2 M, or about 0.175 M to about 0.2 M. Optionally, in some embodiments, the silver-based solution has a concentration of about 0.05 M, about 0.075 M, about 0.1 M, about 0.125 M, about 0.15 M, about 0.175 M, or about 0.2 M. Optionally, in some embodiments, the silver-based solution has a concentration of at least about 0.05 M, about 0.075 M, about 0.1 M, about 0.125 M, about 0.15 M, about 0.175 M, or about 0.2 M. Optionally, in some embodiments, the silver-based solution has a concentration of no more than about 0.05 M, about 0.075 M, about 0.1 M, about 0.125 M, about 0.15 M, about 0.175 M, or about 0.2 M.

Optionally, in some embodiments, the volume of the secondary solvent is greater than the volume of the silver-based solution by a factor of about 1.5 to about 6.5. Optionally, in some embodiments, the volume of the secondary solvent is greater than the volume of the silver-based solution by a factor of at least about 1.5. Optionally, in some embodiments, the volume of the secondary solvent is greater than the volume of the silver-based solution by a factor of at most about 6.5. Optionally, in some embodiments, the volume of the secondary solvent is greater than the volume of the silver-based solution by a factor of about 1.5 to about 2, about 1.5 to about 2.5, about 1.5 to about 3, about 1.5 to about 3.5, about 1.5 to about 4, about 1.5 to about 4.5, about 1.5 to about 5, about 1.5 to about 5.5, about 1.5 to about 6, about 1.5 to about 6.5, about 2 to about 2.5, about 2 to about 3, about 2 to about 3.5, about 2 to about 4, about 2 to about 4.5, about 2 to about 5, about 2 to about 5.5, about 2 to about 6, about 2 to about 6.5, about 2.5 to about 3, about 2.5 to about 3.5, about 2.5 to about 4, about 2.5 to about 4.5, about 2.5 to about 5, about 2.5 to about 5.5, about 2.5 to about 6, about 2.5 to about 6.5, about 3 to about 3.5, about 3 to about 4, about 3 to about 4.5, about 3 to about 5, about 3 to about 5.5, about 3 to about 6, about 3 to about 6.5, about 3.5 to about 4, about 3.5 to about 4.5, about 3.5 to about 5, about 3.5 to about 5.5, about 3.5 to about 6, about 3.5 to about 6.5, about 4 to about 4.5, about 4 to about 5, about 4 to about 5.5, about 4 to about 6, about 4 to about 6.5, about 4.5 to about 5, about 4.5 to about 5.5, about 4.5 to about 6, about 4.5 to about 6.5, about 5 to about 5.5, about 5 to about 6, about 5 to about 6.5, about 5.5 to about 6, about 5.5 to about 6.5, or about 6 to about 6.5. Optionally, in some embodiments, the volume of the secondary solvent is greater than the volume of the silver-based solution by a factor of about 1.5, about 2, about 2.5, about 3, about 3.5, about 4, about 4.5, about 5, about 5.5, about 6, or about 6.5. Optionally, in some embodiments, the volume of the secondary solvent is greater than the volume of the silver-based solution by a factor of at least about 1.5, about 2, about 2.5, about 3, about 3.5, about 4, about 4.5, about 5, about 5.5, about 6, or about 6.5. Optionally, in some embodiments, the volume of the secondary solvent is greater than the volume of the silver-based solution by a factor of no more than about 1.5, about 2, about 2.5, about 3, about 3.5, about 4, about 4.5, about 5, about 5.5, about 6, or about 6.5.

Optionally, in some embodiments, the silver-based solution is injected into the first solution over a period of time of about 1 second to about 900 seconds. Optionally, in some embodiments, the silver-based solution is injected into the first solution over a period of time of at least about 1 second. Optionally, in some embodiments, the silver-based solution is injected into the first solution over a period of time of at most about 900 seconds. Optionally, in some embodiments, the silver-based solution is injected into the first solution over a period of time of about 1 second to about 2 seconds, about 1 second to about 5 seconds, about 1 second to about 10 seconds, about 1 second to about 50 seconds, about 1 second to about 100 seconds, about 1 second to about 200 seconds, about 1 second to about 300 seconds, about 1 second to about 400 seconds, about 1 second to about 600 seconds, about 1 second to about 800 seconds, about 1 second to about 900 seconds, about 2 seconds to about 5 seconds, about 2 seconds to about 10 seconds, about 2 seconds to about 50 seconds, about 2 seconds to about 100 seconds, about 2 seconds to about 200 seconds, about 2 seconds to about 300 seconds, about 2 seconds to about 400 seconds, about 2 seconds to about 600 seconds, about 2 seconds to about 800 seconds, about 2 seconds to about 900 seconds, about 5 seconds to about 10 seconds, about 5 seconds to about 50 seconds, about 5 seconds to about 100 seconds, about 5 seconds to about 200 seconds, about 5 seconds to about 300 seconds, about 5 seconds to about 400 seconds, about 5 seconds to about 600 seconds, about 5 seconds to about 800 seconds, about 5 seconds to about 900 seconds, about 10 seconds to about 50 seconds, about 10 seconds to about 100 seconds, about 10 seconds to about 200 seconds, about 10 seconds to about 300 seconds, about 10 seconds to about 400 seconds, about 10 seconds to about 600 seconds, about 10 seconds to about 800 seconds, about 10 seconds to about 900 seconds, about 50 seconds to about 100 seconds, about 50 seconds to about 200 seconds, about 50 seconds to about 300 seconds, about 50 seconds to about 400 seconds, about 50 seconds to about 600 seconds, about 50 seconds to about 800 seconds, about 50 seconds to about 900 seconds, about 100 seconds to about 200 seconds, about 100 seconds to about 300 seconds, about 100 seconds to about 400 seconds, about 100 seconds to about 600 seconds, about 100 seconds to about 800 seconds, about 100 seconds to about 900 seconds, about 200 seconds to about 300 seconds, about 200 seconds to about 400 seconds, about 200 seconds to about 600 seconds, about 200 seconds to about 800 seconds, about 200 seconds to about 900 seconds, about 300 seconds to about 400 seconds, about 300 seconds to about 600 seconds, about 300 seconds to about 800 seconds, about 300 seconds to about 900 seconds, about 400 seconds to about 600 seconds, about 400 seconds to about 800 seconds, about 400 seconds to about 900 seconds, about 600 seconds to about 800 seconds, about 600 seconds to about 900 seconds, or about 800 seconds to about 900 seconds. Optionally, in some embodiments, the silver-based solution is injected into the first solution over a period of time of about 1 second, about 2 seconds, about 5 seconds, about 10 seconds, about 50 seconds, about 100 seconds, about 200 seconds, about 300 seconds, about 400 seconds, about 600 seconds, about 800 seconds, or about 900 seconds. Optionally, in some embodiments, the silver-based solution is injected into the first solution over a period of time of at least about 1 second, about 2 seconds, about 5 seconds, about 10 seconds, about 50 seconds, about 100 seconds, about 200 seconds, about 300 seconds, about 400 seconds, about 600 seconds, about 800 seconds, or about 900 seconds. Optionally, in some embodiments, the silver-based solution is injected into the first solution over a period of time of no more than about 1 second, about 2 seconds, about 5 seconds, about 10 seconds, about 50 seconds, about 100 seconds, about 200 seconds, about 300 seconds, about 400 seconds, about 600 seconds, about 800 seconds, or about 900 seconds.

Some embodiments further comprise heating the second solution before the process of centrifuging the second solution.

Optionally, in some embodiments, the heating of the second solution occurs over a period of time of about 30 minutes to about 120 minutes. Optionally, in some embodiments, the heating of the second solution occurs over a period of time of at least about 30 minutes. Optionally, in some embodiments, the heating of the second solution occurs over a period of time of at most about 120 minutes. Optionally, in some embodiments, the heating of the second solution occurs over a period of time of about 30 minutes to about 40 minutes, about 30 minutes to about 50 minutes, about 30 minutes to about 60 minutes, about 30 minutes to about 70 minutes, about 30 minutes to about 80 minutes, about 30 minutes to about 90 minutes, about 30 minutes to about 100 minutes, about 30 minutes to about 110 minutes, about 30 minutes to about 120 minutes, about 40 minutes to about 50 minutes, about 40 minutes to about 60 minutes, about 40 minutes to about 70 minutes, about 40 minutes to about 80 minutes, about 40 minutes to about 90 minutes, about 40 minutes to about 100 minutes, about 40 minutes to about 110 minutes, about 40 minutes to about 120 minutes, about 50 minutes to about 60 minutes, about 50 minutes to about 70 minutes, about 50 minutes to about 80 minutes, about 50 minutes to about 90 minutes, about 50 minutes to about 100 minutes, about 50 minutes to about 110 minutes, about 50 minutes to about 120 minutes, about 60 minutes to about 70 minutes, about 60 minutes to about 80 minutes, about 60 minutes to about 90 minutes, about 60 minutes to about 100 minutes, about 60 minutes to about 110 minutes, about 60 minutes to about 120 minutes, about 70 minutes to about 80 minutes, about 70 minutes to about 90 minutes, about 70 minutes to about 100 minutes, about 70 minutes to about 110 minutes, about 70 minutes to about 120 minutes, about 80 minutes to about 90 minutes, about 80 minutes to about 100 minutes, about 80 minutes to about 110 minutes, about 80 minutes to about 120 minutes, about 90 minutes to about 100 minutes, about 90 minutes to about 110 minutes, about 90 minutes to about 120 minutes, about 100 minutes to about 110 minutes, about 100 minutes to about 120 minutes, or about 110 minutes to about 120 minutes. Optionally, in some embodiments, the heating of the second solution occurs over a period of time of about 30 minutes, about 40 minutes, about 50 minutes, about 60 minutes, about 70 minutes, about 80 minutes, about 90 minutes, about 100 minutes, about 110 minutes, or about 120 minutes. Optionally, in some embodiments, the heating of the second solution occurs over a period of time of at least about 30 minutes, about 40 minutes, about 50 minutes, about 60 minutes, about 70 minutes, about 80 minutes, about 90 minutes, about 100 minutes, about 110 minutes, or about 120 minutes. Optionally, in some embodiments, the heating of the second solution occurs over a period of time of no more than about 30 minutes, about 40 minutes, about 50 minutes, about 60 minutes, about 70 minutes, about 80 minutes, about 90 minutes, about 100 minutes, about 110 minutes, or about 120 minutes.

Optionally, in some embodiments, the centrifuging occurs at a speed of about 1,500 rpm to about 6,000 rpm. Optionally, in some embodiments, the centrifuging occurs at a speed of at least about 1,500 rpm. Optionally, in some embodiments, the centrifuging occurs at a speed of at most about 6,000 rpm. Optionally, in some embodiments, the centrifuging occurs at a speed of about 1,500 rpm to about 2,000 rpm, about 1,500 rpm to about 2,500 rpm, about 1,500 rpm to about 3,000 rpm, about 1,500 rpm to about 3,500 rpm, about 1,500 rpm to about 4,000 rpm, about 1,500 rpm to about 4,500 rpm, about 1,500 rpm to about 5,000 rpm, about 1,500 rpm to about 5,500 rpm, about 1,500 rpm to about 6,000 rpm, about 2,000 rpm to about 2,500 rpm, about 2,000 rpm to about 3,000 rpm, about 2,000 rpm to about 3,500 rpm, about 2,000 rpm to about 4,000 rpm, about 2,000 rpm to about 4,500 rpm, about 2,000 rpm to about 5,000 rpm, about 2,000 rpm to about 5,500 rpm, about 2,000 rpm to about 6,000 rpm, about 2,500 rpm to about 3,000 rpm, about 2,500 rpm to about 3,500 rpm, about 2,500 rpm to about 4,000 rpm, about 2,500 rpm to about 4,500 rpm, about 2,500 rpm to about 5,000 rpm, about 2,500 rpm to about 5,500 rpm, about 2,500 rpm to about 6,000 rpm, about 3,000 rpm to about 3,500 rpm, about 3,000 rpm to about 4,000 rpm, about 3,000 rpm to about 4,500 rpm, about 3,000 rpm to about 5,000 rpm, about 3,000 rpm to about 5,500 rpm, about 3,000 rpm to about 6,000 rpm, about 3,500 rpm to about 4,000 rpm, about 3,500 rpm to about 4,500 rpm, about 3,500 rpm to about 5,000 rpm, about 3,500 rpm to about 5,500 rpm, about 3,500 rpm to about 6,000 rpm, about 4,000 rpm to about 4,500 rpm, about 4,000 rpm to about 5,000 rpm, about 4,000 rpm to about 5,500 rpm, about 4,000 rpm to about 6,000 rpm, about 4,500 rpm to about 5,000 rpm, about 4,500 rpm to about 5,500 rpm, about 4,500 rpm to about 6,000 rpm, about 5,000 rpm to about 5,500 rpm, about 5,000 rpm to about 6,000 rpm, or about 5,500 rpm to about 6,000 rpm. Optionally, in some embodiments, the centrifuging occurs at a speed of about 1,500 rpm, about 2,000 rpm, about 2,500 rpm, about 3,000 rpm, about 3,500 rpm, about 4,000 rpm, about 4,500 rpm, about 5,000 rpm, about 5,500 rpm, or about 6,000 rpm. Optionally, in some embodiments, the centrifuging occurs at a speed of at least about 1,500 rpm, about 2,000 rpm, about 2,500 rpm, about 3,000 rpm, about 3,500 rpm, about 4,000 rpm, about 4,500 rpm, about 5,000 rpm, about 5,500 rpm, or about 6,000 rpm. Optionally, in some embodiments, the centrifuging occurs at a speed of no more than about 1,500 rpm, about 2,000 rpm, about 2,500 rpm, about 3,000 rpm, about 3,500 rpm, about 4,000 rpm, about 4,500 rpm, about 5,000 rpm, about 5,500 rpm, or about 6,000 rpm.

Optionally, in some embodiments, the centrifuging occurs over a period of time of about 10 minutes to about 40 minutes. Optionally, in some embodiments, the centrifuging occurs over a period of time of at least about 10 minutes. Optionally, in some embodiments, the centrifuging occurs over a period of time of at most about 40 minutes. Optionally, in some embodiments, the centrifuging occurs over a period of time of about 10 minutes to about 15 minutes, about 10 minutes to about 20 minutes, about 10 minutes to about 25 minutes, about 10 minutes to about 30 minutes, about 10 minutes to about 35 minutes, about 10 minutes to about 40 minutes, about 15 minutes to about 20 minutes, about 15 minutes to about 25 minutes, about 15 minutes to about 30 minutes, about 15 minutes to about 35 minutes, about 15 minutes to about 40 minutes, about 20 minutes to about 25 minutes, about 20 minutes to about 30 minutes, about 20 minutes to about 35 minutes, about 20 minutes to about 40 minutes, about 25 minutes to about 30 minutes, about 25 minutes to about 35 minutes, about 25 minutes to about 40 minutes, about 30 minutes to about 35 minutes, about 30 minutes to about 40 minutes, or about 35 minutes to about 40 minutes. Optionally, in some embodiments, the centrifuging occurs over a period of time of about 10 minutes, about 15 minutes, about 20 minutes, about 25 minutes, about 30 minutes, about 35 minutes, or about 40 minutes. Optionally, in some embodiments, the centrifuging occurs over a period of time of at least about 10 minutes, about 15 minutes, about 20 minutes, about 25 minutes, about 30 minutes, about 35 minutes, or about 40 minutes. Optionally, in some embodiments, the centrifuging occurs over a period of time of no more than about 10 minutes, about 15 minutes, about 20 minutes, about 25 minutes, about 30 minutes, about 35 minutes, or about 40 minutes.

Some embodiments further comprise cooling the second solution before the process of centrifuging the second solution. Optionally, in some embodiments, the second solution is cooled to room temperature. Optionally, in some embodiments, the washing solution comprises ethanol, acetone, water, or any combination thereof.

Optionally, in some embodiments, washing the second solution comprises a plurality of washing cycles comprising about two cycles to about six cycles. Optionally, in some embodiments, washing the second solution comprises a plurality of washing cycles comprising at least about two cycles. Optionally, in some embodiments, washing the second solution comprises a plurality of washing cycles comprising at most about six cycles. Optionally, in some embodiments, washing the second solution comprises a plurality of washing cycles comprising about two cycles to about three cycles, about two cycles to about four cycles, about two cycles to about five cycles, about two cycles to about six cycles, about three cycles to about four cycles, about three cycles to about five cycles, about three cycles to about six cycles, about four cycles to about five cycles, about four cycles to about six cycles, or about five cycles to about six cycles. Optionally, in some embodiments, washing the second solution comprises a plurality of washing cycles comprising about two cycles, about three cycles, about four cycles, about five cycles, or about six cycles. Optionally, in some embodiments, washing the second solution comprises a plurality of washing cycles comprising at least about two cycles, about three cycles, about four cycles, about five cycles, or about six cycles. Optionally, in some embodiments, washing the second solution comprises a plurality of washing cycles comprising no more than about two cycles, about three cycles, about four cycles, about five cycles, or about six cycles.

Some embodiments further comprise dispersing the silver nanowires in a dispersing solution. Optionally, in some embodiments, the dispersing solution comprises ethanol, acetone, and water, or any combination thereof.

Optionally, in some embodiments, the method is performed in open air. Optionally, in some embodiments, the method is performed in a solvothermal chamber. Optionally, in some embodiments, the method is performed under high pressure.

Another aspect provided herein is a method of forming silver nanoparticles comprising: forming a first solution comprising a silver based solution, a secondary solvent, and a polymer solution to form a first solution; stirring the first solution; heating the first solution; cooling the first solution; centrifuging the first solution; and washing the first solution. Optionally, in some embodiments, the first solution is cooled to ambient temperature. Alternatively, in some embodiments, the methods herein are configured form at least one of a silver nanoparticle, a silver nanorod, a silver nanoflower, a silver nanofiber, a silver nanoplatelet, a silver nanoribbon, a silver nanocube, a silver bipyramid. In some embodiments, the silver nanowires are configured to be used in a conductive silver-based ink. Alternatively, in some embodiments, the silver nanowires are configured to be used as a conductive additive in a conductive graphene ink.

Optionally, in some embodiments, the first solution is washed with water, ethanol, isopropyl alcohol, NMP, cyclohexanone, terpineol, 3-methoxy-3-methyl-1-butanol, 4-hydroxyl-4-methyl-pentan-2-one, methyl isobutyl ketone, or any combination thereof. Optionally, in some embodiments, the method further comprises redispersing the first solution. Optionally, in some embodiments, the first solution is redispersed in water. Optionally, in some embodiments, the first solution is washed 1, 2, 3, 4, 5, 6, 7, 8, 9, 10, or more times. Optionally, in some embodiments, the first solution is washed at least 1, 2, 3, 4, 5, 6, 7, 8, 9, or 10 times.

Optionally, in some embodiments, the secondary solvent comprises a glycol. Optionally, in some embodiments the glycol comprises ethylene glycol, polyethylene glycol 200, polyethylene glycol 400, propylene glycol, or any combination thereof.

Optionally, in some embodiments, the polymer solution comprises a synthetic polymer. Optionally, in some embodiments, the polymer solution comprises carboxymethyl cellulose, PVDF, poly(vinyl alcohol), poly(vinyl pyrrolidone), poly(ethylene oxide), ethyl cellulose, or any combination thereof. Optionally, in some embodiments, the binder is a dispersant. Optionally, in some embodiments, the binder comprises carboxymethyl cellulose, PVDF, poly(vinyl alcohol), poly(vinyl pyrrolidone), poly(ethylene oxide), ethyl cellulose, or any combination thereof.

Optionally, in some embodiments, the first solution is heated to a temperature of about 50° C. to about 300° C. Optionally, in some embodiments, the first solution is heated to a temperature of at least about 50° C. Optionally, in some embodiments, the first solution is heated to a temperature of at most about 300° C. Optionally, in some embodiments, the first solution is heated to a temperature of about 50° C. to about 75° C., about 50° C. to about 100° C., about 50° C. to about 125° C., about 50° C. to about 150° C., about 50° C. to about 175° C., about 50° C. to about 200° C., about 50° C. to about 225° C., about 50° C. to about 250° C., about 50° C. to about 275° C., about 50° C. to about 300° C., about 75° C. to about 100° C., about 75° C. to about 125° C., about 75° C. to about 150° C., about 75° C. to about 175° C., about 75° C. to about 200° C., about 75° C. to about 225° C., about 75° C. to about 250° C., about 75° C. to about 275° C., about 75° C. to about 300° C., about 100° C. to about 125° C., about 100° C. to about 150° C., about 100° C. to about 175° C., about 100° C. to about 200° C., about 100° C. to about 225° C., about 100° C. to about 250° C., about 100° C. to about 275° C., about 100° C. to about 300° C., about 125° C. to about 150° C., about 125° C. to about 175° C., about 125° C. to about 200° C., about 125° C. to about 225° C., about 125° C. to about 250° C., about 125° C. to about 275° C., about 125° C. to about 300° C., about 150° C. to about 175° C., about 150° C. to about 200° C., about 150° C. to about 225° C., about 150° C. to about 250° C., about 150° C. to about 275° C., about 150° C. to about 300° C., about 175° C. to about 200° C., about 175° C. to about 225° C., about 175° C. to about 250° C., about 175° C. to about 275° C., about 175° C. to about 300° C., about 200° C. to about 225° C., about 200° C. to about 250° C., about 200° C. to about 275° C., about 200° C. to about 300° C., about 225° C. to about 250° C., about 225° C. to about 275° C., about 225° C. to about 300° C., about 250° C. to about 275° C., about 250° C. to about 300° C., or about 275° C. to about 300° C. Optionally, in some embodiments, the first solution is heated to a temperature of about 50° C., about 75° C., about 100° C., about 125° C., about 150° C., about 175° C., about 200° C., about 225° C., about 250° C., about 275° C., or about 300° C. Optionally, in some embodiments, the first solution is heated to a temperature of at least about 50° C., about 75° C., about 100° C., about 125° C., about 150° C., about 175° C., about 200° C., about 225° C., about 250° C., about 275° C., or about 300° C. Optionally, in some embodiments, the first solution is heated to a temperature of at most about 50° C., about 75° C., about 100° C., about 125° C., about 150° C., about 175° C., about 200° C., about 225° C., about 250° C., about 275° C., or about 300° C.

Optionally, in some embodiments, the first solution is heated for a period of time of about 20 minutes to about 90 minutes. Optionally, in some embodiments, the first solution is heated for a period of time of at least about 20 minutes. Optionally, in some embodiments, the first solution is heated for a period of time of at most about 90 minutes. Optionally, in some embodiments, the first solution is heated for a period of time of about 20 minutes to about 25 minutes, about 20 minutes to about 30 minutes, about 20 minutes to about 35 minutes, about 20 minutes to about 40 minutes, about 20 minutes to about 45 minutes, about 20 minutes to about 50 minutes, about 20 minutes to about 60 minutes, about 20 minutes to about 70 minutes, about 20 minutes to about 80 minutes, about 20 minutes to about 90 minutes, about 25 minutes to about 30 minutes, about 25 minutes to about 35 minutes, about 25 minutes to about 40 minutes, about 25 minutes to about 45 minutes, about 25 minutes to about 50 minutes, about 25 minutes to about 60 minutes, about 25 minutes to about 70 minutes, about 25 minutes to about 80 minutes, about 25 minutes to about 90 minutes, about 30 minutes to about 35 minutes, about 30 minutes to about 40 minutes, about 30 minutes to about 45 minutes, about 30 minutes to about 50 minutes, about 30 minutes to about 60 minutes, about 30 minutes to about 70 minutes, about 30 minutes to about 80 minutes, about 30 minutes to about 90 minutes, about 35 minutes to about 40 minutes, about 35 minutes to about 45 minutes, about 35 minutes to about 50 minutes, about 35 minutes to about 60 minutes, about 35 minutes to about 70 minutes, about 35 minutes to about 80 minutes, about 35 minutes to about 90 minutes, about 40 minutes to about 45 minutes, about 40 minutes to about 50 minutes, about 40 minutes to about 60 minutes, about 40 minutes to about 70 minutes, about 40 minutes to about 80 minutes, about 40 minutes to about 90 minutes, about 45 minutes to about 50 minutes, about 45 minutes to about 60 minutes, about 45 minutes to about 70 minutes, about 45 minutes to about 80 minutes, about 45 minutes to about 90 minutes, about 50 minutes to about 60 minutes, about 50 minutes to about 70 minutes, about 50 minutes to about 80 minutes, about 50 minutes to about 90 minutes, about 60 minutes to about 70 minutes, about 60 minutes to about 80 minutes, about 60 minutes to about 90 minutes, about 70 minutes to about 80 minutes, about 70 minutes to about 90 minutes, or about 80 minutes to about 90 minutes. Optionally, in some embodiments, the first solution is heated for a period of time of at least about 20 minutes, about 25 minutes, about 30 minutes, about 35 minutes, about 40 minutes, about 45 minutes, about 50 minutes, about 60 minutes, about 70 minutes, about 80 minutes, or about 90 minutes. Optionally, in some embodiments, the first solution is heated for a period of time of about 20 minutes, about 25 minutes, about 30 minutes, about 35 minutes, about 40 minutes, about 45 minutes, about 50 minutes, about 60 minutes, about 70 minutes, about 80 minutes, or about 90 minutes. Optionally, in some embodiments, the first solution is heated for a period of time of at most about 20 minutes, about 25 minutes, about 30 minutes, about 35 minutes, about 40 minutes, about 45 minutes, about 50 minutes, about 60 minutes, about 70 minutes, about 80 minutes, or about 90 minutes.

Optionally, in some embodiments a volume of the secondary solvent is greater than a volume of at least one of the silver-based solution and the polymer solution by a factor of about 1.01:1 to about 3.5:1. Optionally, in some embodiments a volume of the secondary solvent is greater than a volume of at least one of the silver-based solution and the polymer solution by a factor of at least about 1.01:1. Optionally, in some embodiments a volume of the secondary solvent is greater than a volume of at least one of the silver-based solution and the polymer solution by a factor of at most about 3.5:1. Optionally, in some embodiments a volume of the secondary solvent is greater than a volume of at least one of the silver-based solution and the polymer solution by a factor of about 1.01:1 to about 1.05:1, about 1.01:1 to about 1.1:1, about 1.01:1 to about 1.25:1, about 1.01:1 to about 1.5:1, about 1.01:1 to about 1.75:1, about 1.01:1 to about 2:1, about 1.01:1 to about 2.25:1, about 1.01:1 to about 2.5:1, about 1.01:1 to about 2.75:1, about 1.01:1 to about 3:1, about 1.01:1 to about 3.5:1, about 1.05:1 to about 1.1:1, about 1.05:1 to about 1.25:1, about 1.05:1 to about 1.5:1, about 1.05:1 to about 1.75:1, about 1.05:1 to about 2:1, about 1.05:1 to about 2.25:1, about 1.05:1 to about 2.5:1, about 1.05:1 to about 2.75:1, about 1.05:1 to about 3:1, about 1.05:1 to about 3.5:1, about 1.1:1 to about 1.25:1, about 1.1:1 to about 1.5:1, about 1.1:1 to about 1.75:1, about 1.1:1 to about 2:1, about 1.1:1 to about 2.25:1, about 1.1:1 to about 2.5:1, about 1.1:1 to about 2.75:1, about 1.1:1 to about 3:1, about 1.1:1 to about 3.5:1, about 1.25:1 to about 1.5:1, about 1.25:1 to about 1.75:1, about 1.25:1 to about 2:1, about 1.25:1 to about 2.25:1, about 1.25:1 to about 2.5:1, about 1.25:1 to about 2.75:1, about 1.25:1 to about 3:1, about 1.25:1 to about 3.5:1, about 1.5:1 to about 1.75:1, about 1.5:1 to about 2:1, about 1.5:1 to about 2.25:1, about 1.5:1 to about 2.5:1, about 1.5:1 to about 2.75:1, about 1.5:1 to about 3:1, about 1.5:1 to about 3.5:1, about 1.75:1 to about 2:1, about 1.75:1 to about 2.25:1, about 1.75:1 to about 2.5:1, about 1.75:1 to about 2.75:1, about 1.75:1 to about 3:1, about 1.75:1 to about 3.5:1, about 2:1 to about 2.25:1, about 2:1 to about 2.5:1, about 2:1 to about 2.75:1, about 2:1 to about 3:1, about 2:1 to about 3.5:1, about 2.25:1 to about 2.5:1, about 2.25:1 to about 2.75:1, about 2.25:1 to about 3:1, about 2.25:1 to about 3.5:1, about 2.5:1 to about 2.75:1, about 2.5:1 to about 3:1, about 2.5:1 to about 3.5:1, about 2.75:1 to about 3:1, about 2.75:1 to about 3.5:1, or about 3:1 to about 3.5:1. Optionally, in some embodiments a volume of the secondary solvent is greater than a volume of at least one of the silver-based solution and the polymer solution by a factor of about 1.01:1, about 1.05:1, about 1.1:1, about 1.25:1, about 1.5:1, about 1.75:1, about 2:1, about 2.25:1, about 2.5:1, about 2.75:1, about 3:1, or about 3.5:1. Optionally, in some embodiments a volume of the secondary solvent is greater than a volume of at least one of the silver-based solution and the polymer solution by a factor of at least about 1.01:1, about 1.05:1, about 1.1:1, about 1.25:1, about 1.5:1, about 1.75:1, about 2:1, about 2.25:1, about 2.5:1, about 2.75:1, about 3:1, or about 3.5:1. Optionally, in some embodiments a volume of the secondary solvent is greater than a volume of at least one of the silver-based solution and the polymer solution by a factor of at most about 1.01:1, about 1.05:1, about 1.1:1, about 1.25:1, about 1.5:1, about 1.75:1, about 2:1, about 2.25:1, about 2.5:1, about 2.75:1, about 3:1, or about 3.5:1.

Optionally, in some embodiments, the silver-based solution comprises a silver-based material comprising $AgNO_3$. Optionally, in some embodiments, a concentration of the silver-based solution is about 0.125 M to about 0.5 M. Optionally, in some embodiments, a concentration of the silver-based solution is at least about 0.125 M. Optionally, in some embodiments, a concentration of the silver-based solution is at most about 0.5 M. Optionally, in some embodiments, a concentration of the silver-based solution is about 0.125 M to about 0.15 M, about 0.125 M to about 0.175 M, about 0.125 M to about 0.2 M, about 0.125 M to about 0.225 M, about 0.125 M to about 0.25 M, about 0.125 M to about 0.3 M, about 0.125 M to about 0.35 M, about 0.125 M to about 0.4 M, about 0.125 M to about 0.45 M, about 0.125 M to about 0.5 M, about 0.15 M to about 0.175 M, about 0.15 M to about 0.2 M, about 0.15 M to about 0.225 M, about 0.15 M to about 0.25 M, about 0.15 M to about 0.3 M, about 0.15 M to about 0.35 M, about 0.15 M to about 0.4 M, about 0.15 M to about 0.45 M, about 0.15 M to about 0.5 M, about 0.175 M to about 0.2 M, about 0.175 M to about 0.225 M, about 0.175 M to about 0.25 M, about 0.175 M to about 0.3 M, about 0.175 M to about 0.35 M, about 0.175 M to about 0.4 M, about 0.175 M to about 0.45 M, about 0.175 M to about 0.5 M, about 0.2 M to about 0.225 M, about 0.2 M to about 0.25 M, about 0.2 M to about 0.3 M, about 0.2 M to about 0.35 M, about 0.2 M to about 0.4 M, about 0.2 M to about 0.45 M, about 0.2 M to about 0.5 M, about 0.225 M to about 0.25 M, about 0.225 M to about 0.3 M, about 0.225 M to about 0.35 M, about 0.225 M to about 0.4 M, about 0.225 M to about 0.45 M, about 0.225 M to about 0.5 M, about 0.25 M to about 0.3 M, about 0.25 M to about 0.35 M, about 0.25 M to about 0.4 M, about 0.25 M to about 0.45 M, about 0.25 M to about 0.5 M, about 0.3 M to about 0.35 M, about 0.3 M to about 0.4 M, about 0.3 M to about 0.45 M, about 0.3 M to about 0.5 M, about 0.35 M to about 0.4 M, about 0.35 M to about 0.45 M, about 0.35 M to about 0.5 M, about 0.4 M to about 0.45 M, about 0.4 M to about 0.5 M, or about 0.45 M to about 0.5 M. Optionally, in some embodiments, a concentration of the silver-based solution is about 0.125 M, about 0.15 M, about 0.175 M, about 0.2 M, about 0.225 M, about 0.25 M, about 0.3 M, about 0.35 M, about 0.4 M, about 0.45 M, or about 0.5 M. Optionally, in some embodiments, a concentration of the silver-based solution is at least about 0.125 M, about 0.15 M, about 0.175 M, about 0.2 M, about 0.225 M, about 0.25 M, about 0.3 M, about 0.35 M, about 0.4 M, about 0.45 M, or about 0.5 M. Optionally, in some embodiments, a concentration of the silver-based solution is at most about 0.125 M, about 0.15 M, about 0.175 M, about 0.2 M, about 0.225 M, about 0.25 M, about 0.3 M, about 0.35 M, about 0.4 M, about 0.45 M, or about 0.5 M.

Optionally, in some embodiments, a concentration of the polymer solution is about 0.025 M to about 0.6 M. Optionally, in some embodiments, a concentration of the polymer solution is at least about 0.025 M. Optionally, in some embodiments, a concentration of the polymer solution is at most about 0.6 M. Optionally, in some embodiments, a concentration of the polymer solution is about 0.025 M to about 0.05 M, about 0.025 M to about 0.075 M, about 0.025 M to about 0.1 M, about 0.025 M to about 0.15 M, about 0.025 M to about 0.2 M, about 0.025 M to about 0.25 M, about 0.025 M to about 0.3 M, about 0.025 M to about 0.35 M, about 0.025 M to about 0.4 M, about 0.025 M to about 0.5 M, about 0.025 M to about 0.6 M, about 0.05 M to about 0.075 M, about 0.05 M to about 0.1 M, about 0.05 M to about 0.15 M, about 0.05 M to about 0.2 M, about 0.05 M to about 0.25 M, about 0.05 M to about 0.3 M, about 0.05 M to about 0.35 M, about 0.05 M to about 0.4 M, about 0.05 M to about 0.5 M, about 0.05 M to about 0.6 M, about 0.075 M to about 0.1 M, about 0.075 M to about 0.15 M, about 0.075 M to about 0.2 M, about 0.075 M to about 0.25 M, about 0.075 M to about 0.3 M, about 0.075 M to about 0.35 M, about 0.075 M to about 0.4 M, about 0.075 M to about 0.5 M, about 0.075 M to about 0.6 M, about 0.1 M to about 0.15 M, about 0.1 M to about 0.2 M, about 0.1 M to about 0.25 M, about 0.1 M to about 0.3 M, about 0.1 M to about 0.35 M, about 0.1 M to about 0.4 M, about 0.1 M to about 0.5 M, about 0.1 M to about 0.6 M, about 0.15 M to about 0.2 M, about 0.15 M to about 0.25 M, about 0.15 M to about 0.3 M, about 0.15 M to about 0.35 M, about 0.15 M to about 0.4 M, about 0.15 M to about 0.5 M, about 0.15 M to about 0.6 M, about 0.2 M to about 0.25 M, about 0.2 M to about 0.3 M, about 0.2 M to about 0.35 M, about 0.2 M to about 0.4 M, about 0.2 M to about 0.5 M, about 0.2 M to about 0.6 M, about 0.25 M to about 0.3 M, about 0.25 M to about 0.35 M, about 0.25 M to about 0.4 M, about 0.25 M to about 0.5 M, about 0.25 M to about 0.6 M, about 0.3 M to about 0.35 M, about 0.3 M to about 0.4 M, about 0.3 M to about 0.5 M, about 0.3 M to about 0.6 M, about 0.35 M to about 0.4 M, about 0.35 M to about 0.5 M, about 0.35 M to about 0.6 M, about 0.4 M to about 0.5 M, about 0.4 M to about 0.6 M, or about 0.5 M to about 0.6 M. Optionally, in some embodiments, a concentration of the polymer solution is about 0.025 M, about 0.05 M, about 0.075 M, about 0.1 M, about 0.15 M, about 0.2 M, about 0.25 M, about 0.3 M, about 0.35 M, about 0.4 M, about 0.5 M, or about 0.6 M. Optionally, in some embodiments, a concentration of the polymer solution is at least about 0.025 M, about 0.05 M, about 0.075 M, about 0.1 M, about 0.15 M, about 0.2 M, about 0.25 M, about 0.3 M, about 0.35 M, about 0.4 M, about 0.5 M, or about 0.6 M. Optionally, in some embodiments, a concentration of the polymer solution is at most about 0.025 M, about 0.05 M, about 0.075 M, about 0.1 M, about 0.15 M, about 0.2 M, about 0.25 M, about 0.3 M, about 0.35 M, about 0.4 M, about 0.5 M, or about 0.6 M.

Another aspect provided herein is a method of forming silver nanoparticles comprising: heating a secondary solvent; adding a silver-based solution and a polymer solution to the secondary solvent to form a first solution; stirring the first solution; heating the first solution; and washing the first solution. Optionally, in some embodiments, the silver-based solution and the polymer solution are added simultaneously to the secondary solvent. Optionally, in some embodiments, the silver-based solution and the polymer solution are added by a two-channel syringe to the secondary solvent. Alternatively, in some embodiments, the methods herein are configured form at least one of a silver nanowire, a silver nanorod, a silver nanoflower, a silver nanofiber, a silver nanoplatelet, a silver nanoribbon, a silver nanocube, a silver bipyramid. In some embodiments, the silver nanowires are configured to be used in a conductive silver-based ink. Alternatively, in some embodiments, the silver nanowires are configured to be used as a conductive additive in a conductive graphene ink.

Optionally, in some embodiments, adding the silver-based solution and the polymer solution to the secondary solvent to form the first solution and stirring the first solution are performed simultaneously. Optionally, in some embodiments, the method further comprises redispersing the first solution. Optionally, in some embodiments, the first solution is redispersed in water.

Optionally, in some embodiments, the secondary solvent comprises a glycol. Optionally, in some embodiments the glycol comprises ethylene glycol, polyethylene glycol 200, polyethylene glycol 400, propylene glycol, or any combination thereof.

Optionally, in some embodiments, the polymer solution comprises a polymer. Optionally, in some embodiments, the polymer solution comprises a synthetic polymer. Optionally, in some embodiments, the polymer solution comprises carboxymethyl cellulose, PVDF, poly(vinyl alcohol), poly(vinyl pyrrolidone), poly(ethylene oxide), ethyl cellulose, or any combination thereof. Optionally, in some embodiments, the binder is a dispersant. Optionally, in some embodiments, the binder comprises carboxymethyl cellulose, PVDF, poly (vinyl alcohol), poly(vinyl pyrrolidone), poly(ethylene oxide), ethyl cellulose, or any combination thereof.

Optionally, in some embodiments, the polymer has a molecular weight of about 10,000 to about 40,000. Optionally, in some embodiments, the polymer has a molecular weight of at least about 10,000. Optionally, in some embodiments, the polymer has a molecular weight of at most about 40,000. Optionally, in some embodiments, the polymer has a molecular weight of about 10,000 to about 12,500, about 10,000 to about 15,000, about 10,000 to about 17,500, about 10,000 to about 20,000, about 10,000 to about 22,500, about 10,000 to about 25,000, about 10,000 to about 27,500, about 10,000 to about 30,000, about 10,000 to about 35,000, about 10,000 to about 40,000, about 12,500 to about 15,000, about 12,500 to about 17,500, about 12,500 to about 20,000, about 12,500 to about 22,500, about 12,500 to about 25,000, about 12,500 to about 27,500, about 12,500 to about 30,000, about 12,500 to about 35,000, about 12,500 to about 40,000, about 15,000 to about 17,500, about 15,000 to about 20,000, about 15,000 to about 22,500, about 15,000 to about 25,000, about 15,000 to about 27,500, about 15,000 to about 30,000, about 15,000 to about 35,000, about 15,000 to about 40,000, about 17,500 to about 20,000, about 17,500 to about 22,500, about 17,500 to about 25,000, about 17,500 to about 27,500, about 17,500 to about 30,000, about 17,500 to about 35,000, about 17,500 to about 40,000, about 20,000 to about 22,500, about 20,000 to about 25,000, about 20,000 to about 27,500, about 20,000 to about 30,000, about 20,000 to about 35,000, about 20,000 to about 40,000, about 22,500 to about 25,000, about 22,500 to about 27,500, about 22,500 to about 30,000, about 22,500 to about 35,000, about 22,500 to about 40,000, about 25,000 to about 27,500, about 25,000 to about 30,000, about 25,000 to about 35,000, about 25,000 to about 40,000, about 27,500 to about 30,000, about 27,500 to about 35,000, about 27,500 to about 40,000, about 30,000 to about 35,000, about 30,000 to about 40,000, or about 35,000 to about 40,000. Optionally, in some embodiments, the polymer has a molecular weight of about 10,000, about 12,500, about 15,000, about 17,500, about 20,000, about 22,500, about 25,000, about 27,500, about 30,000, about 35,000, or about 40,000. Optionally, in some embodiments, the polymer has a molecular weight of at least about 10,000, about 12,500, about 15,000, about 17,500, about 20,000, about 22,500, about 25,000, about 27,500, about 30,000, about 35,000, or about 40,000. Optionally, in some embodiments, the polymer has a molecular weight of no more than about 10,000, about 12,500, about 15,000, about 17,500, about 20,000, about 22,500, about 25,000, about 27,500, about 30,000, about 35,000, or about 40,000.

Optionally, in some embodiments, the secondary solvent is heated to a temperature of about 80° C. to about 300° C. Optionally, in some embodiments, the secondary solvent is heated to a temperature of at least about 80° C. Optionally, in some embodiments, the secondary solvent is heated to a temperature of at most about 300° C. Optionally, in some embodiments, the secondary solvent is heated to a temperature of about 80° C. to about 90° C., about 80° C. to about 100° C., about 80° C. to about 120° C., about 80° C. to about 140° C., about 80° C. to about 160° C., about 80° C. to about 180° C., about 80° C. to about 200° C., about 80° C. to about 250° C., about 80° C. to about 300° C., about 90° C. to about 100° C., about 90° C. to about 120° C., about 90° C. to about 140° C., about 90° C. to about 160° C., about 90° C. to about 180° C., about 90° C. to about 200° C., about 90° C. to about 250° C., about 90° C. to about 300° C., about 100° C. to about 120° C., about 100° C. to about 140° C., about 100° C. to about 160° C., about 100° C. to about 180° C., about 100° C. to about 200° C., about 100° C. to about 250° C., about 100° C. to about 300° C., about 120° C. to about 140° C., about 120° C. to about 160° C., about 120° C. to about 180° C., about 120° C. to about 200° C., about 120° C. to about 250° C., about 120° C. to about 300° C., about 140° C. to about 160° C., about 140° C. to about 180° C., about 140° C. to about 200° C., about 140° C. to about 250° C., about 140° C. to about 300° C., about 160° C. to about 180° C., about 160° C. to about 200° C., about 160° C. to about 250° C., about 160° C. to about 300° C., about 180° C. to about 200° C., about 180° C. to about 250° C., about 180° C. to about 300° C., about 200° C. to about 250° C., about 200° C. to about 300° C., or about 250° C. to about 300° C. Optionally, in some embodiments, the secondary solvent is heated to a temperature of about 80° C., about 90° C., about 100° C., about 120° C., about 140° C., about 160° C., about 180° C., about 200° C., about 250° C., or about 300° C. Optionally, in some embodiments, the secondary solvent is heated to a temperature of at least about 80° C., about 90° C., about 100° C., about 120° C., about 140° C., about 160° C., about 180° C., about 200° C., about 250° C., or about 300° C. Optionally, in some embodiments, the secondary solvent is heated to a temperature of at most about 80° C., about 90° C., about 100° C., about 120° C., about 140° C., about 160° C., about 180° C., about 200° C., about 250° C., or about 300° C.

Optionally, in some embodiments, the secondary solvent is heated for a period of time of about 30 minutes to about 120 minutes. Optionally, in some embodiments, the secondary solvent is heated for a period of time of at least about 30 minutes. Optionally, in some embodiments, the secondary solvent is heated for a period of time of at most about 120 minutes. Optionally, in some embodiments, the secondary solvent is heated for a period of time of about 30 minutes to about 40 minutes, about 30 minutes to about 50 minutes, about 30 minutes to about 60 minutes, about 30 minutes to about 70 minutes, about 30 minutes to about 80 minutes, about 30 minutes to about 90 minutes, about 30 minutes to about 100 minutes, about 30 minutes to about 110 minutes, about 30 minutes to about 120 minutes, about 40 minutes to about 50 minutes, about 40 minutes to about 60 minutes, about 40 minutes to about 70 minutes, about 40 minutes to about 80 minutes, about 40 minutes to about 90 minutes, about 40 minutes to about 100 minutes, about 40 minutes to about 110 minutes, about 40 minutes to about 120 minutes, about 50 minutes to about 60 minutes, about 50 minutes to about 70 minutes, about 50 minutes to about 80 minutes, about 50 minutes to about 90 minutes, about 50 minutes to about 100 minutes, about 50 minutes to about 110 minutes, about 50 minutes to about 120 minutes, about 60 minutes to about 70 minutes, about 60 minutes to about 80 minutes, about 60 minutes to about 90 minutes, about 60 minutes to about 100 minutes, about 60 minutes to about 110 minutes, about 60 minutes to about 120 minutes, about 70 minutes to about 80 minutes, about 70 minutes to about 90 minutes, about 70 minutes to about 100 minutes, about 70 minutes to about 110 minutes, about 70 minutes to about 120 minutes, about 80 minutes to about 90 minutes, about 80 minutes to about 100 minutes, about 80 minutes to about 110 minutes, about 80 minutes to about 120 minutes, about 90 minutes to about 100 minutes, about 90 minutes to about 110 minutes, about 90 minutes to about 120 minutes, about 100 minutes to about 110 minutes, about 100 minutes to about 120 minutes, or about 110 minutes to about 120 minutes. Optionally, in some embodiments, the secondary solvent is heated for a period of time of about 30 minutes, about 40 minutes, about 50 minutes, about 60 minutes, about 70 minutes, about 80 minutes, about 90 minutes, about 100 minutes, about 110 minutes, or about 120 minutes. Optionally, in some embodiments, the secondary solvent is heated for a period of time of at least about 30 minutes, about 40 minutes, about 50 minutes, about 60 minutes, about 70 minutes, about 80 minutes, about 90 minutes, about 100 minutes, about 110 minutes, or about 120 minutes. Optionally, in some embodiments, the secondary solvent is heated for a period of time of at most about 30 minutes, about 40 minutes, about 50 minutes, about 60 minutes, about 70 minutes, about 80 minutes, about 90 minutes, about 100 minutes, about 110 minutes, or about 120 minutes.

Optionally, in some embodiments, the silver-based solution and the polymer solution are added to the secondary solvent at a rate of about 2 mL/min to about 40 mL/min. Optionally, in some embodiments, the silver-based solution and the polymer solution are added to the secondary solvent at a rate of at least about 2 mL/min. Optionally, in some embodiments, the silver-based solution and the polymer solution are added to the secondary solvent at a rate of at most about 40 mL/min. Optionally, in some embodiments, the silver-based solution and the polymer solution are added to the secondary solvent at a rate of about 2 mL/min to about 4 mL/min, about 2 mL/min to about 6 mL/min, about 2 mL/min to about 8 mL/min, about 2 mL/min to about 10 mL/min, about 2 mL/min to about 15 mL/min, about 2 mL/min to about 20 mL/min, about 2 mL/min to about 25 mL/min, about 2 mL/min to about 30 mL/min, about 2 mL/min to about 35 mL/min, about 2 mL/min to about 40 mL/min, about 4 mL/min to about 6 mL/min, about 4 mL/min to about 8 mL/min, about 4 mL/min to about 10 mL/min, about 4 mL/min to about 15 mL/min, about 4 mL/min to about 20 mL/min, about 4 mL/min to about 25 mL/min, about 4 mL/min to about 30 mL/min, about 4 mL/min to about 35 mL/min, about 4 mL/min to about 40 mL/min, about 6 mL/min to about 8 mL/min, about 6 mL/min to about 10 mL/min, about 6 mL/min to about 15 mL/min, about 6 mL/min to about 20 mL/min, about 6 mL/min to about 25 mL/min, about 6 mL/min to about 30 mL/min, about 6 mL/min to about 35 mL/min, about 6 mL/min to about 40 mL/min, about 8 mL/min to about 10 mL/min, about 8 mL/min to about 15 mL/min, about 8 mL/min to about 20 mL/min, about 8 mL/min to about 25 mL/min, about 8 mL/min to about 30 mL/min, about 8 mL/min to about 35 mL/min, about 8 mL/min to about 40 mL/min, about 10 mL/min to about 15 mL/min, about 10 mL/min to about 20 mL/min, about 10 mL/min to about 25 mL/min, about 10 mL/min to about 30 mL/min, about 10 mL/min to about 35 mL/min, about 10 mL/min to about 40 mL/min, about 15 mL/min to about 20 mL/min, about 15 mL/min to about 25 mL/min, about 15 mL/min to about 30 mL/min, about 15 mL/min to about 35 mL/min, about 15 mL/min to about 40 mL/min, about 20 mL/min to about 25 mL/min, about 20 mL/min to about 30 mL/min, about 20 mL/min to about 35 mL/min, about 20 mL/min to about 40 mL/min, about 25 mL/min to about 30 mL/min, about 25 mL/min to about 35 mL/min, about 25 mL/min to about 40 mL/min, about 30 mL/min to about 35 mL/min, about 30 mL/min to about 40 mL/min, or about 35 mL/min to about 40 mL/min. Optionally, in some embodiments, the silver-based solution and the polymer solution are added to the secondary solvent at a rate of about 2 mL/min, about 4 mL/min, about 6 mL/min, about 8 mL/min, about 10 mL/min, about 15 mL/min, about 20 mL/min, about 25 mL/min, about 30 mL/min, about 35 mL/min, or about 40 mL/min. Optionally, in some embodiments, the silver-based solution and the polymer solution are added to the secondary solvent at a rate of at least about 2 mL/min, about 4 mL/min, about 6 mL/min, about 8 mL/min, about 10 mL/min, about 15 mL/min, about 20 mL/min, about 25 mL/min, about 30 mL/min, about 35 mL/min, or about 40 mL/min. Optionally, in some embodiments, the silver-based solution and the polymer solution are added to the secondary solvent at a rate of at most about 2 mL/min, about 4 mL/min, about 6 mL/min, about 8 mL/min, about 10 mL/min, about 15 mL/min, about 20 mL/min, about 25 mL/min, about 30 mL/min, about 35 mL/min, or about 40 mL/min.

Optionally, in some embodiments, heating the first solution is performed at a temperature of about 50° C. to about 300° C. Optionally, in some embodiments, heating the first solution is performed at a temperature of at least about 50° C. Optionally, in some embodiments, heating the first solution is performed at a temperature of at most about 300° C. Optionally, in some embodiments, heating the first solution is performed at a temperature of about 50° C. to about 60° C., about 50° C. to about 80° C., about 50° C. to about 100° C., about 50° C. to about 120° C., about 50° C. to about 140° C., about 50° C. to about 160° C., about 50° C. to about 180° C., about 50° C. to about 200° C., about 50° C. to about 250° C., about 50° C. to about 300° C., about 60° C. to about 80° C., about 60° C. to about 100° C., about 60° C. to about 120° C., about 60° C. to about 140° C., about 60° C. to about 160° C., about 60° C. to about 180° C., about 60° C. to about 200° C., about 60° C. to about 250° C., about 60° C. to about 300° C., about 80° C. to about 100° C., about 80° C. to about 120° C., about 80° C. to about 140° C., about 80° C. to about 160° C., about 80° C. to about 180° C., about 80° C. to about 200° C., about 80° C. to about 250° C., about 80° C. to about 300° C., about 100° C. to about 120° C., about 100° C. to about 140° C., about 100° C. to about 160° C., about 100° C. to about 180° C., about 100° C. to about 200° C., about 100° C. to about 250° C., about 100° C. to about 300° C., about 120° C. to about 140° C., about 120° C. to about 160° C., about 120° C. to about 180° C., about 120° C. to about 200° C., about 120° C. to about 250° C., about 120° C. to about 300° C., about 140° C. to about 160° C., about 140° C. to about 180° C., about 140° C. to about 200° C., about 140° C. to about 250° C., about 140° C. to about 300° C., about 160° C. to about 180° C., about 160° C. to about 200° C., about 160° C. to about 250° C., about 160° C. to about 300° C., about 180° C. to about 200° C., about 180° C. to about 250° C., about 180° C. to about 300° C., about 200° C. to about 250° C., about 200° C. to about 300° C., or about 250° C. to about 300° C. Optionally, in some embodiments, heating the first solution is performed at a temperature of about 50° C., about 60° C., about 80° C., about 100° C., about 120° C., about 140° C., about 160° C., about 180° C., about 200° C., about 250° C., or about 300° C. Optionally, in some embodiments, heating the first solution is performed at a temperature of at most about 50° C., about 60° C., about 80° C., about 100° C., about 120° C., about 140° C., about 160° C., about 180° C., about 200° C., about 250° C., or about 300° C. Optionally, in some embodiments, heating the first solution is performed at a temperature of at least about 50° C., about 60° C., about 80° C., about 100° C., about 120° C., about 140° C., about 160° C., about 180° C., about 200° C., about 250° C., or about 300° C.

Optionally, in some embodiments, heating the first solution is performed for a period of time of about 25 minutes to about 100 minutes. Optionally, in some embodiments, heating the first solution is performed for a period of time of at least about 25 minutes. Optionally, in some embodiments, heating the first solution is performed for a period of time of at most about 100 minutes. Optionally, in some embodiments, heating the first solution is performed for a period of time of about 25 minutes to about 35 minutes, about 25 minutes to about 45 minutes, about 25 minutes to about 55 minutes, about 25 minutes to about 65 minutes, about 25 minutes to about 75 minutes, about 25 minutes to about 85 minutes, about 25 minutes to about 95 minutes, about 25 minutes to about 100 minutes, about 35 minutes to about 45 minutes, about 35 minutes to about 55 minutes, about 35 minutes to about 65 minutes, about 35 minutes to about 75 minutes, about 35 minutes to about 85 minutes, about 35 minutes to about 95 minutes, about 35 minutes to about 100 minutes, about 45 minutes to about 55 minutes, about 45 minutes to about 65 minutes, about 45 minutes to about 75 minutes, about 45 minutes to about 85 minutes, about 45 minutes to about 95 minutes, about 45 minutes to about 100 minutes, about 55 minutes to about 65 minutes, about 55 minutes to about 75 minutes, about 55 minutes to about 85 minutes, about 55 minutes to about 95 minutes, about 55 minutes to about 100 minutes, about 65 minutes to about 75 minutes, about 65 minutes to about 85 minutes, about 65 minutes to about 95 minutes, about 65 minutes to about 100 minutes, about 75 minutes to about 85 minutes, about 75 minutes to about 95 minutes, about 75 minutes to about 100 minutes, about 85 minutes to about 95 minutes, about 85 minutes to about 100 minutes, or about 95 minutes to about 100 minutes. Optionally, in some embodiments, heating the first solution is performed for a period of time of about 25 minutes, about 35 minutes, about 45 minutes, about 55 minutes, about 65 minutes, about 75 minutes, about 85 minutes, about 95 minutes, or about 100 minutes. Optionally, in some embodiments, heating the first solution is performed for a period of time of at least about 25 minutes, about 35 minutes, about 45 minutes, about 55 minutes, about 65 minutes, about 75 minutes, about 85 minutes, about 95 minutes, or about 100 minutes. Optionally, in some embodiments, heating the first solution is performed for a period of time of at most about 25 minutes, about 35 minutes, about 45 minutes, about 55 minutes, about 65 minutes, about 75 minutes, about 85 minutes, about 95 minutes, or about 100 minutes.

Optionally, in some embodiments, the first solution is washed in ethanol, isopropyl alcohol, NMP, cyclohexanone, terpineol, 3-methoxy-3-methyl-1-butanol, 4-hydroxyl-4-methyl-pentan-2-one, methyl isobutyl ketone, or any combination thereof.

Optionally, in some embodiments a volume of the secondary solvent is greater than a volume of at least one of the silver-based solution and the polymer solution by a factor of about 1.01:1 to about 3.5:1. Optionally, in some embodiments a volume of the secondary solvent is greater than a volume of at least one of the silver-based solution and the polymer solution by a factor of at least about 1.01:1. Optionally, in some embodiments a volume of the secondary solvent is greater than a volume of at least one of the silver-based solution and the polymer solution by a factor of at most about 3.5:1. Optionally, in some embodiments a volume of the secondary solvent is greater than a volume of at least one of the silver-based solution and the polymer solution by a factor of about 1.01:1 to about 1.05:1, about 1.01:1 to about 1.1:1, about 1.01:1 to about 1.25:1, about 1.01:1 to about 1.5:1, about 1.01:1 to about 1.75:1, about 1.01:1 to about 2:1, about 1.01:1 to about 2.25:1, about 1.01:1 to about 2.5:1, about 1.01:1 to about 2.75:1, about 1.01:1 to about 3:1, about 1.01:1 to about 3.5:1, about 1.05:1 to about 1.1:1, about 1.05:1 to about 1.25:1, about 1.05:1 to about 1.5:1, about 1.05:1 to about 1.75:1, about 1.05:1 to about 2:1, about 1.05:1 to about 2.25:1, about 1.05:1 to about 2.5:1, about 1.05:1 to about 2.75:1, about 1.05:1 to about 3:1, about 1.05:1 to about 3.5:1, about 1.1:1 to about 1.25:1, about 1.1:1 to about 1.5:1, about 1.1:1 to about 1.75:1, about 1.1:1 to about 2:1, about 1.1:1 to about 2.25:1, about 1.1:1 to about 2.5:1, about 1.1:1 to about 2.75:1, about 1.1:1 to about 3:1, about 1.1:1 to about 3.5:1, about 1.25:1 to about 1.5:1, about 1.25:1 to about 1.75:1, about 1.25:1 to about 2:1, about 1.25:1 to about 2.25:1, about 1.25:1 to about 2.5:1, about 1.25:1 to about 2.75:1, about 1.25:1 to about 3:1, about 1.25:1 to about 3.5:1, about 1.5:1 to about 1.75:1, about 1.5:1 to about 2:1, about 1.5:1 to about 2.25:1, about 1.5:1 to about 2.5:1, about 1.5:1 to about 2.75:1, about 1.5:1 to about 3:1, about 1.5:1 to about 3.5:1, about 1.75:1 to about 2:1, about 1.75:1 to about 2.25:1, about 1.75:1 to about 2.5:1, about 1.75:1 to about 2.75:1, about 1.75:1 to about 3:1, about 1.75:1 to about 3.5:1, about 2:1 to about 2.25:1, about 2:1 to about 2.5:1, about 2:1 to about 2.75:1, about 2:1 to about 3:1, about 2:1 to about 3.5:1, about 2.25:1 to about 2.5:1, about 2.25:1 to about 2.75:1, about 2.25:1 to about 3:1, about 2.25:1 to about 3.5:1, about 2.5:1 to about 2.75:1, about 2.5:1 to about 3:1, about 2.5:1 to about 3.5:1, about 2.75:1 to about 3:1, about 2.75:1 to about 3.5:1, or about 3:1 to about 3.5:1. Optionally, in some embodiments a volume of the secondary solvent is greater than a volume of at least one of the silver-based solution and the polymer solution by a factor of about 1.01:1, about 1.05:1, about 1.1:1, about 1.25:1, about 1.5:1, about 1.75:1, about 2:1, about 2.25:1, about 2.5:1, about 2.75:1, about 3:1, or about 3.5:1. Optionally, in some embodiments a volume of the secondary solvent is greater than a volume of at least one of the silver-based solution and the polymer solution by a factor of at least about 1.01:1, about 1.05:1, about 1.1:1, about 1.25:1, about 1.5:1, about 1.75:1, about 2:1, about 2.25:1, about 2.5:1, about 2.75:1, about 3:1, or about 3.5:1. Optionally, in some embodiments a volume of the secondary solvent is greater than a volume of at least one of the silver-based solution and the polymer solution by a factor of at most about 1.01:1, about 1.05:1, about 1.1:1, about 1.25:1, about 1.5:1, about 1.75:1, about 2:1, about 2.25:1, about 2.5:1, about 2.75:1, about 3:1, or about 3.5:1.

Optionally, in some embodiments, the silver-based solution comprises a silver-based material comprising $AgNO_3$. Optionally, in some embodiments, a concentration of the silver-based solution is about 0.125 M to about 0.5 M. Optionally, in some embodiments, a concentration of the silver-based solution is at least about 0.125 M. Optionally, in some embodiments, a concentration of the silver-based solution is at most about 0.5 M. Optionally, in some embodiments, a concentration of the silver-based solution is about 0.125 M to about 0.15 M, about 0.125 M to about 0.175 M, about 0.125 M to about 0.2 M, about 0.125 M to about 0.225 M, about 0.125 M to about 0.25 M, about 0.125 M to about 0.3 M, about 0.125 M to about 0.35 M, about 0.125 M to about 0.4 M, about 0.125 M to about 0.45 M, about 0.125 M to about 0.5 M, about 0.15 M to about 0.175 M, about 0.15 M to about 0.2 M, about 0.15 M to about 0.225 M, about 0.15 M to about 0.25 M, about 0.15 M to about 0.3 M, about 0.15 M to about 0.35 M, about 0.15 M to about 0.4 M, about 0.15 M to about 0.45 M, about 0.15 M to about 0.5 M, about 0.175 M to about 0.2 M, about 0.175 M to about 0.225 M, about 0.175 M to about 0.25 M, about 0.175 M to about 0.3 M, about 0.175 M to about 0.35 M, about 0.175 M to about 0.4 M, about 0.175 M to about 0.45 M, about 0.175 M to about 0.5 M, about 0.2 M to about 0.225 M, about 0.2 M to about 0.25 M, about 0.2 M to about 0.3 M, about 0.2 M to about 0.35 M, about 0.2 M to about 0.4 M, about 0.2 M to about 0.45 M, about 0.2 M to about 0.5 M, about 0.225 M to about 0.25 M, about 0.225 M to about 0.3 M, about 0.225 M to about 0.35 M, about 0.225 M to about 0.4 M, about 0.225 M to about 0.45 M, about 0.225 M to about 0.5 M, about 0.25 M to about 0.3 M, about 0.25 M to about 0.35 M, about 0.25 M to about 0.4 M, about 0.25 M to about 0.45 M, about 0.25 M to about 0.5 M, about 0.3 M to about 0.35 M, about 0.3 M to about 0.4 M, about 0.3 M to about 0.45 M, about 0.3 M to about 0.5 M, about 0.35 M to about 0.4 M, about 0.35 M to about 0.45 M, about 0.35 M to about 0.5 M, about 0.4 M to about 0.45 M, about 0.4 M to about 0.5 M, or about 0.45 M to about 0.5 M. Optionally, in some embodiments, a concentration of the silver-based solution is about 0.125 M, about 0.15 M, about 0.175 M, about 0.2 M, about 0.225 M, about 0.25 M, about 0.3 M, about 0.35 M, about 0.4 M, about 0.45 M, or about 0.5 M. Optionally, in some embodiments, a concentration of the silver-based solution is at most about 0.125 M, about 0.15 M, about 0.175 M, about 0.2 M, about 0.225 M, about 0.25 M, about 0.3 M, about 0.35 M, about 0.4 M, about 0.45 M, or about 0.5 M. Optionally, in some embodiments, a concentration of the silver-based solution is at least about 0.125 M, about 0.15 M, about 0.175 M, about 0.2 M, about 0.225 M, about 0.25 M, about 0.3 M, about 0.35 M, about 0.4 M, about 0.45 M, or about 0.5 M.

Optionally, in some embodiments, a concentration of the polymer solution is about 0.15 M to about 0.7 M. Optionally, in some embodiments, a concentration of the polymer solution is at least about 0.15 M. Optionally, in some embodiments, a concentration of the polymer solution is at most about 0.7 M. Optionally, in some embodiments, a concentration of the polymer solution is about 0.15 M to about 0.2 M, about 0.15 M to about 0.25 M, about 0.15 M to about 0.3 M, about 0.15 M to about 0.35 M, about 0.15 M to about 0.4 M, about 0.15 M to about 0.45 M, about 0.15 M to about 0.5 M, about 0.15 M to about 0.55 M, about 0.15 M to about 0.6 M, about 0.15 M to about 0.7 M, about 0.2 M to about 0.25 M, about 0.2 M to about 0.3 M, about 0.2 M to about 0.35 M, about 0.2 M to about 0.4 M, about 0.2 M to about 0.45 M, about 0.2 M to about 0.5 M, about 0.2 M to about 0.55 M, about 0.2 M to about 0.6 M, about 0.2 M to about 0.7 M, about 0.25 M to about 0.3 M, about 0.25 M to about 0.35 M, about 0.25 M to about 0.4 M, about 0.25 M to about 0.45 M, about 0.25 M to about 0.5 M, about 0.25 M to about 0.55 M, about 0.25 M to about 0.6 M, about 0.25 M to about 0.7 M, about 0.3 M to about 0.35 M, about 0.3 M to about 0.4 M, about 0.3 M to about 0.45 M, about 0.3 M to about 0.5 M, about 0.3 M to about 0.55 M, about 0.3 M to about 0.6 M, about 0.3 M to about 0.7 M, about 0.35 M to about 0.4 M, about 0.35 M to about 0.45 M, about 0.35 M to about 0.5 M, about 0.35 M to about 0.55 M, about 0.35 M to about 0.6 M, about 0.35 M to about 0.7 M, about 0.4 M to about 0.45 M, about 0.4 M to about 0.5 M, about 0.4 M to about 0.55 M, about 0.4 M to about 0.6 M, about 0.4 M to about 0.7 M, about 0.45 M to about 0.5 M, about 0.45 M to about 0.55 M, about 0.45 M to about 0.6 M, about 0.45 M to about 0.7 M, about 0.5 M to about 0.55 M, about 0.5 M to about 0.6 M, about 0.5 M to about 0.7 M, about 0.55 M to about 0.6 M, about 0.55 M to about 0.7 M, or about 0.6 M to about 0.7 M. Optionally, in some embodiments, a concentration of the polymer solution is about 0.15 M, about 0.2 M, about 0.25 M, about 0.3 M, about 0.35 M, about 0.4 M, about 0.45 M, about 0.5 M, about 0.55 M, about 0.6 M, or about 0.7 M. Optionally, in some embodiments, a concentration of the polymer solution is at least about 0.15 M, about 0.2 M, about 0.25 M, about 0.3 M, about 0.35 M, about 0.4 M, about 0.45 M, about 0.5 M, about 0.55 M, about 0.6 M, or about 0.7 M. Optionally, in some embodiments, a concentration of the polymer solution is at most about 0.15 M, about 0.2 M, about 0.25 M, about 0.3 M, about 0.35 M, about 0.4 M, about 0.45 M, about 0.5 M, about 0.55 M, about 0.6 M, or about 0.7 M.

Another aspect provided herein is a conductive silver-based film comprising a substrate and a conductive silver-based ink. Optionally, in some embodiments, the silver-based ink comprises silver nanoparticles, silver nanorods, silver nanowires, silver nanoflowers, silver nanofibers, silver nanoplatelets, silver nanoribbons, silver nanocubes, silver bipyramids, or any combination thereof.

Optionally, in some embodiments, the conductive silver-based ink comprises silver nanowires, wherein the conductive silver-based film has a sheet resistance of about 0.3 ohm/sq/mil to about 1.8 ohms/sq/mil. Optionally, in some embodiments, the conductive silver-based ink comprises silver nanowires, wherein the conductive silver-based film has a sheet resistance of at least about 0.3 ohm/sq/mil. Optionally, in some embodiments, the conductive silver-based ink comprises silver nanowires, wherein the conductive silver-based film has a sheet resistance of at most about 1.8 ohms/sq/mil. Optionally, in some embodiments, the conductive silver-based ink comprises silver nanowires, wherein the conductive silver-based film has a sheet resistance of about 0.3 ohm/sq/mil to about 0.4 ohm/sq/mil, about 0.3 ohm/sq/mil to about 0.5 ohm/sq/mil, about 0.3 ohm/sq/mil to about 0.6 ohm/sq/mil, about 0.3 ohm/sq/mil to about 0.7 ohm/sq/mil, about 0.3 ohm/sq/mil to about 0.8 ohm/sq/mil, about 0.3 ohm/sq/mil to about 0.9 ohm/sq/mil, about 0.3 ohm/sq/mil to about 1 ohm/sq/mil, about 0.3 ohm/sq/mil to about 1.2 ohms/sq/mil, about 0.3 ohm/sq/mil to about 1.4 ohms/sq/mil, about 0.3 ohm/sq/mil to about 1.6 ohms/sq/mil, about 0.3 ohm/sq/mil to about 1.8 ohms/sq/mil, about 0.4 ohm/sq/mil to about 0.5 ohm/sq/mil, about 0.4 ohm/sq/mil to about 0.6 ohm/sq/mil, about 0.4 ohm/sq/mil to about 0.7 ohm/sq/mil, about 0.4 ohm/sq/mil to about 0.8 ohm/sq/mil, about 0.4 ohm/sq/mil to about 0.9 ohm/sq/mil, about 0.4 ohm/sq/mil to about 1 ohm/sq/mil, about 0.4 ohm/sq/mil to about 1.2 ohms/sq/mil, about 0.4 ohm/sq/mil to about 1.4 ohms/sq/mil, about 0.4 ohm/sq/mil to about 1.6 ohms/sq/mil, about 0.4 ohm/sq/mil to about 1.8 ohms/sq/mil, about 0.5 ohm/sq/mil to about 0.6 ohm/sq/mil, about 0.5 ohm/sq/mil to about 0.7 ohm/sq/mil, about 0.5 ohm/sq/mil to about 0.8 ohm/sq/mil, about 0.5 ohm/sq/mil to about 0.9 ohm/sq/mil, about 0.5 ohm/sq/mil to about 1 ohm/sq/mil, about 0.5 ohm/sq/mil to about 1.2 ohms/sq/mil, about 0.5 ohm/sq/mil to about 1.4 ohms/sq/mil, about 0.5 ohm/sq/mil to about 1.6 ohms/sq/mil, about 0.5 ohm/sq/mil to about 1.8 ohms/sq/mil, about 0.6 ohm/sq/mil to about 0.7 ohm/sq/mil, about 0.6 ohm/sq/mil to about 0.8 ohm/sq/mil, about 0.6 ohm/sq/mil to about 0.9 ohm/sq/mil, about 0.6 ohm/sq/mil to about 1 ohm/sq/mil, about 0.6 ohm/sq/mil to about 1.2 ohms/sq/mil, about 0.6 ohm/sq/mil to about 1.4 ohms/sq/mil, about 0.6 ohm/sq/mil to about 1.6 ohms/sq/mil, about 0.6 ohm/sq/mil to about 1.8 ohms/sq/mil, about 0.7 ohm/sq/mil to about 0.8 ohm/sq/mil, about 0.7 ohm/sq/mil to about 0.9 ohm/sq/mil, about 0.7 ohm/sq/mil to about 1 ohm/sq/mil, about 0.7 ohm/sq/mil to about 1.2 ohms/sq/mil, about 0.7 ohm/sq/mil to about 1.4 ohms/sq/mil, about 0.7 ohm/sq/mil to about 1.6 ohms/sq/mil, about 0.7 ohm/sq/mil to about 1.8 ohms/sq/mil, about 0.8 ohm/sq/mil to about 0.9 ohm/sq/mil, about 0.8 ohm/sq/mil to about 1 ohm/sq/mil, about 0.8 ohm/sq/mil to about 1.2 ohms/sq/mil, about 0.8 ohm/sq/mil to about 1.4 ohms/sq/mil, about 0.8 ohm/sq/mil to about 1.6 ohms/sq/mil, about 0.8 ohm/sq/mil to about 1.8 ohms/sq/mil, about 0.9 ohm/sq/mil to about 1 ohm/sq/mil, about 0.9 ohm/sq/mil to about 1.2 ohms/sq/mil, about 0.9 ohm/sq/mil to about 1.4 ohms/sq/mil, about 0.9 ohm/sq/mil to about 1.6 ohms/sq/mil, about 0.9 ohm/sq/mil to about 1.8 ohms/sq/mil, about 1 ohm/sq/mil to about 1.2 ohms/sq/mil, about 1 ohm/sq/mil to about 1.4 ohms/sq/mil, about 1 ohm/sq/mil to about 1.6 ohms/sq/mil, about 1 ohm/sq/mil to about 1.8 ohms/sq/mil, about 1.2 ohms/sq/mil to about 1.4 ohms/sq/mil, about 1.2 ohms/sq/mil to about 1.6 ohms/sq/mil, about 1.2 ohms/sq/mil to about 1.8 ohms/sq/mil, about 1.4 ohms/sq/mil to about 1.6 ohms/sq/mil, about 1.4 ohms/sq/mil to about 1.8 ohms/sq/mil, or about 1.6 ohms/sq/mil to about 1.8 ohms/sq/mil. Optionally, in some embodiments, the conductive silver-based ink comprises silver nanowires, wherein the conductive silver-based film has a sheet resistance of about 0.3 ohm/sq/mil, about 0.4 ohm/sq/mil, about 0.5 ohm/sq/mil, about 0.6 ohm/sq/mil, about 0.7 ohm/sq/mil, about 0.8 ohm/sq/mil, about 0.9 ohm/sq/mil, about 1 ohm/sq/mil, about 1.2 ohms/sq/mil, about 1.4 ohms/sq/mil, about 1.6 ohms/sq/mil, or about 1.8 ohms/sq/mil. Optionally, in some embodiments, the conductive silver-based ink comprises silver nanowires, wherein the conductive silver-based film has a sheet resistance of at least about 0.3 ohm/sq/mil, about 0.4 ohm/sq/mil, about 0.5 ohm/sq/mil, about 0.6 ohm/sq/mil, about 0.7 ohm/sq/mil, about 0.8 ohm/sq/mil, about 0.9 ohm/sq/mil, about 1 ohm/sq/mil, about 1.2 ohms/sq/mil, about 1.4 ohms/sq/mil, about 1.6 ohms/sq/mil, or about 1.8 ohms/sq/mil. Optionally, in some embodiments, the conductive silver-based ink comprises silver nanowires, wherein the conductive silver-based film has a sheet resistance of at most about 0.3 ohm/sq/mil, about 0.4 ohm/sq/mil, about 0.5 ohm/sq/mil, about 0.6 ohm/sq/mil, about 0.7 ohm/sq/mil, about 0.8 ohm/sq/mil, about 0.9 ohm/sq/mil, about 1 ohm/sq/mil, about 1.2 ohms/sq/mil, about 1.4 ohms/sq/mil, about 1.6 ohms/sq/mil, or about 1.8 ohms/sq/mil.

Optionally, in some embodiments, the conductive silver-based ink comprises silver nanoparticles, wherein the conductive silver-based film has a sheet resistance of about 0.01 ohm/sq/mil to about 0.04 ohm/sq/mil. Optionally, in some embodiments, the conductive silver-based ink comprises silver nanoparticles, wherein the conductive silver-based film has a sheet resistance of at least about 0.01 ohm/sq/mil. Optionally, in some embodiments, the conductive silver-based ink comprises silver nanoparticles, wherein the conductive silver-based film has a sheet resistance of at most about 0.04 ohm/sq/mil. Optionally, in some embodiments, the conductive silver-based ink comprises silver nanoparticles, wherein the conductive silver-based film has a sheet resistance of about 0.01 ohm/sq/mil to about 0.011 ohm/sq/mil, about 0.01 ohm/sq/mil to about 0.012 ohm/sq/mil, about 0.01 ohm/sq/mil to about 0.014 ohm/sq/mil, about 0.01 ohm/sq/mil to about 0.016 ohm/sq/mil, about 0.01 ohm/sq/mil to about 0.018 ohm/sq/mil, about 0.01 ohm/sq/mil to about 0.02 ohm/sq/mil, about 0.01 ohm/sq/mil to about 0.025 ohm/sq/mil, about 0.01 ohm/sq/mil to about 0.03 ohm/sq/mil, about 0.01 ohm/sq/mil to about 0.035 ohm/sq/mil, about 0.01 ohm/sq/mil to about 0.04 ohm/sq/mil, about 0.011 ohm/sq/mil to about 0.012 ohm/sq/mil, about 0.011 ohm/sq/mil to about 0.014 ohm/sq/mil, about 0.011 ohm/sq/mil to about 0.016 ohm/sq/mil, about 0.011 ohm/sq/mil to about 0.018 ohm/sq/mil, about 0.011 ohm/sq/mil to about 0.02 ohm/sq/mil, about 0.011 ohm/sq/mil to about 0.025 ohm/sq/mil, about 0.011 ohm/sq/mil to about 0.03 ohm/sq/mil, about 0.011 ohm/sq/mil to about 0.035 ohm/sq/mil, about 0.011 ohm/sq/mil to about 0.04 ohm/sq/mil, about 0.012 ohm/sq/mil to about 0.014 ohm/sq/mil, about 0.012 ohm/sq/mil to about 0.016 ohm/sq/mil, about 0.012 ohm/sq/mil to about 0.018 ohm/sq/mil, about 0.012 ohm/sq/mil to about 0.02 ohm/sq/mil, about 0.012 ohm/sq/mil to about 0.025 ohm/sq/mil, about 0.012 ohm/sq/mil to about 0.03 ohm/sq/mil, about 0.012 ohm/sq/mil to about 0.035 ohm/sq/mil, about 0.012 ohm/sq/mil to about 0.04 ohm/sq/mil, about 0.014 ohm/sq/mil to about 0.016 ohm/sq/mil, about 0.014 ohm/sq/mil to about 0.018 ohm/sq/mil, about 0.014 ohm/sq/mil to about 0.02 ohm/sq/mil, about 0.014 ohm/sq/mil to about 0.025 ohm/sq/mil, about 0.014 ohm/sq/mil to about 0.03 ohm/sq/mil, about 0.014 ohm/sq/mil to about 0.035 ohm/sq/mil, about 0.014 ohm/sq/mil to about 0.04 ohm/sq/mil, about 0.016 ohm/sq/mil to about 0.018 ohm/sq/mil, about 0.016 ohm/sq/mil to about 0.02 ohm/sq/mil, about 0.016 ohm/sq/mil to about 0.025 ohm/sq/mil, about 0.016 ohm/sq/mil to about 0.03 ohm/sq/mil, about 0.016 ohm/sq/mil to about 0.035 ohm/sq/mil, about 0.016 ohm/sq/mil to about 0.04 ohm/sq/mil, about 0.018 ohm/sq/mil to about 0.02 ohm/sq/mil, about 0.018 ohm/sq/mil to about 0.025 ohm/sq/mil, about 0.018 ohm/sq/mil to about 0.03 ohm/sq/mil, about 0.018 ohm/sq/mil to about 0.035 ohm/sq/mil, about 0.018 ohm/sq/mil to about 0.04 ohm/sq/mil, about 0.02 ohm/sq/mil to about 0.025 ohm/sq/mil, about 0.02 ohm/sq/mil to about 0.03 ohm/sq/mil, about 0.02 ohm/sq/mil to about 0.035 ohm/sq/mil, about 0.02 ohm/sq/mil to about 0.04 ohm/sq/mil, about 0.025 ohm/sq/mil to about 0.03 ohm/sq/mil, about 0.025 ohm/sq/mil to about 0.035 ohm/sq/mil, about 0.025 ohm/sq/mil to about 0.04 ohm/sq/mil, about 0.03 ohm/sq/mil to about 0.035 ohm/sq/mil, about 0.03 ohm/sq/mil to about 0.04 ohm/sq/mil, or about 0.035 ohm/sq/mil to about 0.04 ohm/sq/mil. Optionally, in some embodiments, the conductive silver-based ink comprises silver nanoparticles, wherein the conductive silver-based film has a sheet resistance of about 0.01 ohm/sq/mil, about 0.011 ohm/sq/mil, about 0.012 ohm/sq/mil, about 0.014 ohm/sq/mil, about 0.016 ohm/sq/mil, about 0.018 ohm/sq/mil, about 0.02 ohm/sq/mil, about 0.025 ohm/sq/mil, about 0.03 ohm/sq/mil, about 0.035 ohm/sq/mil, or about 0.04 ohm/sq/mil. Optionally, in some embodiments, the conductive silver-based ink comprises silver nanoparticles, wherein the conductive silver-based film has a sheet resistance of at least about 0.01 ohm/sq/mil, about 0.011 ohm/sq/mil, about 0.012 ohm/sq/mil, about 0.014 ohm/sq/mil, about 0.016 ohm/sq/mil, about 0.018 ohm/sq/mil, about 0.02 ohm/sq/mil, about 0.025 ohm/sq/mil, about 0.03 ohm/sq/mil, about 0.035 ohm/sq/mil, or about 0.04 ohm/sq/mil. Optionally, in some embodiments, the conductive silver-based ink comprises silver nanoparticles, wherein the conductive silver-based film has a sheet resistance of at most about 0.01 ohm/sq/mil, about 0.011 ohm/sq/mil, about 0.012 ohm/sq/mil, about 0.014 ohm/sq/mil, about 0.016 ohm/sq/mil, about 0.018 ohm/sq/mil, about 0.02 ohm/sq/mil, about 0.025 ohm/sq/mil, about 0.03 ohm/sq/mil, about 0.035 ohm/sq/mil, or about 0.04 ohm/sq/mil.

Optionally, in some embodiments, the substrate comprises metal, wood, glass, paper, organic material, cloths, plastics, fiberglass, carbon cloth, carbon fiber, silicon, or any combination thereof.

Other goals and advantages of the embodiments described herein will be further appreciated and understood when considered in conjunction with the following description and accompanying drawings. While the following description may contain specific details describing particular embodiments described herein, this should not be construed as limitations to the scope of the embodiments described herein but rather as an exemplification of preferable embodiments. For each embodiment described herein, many variations are possible as suggested herein that are known to those of ordinary skill in the art. A variety of changes and modifications may be made within the scope of the embodiments described herein without departing from the spirit thereof.

BRIEF DESCRIPTION OF THE DRAWINGS

Features of the disclosure are set forth with particularity in the appended claims. A better understanding of the features and advantages of the present disclosure will be obtained by reference to the following detailed description that sets forth illustrative embodiments, in which the principles of the embodiments are utilized, and the accompanying drawings or figures (also "FIG." and "FIGS." herein), of which:

DETAILED DESCRIPTION

Provided herein are graphene materials, fabrication processes, and devices with improved performance. Optionally, in some embodiments, the present disclosure provides devices and methods for forming a conductive graphene ink comprising a graphene material and devices and methods for forming a conductive graphene film comprising a substrate coated with a conductive ink comprising a graphene material. Such graphene inks and films avoid the shortcomings of conductive inks. The conductive graphene ink can be used to form patterns and shapes comprising electrodes and wires on a substrate.

Various aspects of the disclosure described herein may be applied to any of the particular applications set forth below or in any other type of manufacturing, synthesis, or processing setting. Other manufacturing, synthesis, or processing of materials may equally benefit from features described herein. For example, the methods, devices, and systems herein may be advantageously applied to manufacture (or synthesis) of various forms of graphene or graphene oxide. The embodiments described herein may be applied as a stand-alone method, device, or system or as part of an integrated manufacturing or materials (e.g., chemicals) processing system. It shall be understood that different aspects of the disclosure may be appreciated individually, collectively, or in combination with each other.

Reference will now be made to the figures. It will be appreciated that the figures and features therein are not necessarily drawn to scale. The schematic illustrations, images, formulas, charts, and graphs referred to herein represent fabricated exemplary devices that serve as a representation of the appearance, characteristics, and functionality of the devices produced by the exemplary methods described herein.

While preferable embodiments have been shown and described herein, it will be obvious to those skilled in the art that such embodiments are provided by way of example only. Numerous variations, changes, and substitutions will now occur to those skilled in the art. It should be understood that various alternatives to the embodiments described herein may be employed.

Figure 1:
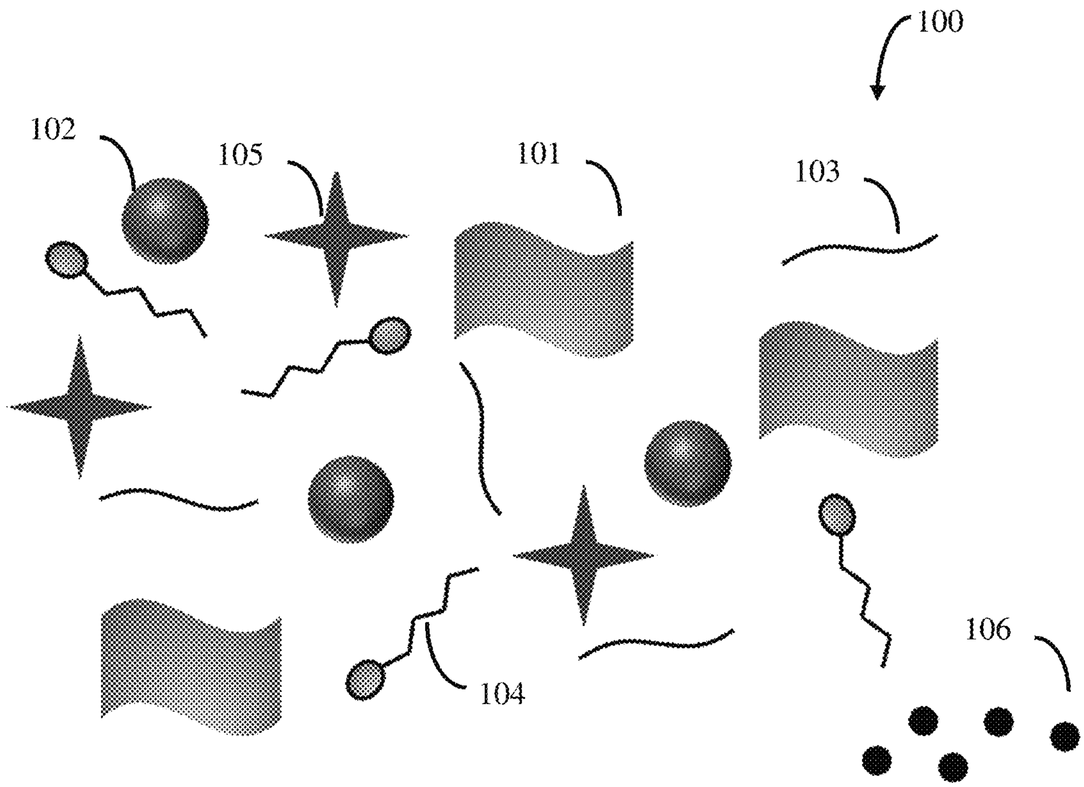
FIG. 1 shows an illustration of the composition of an exemplary conductive graphene ink, in accordance with some embodiments of the present disclosure.

Provided herein per FIGS. 1 to 7D are conductive graphene inks and components for the fabrication of the conductive inks thereof. FIG. 1 shows an illustration of the composition of an exemplary conductive graphene ink, in accordance with some embodiments. Per FIG. 1, the exemplary conductive graphene ink 100 comprises a graphene sheet 101, a carbon particle 102, a binder 103, a surfactant 104, a defoamer 105, and a first solvent 106.

Figure 2A:
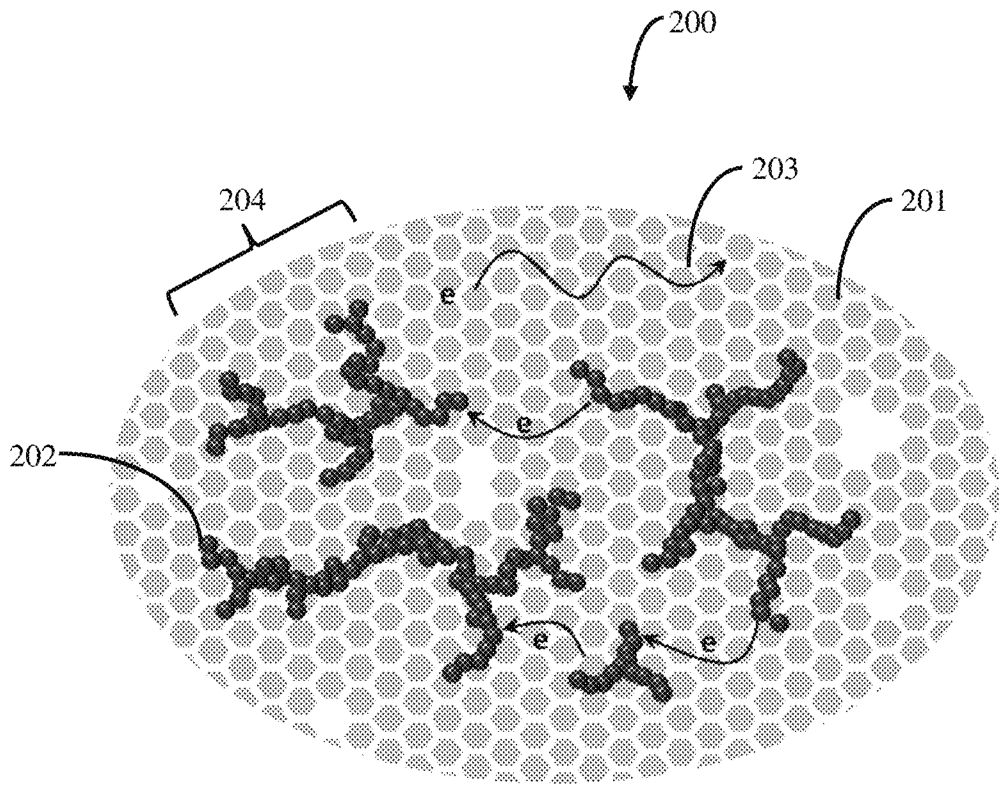
FIG. 2A shows an exemplary schematic illustration of chains of carbon black interconnected through a conductive graphene sheet, in accordance with some embodiments of the present disclosure.
Figure 2B:
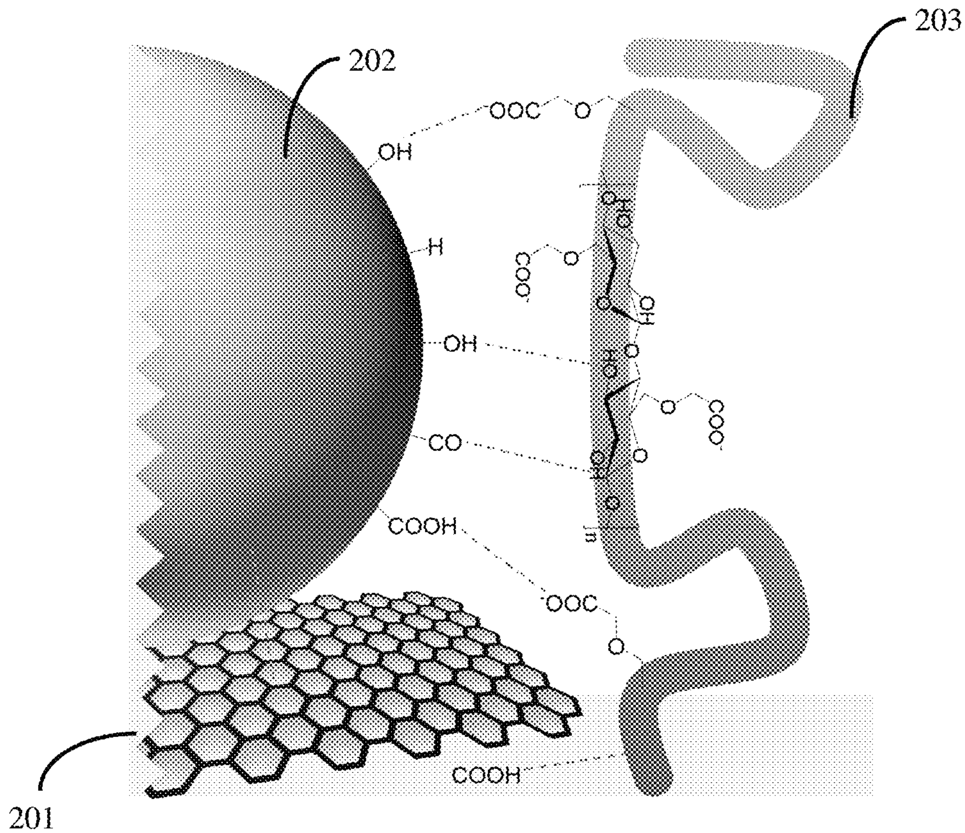
FIG. 2B shows an exemplary schematic illustration of a binder stabilizing the graphene ink, in accordance with some embodiments of the present disclosure.
Figure 2C:
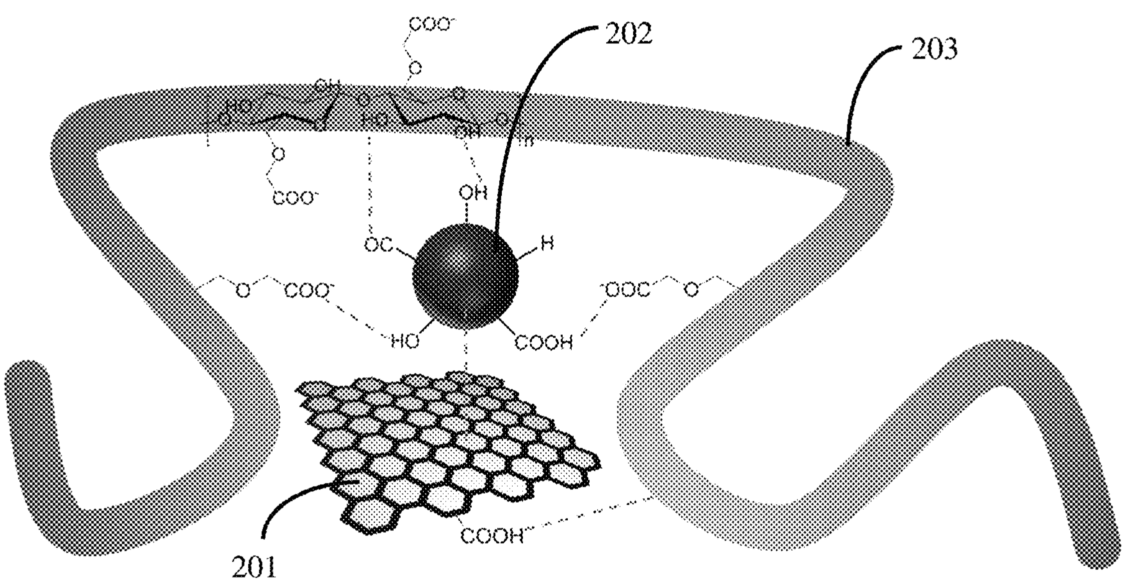
FIG. 2C shows an exemplary schematic illustration of the chemical interactions between binder and the components of the graphene ink, in accordance with some embodiments of the present disclosure.

FIGS. 2A-2C show exemplary schematic illustrations of the chemical bonds within a conductive graphene ink, in accordance with some embodiments. FIG. 2A shows an exemplary schematic illustration of chains of carbon black interconnected through a conductive graphene sheet, in accordance with some embodiments of the present disclosure. Per FIG. 2A, although interconnected carbon particle chains 204 of carbon particles 202 within graphene inks are capable of conducting an electrical current, the isolation of the carbon particle chains 204 must be overcome to enable continuous conductivity within graphene inks 200. However, embedding the carbon particle chains 204 within conductive graphene sheets 201 through van der Waals forces forms a continuous conductive graphene ink 200.

FIG. 2B shows an exemplary schematic illustration of a binder stabilizing the graphene ink, in accordance with some embodiments. FIG. 2C shows an exemplary schematic illustration of the chemical interactions between binder and the components of the graphene ink, in accordance with some embodiments. Per FIGS. 2A to 2C, the conductive graphene ink optionally further comprises a binder 203, wherein the a negatively charged backbone of the binder 203 forms stable emulsions within, and further increases the conductivity of, the conductive graphene ink. Optionally, in some embodiments, the binder 203 comprises a polymer. Optionally, in some embodiments, the polymer comprises a synthetic polymer. Optionally, in some embodiments, the synthetic polymer comprises carboxymethyl cellulose, polyvinylidene fluoride, poly(vinyl alcohol), poly(vinyl pyrrolidone), poly(ethylene oxide), ethyl cellulose, or any combination thereof. Optionally, in some embodiments, the binder is incorporated into the conductive graphene ink via a binder solution. Carboxymethyl cellulose, an exemplary polymer binder, forms extensive hydrogen bonding with both carbon particles 202 and graphene sheets 201, thus increases the stability of the conductive graphene ink. Furthermore, the use of a binder increases the adhesion of the components within the conductive graphene ink, the adhesion of the conductive graphene ink to a substrate, and the flexibility of the graphene film produced therewith. Per FIGS. 2B and 2C, the conductive graphene ink optionally further comprises a solvent. Some forms of carbon particles 202, such as carbon black, contains surface functional groups comprising, for example, —H, —OH, —CO, —COOH, which render its surface hydrophilic to increase its interaction with solvents and the graphene sheets 201.

Figure 3A:
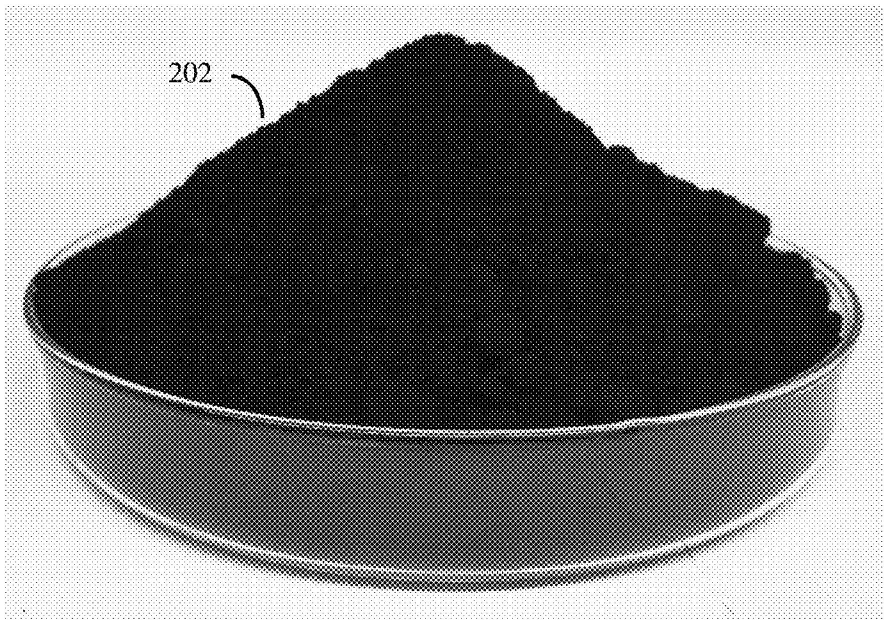
FIG. 3A shows an exemplary image of a carbon particle comprising carbon black, in accordance with some embodiments of the present disclosure.
Figures 3B, 3C, 3D:
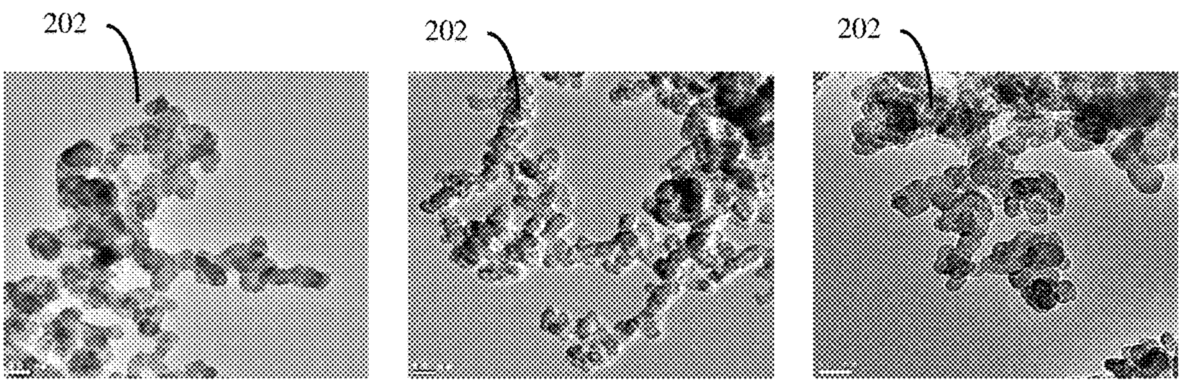
FIG. 3B shows an exemplary transmission electron microscopy (TEM) image of a commercially available form of carbon black, in accordance with some embodiments of the present disclosure.
FIG. 3C shows an exemplary TEM image of a second commercially available form of carbon black, in accordance with some embodiments of the present disclosure.
FIG. 3D shows an exemplary TEM image of a third commercially available form of carbon black, in accordance with some embodiments of the present disclosure.

FIG. 3A shows an exemplary image of a carbon particle 202 comprising carbon black, in accordance with some embodiments of the present disclosure. FIG. 3B shows an exemplary transmission electron microscopy (TEM) image of a commercially available form of carbon black, in accordance with some embodiments of the present disclosure. FIG. 3C shows an exemplary TEM image of a second commercially available form of carbon black, in accordance with some embodiments of the present disclosure. FIG. 3D shows an exemplary TEM image of a third commercially available form of carbon black, in accordance with some embodiments of the present disclosure. Carbon black is a material typically produced by the incomplete combustion of heavy petroleum products such as fluid catalytic cracking tar, coal tar, ethylene cracking tar, and a small amount from vegetable oil. As seen in FIGS. 3B-3D, carbon black is a form of paracrystalline carbon that typically has a high surface area-to-volume ratio. Forms of carbon black include but are not limited to Super C45, Super C65, and Super P.

Figure 4:
FIG. 4 shows an exemplary image of raw graphene, in accordance with some embodiments transmission electron microscopy, which is used to make the graphene sheet 101.

FIG. 4 shows an exemplary image of raw graphene, in accordance with some embodiments of the present disclosure. Optionally, in some embodiments, raw graphene is used to make the graphene sheet.

Figure 5A:
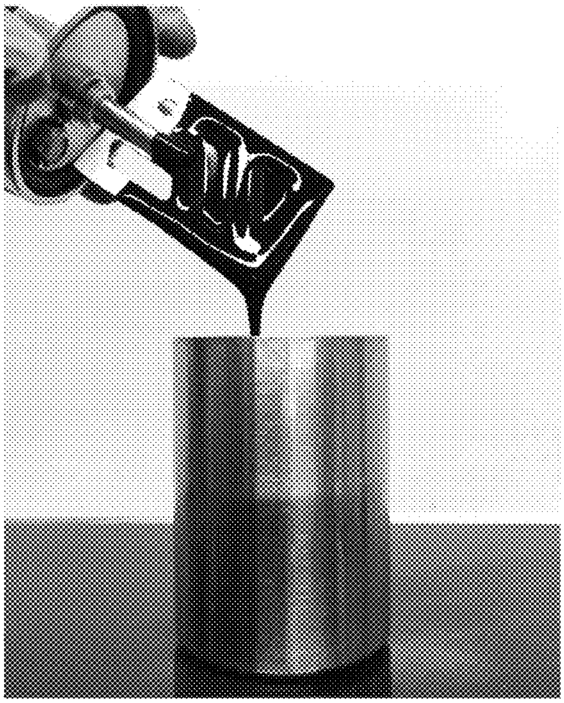
FIG. 5A shows an image of an exemplary conductive graphene ink being removed from a mixer, in accordance with some embodiments of the present disclosure.
Figure 5B:
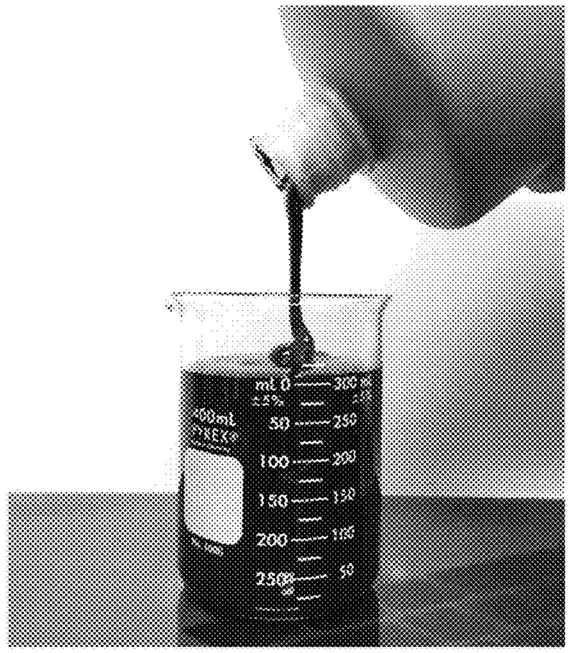
FIG. 5B shows an image of an exemplary conductive graphene ink being poured into a beaker, in accordance with some embodiments of the present disclosure.
Figure 5C:
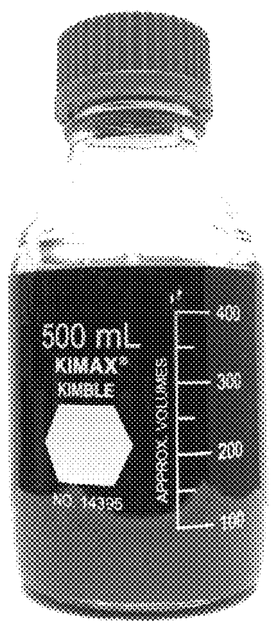
FIG. 5C shows an image of an exemplary conductive graphene ink in a jar, in accordance with some embodiments of the present disclosure.

FIGS. 5A-5C show images of an exemplary conductive graphene ink in accordance with some embodiments of the present disclosure. FIG. 5A shows an image of an exemplary conductive graphene ink being removed from a mixer, in accordance with some embodiments of the present disclosure. FIG. 5B shows an image of an exemplary conductive graphene ink being poured into a beaker, in accordance with some embodiments of the present disclosure. FIG. 5C shows an image of an exemplary conductive graphene ink in a jar, in accordance with some embodiments of the present disclosure. As seen in FIGS. 5A-5C, the conductive graphene ink is highly viscous. As shown, the conductive graphene ink is black. Optionally, in some embodiments, the conductive graphene ink is blue, green, red, yellow, orange, indigo, violet, or any combination thereof.

Figure 6A:
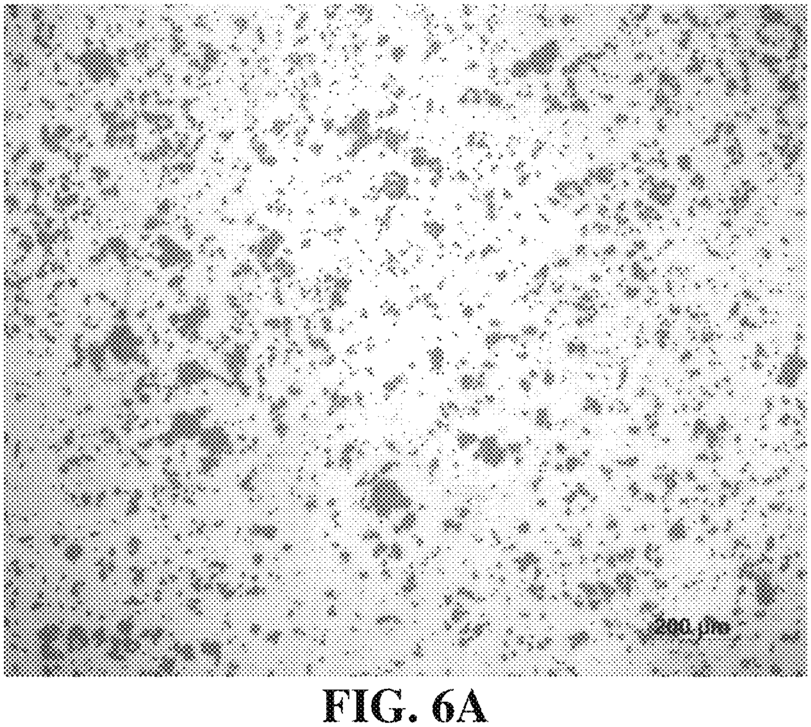
FIG. 6A shows a first optical microscopy image of an exemplary conductive graphene ink, in accordance with some embodiments of the present disclosure.
Figure 6B:
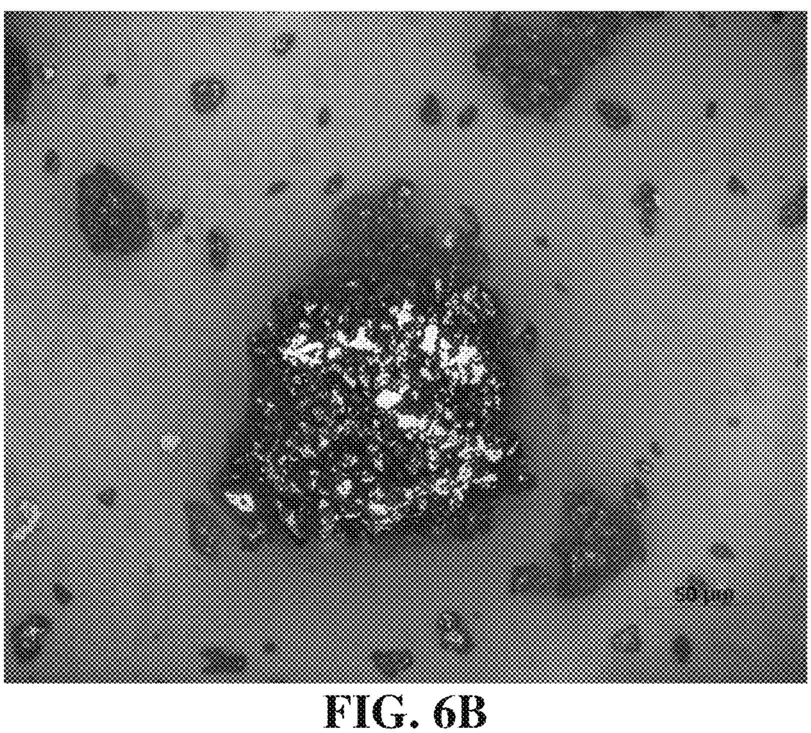
FIG. 6B shows a second optical microscopy image of an exemplary conductive graphene ink, in accordance with some embodiments of the present disclosure.
Figure 7A:
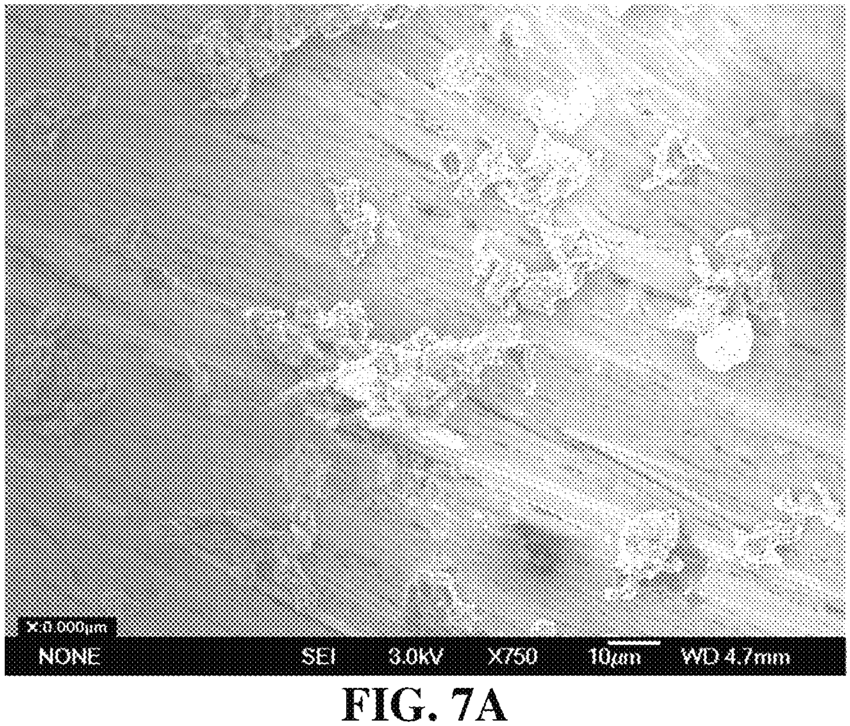
FIG. 7A shows a first high-magnification scanning electron microscopy (SEM) image of an exemplary conductive graphene ink, in accordance with some embodiments of the present disclosure.
Figure 7B:
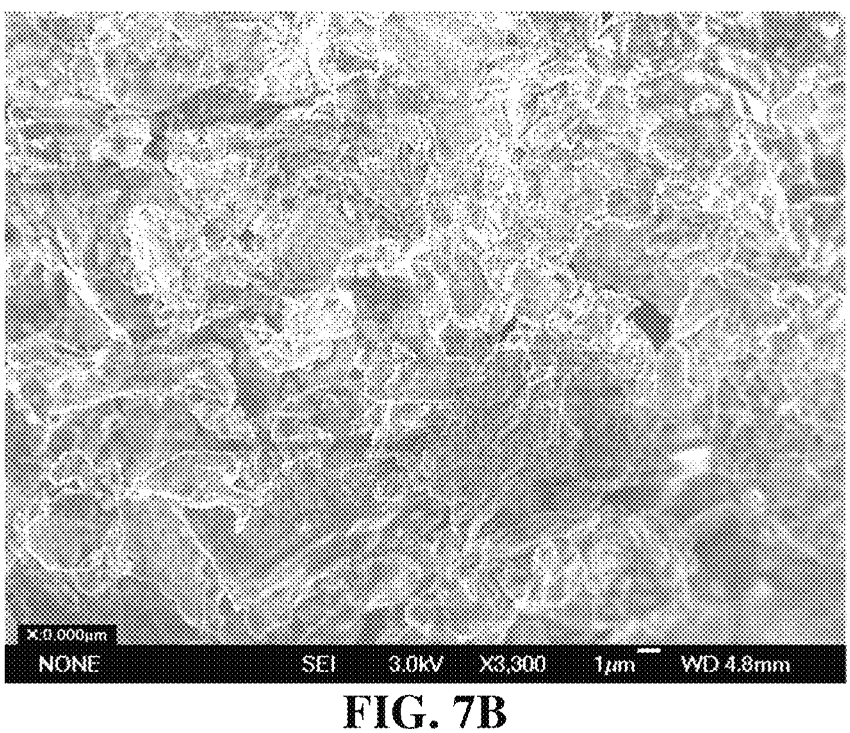
FIG. 7B shows a second high-magnification SEM image of an exemplary conductive graphene ink, in accordance with some embodiments of the present disclosure.
Figure 7C:
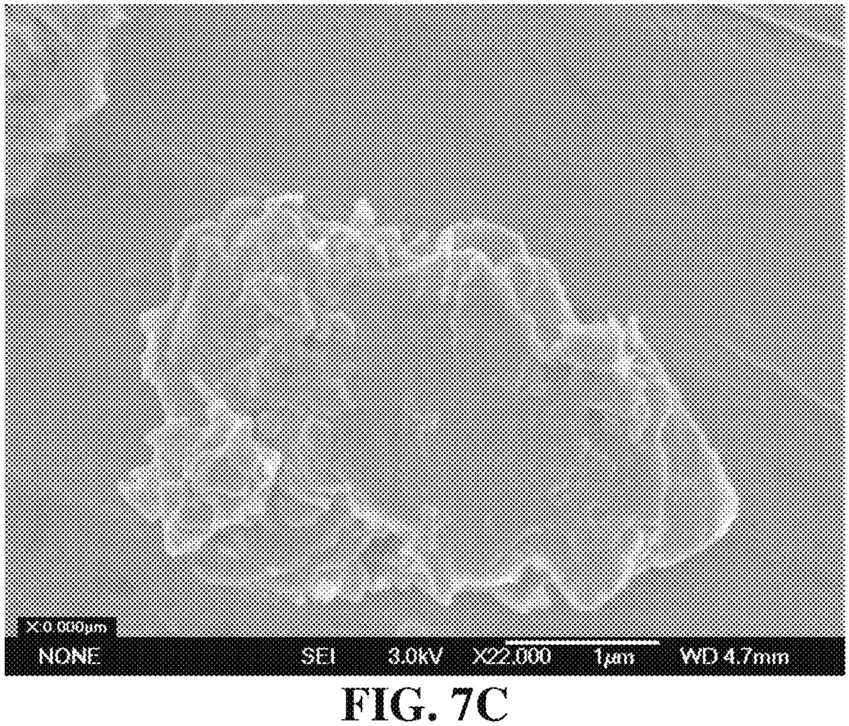
FIG. 7C shows a third high-magnification SEM image of an exemplary conductive graphene ink, in accordance with some embodiments of the present disclosure.
Figure 7D:
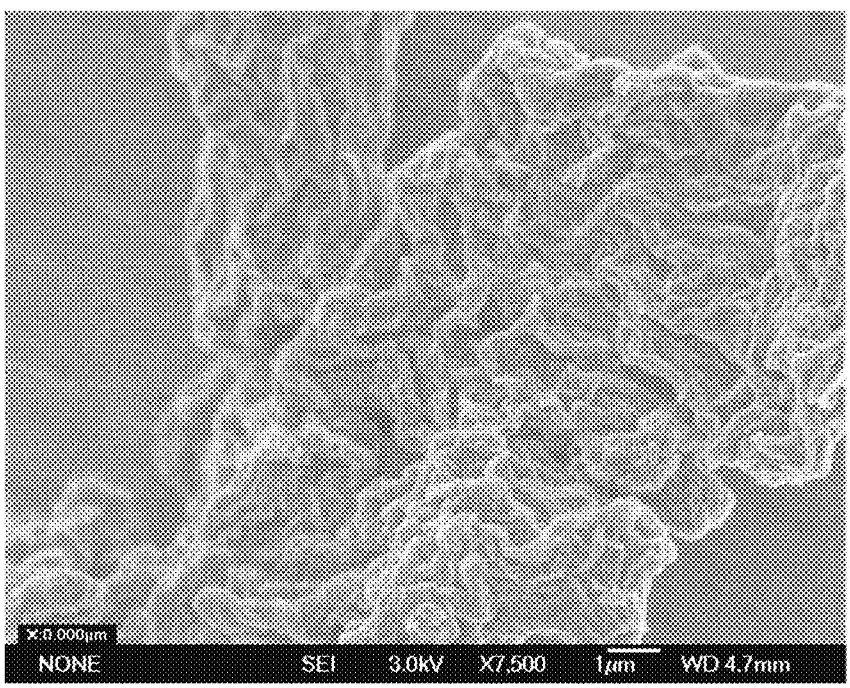
FIG. 7D shows a fourth high-magnification SEM image of an exemplary conductive graphene ink, in accordance with some embodiments of the present disclosure.

FIG. 6A shows a first optical microscopy image of an exemplary conductive graphene ink, in accordance with some embodiments of the present disclosure. FIG. 6B shows a second optical microscopy image of an exemplary conductive graphene ink, in accordance with some embodiments of the present disclosure. FIG. 7A shows a first high-magnification scanning electron microscopy (SEM) image of an exemplary conductive graphene ink, in accordance with some embodiments of the present disclosure. FIG. 7B shows a second high-magnification SEM image of an exemplary conductive graphene ink, in accordance with some embodiments of the present disclosure. FIG. 7C shows a third high-magnification SEM image of an exemplary conductive graphene ink, in accordance with some embodiments of the present disclosure. FIG. 7D shows a fourth high-magnification SEM image of an exemplary conductive graphene ink, in accordance with some embodiments of the present disclosure.

Optionally, in some embodiments, the conductive graphene ink has a viscosity of at most about 10,000 centipoise. Optionally, in some embodiments, the conductive graphene ink has a surface area of at least about 40 $m^2/g$. Optionally, in some embodiments, the graphene ink has a resistivity when dry of about 0.01 ohm/sq/mil to about 60 ohms/sq/mil.

Provided herein is a method of forming a conductive graphene ink comprising: forming a binder solution; forming a reduced graphene oxide dispersion; and forming a graphene solution comprising the binder solution, the reduced graphene dispersion, a third solvent, a conductive additive, a surfactant, and a defoamer; and mixing the graphene solution to form a conductive graphene ink. Optionally, in some embodiments, forming a binder solution comprises heating a first solvent, adding a binder to the first solvent, mixing the binder and the first solvent, and cooling the binder and the first solvent. Optionally, in some embodiments, the reduced graphene oxide dispersion comprises a second solvent and reduced graphene oxide.

Figure 8:
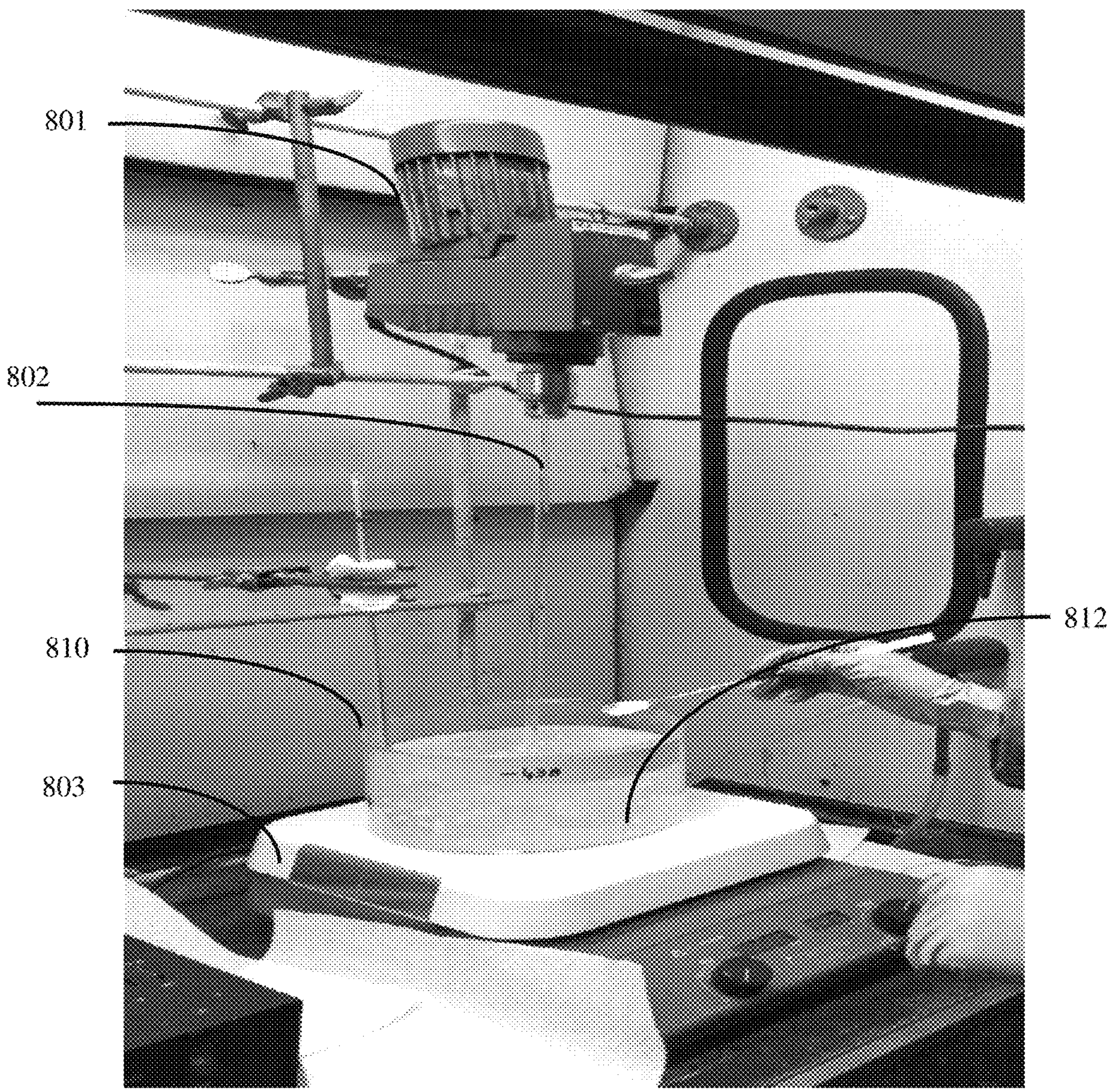
FIG. 8 shows an image of an exemplary apparatus for forming a conductive graphene ink, in accordance with some embodiments of the present disclosure.

FIG. 8 shows an image of an exemplary apparatus for forming a conductive graphene ink, in accordance with some embodiments of the present disclosure. Per FIG. 8, the exemplary apparatus for mixing a binder of a conductive graphene ink comprises a first mechanical mixer 801, a beater 802, and a hot plate 803.

Optionally, in some embodiments, the process of forming a binder solution comprises: heating a first solvent 810, adding a binder 812 to the first solvent 810, mixing the binder 812 and the first solvent 810, and cooling the binder 812 and the first solvent 810.

Optionally, in some embodiments, at least one of the first solvent, the second solvent, and the third solvent comprises water, an organic solvent, or any combination thereof. Optionally, in some embodiments, at least one of the first solvent, the second solvent, and the third solvent comprises water and an organic solvent. Optionally, in some embodiments, the organic solvent comprises ethanol, isopropyl alcohol, N-methyl-2-pyrrolidone, cyclohexanone, terpineol, 3-methoxy-3-methyl-1-butanol, 4-hydroxyl-4-methyl-pentan-2-one, methyl isobutyl ketone, or any combination thereof. Optionally, in some embodiments, at least one of the first solvent, the second solvent, and the third solvent comprises water, ethanol, isopropyl alcohol, N-methyl-2-pyrrolidone, cyclohexanone, terpineol, 3-methoxy-3-methyl-1-butanol, 4-hydroxyl-4-methyl-pentan-2-one, methyl isobutyl ketone, or any combination thereof.

Optionally, in some embodiments, the binder comprises carboxymethyl cellulose, polyvinylidene fluoride, poly(vinyl alcohol), poly(vinyl pyrrolidone), poly(ethylene oxide), ethyl cellulose, or any combination thereof.

Optionally, in some embodiments, the conductive additive comprises a carbon-based material. Optionally, in some embodiments, the carbon-based material comprises a paracrystalline carbon. Optionally, in some embodiments, the paracrystalline carbon comprises carbon black, acetylene black, channel black, furnace black, lamp black, thermal black, or any combination thereof. Optionally, in some embodiments, the conductive additive comprises silver. Optionally, in some embodiments, the silver comprises silver nanoparticles, silver nanorods, silver nanowires, silver nanoflowers, silver nanofibers, silver nanoplatelets, silver nanoribbons, silver nanocubes, silver bipyramids, or any combination thereof.

Optionally, in some embodiments, the surfactant comprises perfluorooctanoic acid, perfluorooctane sulfonate, perfluorohexane sulfonic acid, perfluorononanoic acid, perfluorodecanoic acid, polyethylene glycol alkyl ethers, octaethylene glycol monododecyl ether, pentaethylene glycol monododecyl ether, polypropylene glycol alkyl ethers, glucoside alkyl ethers, decyl glucoside, lauryl glucoside, octyl glucoside, polyethylene glycol octylphenyl ethers, Triton X-100, polyethylene glycol alkylphenyl ethers, nonoxynol-9, glycerol alkyl esters polysorbate, sorbitan alkyl esters poloxamers, polyethoxylated tallow amine, Dynol 604, or any combination thereof.

Optionally, in some embodiments, the defoamer comprises an insoluble oil, a silicone, a glycol, a stearate, an organic solvent, Surfynol DF-1100, alkyl polyacrylate, or any combination thereof. Optionally, in some embodiments, the insoluble oil comprises mineral oil, vegetable oil, white oil, or any combination thereof. Optionally, in some embodiments, the silicone comprises polydimethylsiloxane, silicone glycol, a fluorosilicone, or any combination thereof. Optionally, in some embodiments, the glycol comprises polyethylene glycol, ethylene glycol, propylene glycol, or any combination thereof. Optionally, in some embodiments, the stearate comprises glycol stearate, stearin, or any combination thereof. Optionally, in some embodiments, the organic solvent comprises ethanol, isopropyl alcohol, N-methyl-2-pyrrolidone, cyclohexanone, terpineol, 3-methoxy-3-methyl-1-butanol, 4-hydroxyl-4-methyl-pentan-2-one, methyl isobutyl ketone, or any combination thereof.

High quantities of water in water-based conductive graphene inks may optionally increase the surface tension of the ink. In some applications, such as in inkjet printing, however, a low, controlled surface tension and viscosity is required to maintain consistent jetting through the print head nozzles. The addition of a surfactant may reduce the surface tension of an ink because as the surfactant units move to the water/air interface, their relative force of attraction weakens as the non-polar surfactant heads become exposed.

A specific ink viscosity is important for some applications. For example, a viscosity of greater than about 1000 mPa·s is ideal for ink for screen printing, wherein a viscosity lower than 20 mPa·s works best for inkjet printing. Optionally, in some embodiments, the viscosity of the conductive graphene ink can be controlled by the amount of at least one of the first solvent, the second solvent, the third solvent, and binder used, wherein lower quantities of at least one of the first solvent, the second solvent, and the third solvent form inks with lower viscosities.

Optionally, in some embodiments, the mixing of the binder and the first solvent is performed by a first mechanical mixer. Optionally, in some embodiments, the mixing of the binder solution, the first solvent, the conductive additive, and the RGO dispersion is performed by a second mechanical mixer. Optionally, in some embodiments, the second mechanical mixer mixes the graphene solution at a stirring speed of about 15 rpm to about 125 rpm. Optionally, in some embodiments, the second mechanical mixer mixes the graphene solution during one or more intervals, wherein each interval comprises a period of time of about 0.5 minute to about 30 minutes. Optionally, in some embodiments, the second mechanical mixer mixes the graphene solution under a vacuum degree, and wherein the vacuum degree is equal to the ambient pressure. Optionally, in some embodiments, the second mechanical mixer mixes the graphene solution under a vacuum degree, and wherein the vacuum degree is about −0.05 MPa to about −0.2 MPa.

Optionally, in some embodiments, the method of forming the binder dictates the mechanical and electrical performance characteristics of the conductive graphene ink and the graphene films formed thereby. Optionally, in some embodiments, the method herein is capable of producing a conductive graphene ink capable of forming a thin consistent layer with a low lateral thickness, when coated on a substrate.

Figure 9:
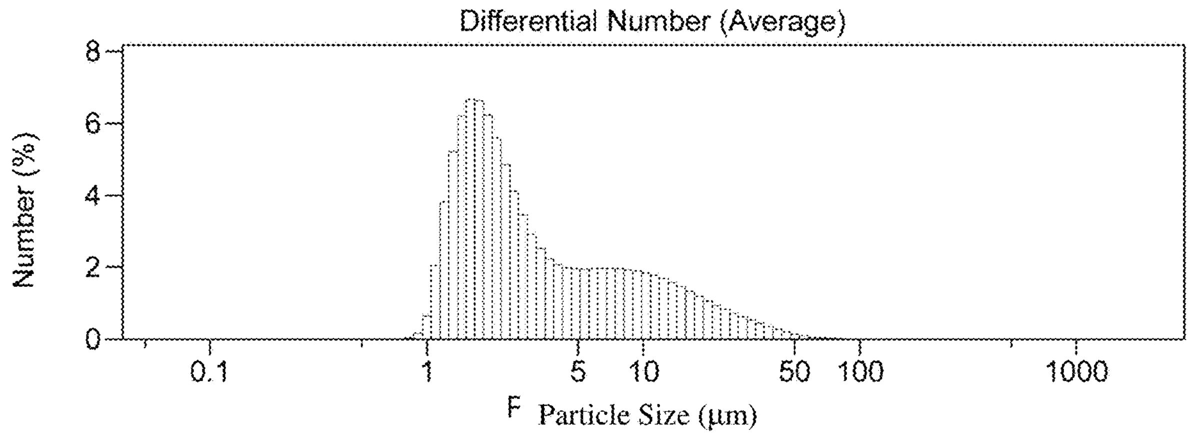
FIG. 9 shows a particle size distribution chart of an exemplary conductive graphene ink.

FIG. 9 shows a particle size distribution chart of an exemplary conductive graphene ink. Optionally, in some embodiments, the particle size distribution of the conductive graphene ink, per FIG. 9, was determined by measuring the static light scattering of a dilute solution of homogeneously disbursed conductive graphene ink. As seen in FIG. 9, the exemplary conductive graphene ink comprises particles ranging from about 1 μm to about 50 μm, wherein the most prevalent particle size is about 2 μm.

Figure 10:
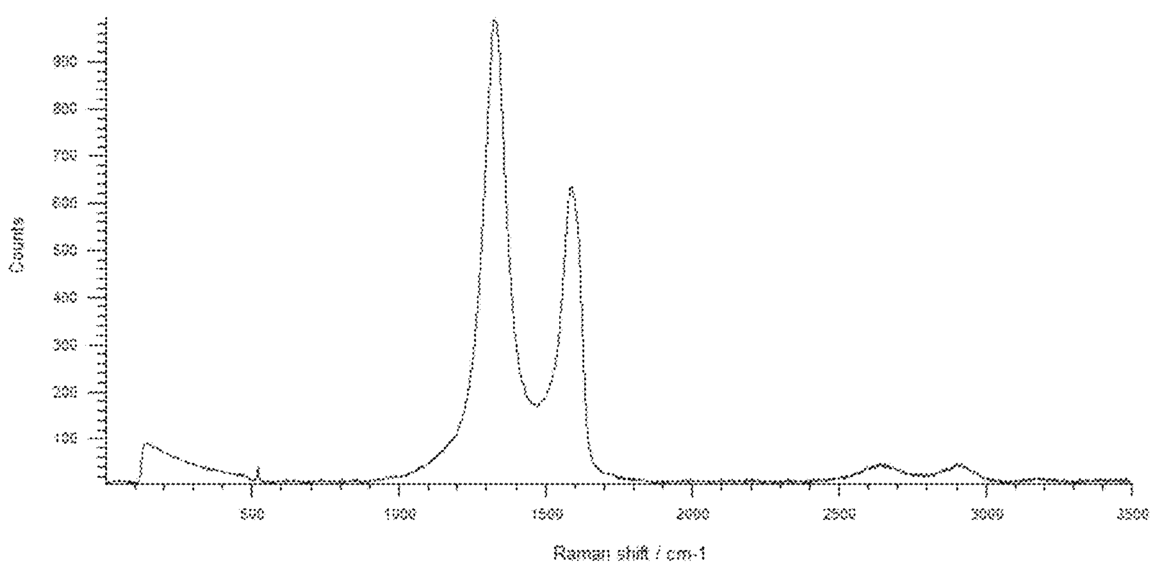
FIG. 10 shows a Raman spectra chart of an exemplary conductive graphene ink, in accordance with some embodiments of the present disclosure.

FIG. 10 shows a Raman spectra chart of an exemplary conductive graphene ink, in accordance with some embodiments of the present disclosure. Optionally, in some embodiments, the Raman spectra of the conductive graphene ink, per FIG. 10, were obtained with a 633 nm laser with a 10 second acquisition time on samples of conductive graphene ink that were drop-cast onto a silicon wafer.

Figure 11:
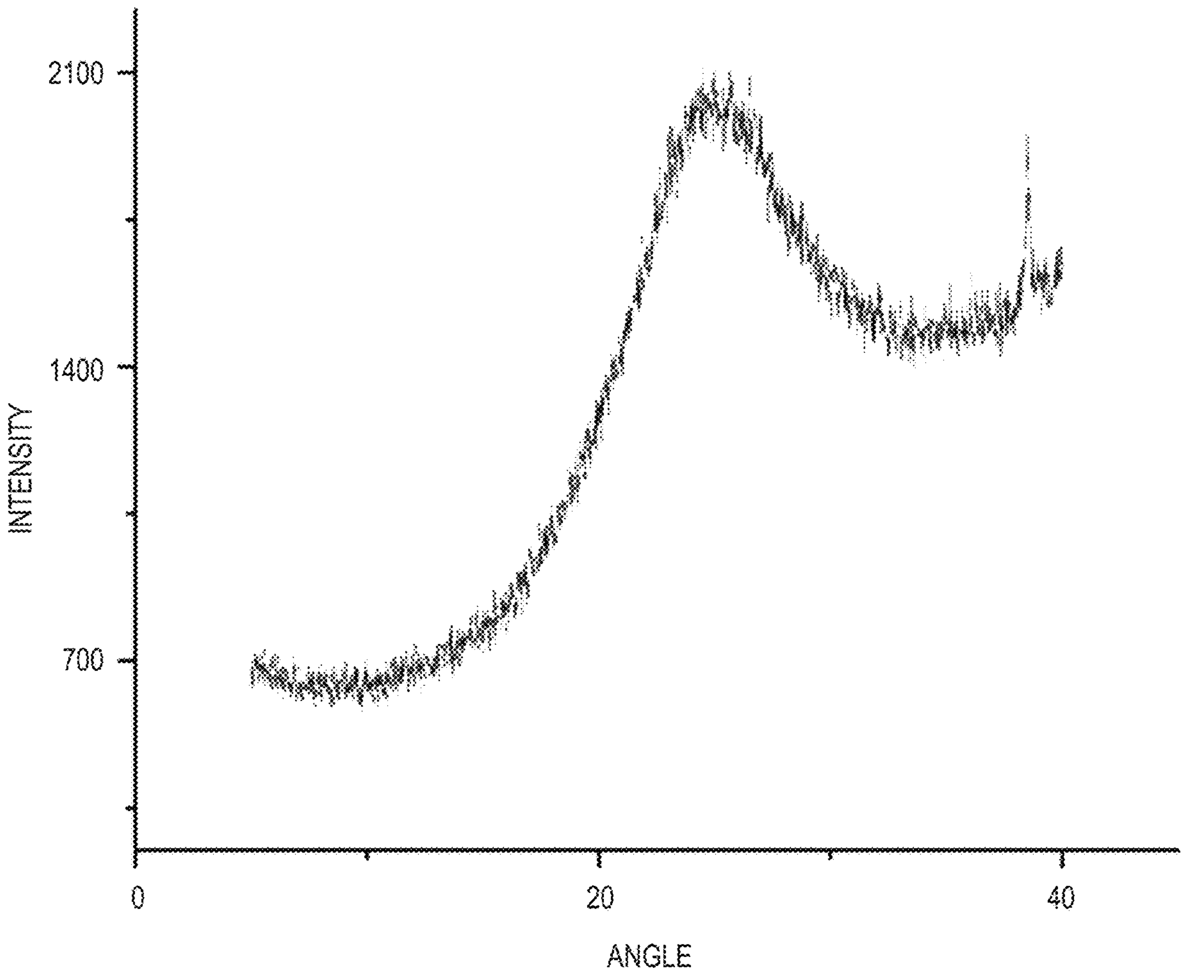
FIG. 11 shows an X-ray diffraction chart of an exemplary conductive graphene ink, in accordance with some embodiments of the present disclosure.

FIG. 11 shows an X-ray diffraction chart of an exemplary conductive graphene ink, in accordance with some embodiments of the present disclosure. Optionally, in some embodiments, the X-ray diffraction graphs of the conductive graphene ink, per FIG. 11, were obtained by measuring the spectra of a purified graphene oxide that is drop-cast onto a zero-background silicon over a 15 minute scan from a 2theta of 0 to 40 degrees.

Figure 12A:
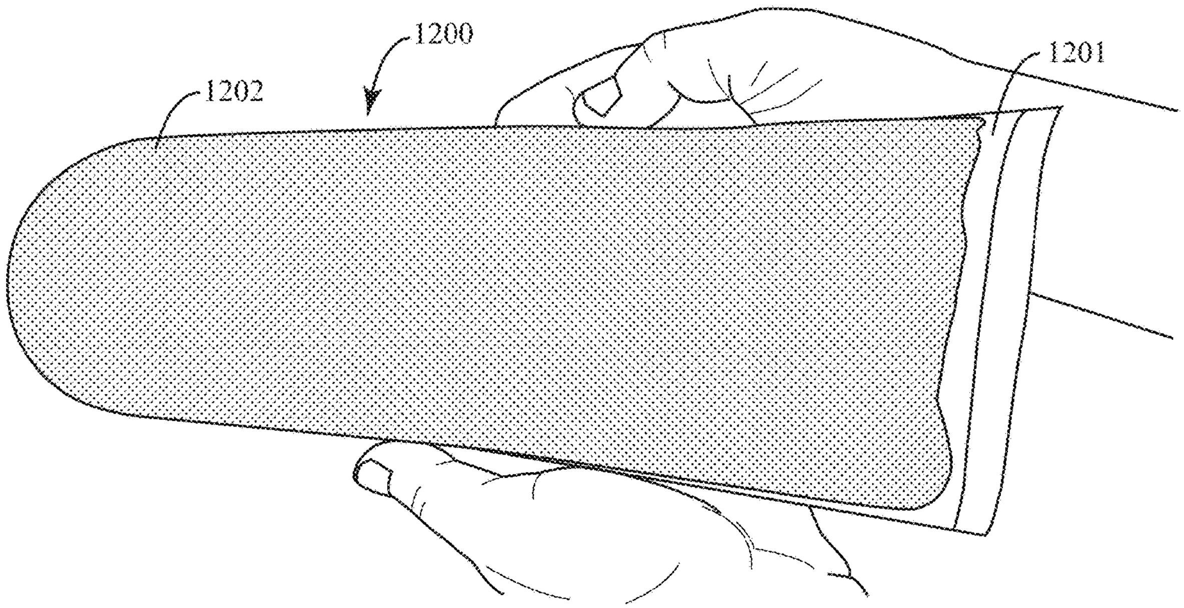
FIG. 12A shows an image of an exemplary conductive graphene ink on an exemplary substrate, in accordance with some embodiments of the present disclosure.
Figure 12B:
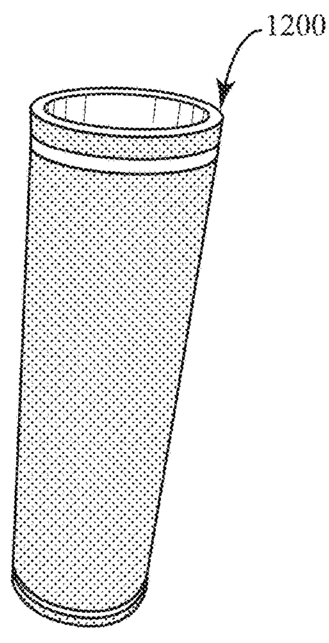
FIG. 12B shows an image of an exemplary roll of a conductive graphene ink-coated substrate, in accordance with some embodiments of the present disclosure.

FIGS. 12A-14B show images of exemplary graphene films comprising conductive graphene ink on a substrate. FIG. 12A shows an image of an exemplary conductive graphene ink on an exemplary substrate, in accordance with some embodiments of the present disclosure. FIG. 12B shows an image of an exemplary roll of a conductive graphene ink coated substrate, in accordance with some embodiments of the present disclosure. Per FIGS. 12A and 12B, the graphene films 1200 comprise a conductive graphene ink 1202 covering a majority of the exemplary substrate 1201. Optionally, in some embodiments, the substrate 1201 comprises metal, plastic, paper, wood, silicon, metal, glass, fiberglass, carbon fiber, ceramics, fabric, or any combination thereof. Optionally, in some embodiments, the conductive graphene ink 1202 covers at least a portion of the substrate 1201. Optionally, in some embodiments, the conductive graphene ink 1202 covers the entirety of the substrate 1201. Optionally, in some embodiments, the graphene film 1200 comprises a conductive graphene ink 1202 covering a majority of the substrate 1201 wherein a portion of the substrate 1201 not covered by the conductive graphene ink 1202 is removed. Optionally, in some embodiments, the graphene film 1200 can be cut to form graphene film 1200 ribbons, particles, shapes, cutouts, wires, connectors, or any combination thereof.

Figure 13:
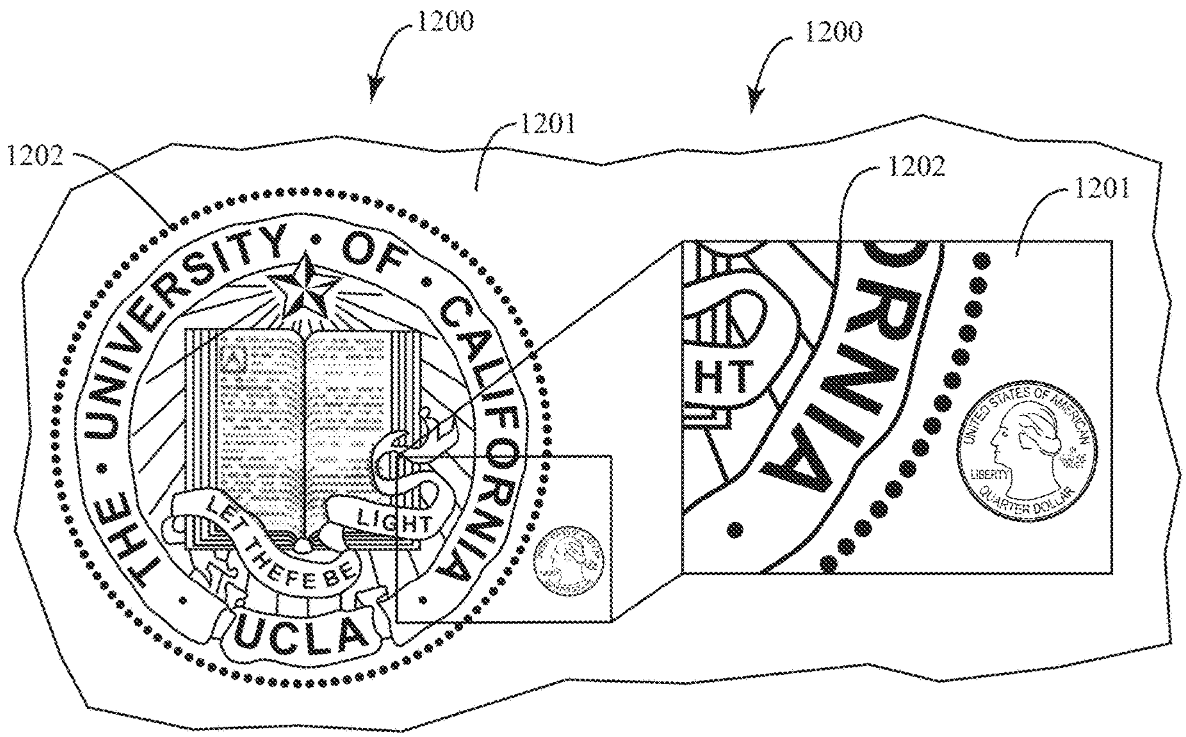
FIG. 13 shows an image of an exemplary graphene film comprising a conductive graphene logo on an exemplary substrate, in accordance with some embodiments of the present disclosure.

FIG. 13 shows an image of an exemplary graphene film comprising a conductive graphene logo on an exemplary substrate, in accordance with some embodiments of the present disclosure. Optionally, in some embodiments, the graphene film 1200 comprises a conductive graphene ink 1202 that is screen-printed to form a logo on an exemplary substrate 1201. Optionally, in some embodiments, the printing resolution of the conductive graphene ink 1202 on an exemplary substrate 1201 is defined, and only limited by, the resolution of the printer used to deposit the conductive graphene ink 1202. Optionally, in some embodiments, the substrate 1201 comprises metal, wood, glass, paper, an organic material, cloths, plastics, fiberglass, carbon cloth, carbon fiber, silicon, or any combination thereof.

Figure 14A:
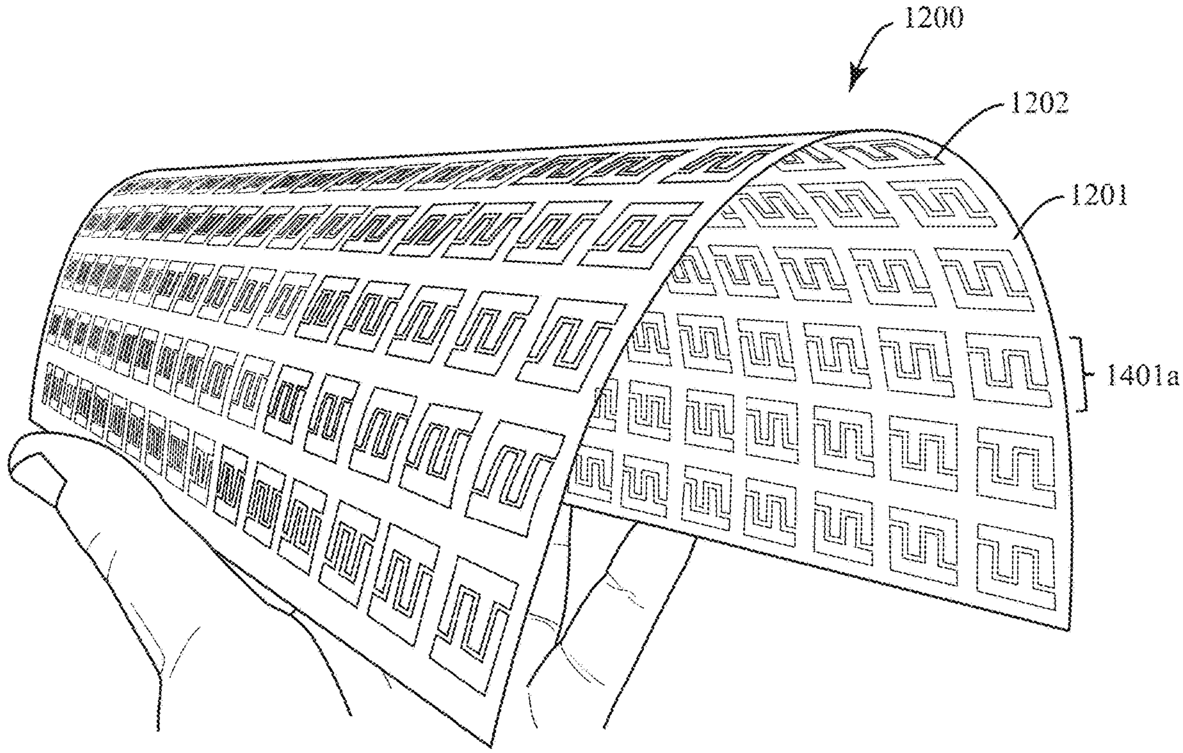
FIG. 14A shows an image of an exemplary graphene films comprising arrays of two interdigitated electrodes formed from an exemplary conductive graphene ink and an exemplary substrate, in accordance with some embodiments of the present disclosure.
Figure 14B:
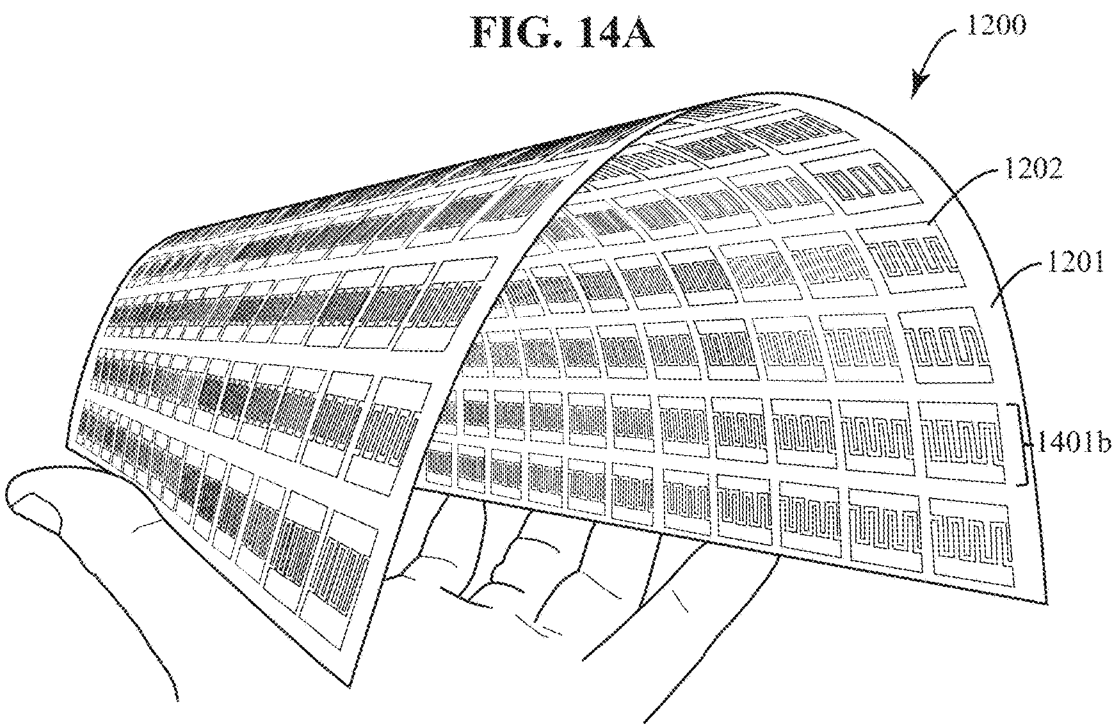
FIG. 14B shows an image of an exemplary graphene films comprising arrays of three interdigitated electrodes formed from an exemplary conductive graphene ink and an exemplary substrate, in accordance with some embodiments of the present disclosure.

FIGS. 14A and 14B shows images of an exemplary graphene films comprising arrays of interdigitated electrodes formed from an exemplary conductive graphene ink and an exemplary substrate, in accordance with some embodiments. FIG. 14A shows an image of an exemplary graphene films comprising arrays of two interdigitated electrodes formed from an exemplary conductive graphene ink and an exemplary substrate, in accordance with some embodiments of the present disclosure. FIG. 14B shows an image of an exemplary graphene films comprising arrays of three interdigitated electrodes formed from an exemplary conductive graphene ink and an exemplary substrate, in accordance with some embodiments of the present disclosure. As shown, the exemplary graphene film 1200 comprises interdigitated electrodes 1401*a*, 1401*b* formed from the conductive graphene ink 1202 and the substrate 1201 and comprising two and four electrodes, respectively. Optionally, in some embodiments, the exemplary graphene film 1200 comprises interdigitated electrodes 1401*a*, 1401*b* comprising two, three, four, five, six, seven, eight, or more electrodes. Optionally, in some embodiments, the number of interdigitated electrodes 1401*a*, 1401*b* formed by the conductive graphene ink 1202 on an exemplary substrate 1201 is defined, and only limited by, the resolution of the printer used to deposit the conductive graphene ink 1202. Per FIGS. 14A and 14B, the exemplary graphene film 1200 comprises an array of interdigitated electrodes 1401*a*, 1401*b*, wherein one or more of the interdigitated electrodes 1401*a*, 1401*b* within the exemplary graphene film 1200 may be separated and used individually.

Figure 15A:
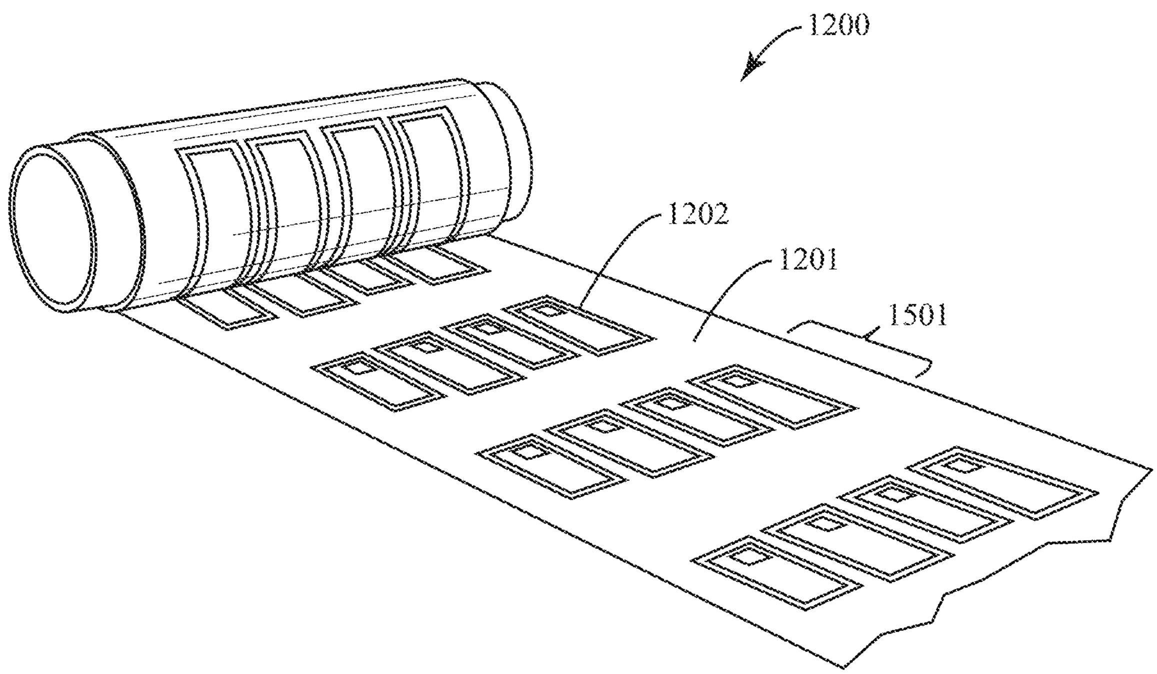
FIG. 15A shows an image of an exemplary radio frequency identification device printed on an exemplary conductive graphene ink on an exemplary paper substrate, in accordance with some embodiments of the present disclosure.

FIG. 15A shows an image of an exemplary graphene film comprising arrays of radio frequency identification (RFID) chips formed from an exemplary conductive graphene ink and an exemplary substrate, in accordance with some embodiments. An array of exemplary non-limiting RFID chips 1501 comprises an exemplary substrate 1201 coated with an exemplary conductive graphene ink 1202 is shown in FIG. 15A. Optionally, in some embodiments, the number of interdigitated electrodes 1401*a*, 1401*b* formed by the conductive graphene ink 1202 on an exemplary substrate 1201 is defined, and only limited by, the resolution of the printer used to deposit the conductive graphene ink 1202. Per FIGS. 14A and 14B, the exemplary graphene film 1200 comprises an array of interdigitated electrodes 1401*a*, 1401*b*, wherein one or more of the interdigitated electrodes 1401*a*, 1401*b* within the exemplary graphene film 1200 may be separated and used individually.

Figure 15B:
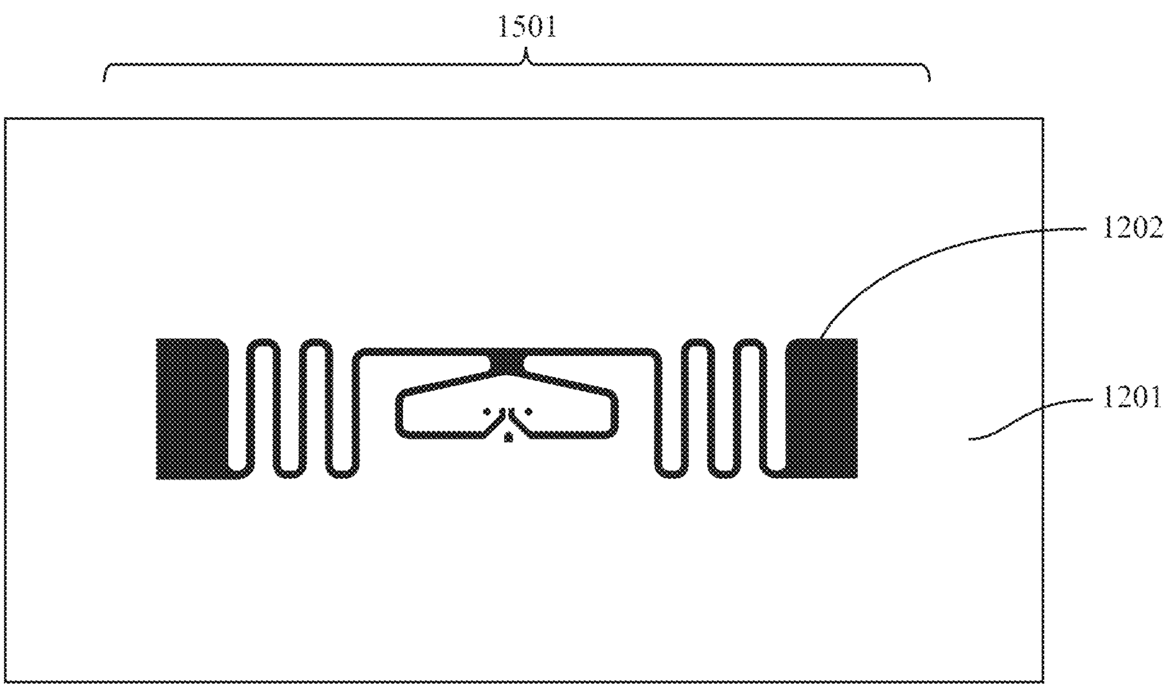
FIG. 15B shows an image of an exemplary radio frequency identification device printed on an exemplary conductive graphene ink on an exemplary paper substrate, in accordance with some embodiments of the present disclosure.

FIG. 15B shows an image of an exemplary RFID device printed on an exemplary conductive graphene ink on an exemplary paper substrate, in accordance with some embodiments of the present disclosure. An exemplary non-limiting RFID chip 1501 is shown in FIG. 15 wherein the exemplary conductive graphene ink 1202 is coated on an exemplary substrate 1201, wherein the substrate 1201 comprises paper.

Figure 16:
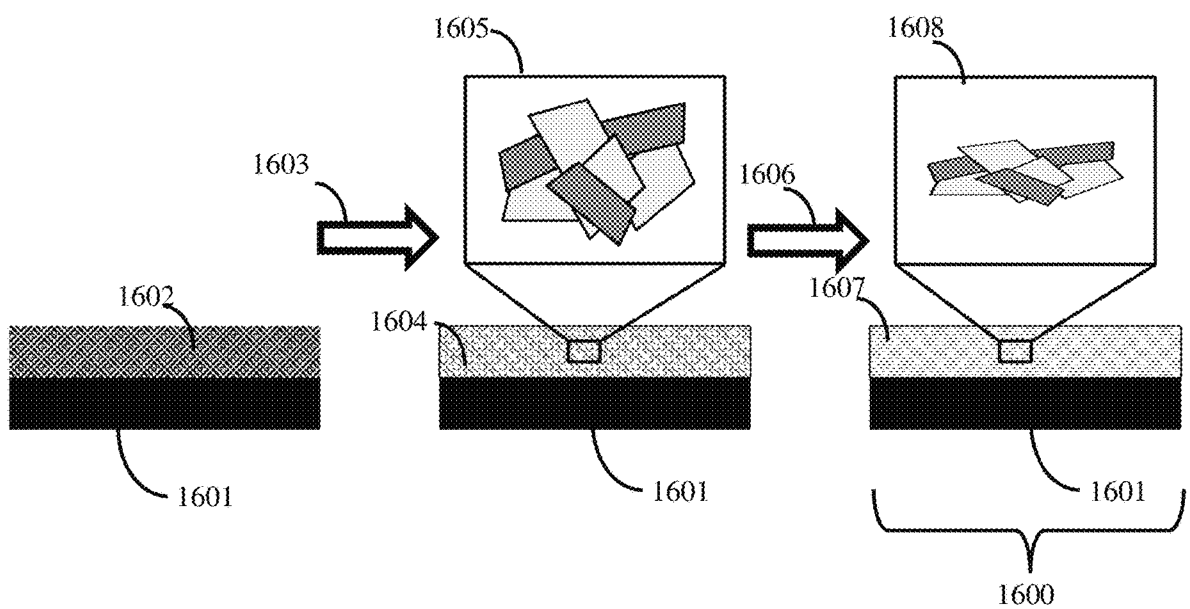
FIG. 16 shows a schematic illustration of an exemplary method of forming a graphene film, in accordance with some embodiments of the present disclosure.

FIG. 16 shows a schematic illustration of an exemplary method of forming a graphene film, in accordance with some embodiments of the present disclosure. Optionally, in some embodiments, the method of forming a graphene film 1600 comprises coating a substrate 1601 with a conductive graphene ink 1602, and drying 1603 the conductive graphene ink 1602 on the substrate 1601. Optionally, in some embodiments, drying 1603 the conductive graphene ink 1602 on the substrate 1601 forms a graphene coating 1604 comprising a highly porous array of graphene sheets 1605. Optionally, in some embodiments, the method of forming a graphene film 1600 further comprises compressing 1606 the graphene coating 1604 to form a compressed laminate 1607. Optionally, in some embodiments, the compressed laminate 1607 comprises a highly dense array of graphene sheets 1608.

Figure 17:
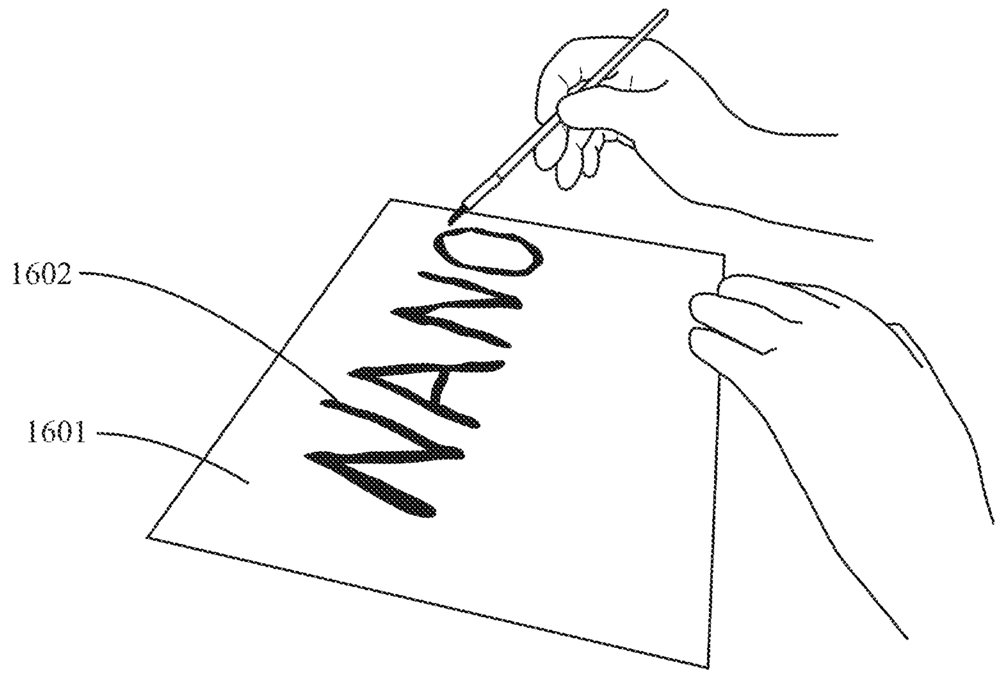
FIG. 17 shows an image of an exemplary method of forming a graphene film with a brush, in accordance with some embodiments of the present disclosure.

FIG. 17 shows an image of an exemplary method of forming a graphene film with a brush, in accordance with some embodiments. As seen in FIG. 17, an exemplary graphene ink 1602 is applied by a brush. Additionally, an exemplary substrate 1601, comprising paper, is shown in FIG. 17. Alternatively, the exemplary graphene ink 1602 is applied by a roller, a pipette, a pen, or any other known method of applying a liquid to a substrate. Optionally, in some embodiments, the ability of the exemplary graphene ink 1602 to be safely and easily applied to a substrate 1601 enables its use in such applications as prototyping, educational demonstrations, and learning activities.

Figure 18:
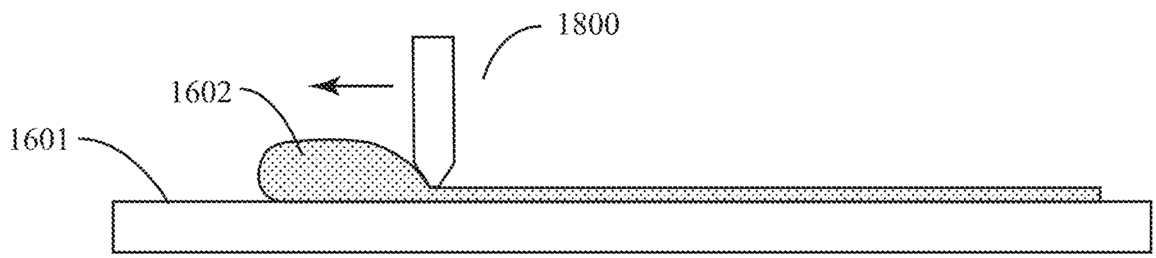
FIG. 18 shows an illustration of an exemplary method of forming a graphene film with a doctor blade, in accordance with some embodiments of the present disclosure.
Figure 19A:
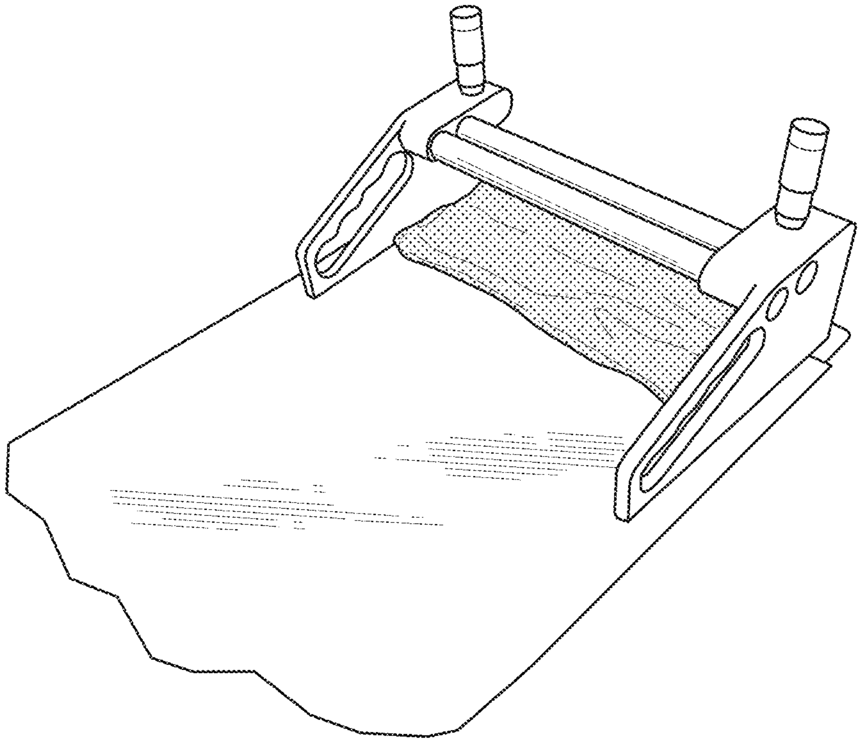
FIG. 19A shows an image of an exemplary doctor blade apparatus, in accordance with some embodiments of the present disclosure.
Figure 19B:
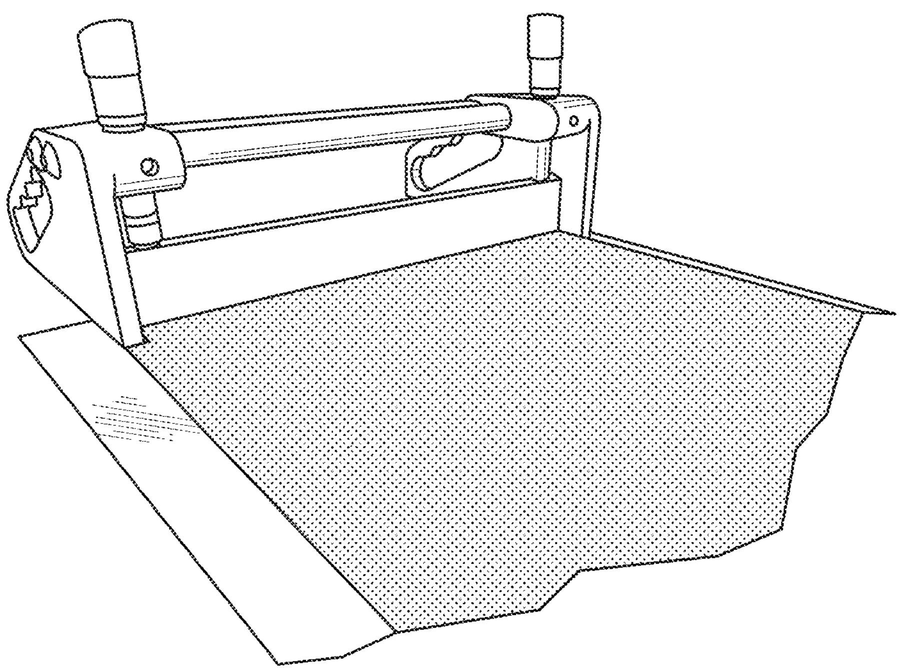
FIG. 19B shows an image of an exemplary graphene film formed with a doctor blade, in accordance with some embodiments of the present disclosure.

FIGS. 18 to 19B display an exemplary method of forming a graphene film with a doctor blade. FIG. 18 shows an illustration of an exemplary method of forming a graphene film with a doctor blade, in accordance with some embodiments of the present disclosure. FIG. 19A shows an image of an exemplary doctor blade apparatus, in accordance with some embodiments of the present disclosure. FIG. 19B shows an image of an exemplary graphene film formed with a doctor blade, in accordance with some embodiments of the present disclosure.

An exemplary method of forming a graphene film with a doctor blade, per FIG. 18, comprises depositing graphene ink 1602 onto a substrate 1601 and translating a doctor blade 1800 from one end to another end of the a substrate 1601 to form a coating of the graphene ink 1602 with a consistent thickness. As seen in FIGS. 19A and 19B, the doctor blade 1800 is configured to produce a graphene film with a consistent thickness. Optionally, in some embodiments, the doctor blade 1800 can be adjusted to spread a certain thickness of the graphene ink 1602 onto a substrate 1601. Optionally, in some embodiments, the thickness of the graphene ink 1602 affects the electrical properties of the graphene film. Optionally, in some embodiments, the doctor blade 1800 applies the graphene ink 1602 onto the entirety of the substrate 1601.

Figure 20:
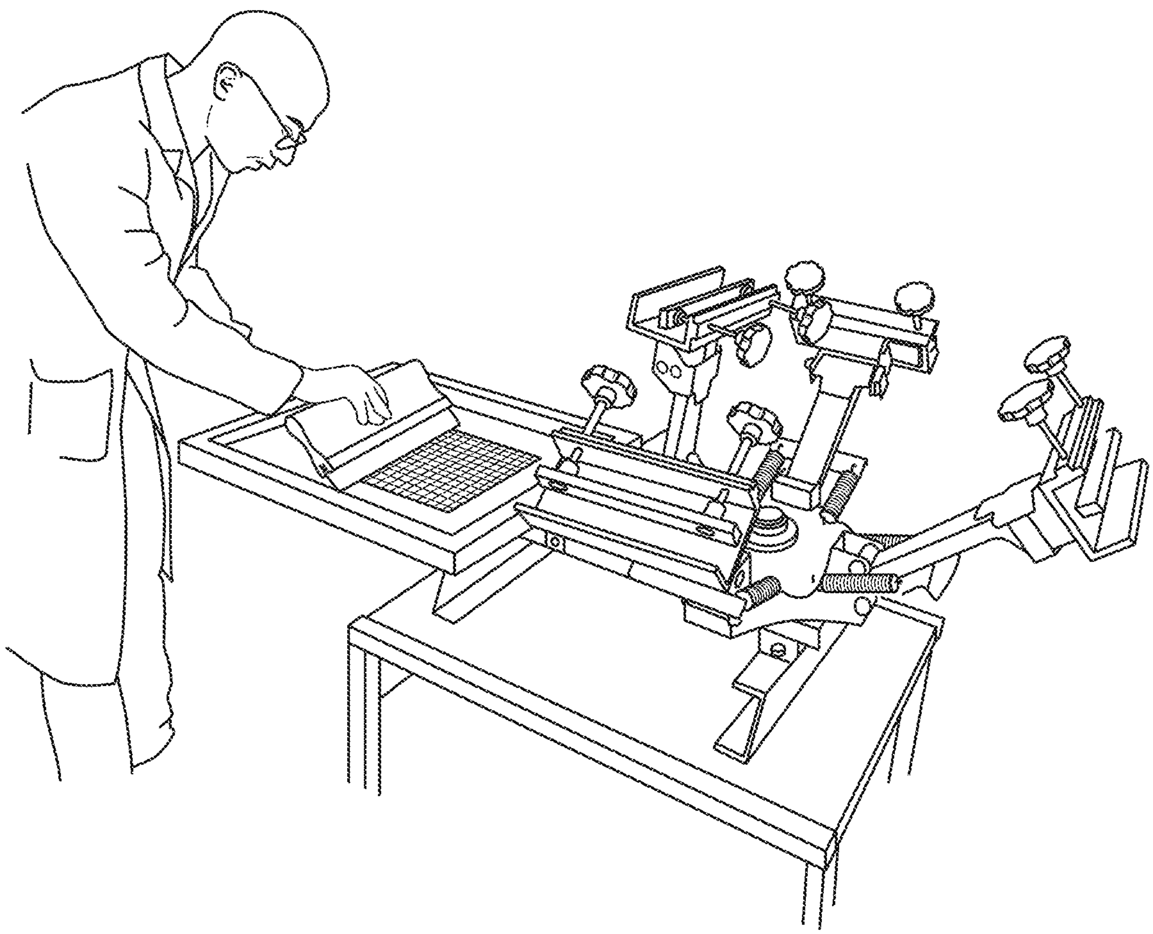
FIG. 20 shows an image of an exemplary method of coating a substrate with graphene ink with a screen printer, in accordance with some embodiments of the present disclosure.

FIG. 20 shows an image of an exemplary method of coating a substrate with graphene ink with a screen printer, in accordance with some embodiments of the present disclosure. Per FIG. 20, the exemplary method of forming a graphene film with a screen printer comprises depositing a screen onto a substrate, depositing graphene ink onto the screen and translating a squeegee from one end to another end of the a substrate to form a coating of the graphene ink with a consistent thickness. Optionally, in some embodiments, the screen comprises a stencil that is impermeable to the ink. Optionally, in some embodiments, screen printing is configured to produce a graphene film with a consistent thickness. Optionally, in some embodiments, the screen printer is adjusted to spread a certain thickness of the graphene ink onto a substrate. Optionally, in some embodiments, the screen printer applies the graphene ink onto the entirety of the substrate or one or more portions of the substrate.

Figure 21A:
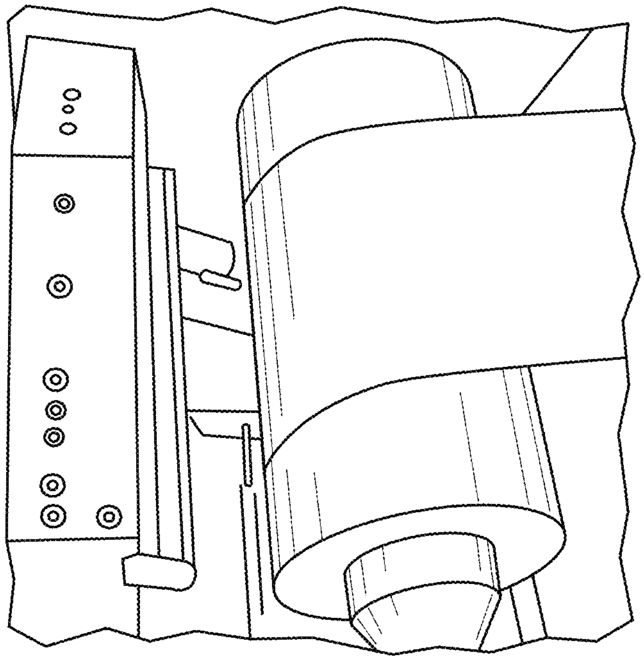
FIG. 21A shows an image of an exemplary substrate in a roll-to-roll printer, in accordance with some embodiments of the present disclosure.
Figure 21B:
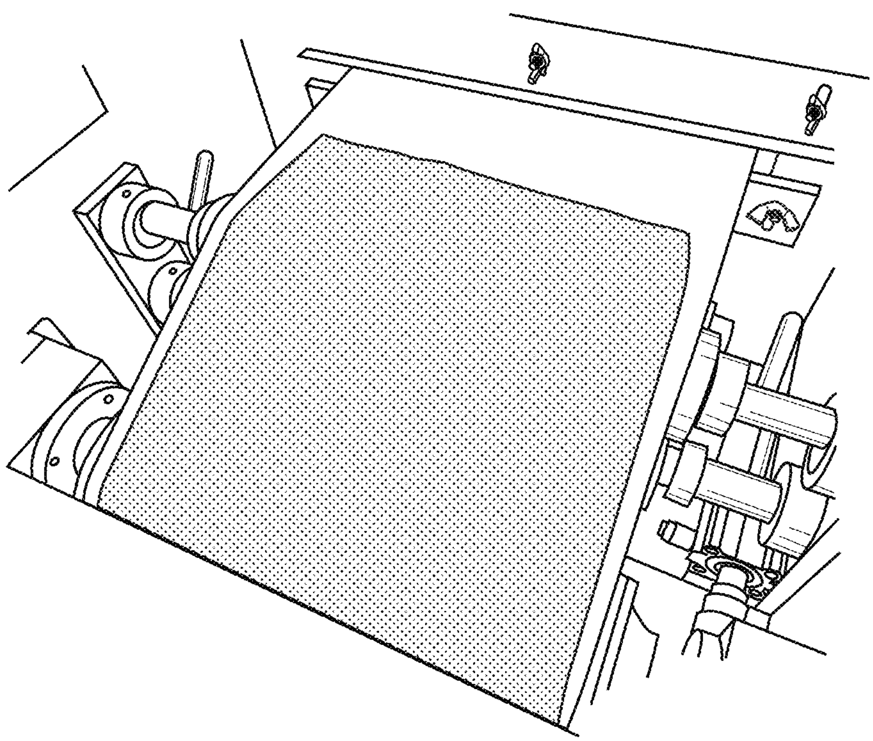
FIG. 21B shows an image of an exemplary graphene ink coating an exemplary substrate in a roll-to-roll printer, in accordance with some embodiments of the present disclosure.
Figure 21C:
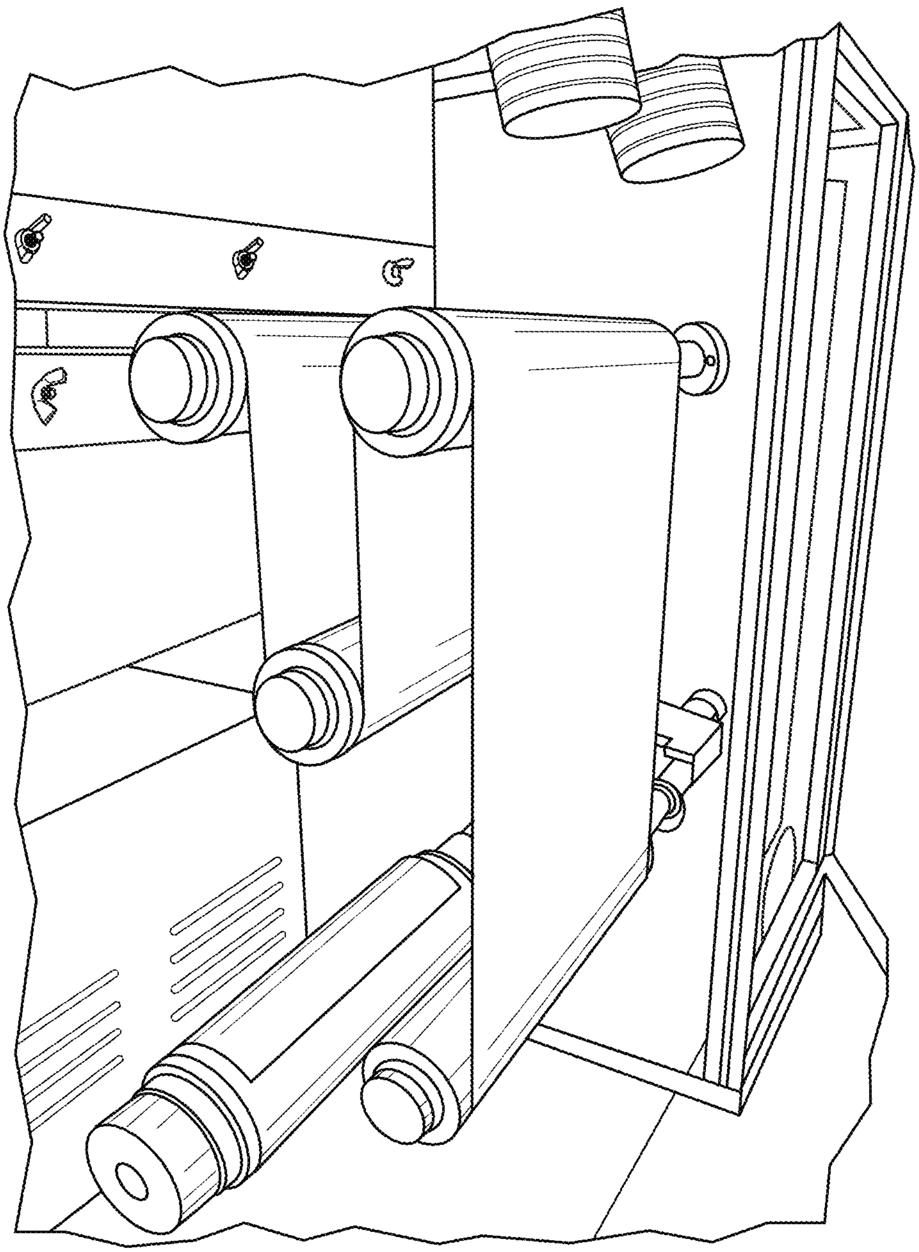
FIG. 21C shows an image of an exemplary graphene film formed by a roll-to-roll printer, in accordance with some embodiments of the present disclosure.

FIGS. 21A-21C show images of an exemplary method of coating a substrate with graphene ink with a roll-to-roll printer, in accordance with some embodiments of the present disclosure. FIG. 21A shows an image of an exemplary substrate in a roll-to-roll printer, in accordance with some embodiments of the present disclosure. FIG. 21B shows an image of an exemplary graphene ink coating an exemplary substrate in a roll-to-roll printer, in accordance with some embodiments of the present disclosure. FIG. 21C shows an image of an exemplary graphene film formed by a roll-to-roll printer, in accordance with some embodiments of the present disclosure. Optionally, in some embodiments, roll-to-roll printing is configured to produce a graphene film with a consistent thickness. Optionally, in some embodiments, the roll-to-roll printer is adjusted to spread a certain thickness of the graphene ink onto a substrate. Optionally, in some embodiments, the roll-to-roll printer applies the graphene ink onto the entirety of the substrate, or one or more portions of the substrate.

Alternatively, in this or any other embodiment, any other method or combination of methods known to those of skill in the art can be used to apply the graphene ink to a substrate to form a graphene film.

Figure 22:
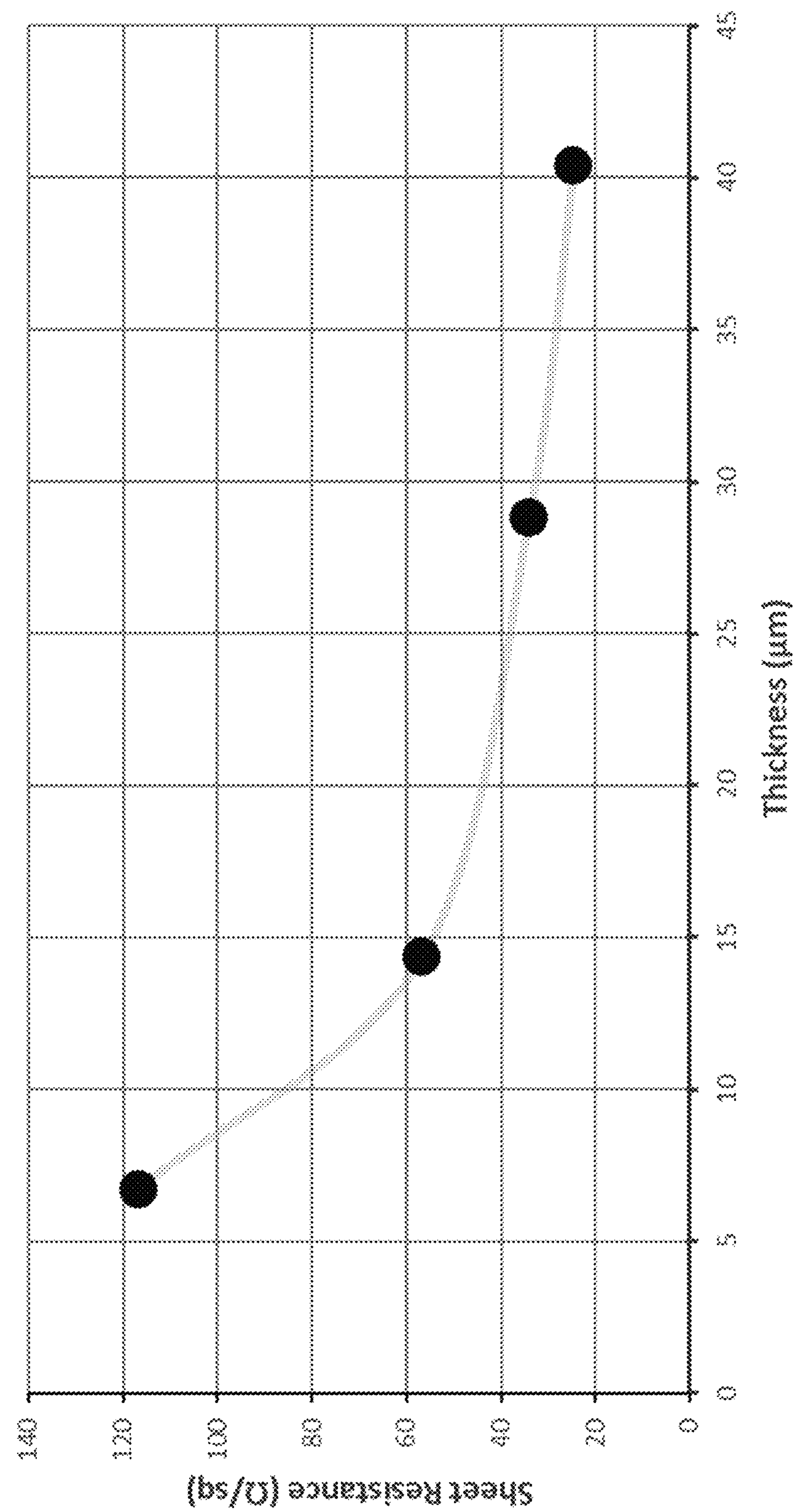
FIG. 22 shows a plot of the sheet resistance and dry thickness of an exemplary conducting graphene coating, in accordance with some embodiments of the present disclosure.

FIGS. 22-25 show the performance of exemplary graphene films. FIG. 22 shows a plot of the sheet resistance and dry thickness of an exemplary conducting graphene coating, in accordance with some embodiments of the present disclosure. Per FIG. 22, the sheet resistance of the exemplary non-limiting conducting graphene coating decreases from about 120 ohms/sq as the coating thickness increases from about 7 micrometers to about 41 micrometers. The sheet resistance of a graphene film is generally tuned by adjusting the thickness of the conductive graphene ink that coats the substrate. Optionally, in some embodiments, the graphene film has a resistivity of about 0.01 ohm/sq/mil to about 60 ohms/sq/mil.

Figure 23:
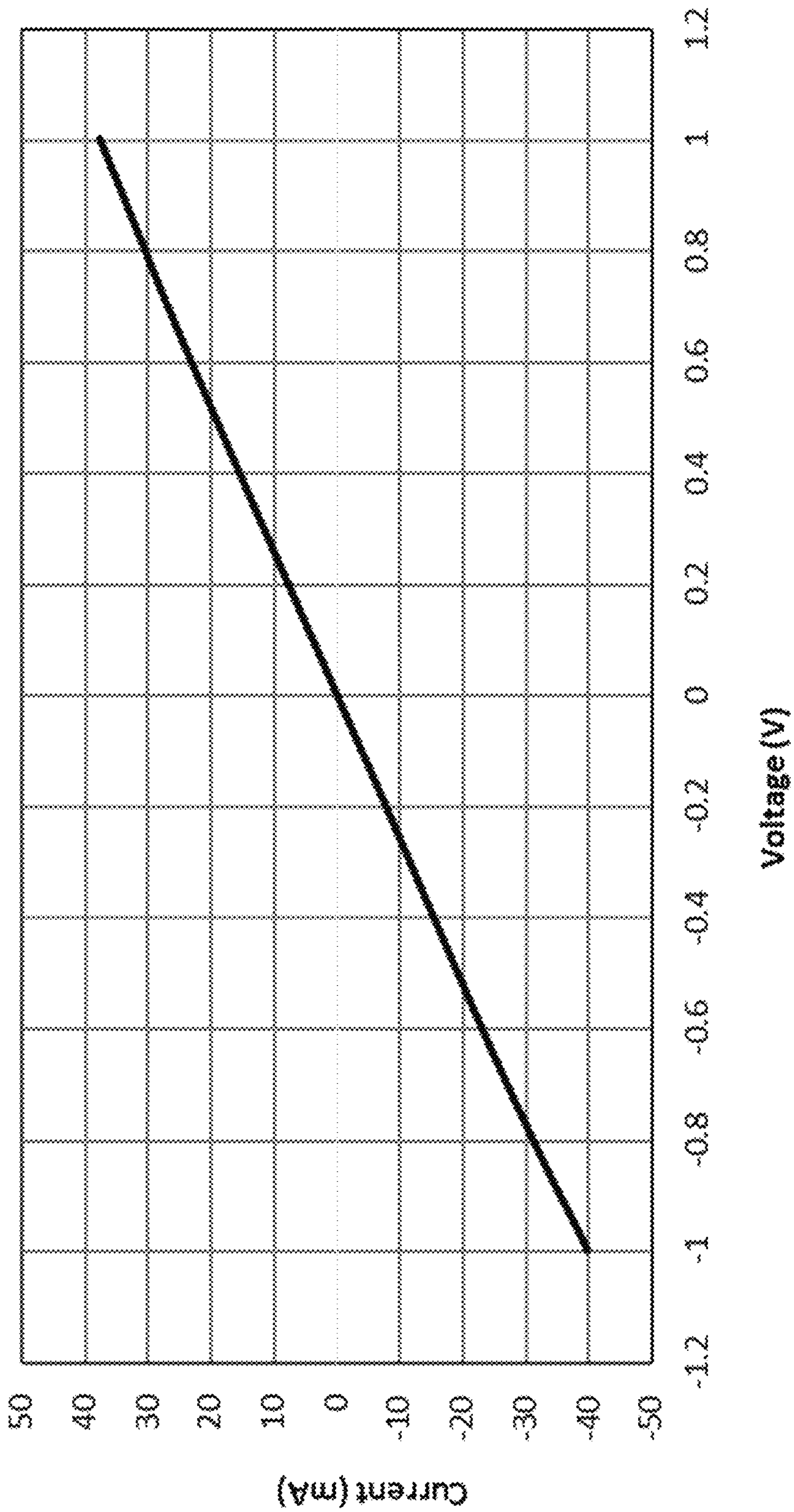
FIG. 23 shows an current-voltage plot of an exemplary conducting graphene coating, in accordance with some embodiments of the present disclosure.

FIG. 23 shows an current-voltage (I-V) plot of an exemplary conducting graphene coating, in accordance with some embodiments of the present disclosure. As seen in FIG. 23, the linear I-V curve of an exemplary non-limiting graphene film comprising a substrate and a conductive graphene ink with a 300 micrometer wet coating thickness displays a high conductivity.

Figure 24A:
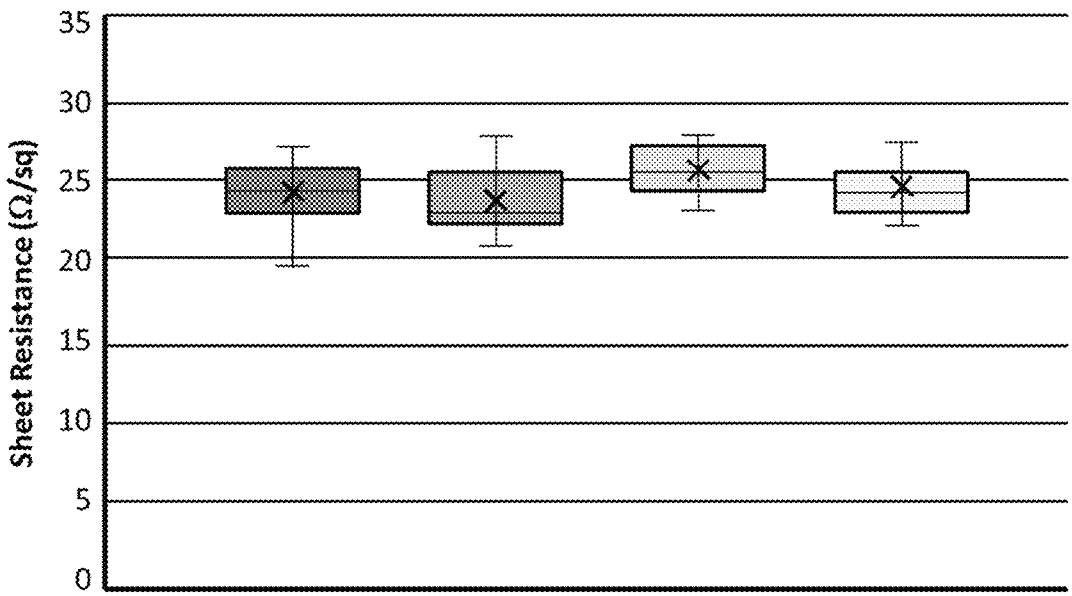
FIG. 24A shows a graph of the sheet resistance of exemplary conducting graphene-coated substrates with a dry coating thickness of 41 micrometers, in accordance with some embodiments of the present disclosure.
Figure 24B:
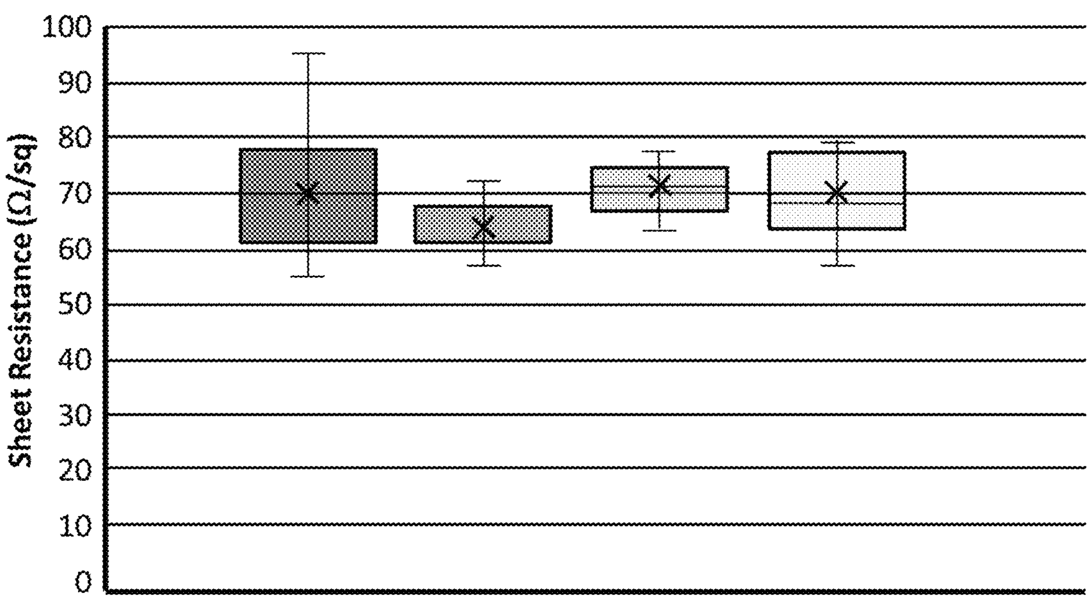
FIG. 24B shows a graph of the sheet resistance of exemplary conducting graphene-coated substrates with a wet coating thickness of 200 micrometers, in accordance with some embodiments of the present disclosure.

FIG. 24A shows a graph of the sheet resistance of exemplary conducting graphene-coated substrates with a dry coating thickness of 41 micrometers, in accordance with some embodiments of the present disclosure. FIG. 24B shows a graph of the sheet resistance of exemplary conducting graphene-coated substrates with a wet coating thickness of 200 micrometers, in accordance with some embodiments of the present disclosure. The sheet resistance measurements in four distinct regions of exemplary conducting graphene-coated substrates, per FIGS. 24A and 24B, are consistent and uniform. As sheet resistance is indicative of sheet thickness, the uniform sheet resistance measurements denote a highly uniform thickness.

Figure 25:
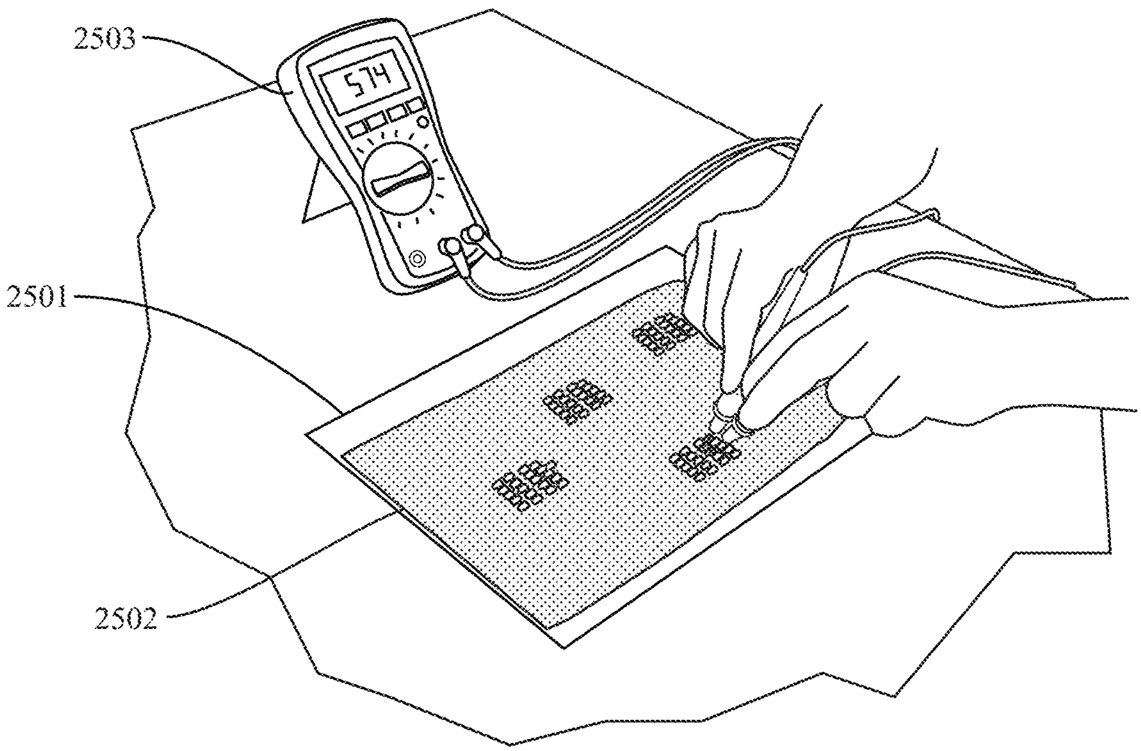
FIG. 25 shows an exemplary apparatus for testing the resistance of a conductive graphene ink coated on a substrate, in accordance with some embodiments of the present disclosure.

FIG. 25 shows an exemplary apparatus for testing the resistance of an exemplary conductive graphene ink-coated substrate, in accordance with some embodiments of the present disclosure. As shown per FIG. 25, the exemplary non-limiting apparatus measures the resistance between the exemplary conductive graphene ink 2502 and the exemplary substrate 2501 by a multimeter 2503.

Figure 26A:
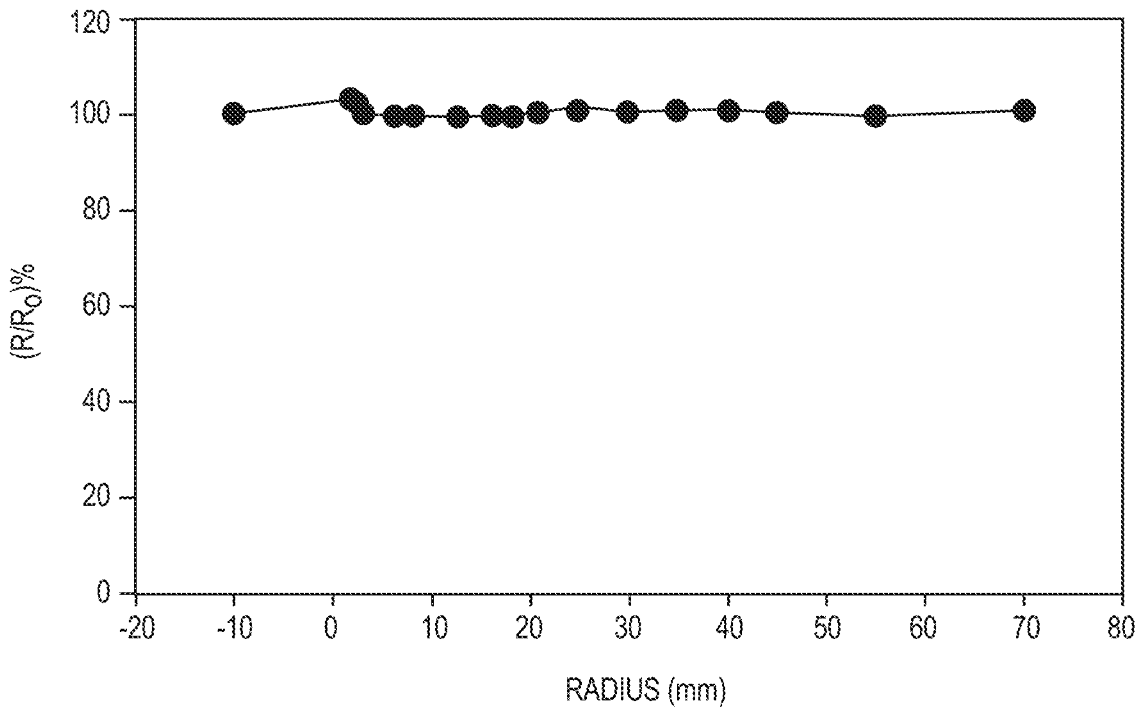
FIG. 26A shows a plot of the bend radius and the resistance change of an exemplary graphene-coated substrate under convex bending, in accordance with some embodiments of the present disclosure.
Figure 26B:
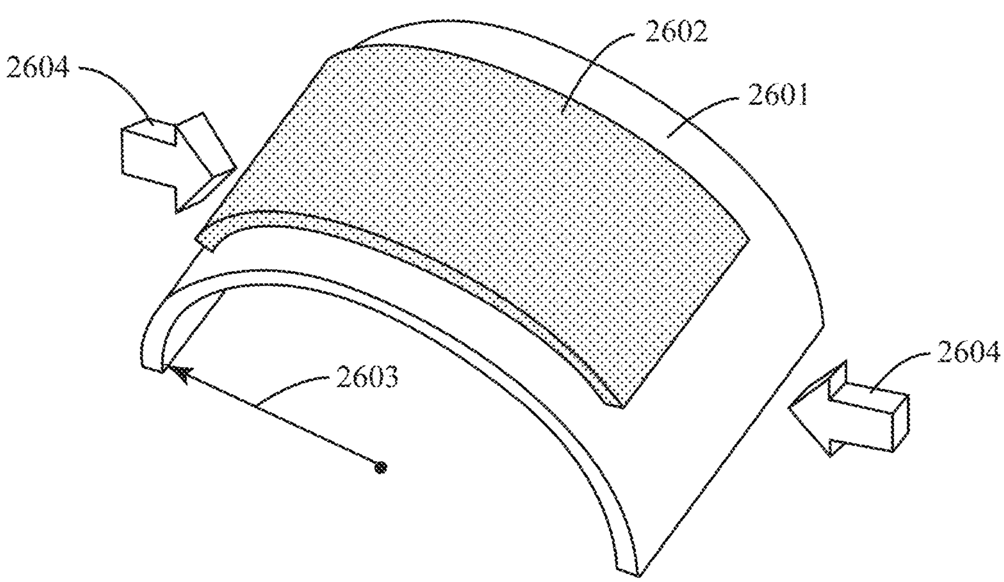
FIG. 26B shows an illustration of the convex bending radius of an exemplary graphene-coated substrate, in accordance with some embodiments of the present disclosure.
Figure 26C:
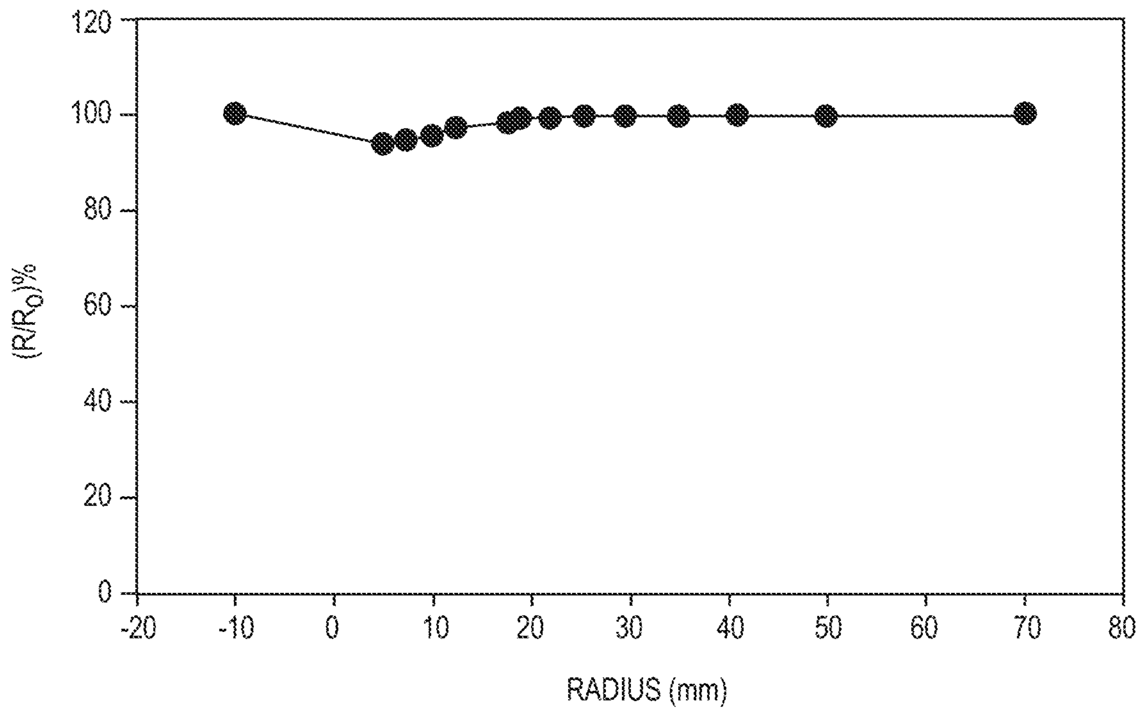
FIG. 26C shows a plot of the bend radius and the resistance change of an exemplary graphene-coated substrate under concave bending, in accordance with some embodiments of the present disclosure.
Figure 26D:
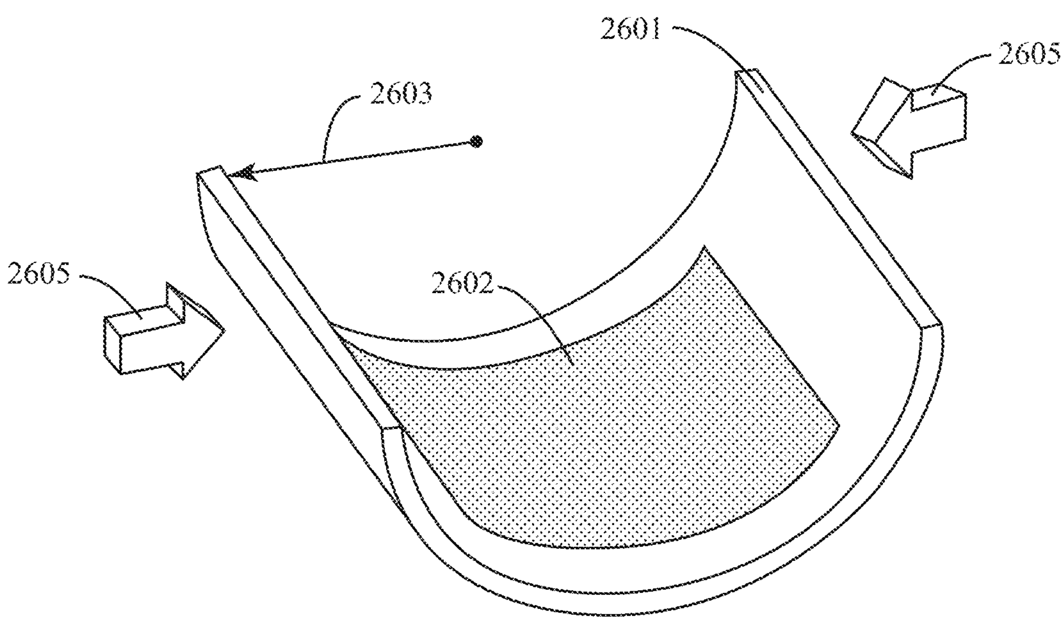
FIG. 26D shows an illustration of the concave bending radius of an exemplary graphene-coated substrate, in accordance with some embodiments of the present disclosure.

FIG. 26A shows a plot of the bend radius and the resistance change of an exemplary graphene coated substrate under convex bending, in accordance with some embodiments of the present disclosure. FIG. 26B shows an illustration of the convex bending radius of an exemplary graphene coated substrate, in accordance with some embodiments of the present disclosure. FIG. 26C shows a plot of the bend radius and the resistance change of an exemplary graphene coated substrate under concave bending, in accordance with some embodiments of the present disclosure. FIG. 26D shows an illustration of the concave bending radius of an exemplary graphene coated substrate, in accordance with some embodiments of the present disclosure. While the sheet resistance of the exemplary non-limiting graphene ink 2602-coated substrate 2601 slightly increases at extreme bending radii 2603 of about 1.75 mm, FIGS. 26A and 26C show that the resistance returns to baseline once the radius 2603 is increased, or once the graphene ink 2602-coated substrate 2601 is flattened. This resistance reversibility is indicative that the graphene ink 2602-coated substrate 2601 herein is highly flexible and durable and maintains its performance characteristics under a convex bending force 2604 or a concave bending force 2605.

Figure 27A:
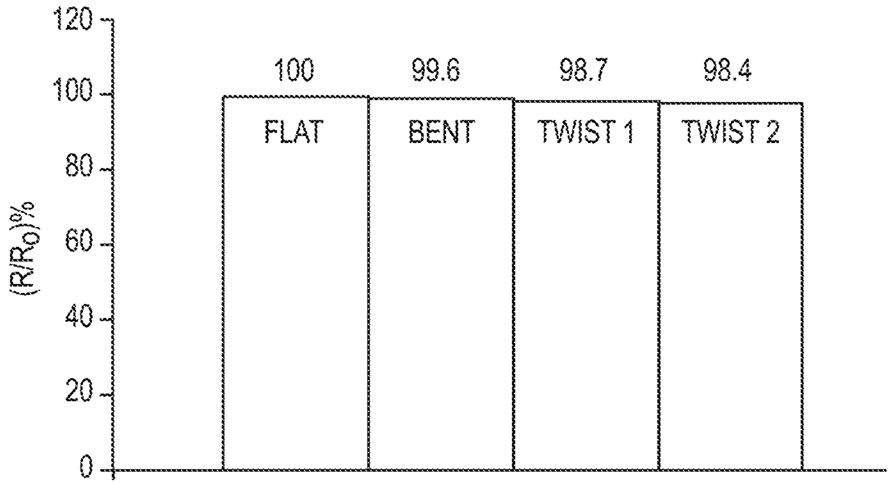
FIG. 27A shows a graph of the resistance change of exemplary flat, bent, and twisted graphene-coated substrates, in accordance with some embodiments of the present disclosure.
Figure 27B:
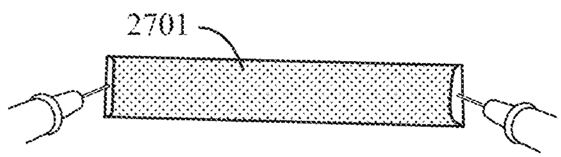
FIG. 27B shows an image of an exemplary flat graphene-coated substrate, in accordance with some embodiments of the present disclosure.
Figure 27C:
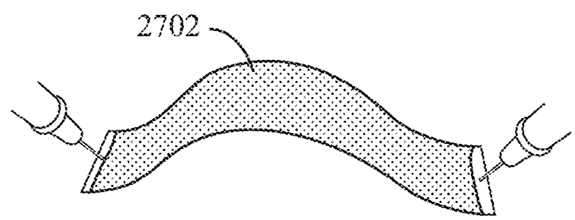
FIG. 27C shows an image of an exemplary bent graphene-coated substrate, in accordance with some embodiments of the present disclosure.
Figure 27D:
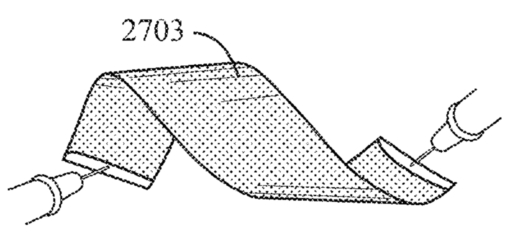
FIG. 27D shows an exemplary image of a first exemplary twisted graphene-coated substrate, in accordance with some embodiments of the present disclosure.
Figure 27E:
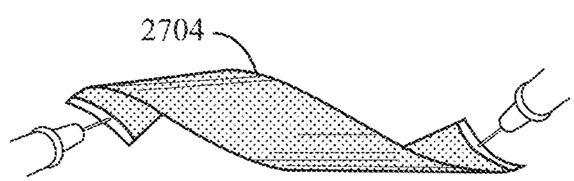
FIG. 27E shows an image of a second exemplary twisted graphene-coated substrate, in accordance with some embodiments of the present disclosure.

FIG. 27A shows a graph of the resistance change of exemplary flat, bent, and twisted graphene-coated substrates, in accordance with some embodiments of the present disclosure. FIG. 27B shows an image of an exemplary flat graphene-coated substrate, in accordance with some embodiments of the present disclosure. FIG. 27C shows an image of an exemplary bent graphene-coated substrate, in accordance with some embodiments of the present disclosure. FIG. 27D shows an exemplary image of a first exemplary twisted graphene-coated substrate, in accordance with some embodiments of the present disclosure. FIG. 27E shows an image of a second exemplary twisted graphene-coated substrate, in accordance with some embodiments of the present disclosure. As seen in FIG. 27A, a bent device 2702, a first exemplary twisted device 2703, and a second exemplary twisted device 2704 of FIGS. 27C-27E exhibit 99.6%, 98.7%, and 98.4% of the resistance of an exemplary flat device 2701 of FIG. 27B, respectively. The minor resistance decrease caused by bending and twisting indicates that the graphene-coated substrates herein are highly flexible and durable and maintain their performance characteristics under strain.

Figure 28:
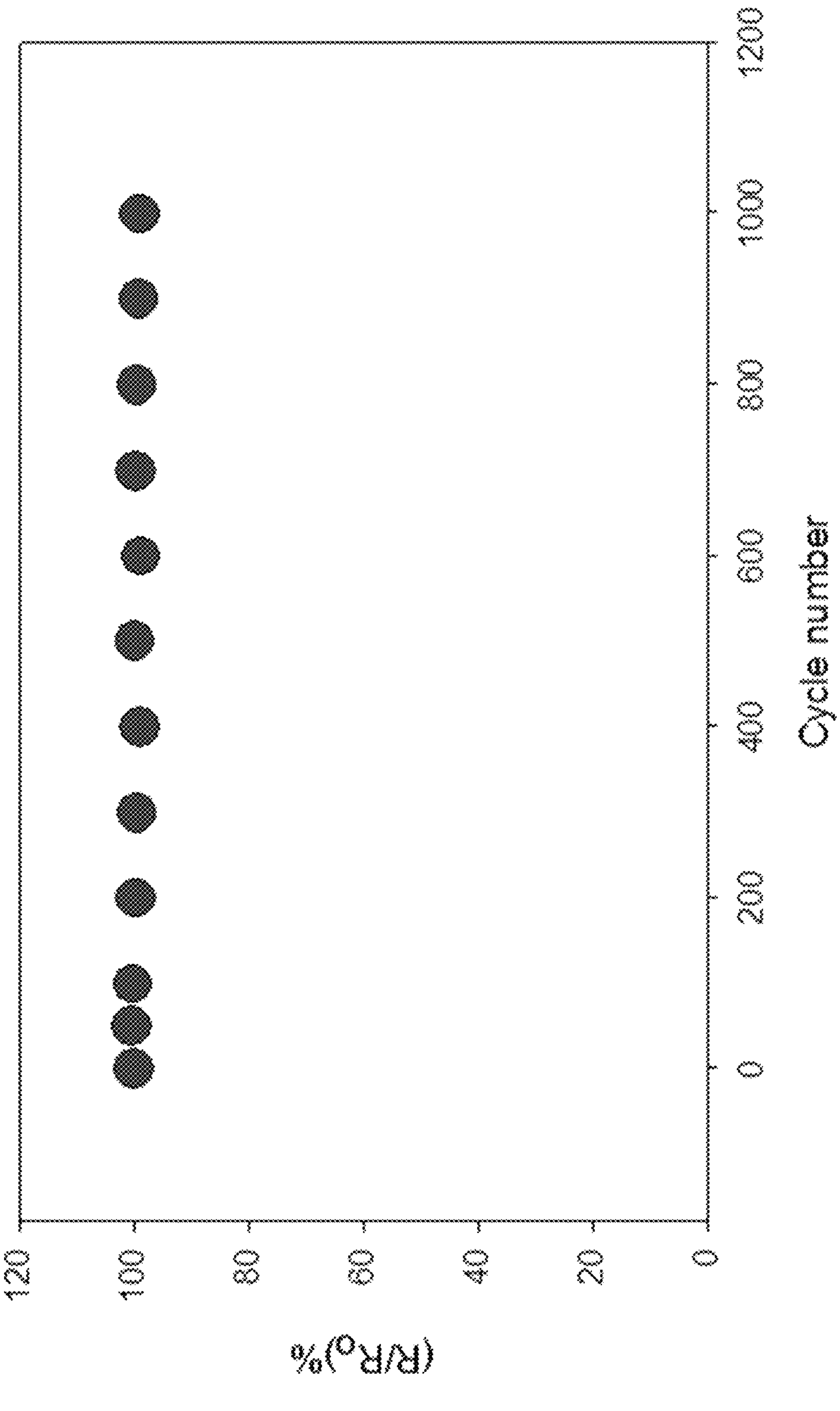
FIG. 28 shows a plot of the bend cycles at a radius of about 10 mm and the resistance change of an exemplary graphene-coated substrate, in accordance with some embodiments of the present disclosure.

FIG. 28 shows a plot of the bend cycles at a radius of about 10 mm and the resistance change of an exemplary graphene-coated substrate, in accordance with some embodiments of the present disclosure. As seen in FIG. 28, cyclical bending for up to about 1,000 cycles shows no discernable resistance decrease, proving that the exemplary conductive graphene ink can be coated onto a variety of rigid or flexible substrates to form high-conductivity rigid or flexible devices.

Disclosed herein, per FIGS. 29A to 41F, are conductive silver-based inks, along with methods and apparatus for synthesis thereof. In some embodiments, the conductive silver-based ink comprises a primary solvent and silver nanowires. In some embodiments, the conductive silver-based ink comprises a primary solvent and silver nanoparticles. In some embodiments, the conductive silver-based ink comprises a primary solvent and silver nanoparticles. In some embodiments, the conductive silver-based ink comprises a primary solvent and silver nanowires.

Silver nanostructures, such as silver nanowires and silver nanoparticles, are optimal conductive elements in the fabrication of electrodes, electronics components, energy storage components, and a wide variety of other applications. Silver demonstrates a high thermal and electrical conductivity, allowing it to form durable electronic components. Additionally, silver exhibits intriguing optical properties that enable its use in transparent electronics, such as for solar cells, touch screens, and flexible displays.

In some embodiments, the conductive silver-based ink comprises a primary solvent, silver nanoparticles, and silver nanowires. In some embodiments, the primary solvent comprises water, ethanol, isopropyl alcohol, N-methyl-2-pyrrolidone, cyclohexanone, terpineol, 3-methoxy-3-methyl-1-butanol, 4-hydroxyl-4-methyl-pentan-2-one, methyl isobutyl ketone, or any combination thereof.

Figure 29C:
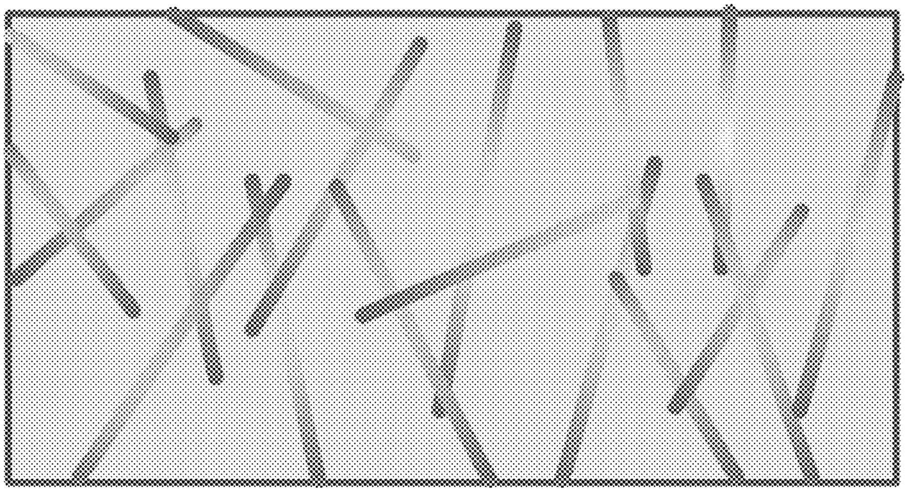
FIG. 29C is an illustration of a conductive graphene ink comprising silver nanoparticles with a percolation threshold of less than 1%, in accordance with some embodiments of the present disclosure.
Figure 29B:
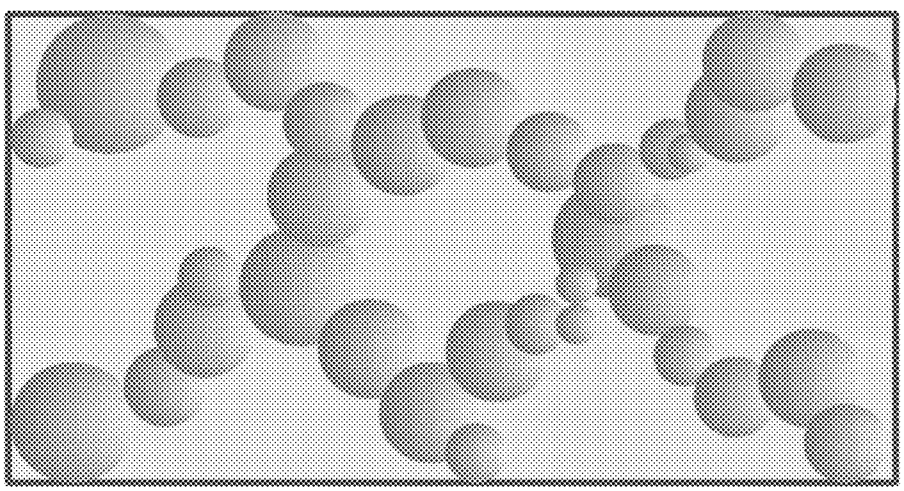
FIG. 29B is an illustration of a conductive graphene ink comprising silver nanoparticles with a percolation threshold of about 15%, in accordance with some embodiments of the present disclosure.
Figure 29A:
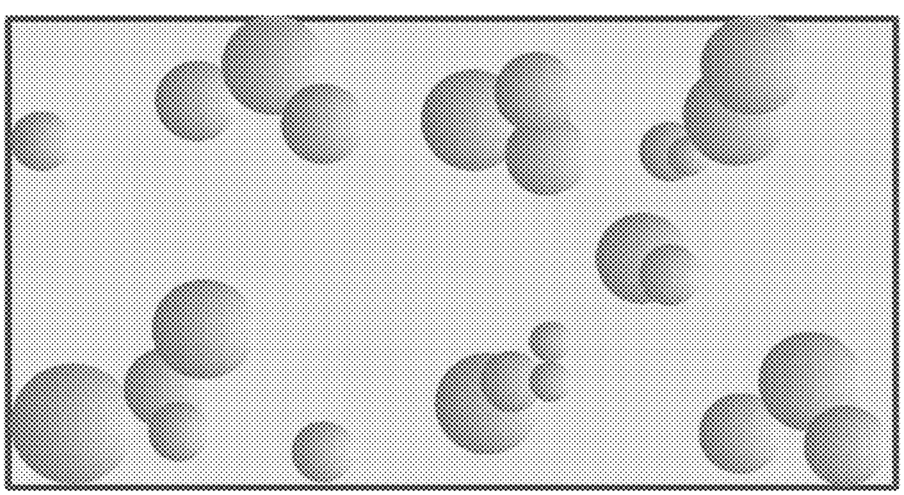
FIG. 29A is an illustration of a conductive graphene ink comprising silver nanoparticles below percolation, in accordance with some embodiments of the present disclosure.

FIG. 29A is an illustration of a conductive ink comprising silver nanoparticles below percolation, in accordance with some embodiments of the present disclosure. FIG. 29B is an illustration of a conductive ink comprising silver nanoparticles with a percolation threshold of about 15%, in accordance with some embodiments of the present disclosure. FIG. 29C is an illustration of a conductive ink comprising silver nanoparticles with a percolation threshold of less than 1%, in accordance with some embodiments of the present disclosure. Percolation threshold is defined as the percentage of the conductive elements that are not interconnected. A low percolation threshold to enable high interconnectivity allows for greater conductivity. Method parameters, such as the component quantities, the order of operation, time periods, and temperatures herein, are configured to ensure a low percolation threshold of the conductive silver-based ink. As shown in FIGS. 29A-29C, in some embodiments, the conductive silver-based ink comprising silver nanoparticles requires a higher percolation threshold than a conductive ink comprising silver nanowires.

Provided herein are methods for forming silver nanowires and silver nanoparticles wherein the methods are generally characterized as follows:

Method A: Rapid mixing of a precursor solutions into the reactor.

Method B: Injection of the precursors to the reactor at a controlled rate and temperature to control the kinetics of nanowire formation.

Method C: Employing polymers, such as polyethylene glycol 400 medium, and employing a reducing agent to control the viscosity of the reaction medium.

Method D: Solvothermal silver nanowire formation with a sealed Teflon-line stainless steel autoclave.

Method E: Formation of nanowires with an ionic liquid catalyst.

Method F: Controlling kinetics of nucleation and growth of nanowires through temperature control.

One aspect provided herein is a method of forming silver nanowires comprising: heating a secondary solvent; adding a catalyst solution and a polymer solution to the secondary solvent to form a first solution; injecting a silver-based solution into the first solution to form a second solution; centrifuging the second solution; and washing the second solution with a washing solution to extract the silver nanowires. Alternatively, in some embodiments of the present disclosure, the methods herein are configured form at least one of a silver nanoparticle, a silver nanorod, a silver nanoflower, a silver nanofiber, a silver nanoplatelet, a silver nanoribbon, a silver nanocube, or a silver bipyramid. In some embodiments, the silver nanowires are configured to be used in a conductive silver-based ink. Alternatively, in some embodiments, the silver nanowires are configured to be used as a conductive additive in a conductive graphene ink.

Optionally, in some embodiments, the volume of the secondary solvent is greater than the volume of the catalyst solution by a factor of about 20 to about 700. Optionally, in some embodiments, the volume of the secondary solvent is greater than the volume of the catalyst solution by a factor of at least about 20. Optionally, in some embodiments, the volume of the secondary solvent is greater than the volume of the catalyst solution by a factor of at most about 700. Optionally, in some embodiments, the volume of the secondary solvent is greater than the volume of the polymer solution by a factor of about 1.5 to about 6.5. Optionally, in some embodiments, the volume of the secondary solvent is greater than the volume of the polymer solution by a factor of at least about 1.5. Optionally, in some embodiments, the volume of the secondary solvent is greater than the volume of the polymer solution by a factor of at most about 6.5.

Optionally, in some embodiments, the secondary solvent is heated to a temperature of about 75° C. to about 300° C. Optionally, in some embodiments, the secondary solvent is heated for a period of time of about 30 minutes to about 120 minutes. Optionally, in some embodiments, the secondary solvent is stirred while being heated. Optionally, in some embodiments, the stirring is performed by a magnetic stir bar. Optionally, in some embodiments, the stirring is performed at a rate of about 100 rpm to about 400 rpm.

Optionally, in some embodiments, the secondary solvent comprises a glycol. Optionally, in some embodiments, the glycol comprises ethylene glycol, polyethylene glycol 200, polyethylene glycol 400, propylene glycol, or any combination thereof. Optionally, in some embodiments, the polymer solution comprises a polymer comprising polyvinyl pyrrolidone, sodium dodecyl sulfonate, vitamin B2, poly (vinyl alcohol), dextrin, poly(methyl vinyl ether), or any combination thereof.

Optionally, in some embodiments, the catalyst solution comprises a catalyst comprising (a chloride) $CuCl_2$, CuCl, NaCl, $PtCl_2$, AgCl, $FeCl_2$, $FeCl_3$, tetrapropylammonium chloride, tetrapropylammonium bromide, or any combination thereof. Optionally, in some embodiments, the catalyst solution has a concentration of about 2 mM to about 8 mM. Optionally, in some embodiments, the volume of the secondary solvent is greater than the volume of the catalyst solution by a factor of about 75 to about 250.

Optionally, in some embodiments, the polymer has a molecular weight of about 10,000 to about 40,000. Optionally, in some embodiments, the polymer solution has a concentration of about 0.075 M to about 0.25 M. Optionally, in some embodiments, the kinetics of silver nanowire formation is controlled by adjusting the viscosity of the reaction medium. Optionally, in some embodiments, employing a polymer solution, such as polyethylene glycol 200 or polyethylene glycol 400, the viscosity of which is 6 times higher than that of ethylene glycol, slows down the growth rate of silver particles to form different nanostructures.

Optionally, in some embodiments, the silver-based solution comprises a silver-based material comprising $AgNO_3$. Optionally, in some embodiments, the silver-based solution has a concentration of about 0.05 M to about 0.2 M. Optionally, in some embodiments, the volume of the secondary solvent is greater than the volume of the silver-based solution by a factor of about 1.5 to about 6.5. Optionally, in some embodiments, the silver-based solution is injected into the first solution over a period of time of about 1 second to about 900 seconds.

Some embodiments further comprise heating the second solution before the process of centrifuging the second solution. Optionally, in some embodiments, the heating of the second solution occurs over a period of time of about 30 minutes to about 120 minutes. Optionally, in some embodiments, the centrifuging occurs at a speed of about 1,500 rpm to about 6,000 rpm. Optionally, in some embodiments, the centrifuging occurs over a period of time of about 10 minutes to about 40 minutes.

Some embodiments further comprise cooling the second solution before the process of centrifuging the second solution. Optionally, in some embodiments, the second solution is cooled to room temperature. Optionally, in some embodiments, the washing solution comprises ethanol, acetone, water, or any combination thereof.

Optionally, in some embodiments, washing the second solution comprises a plurality of washing cycles comprising about two cycles to about six cycles. Some embodiments further comprise dispersing the silver nanowires in a dispersing solution. Optionally, in some embodiments, the dispersing solution comprises ethanol, acetone, and water, or any combination thereof.

Figure 30:
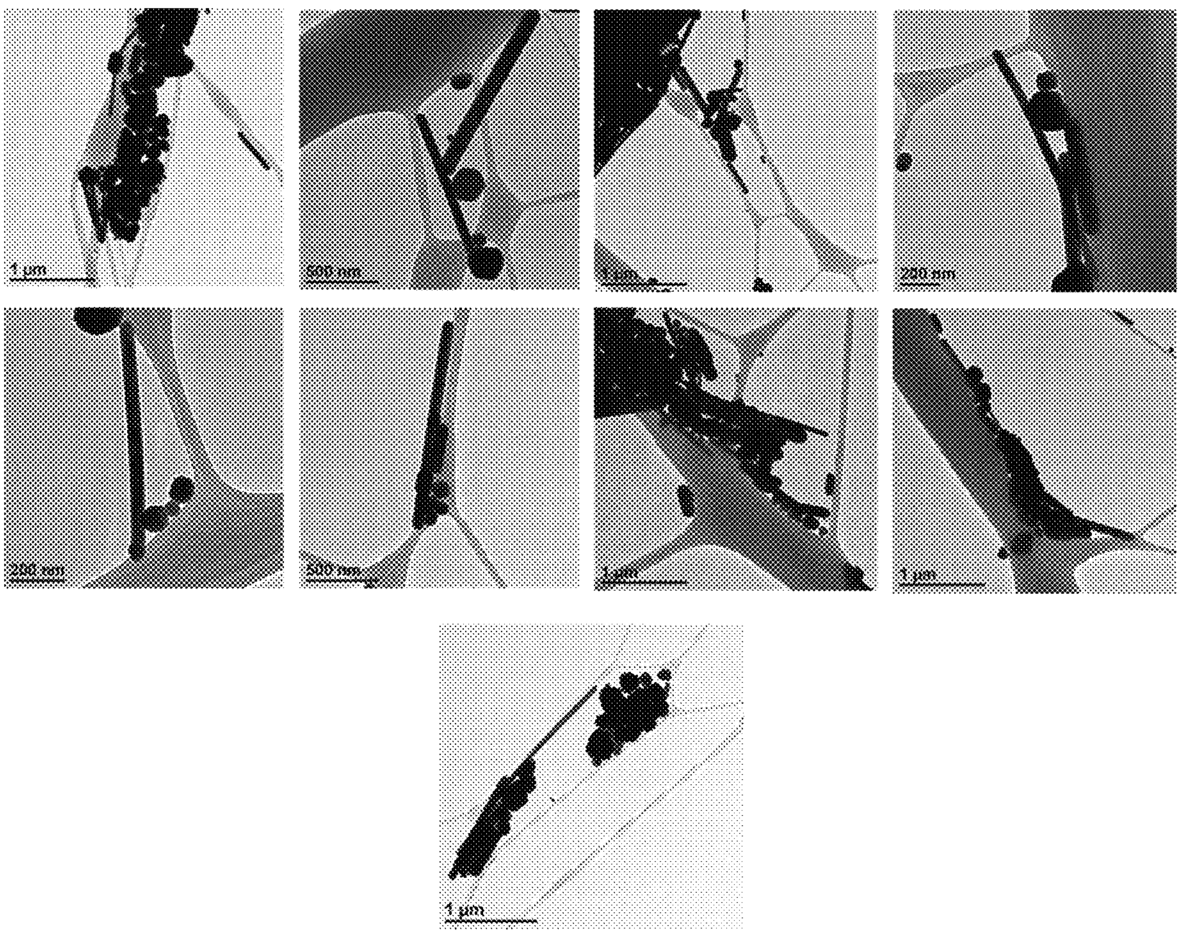
FIG. 30 shows TEM images of exemplary silver nanowires formed by immediately injecting the silver-based solution into the reaction vessel, in accordance with some embodiments of the present disclosure.

FIG. 30 shows TEM images of exemplary silver nanowires formed by immediately injecting the silver-based solution into the reaction vessel, in accordance with some embodiments of the present disclosure. As seen in FIG. 30, the exemplary silver nanowires formed by immediately injecting the silver-based solution into the reaction vessel comprise both short silver nanowires and silver nanoparticles.

Figure 31B:
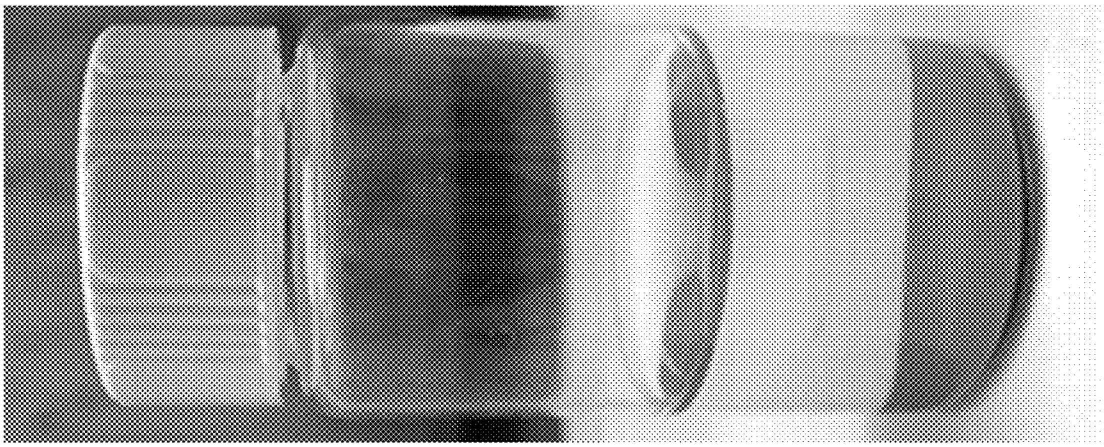
FIG. 31B displays the exemplary solution of FIG. 31A after resting for about one week, in accordance with some embodiments of the present disclosure.
Figure 31A:
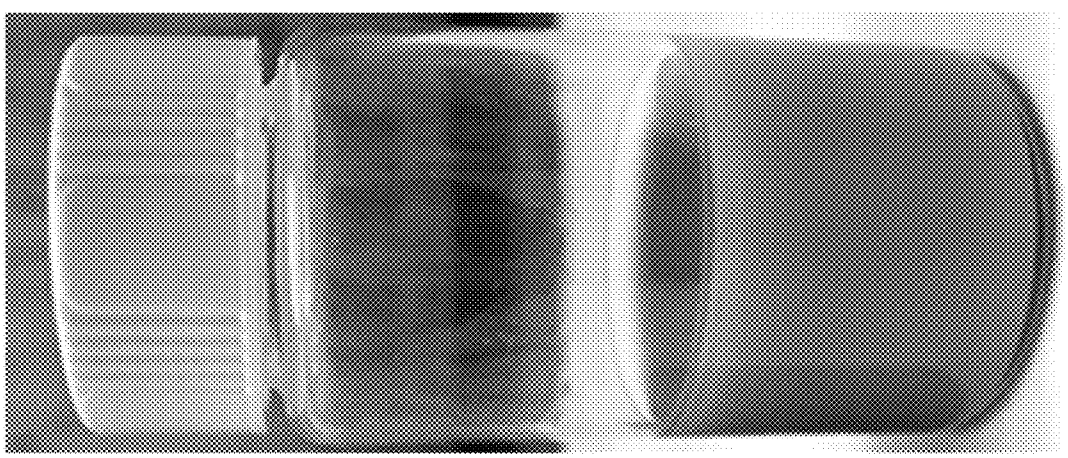
FIG. 31A displays an exemplary solution comprising silver nanowires formed by immediately injecting the silver-based solution into the reaction vessel, in accordance with some embodiments of the present disclosure.

FIGS. 31A and 31B show the stability of a solution of the exemplary silver nanowires formed by immediately injecting the silver-based solution into the reaction vessel. FIG. 31A displays an exemplary solution comprising silver nanowires formed by immediately injecting the silver-based solution into the reaction vessel, in accordance with some embodiments of the present disclosure. FIG. 31B displays the exemplary solution of FIG. 31A after resting for about one week, in accordance with some embodiments of the present disclosure.

Figure 32:
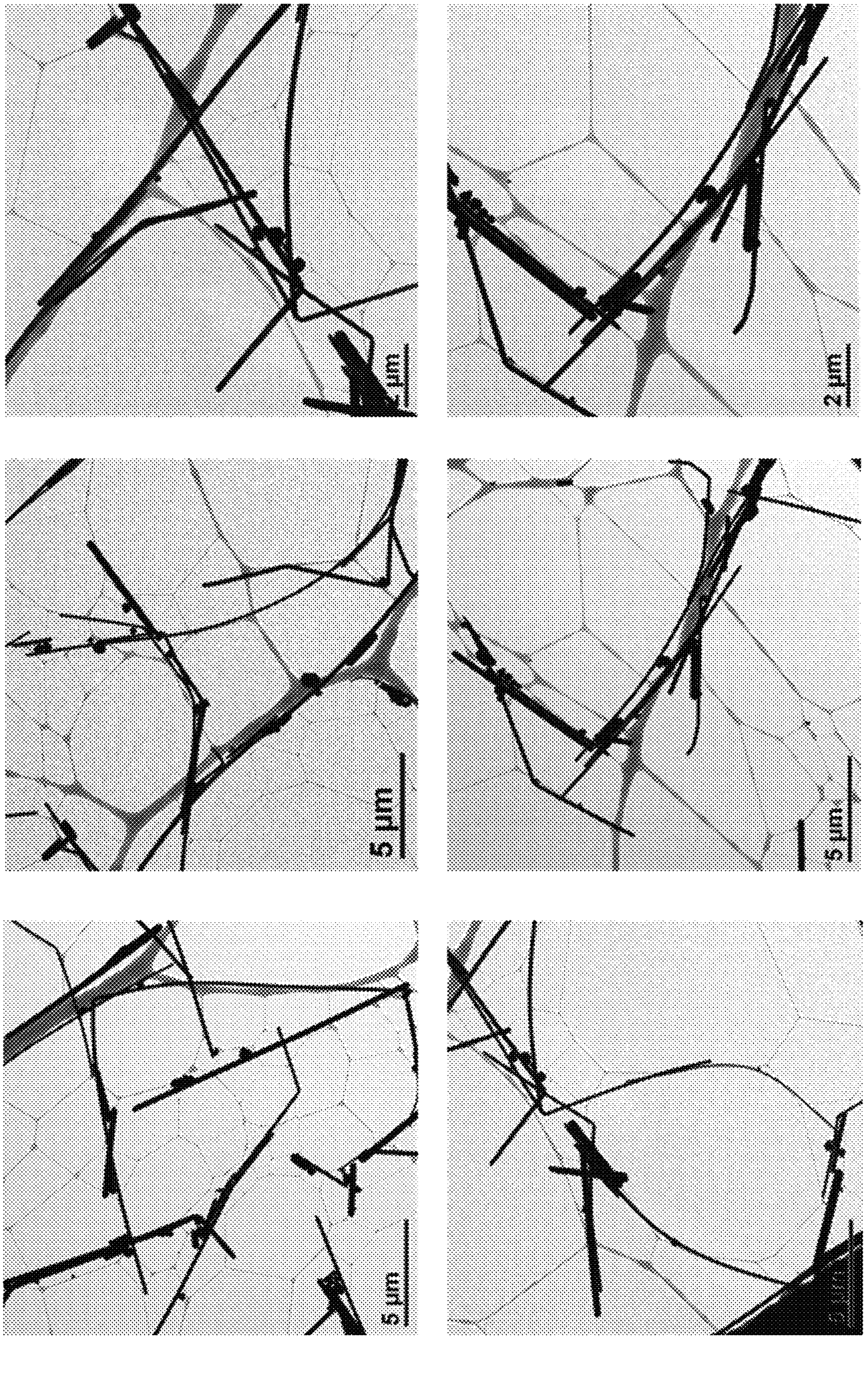
FIG. 32 shows TEM images of exemplary silver nanowires formed by injecting the silver-based solution into the reaction vessel over a period of time of about 15 minutes, in accordance with some embodiments of the present disclosure.

FIG. 32 shows TEM images of exemplary silver nanowires formed by injecting the silver-based solution into the reaction vessel over a period of time of about 15 minutes, in accordance with some embodiments of the present disclosure. As seen in FIG. 32, the exemplary silver nanowires formed by injecting the silver-based solution into the reaction vessel over a period of time of about 15 minutes comprise silver nanowires having a diameter and a length of about 15 μm to about 20 μm and about 165 nm to about 260 nm, respectively. Optionally, in some embodiments, the sheet resistance of the silver nanowires formed by injecting the silver-based solution into the reaction vessel over a period of time of about 15 minutes is about 3 ohms/sq to about 16 ohms/sq.

Figure 33B:
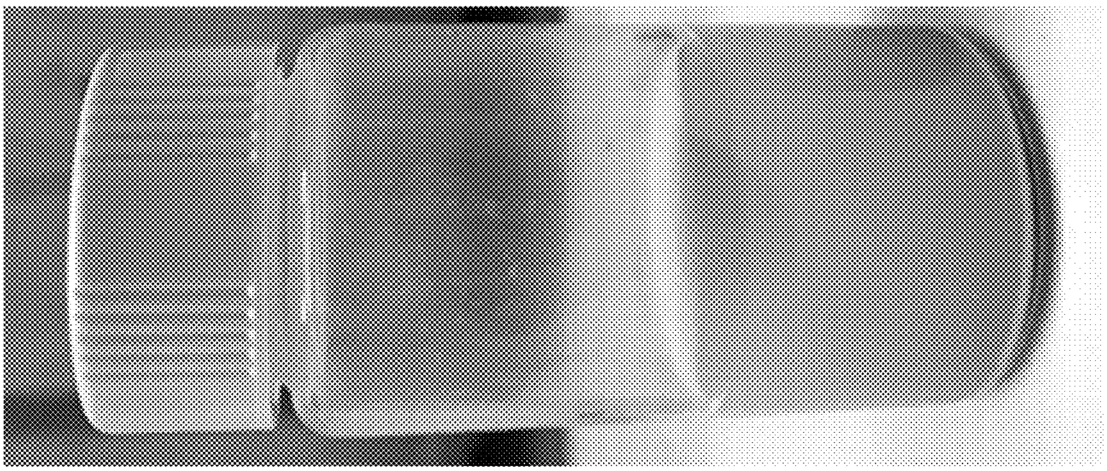
FIG. 33B displays the exemplary solution of FIG. 33A after resting for about one week, in accordance with some embodiments of the present disclosure.
Figure 33A:
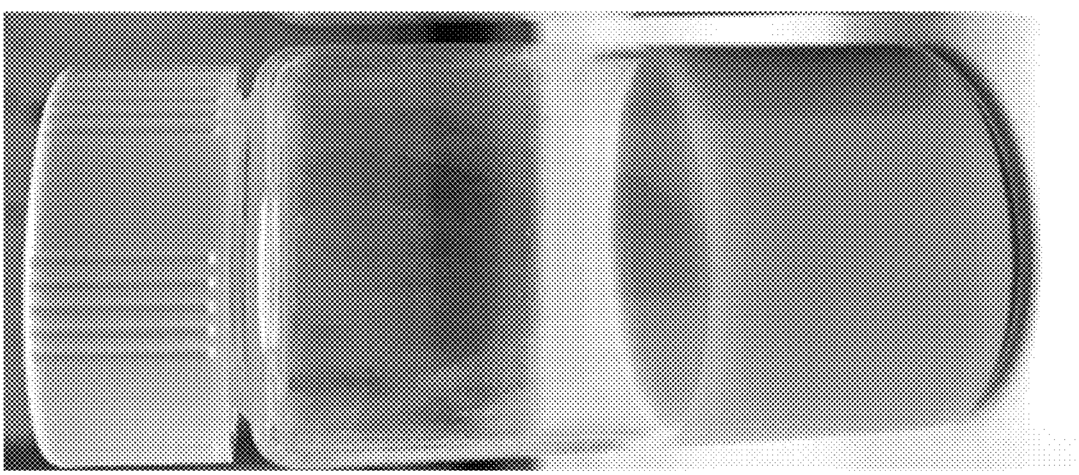
FIG. 33A displays an exemplary solution comprising silver nanowires formed by immediately injecting the silver-based solution into the reaction vessel, in accordance with some embodiments of the present disclosure.

FIGS. 33A-B show the stability of a solution of the exemplary silver nanowires formed by immediately injecting the silver-based solution into the reaction vessel. FIG. 33A displays an exemplary solution comprising silver nanowires formed by immediately injecting the silver-based solution into the reaction vessel, in accordance with some embodiments. FIG. 33B displays the exemplary solution of FIG. 33A after resting for about one week, in accordance with some embodiments.

As seen in FIGS. 31A and 31B and 33A and 33B, the exemplary solution of FIG. 31B is more translucent than the exemplary solution of FIG. 33B, in accordance with some embodiments of the present disclosure. As such, the exemplary silver nanowires formed by injecting the silver-based solution into the reaction vessel over a period of time of about 15 minutes may exhibit more stability than the exemplary silver nanowires formed by immediately injecting the silver-based solution into the reaction vessel. In some cases, increased stability allows the exemplary conductive silver-based ink to be stored for long periods of time, without requiring remixing or reconstitution.

Figure 34:
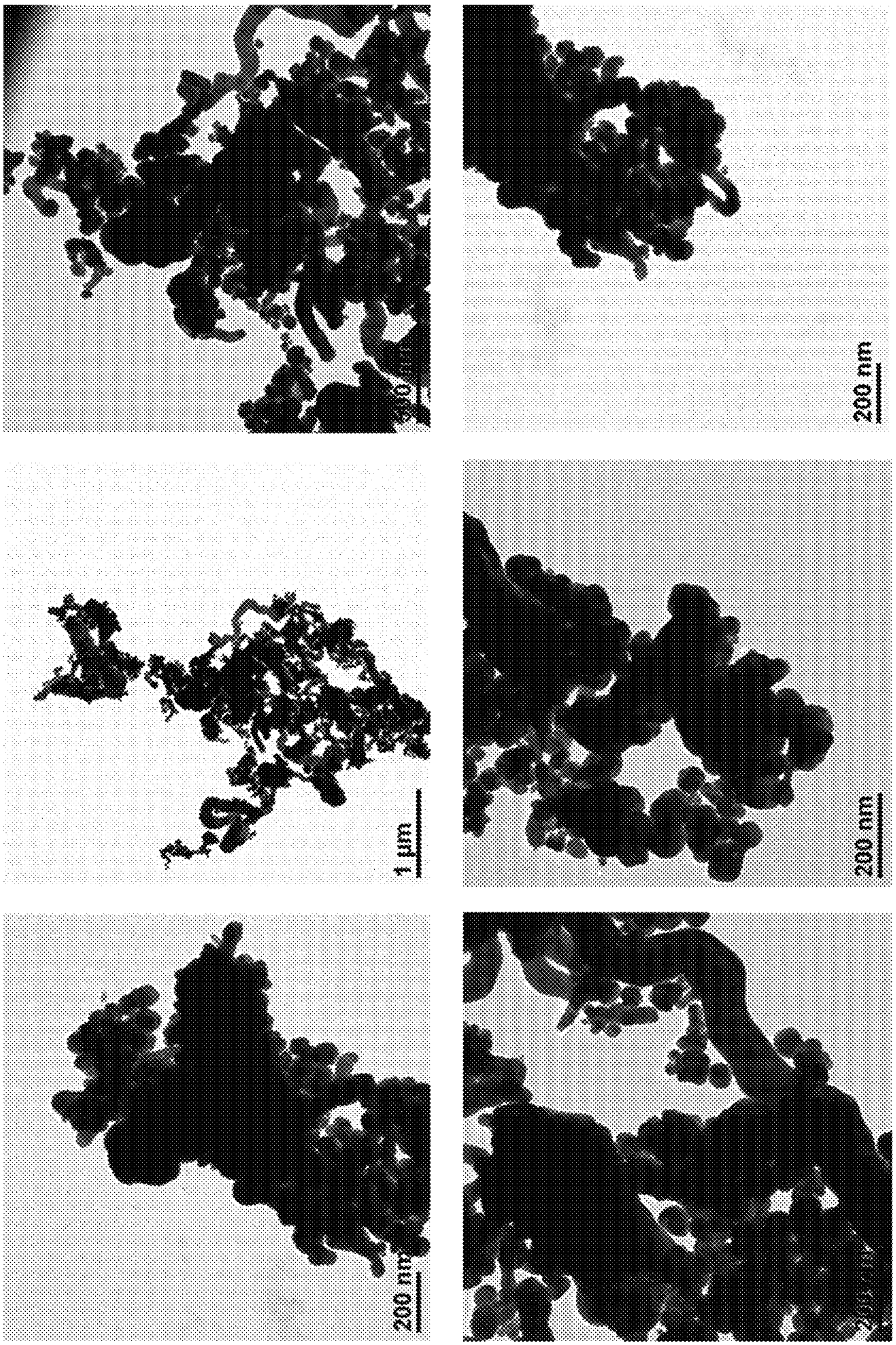
FIG. 34 shows TEM images of exemplary silver nanowires formed with a high viscosity binder, in accordance with some embodiments of the present disclosure.
Figure 35:
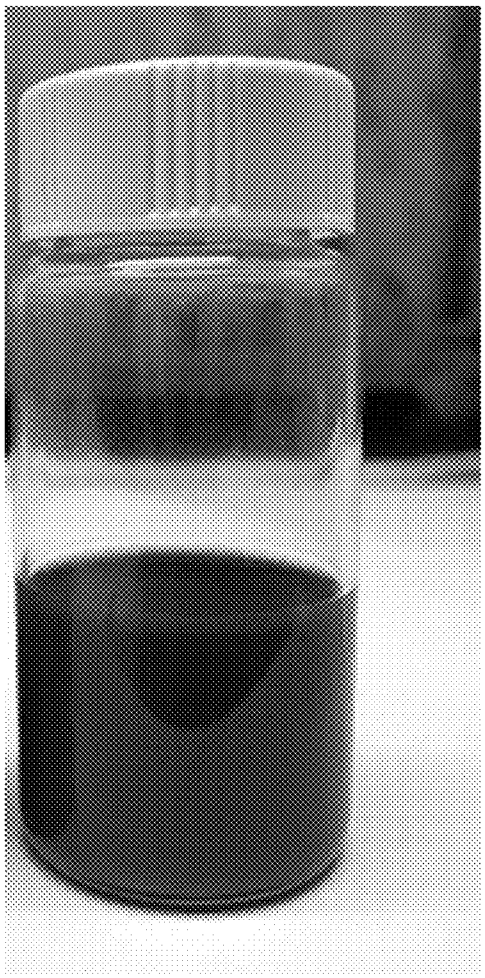
FIG. 35 shows an image of an exemplary conductive silver-based ink comprising silver nanowires formed with a high viscosity binder, in accordance with some embodiments of the present disclosure.

FIG. 34 shows TEM images of exemplary silver nanowires formed with a high viscosity binder, in accordance with some embodiments of the present disclosure. Optionally, in some embodiments, the high viscosity binder slows the growth rate of the silver nanowires. Optionally, in some embodiments, the high viscosity binder comprises polyethylene glycol 400. It can be seen per FIG. 34 that the exemplary silver nanowires formed with a high viscosity binder may comprise mostly nanoparticles. FIG. 35 shows an image of an exemplary conductive silver-based ink comprising silver nanowires formed with a high viscosity binder, in accordance with some embodiments of the present disclosure.

Figure 36:
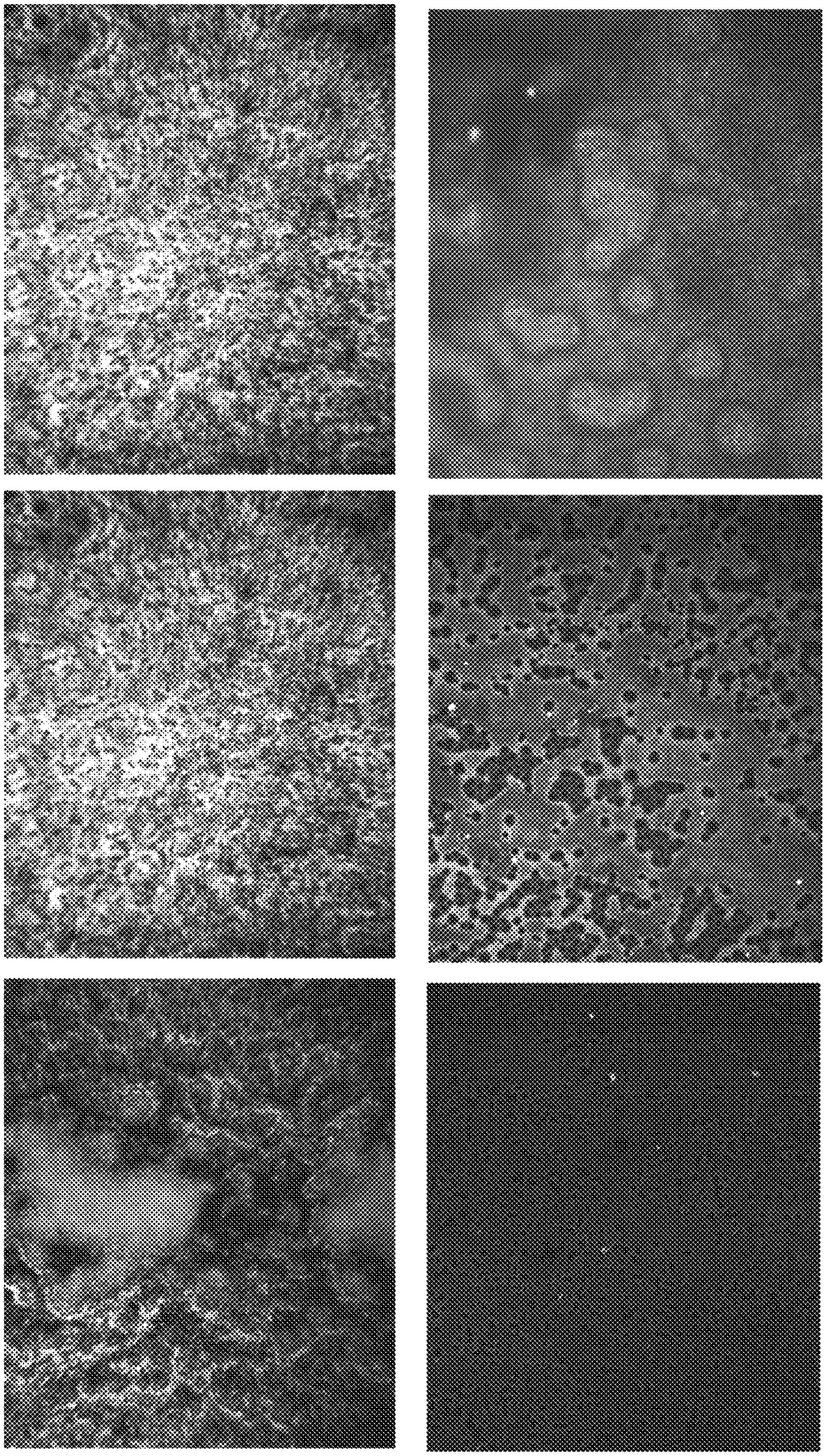
FIG. 36 shows optical microscope images of an exemplary film comprising silver nanowires formed by a solvothermal method, in accordance with some embodiments of the present disclosure.
Figure 37:
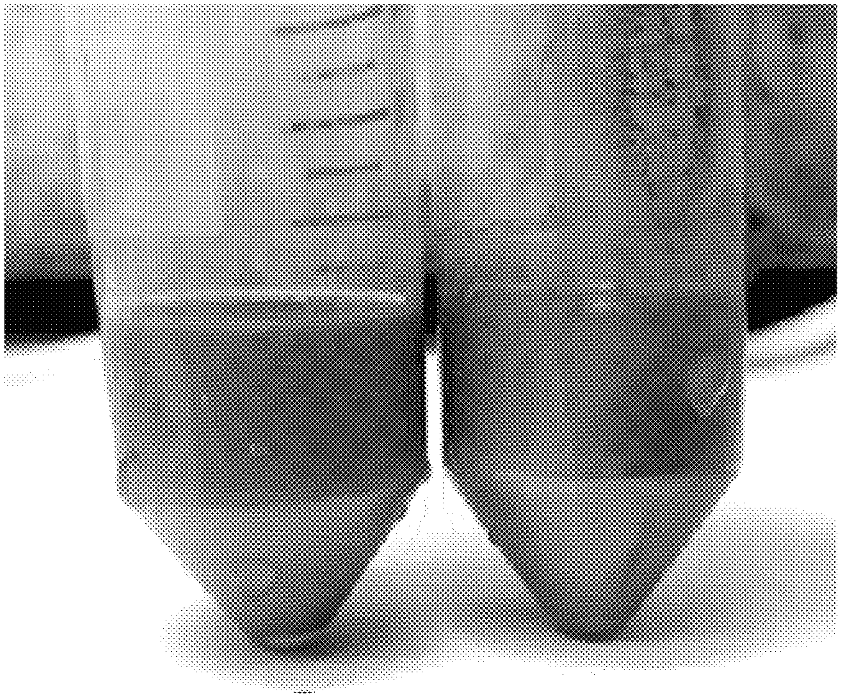
FIG. 37 shows an image of an exemplary conductive silver-based ink comprising silver nanowires formed with a high viscosity binder, in accordance with some embodiments of the present disclosure.
Figure 38:
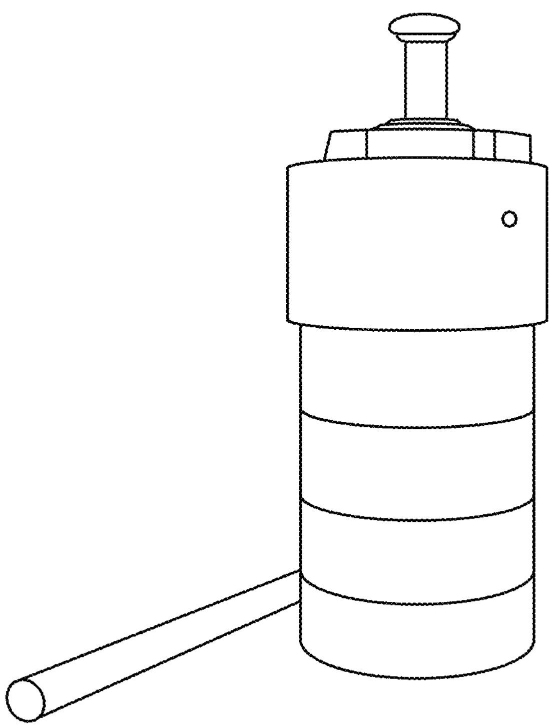
FIG. 38 shows an image of an exemplary apparatus for forming silver nanowires formed by a solvothermal method, in accordance with some embodiments of the present disclosure.

FIG. 36 shows optical microscope images of an exemplary film comprising silver nanowires formed by a solvothermal method, in accordance with some embodiments of the present disclosure. Optionally, in some embodiments, the solvothermal method comprises forming a silver nanowire in a sealed system. Optionally, in some embodiments, the solvothermal method comprises forming silver nanowires at a high pressure. Optionally, in some embodiments, the solvothermal method comprises forming silver nanowires away from open air. It can be seen per FIG. 36, that the exemplary silver nanowires formed by a solvothermal method may comprise agglomerated nanoparticles. FIG. 37 shows an image of an exemplary conductive silver-based ink comprising silver nanowires formed with a high viscosity binder, in accordance with some embodiments of the present disclosure. FIG. 38 shows an image of an exemplary apparatus for forming silver nanowires formed by a solvothermal method, in accordance with some embodiments of the present disclosure. Optionally, in some embodiments, the apparatus for forming silver nanowires formed by a solvothermal method comprises an autoclave. Optionally, in some embodiments, the autoclave comprises a stainless steel autoclave. Optionally, in some embodiments, the autoclave comprises a Teflon lined autoclave. Optionally, in some embodiments, the apparatus herein forms at least one of a silver nanoparticle, a silver nanorod, a silver nanowire, a silver nanoflower, a silver nanofiber, a silver nanoplatelet, a silver nanoribbon, a silver nanocube, a silver bipyramid, or any combination thereof.

Figure 39:
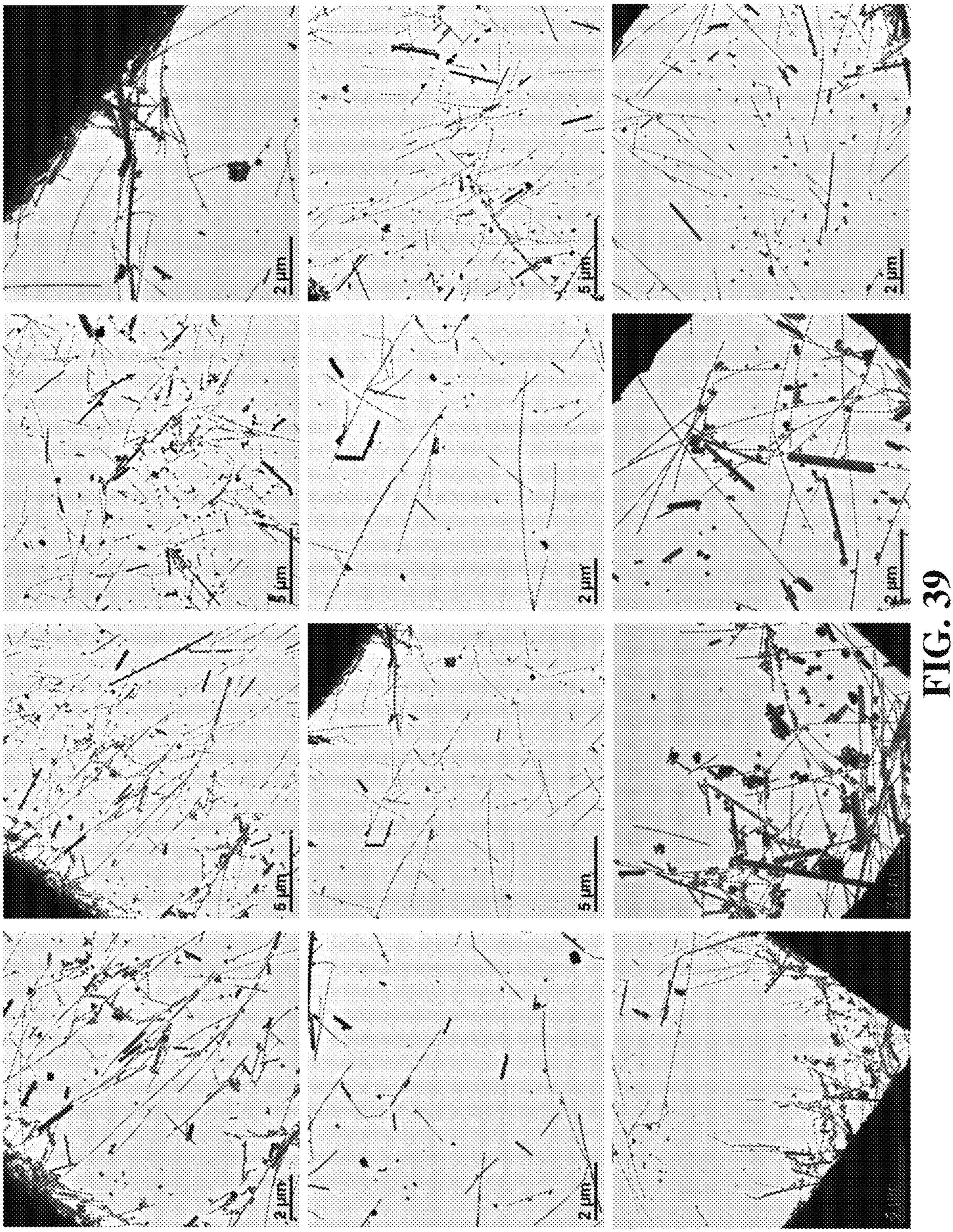
FIG. 39 shows TEM images of exemplary silver nanowires formed with an ionic liquid catalyst, in accordance with some embodiments of the present disclosure.
Figure 40B:
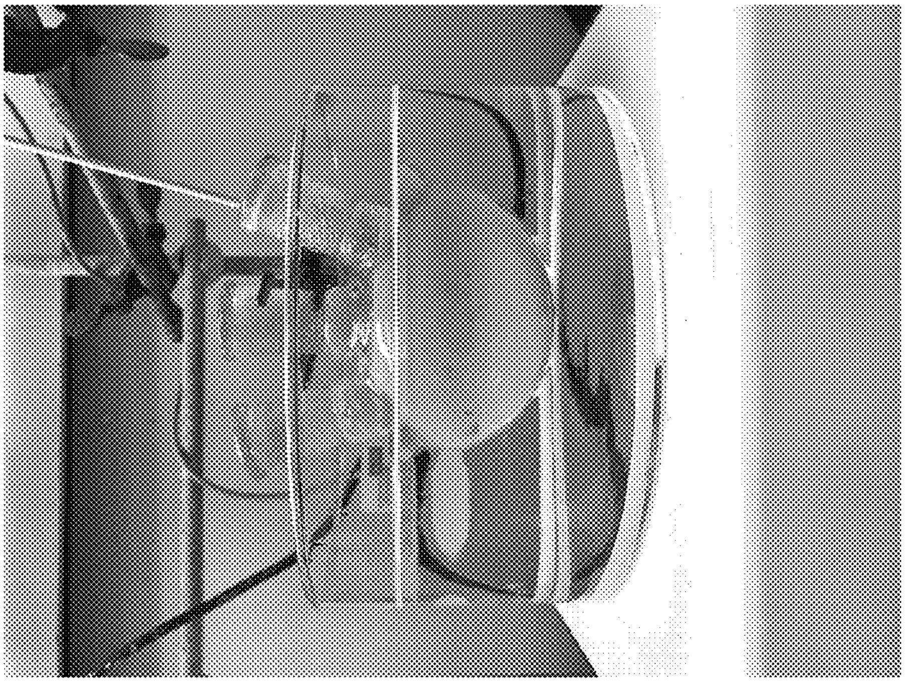
FIG. 40B shows an image of an exemplary conductive silver-based ink during growth of the silver nanowires formed with an ionic liquid catalyst, in accordance with some embodiments of the present disclosure.
Figure 40A:
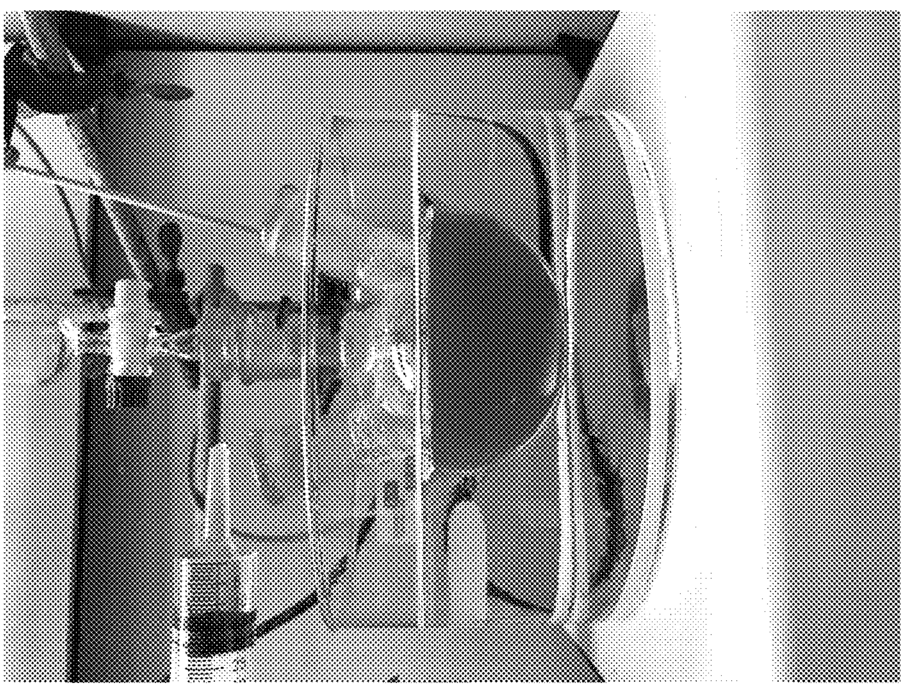
FIG. 40A shows an image of an exemplary conductive silver-based ink during seeding and nucleation of the silver nanowires formed with an ionic liquid catalyst, in accordance with some embodiments of the present disclosure.
Figure 41A:
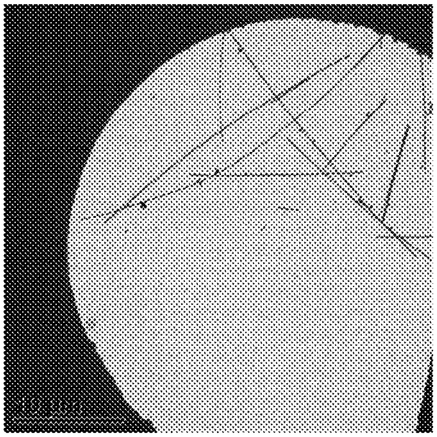
FIG. 41A shows a TEM image of exemplary silver nanowires formed with controlled nucleation and growth, in accordance with some embodiments of the present disclosure.
Figure 41B:
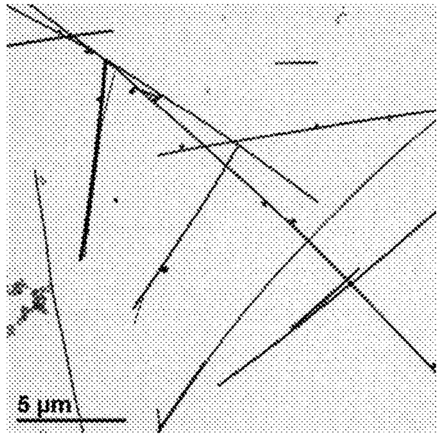
FIG. 41B shows another TEM image of exemplary silver nanowires formed with controlled nucleation and growth, in accordance with some embodiments of the present disclosure.
Figure 41C:
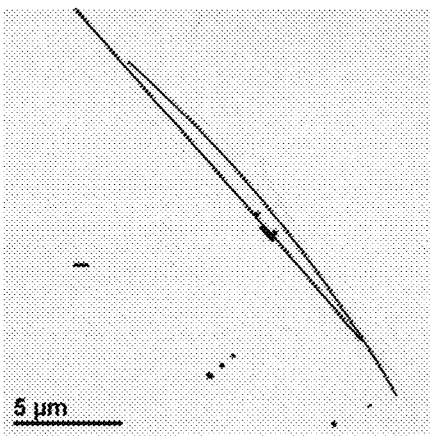
FIG. 41C shows another TEM image of exemplary silver nanowires formed with controlled nucleation and growth, in accordance with some embodiments of the present disclosure.
Figure 41D:
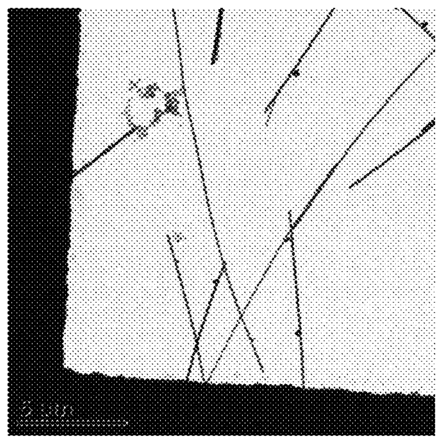
FIG. 41D shows another TEM image of exemplary silver nanowires formed with controlled nucleation and growth, in accordance with some embodiments of the present disclosure.
Figure 41E:
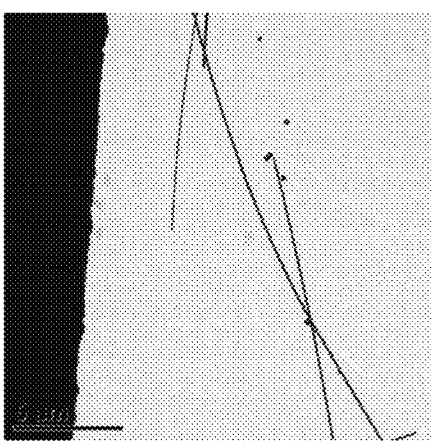
FIG. 41E shows another TEM image of exemplary silver nanowires formed with controlled nucleation and growth, in accordance with some embodiments of the present disclosure.
Figure 41F:
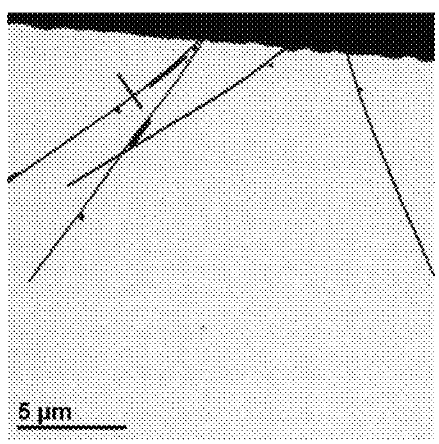
FIG. 41F shows another TEM image of exemplary silver nanowires formed with controlled nucleation and growth, in accordance with some embodiments of the present disclosure.

Optionally, in some embodiments, the method further comprises adding an ionic liquid catalyst. Optionally, in some embodiments, the ionic liquid catalyst comprises tetrapropylammonium chloride, tetrapropylammonium bromide, or any combination thereof. FIG. 39 shows TEM images of exemplary silver nanowires formed with an ionic liquid catalyst, in accordance with some embodiments. It can be seen per FIG. 39 that the exemplary silver nanowires formed by a solvothermal method may comprise nanowires and nanorods. FIGS. 40A and 40B show images of the formation of an exemplary conductive silver-based ink comprising silver nanowires formed with an ionic liquid catalyst, in accordance with some embodiments of the present disclosure.

FIG. 40A shows an image of an exemplary conductive silver-based ink during seeding and nucleation of the silver nanowires formed with an ionic liquid catalyst, in accordance with some embodiments of the present disclosure. FIG. 40B shows an image of an exemplary conductive silver-based ink during growth of the silver nanowires formed with an ionic liquid catalyst, in accordance with some embodiments of the present disclosure. Optionally, in some embodiments, the conductive silver-based ink reaches a temperature of about 120° C. during the seeding and nucleation of the silver nanowires. Optionally, in some embodiments, the conductive silver-based ink, per FIG. 40A, displays a light brown color during the seeding and nucleation of the silver nanowires. Optionally, in some embodiments, the conductive silver-based ink reaches a temperature of about 160° C. during the growth of the silver nanowires. Optionally, in some embodiments, the conductive silver-based ink, per FIG. 40B, displays a milky white color during the growth of the silver nanowires.

Optionally, in some embodiments, the viscosity of the conductive silver-based ink comprising an ionic liquid catalyst has a viscosity of about 4 mPa·s at a temperature of about 22.7° C. Optionally, in some embodiments, the viscosity of the conductive silver-based ink comprising an ionic liquid catalyst has a viscosity of about 2 mPa·s to about 8 mPa·s at a temperature of about 22.7° C. The low viscosity of the conductive inks provided herein allow for accurate, precise, and consistent printing.

FIGS. 41A-41F show TEM images of exemplary silver nanowires formed with controlled nucleation and growth, in accordance with some embodiments of the present disclosure. It can be seen per FIGS. 41A-41F that the exemplary silver nanowires formed with controlled nucleation and growth may comprise long and thin nanowires. Optionally, in some embodiments, controlled nucleation and growth comprises controlling the temperature of the conductive solution to about 120° C. during the nucleation of the silver nanowires. Optionally, in some embodiments, controlled nucleation and growth comprises controlling the temperature of the conductive solution to about 160° C. during the growth of the silver nanowires.

Optionally, in some embodiments, the silver nanowires formed with controlled nucleation and growth comprise a width of about 40 nm to about 125 nm. Optionally, in some embodiments, the silver nanowires formed with controlled nucleation and growth comprise a width of about 75 nm. Optionally, in some embodiments, the silver nanowires formed with controlled nucleation and growth comprise a length of about 7 um to about 100 um. Optionally, in some embodiments, the silver nanowires formed with controlled nucleation and growth comprise a length of about 15 μm to about 50 μm. Optionally, in some embodiments, the silver nanowires formed with controlled nucleation and growth comprise an aspect ratio of about 120:1 to about 1250:1. Optionally, in some embodiments, the silver nanowires formed with controlled nucleation and growth comprise an aspect ratio of about 200:1 to about 700:1. Optionally, in some embodiments, further nucleation control yields longer and thinner silver nanowires.

Figure 42D:
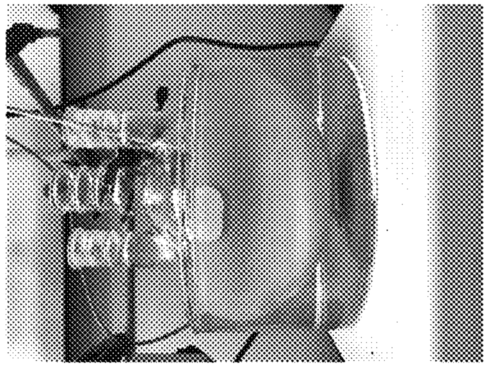
FIG. 42D shows an image of an exemplary conductive additive during silver nanowire growth, in accordance with some embodiments of the present disclosure.
Figure 42C:
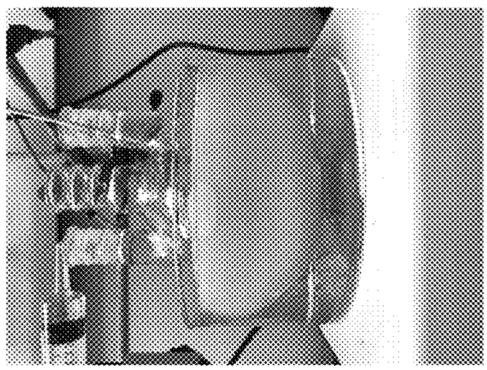
FIG. 42C shows an image of an exemplary conductive additive comprising silver nanowires during nucleation, in accordance with some embodiments of the present disclosure.
Figure 42B:
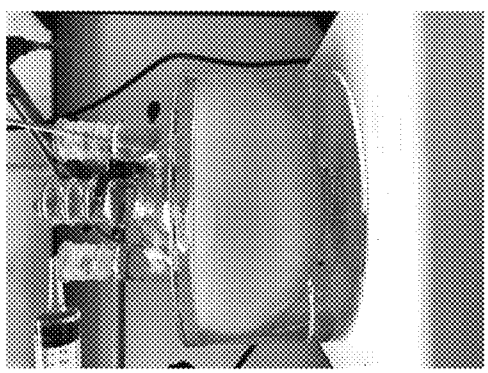
FIG. 42B shows an image of an exemplary conductive additive comprising silver nanowires at nucleation initiation, in accordance with some embodiments of the present disclosure.
Figure 42A:
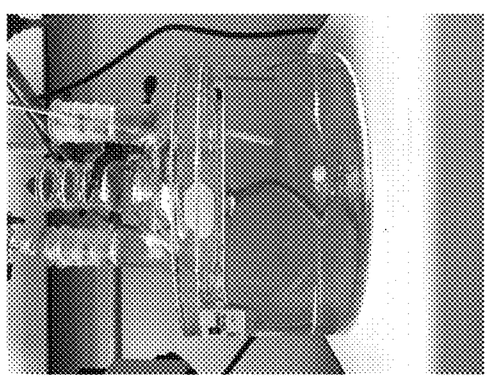
FIG. 42A shows an image of an exemplary conductive additive comprising silver nanowires before nucleation, in accordance with some embodiments of the present disclosure.

FIGS. 42A-42D show images of the controlled nucleation and growth of an exemplary conductive silver-based ink comprising silver nanowires, in accordance with some embodiments of the present disclosure. FIG. 42A shows an image of an exemplary conductive silver-based ink comprising silver nanowires before nucleation, in accordance with some embodiments of the present disclosure. FIG. 42B shows an image of an exemplary conductive silver-based ink comprising silver nanowires at nucleation initiation, in accordance with some embodiments of the present disclosure. FIG. 42C shows an image of an exemplary conductive silver-based ink comprising silver nanowires during nucleation, in accordance with some embodiments of the present disclosure. FIG. 42D shows an image of an exemplary conductive silver-based ink during silver nanowire growth, in accordance with some embodiments of the present disclosure. It can be seen, per FIGS. 42A-42D, that the exemplary conductive silver-based ink is translucent before nucleation and becomes more opaque, white, and chalky as nucleation initiates and growth of the silver nanowires.

Figure 43A:
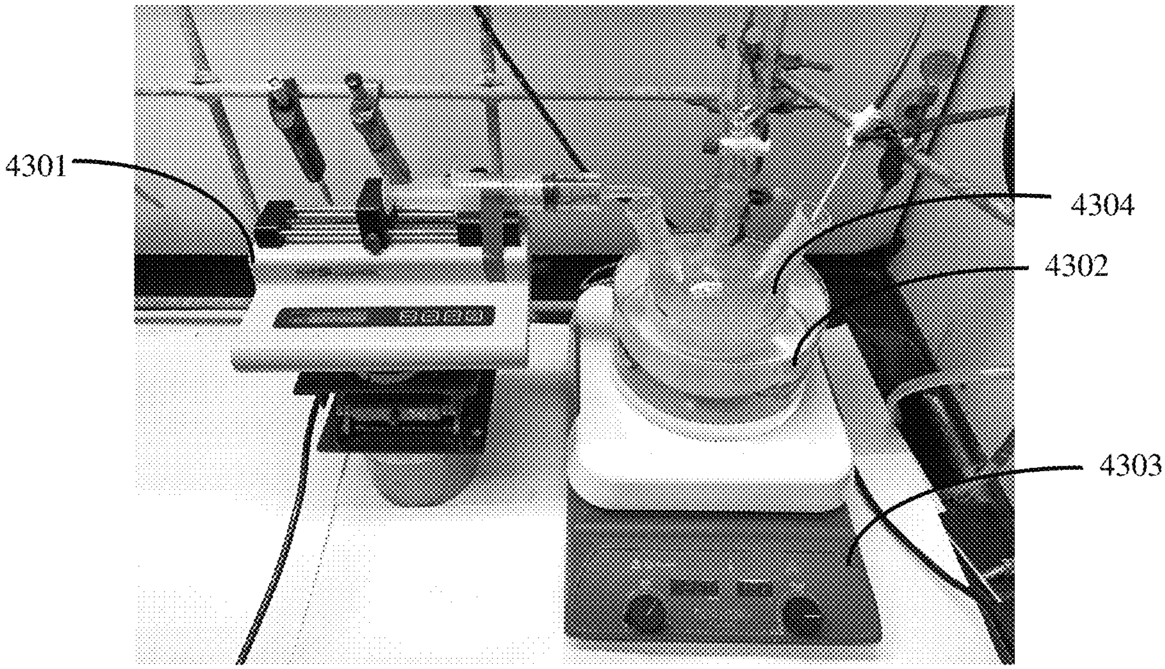
FIG. 43A shows a front image of an exemplary apparatus for forming a conductive additive comprising silver nanowires, in accordance with some embodiments of the present disclosure.
Figure 43B:
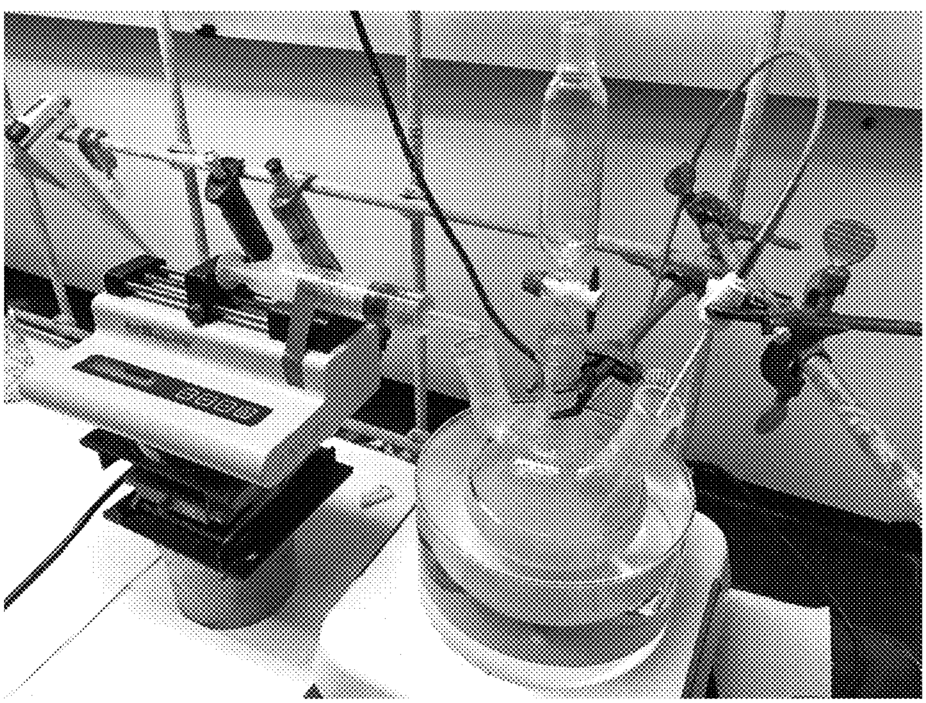
FIG. 43B shows a perspective image of the exemplary apparatus of FIG. 43A, in accordance with some embodiments of the present disclosure.
Figure 43C:
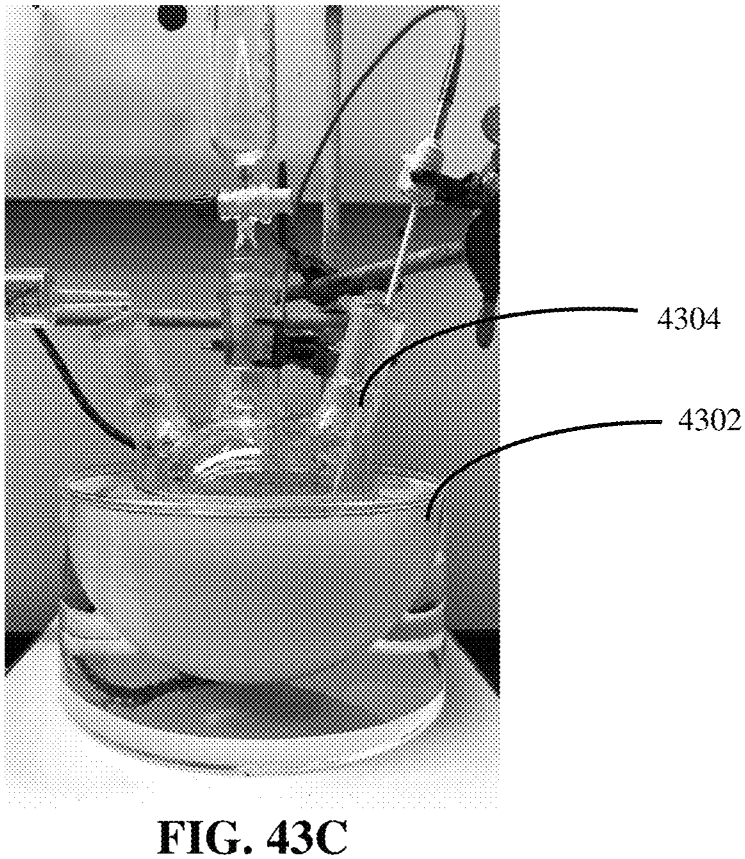
FIG. 43C shows a detailed front image of the exemplary apparatus of FIG. 43A, in accordance with some embodiments of the present disclosure.
Figure 43D:
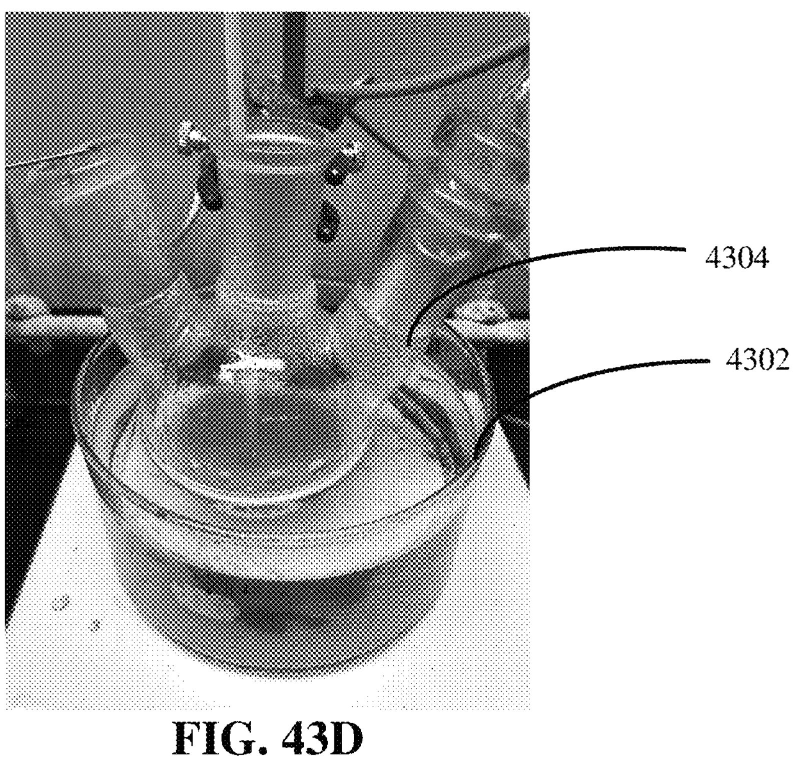
FIG. 43D shows a detailed perspective image of an exemplary bath and reaction chamber of the exemplary apparatus of FIG. 43A, in accordance with some embodiments of the present disclosure.
Figure 43E:
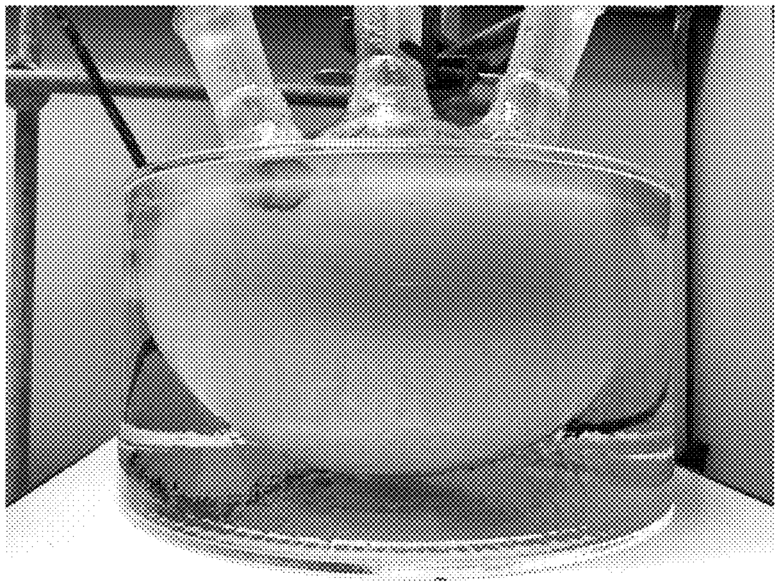
FIG. 43E shows a highly detailed front image of an exemplary bath and reaction chamber of the exemplary apparatus of FIG. 43A, in accordance with some embodiments of the present disclosure.
Figure 43F:
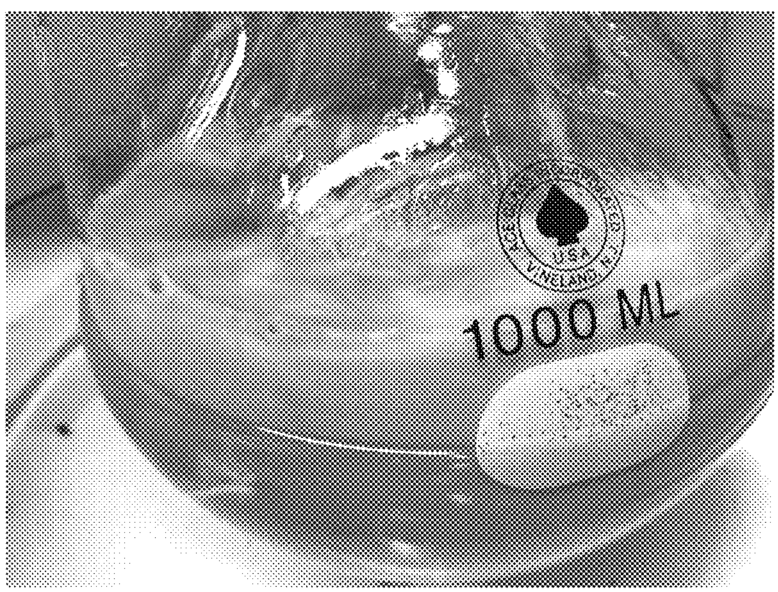
FIG. 43F shows a highly detailed perspective image of an exemplary bath and reaction chamber of the exemplary apparatus of FIG. 43A, in accordance with some embodiments of the present disclosure.

FIGS. 43A-43F show images of an exemplary apparatus for forming a conductive silver-based ink comprising silver nanowires. FIG. 43A shows a front image of an exemplary apparatus for forming a conductive silver-based ink comprising silver nanowires, in accordance with some embodiments of the present disclosure. FIG. 43B shows a perspective image of the exemplary apparatus of FIG. 43A, in accordance with some embodiments of the present disclosure. FIG. 43C shows a detailed front image of the exemplary apparatus of FIG. 43A, in accordance with some embodiments of the present disclosure. FIG. 43D shows a detailed perspective image of an exemplary bath and reaction chamber of the exemplary apparatus of FIG. 43A, in accordance with some embodiments of the present disclosure. FIG. 43E shows a highly detailed front image of an exemplary bath and reaction chamber of the exemplary apparatus of FIG. 43A, in accordance with some embodiments of the present disclosure. FIG. 43F shows a highly detailed perspective image of an exemplary bath and reaction chamber of the exemplary apparatus of FIG. 43A, in accordance with some embodiments of the present disclosure. As seen in FIG. 43A, the exemplary apparatus for forming a conductive silver-based ink comprising silver nanowires comprises a syringe pump 4301, a bath 4302, a hot plate 4303, and a reaction vessel 4304.

Optionally, in some embodiments, the syringe pump 4301 is configured to deposit the silver-based solution into the reaction vessel 4304. Optionally, in some embodiments, the syringe pump 4301 is configured to deposit a set volume of the silver-based solution into the reaction vessel 4304 at a set rate. Optionally, in some embodiments, the bath 4302 comprises an oil bath. Optionally, in some embodiments, the hot plate 4303 is configured to heat the bath 4302, which heats the reaction vessel 4304. Optionally, in some embodiments, the hot plate 4303 is configured to mix the contents of the reaction vessel 4304 with a stirring rod. Optionally, in some embodiments, the hot plate 4303 is configured to mix the contents of the reaction vessel 4304 with a stirring rod at a rotational velocity of about 10 rpm to about 4,500 rpm. Optionally, in some embodiments, the apparatus further comprises the stirring rod. Optionally, in some embodiments, the reaction vessel 4304 comprises a glass reaction vessel.

Figure 44:
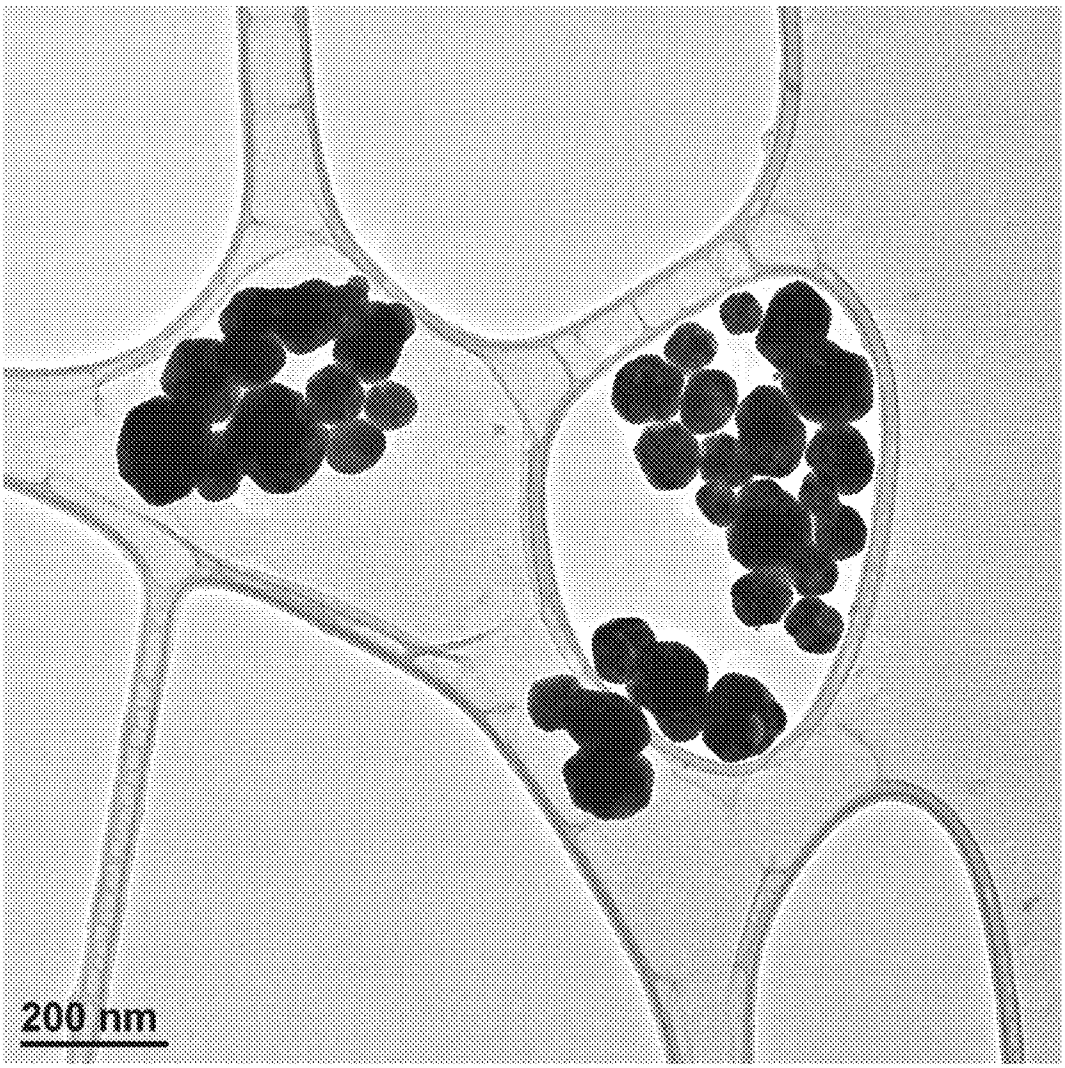
FIG. 44 shows a TEM image of exemplary silver nanoparticles formed by a first method of silver nanoparticle formation, in accordance with some embodiments of the present disclosure.

Provided herein per FIGS. 44-48 are silver nanoparticles and methods of forming the silver nanoparticles. FIG. 44 shows a TEM image of exemplary silver nanoparticles formed by a first method of silver nanoparticle formation, in accordance with some embodiments of the present disclosure. In some embodiments, the second method of forming silver nanoparticles comprises: forming a first solution comprising a silver based solution, a secondary solvent, and a polymer solution; stirring the first solution; heating the first solution; cooling the first solution; centrifuging the first solution; and washing the first solution. Optionally, in some embodiments, the first solution is cooled to ambient temperature. Optionally, in some embodiments, the polymer solution prevents agglomeration of the silver nanoparticles. In some embodiments, the silver nanoparticles are configured to be used in a conductive silver-based ink. Alternatively, in some embodiments, the silver nanoparticles are configured to be used as a conductive additive in a conductive graphene ink. Optionally, in some embodiments, the small size of the silver nanoparticle enables the conductive silver-based ink to be used by an inkjet printer or in an inkjet printing process.

Optionally, in some embodiments, the silver-based solution comprises a silver-based material comprising $AgNO_3$. Optionally, in some embodiments, the polymer solution comprises a synthetic polymer. Optionally, in some embodiments, the synthetic polymer comprises carboxymethyl cellulose, polyvinylidene fluoride, poly(vinyl alcohol), poly (vinyl pyrrolidone), poly(ethylene oxide), ethyl cellulose, or any combination thereof. Optionally, in some embodiments, the binder is a dispersant. Optionally, in some embodiments, the binder comprises carboxymethyl cellulose, polyvinylidene fluoride, poly(vinyl alcohol), poly(vinyl pyrrolidone), poly(ethylene oxide), ethyl cellulose, or any combination thereof. Optionally, in some embodiments, the secondary solvent comprises a glycol. Optionally, in some embodiments the glycol comprises ethylene glycol, polyethylene glycol 200, polyethylene glycol 400, propylene glycol, or any combination thereof.

Figure 45A:
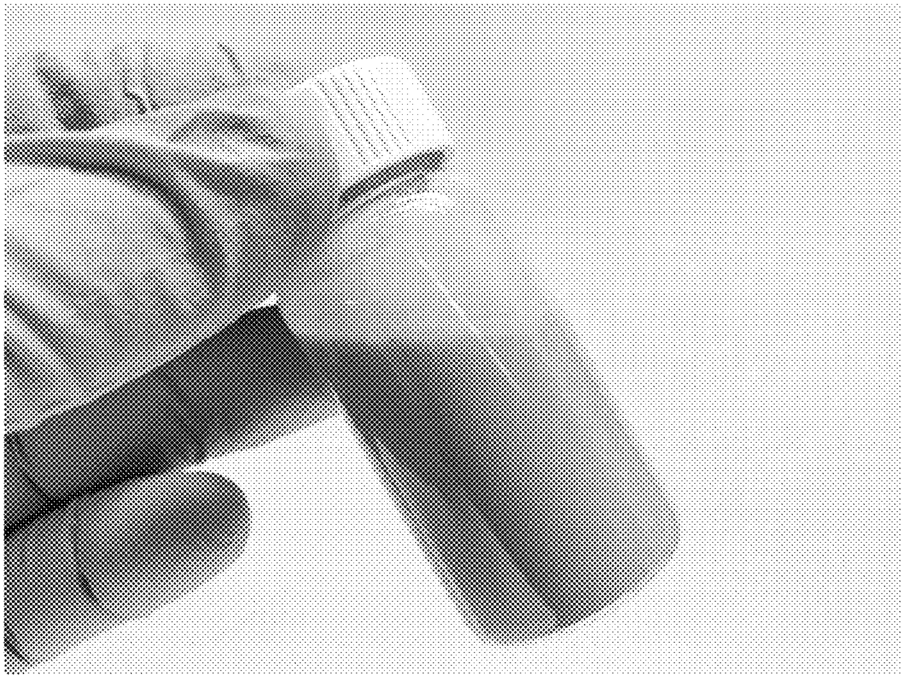
FIG. 45A shows a first image of an exemplary dispersion of silver nanoparticles formed by a first method of silver nanoparticle formation, in accordance with some embodiments of the present disclosure.
Figure 45B:
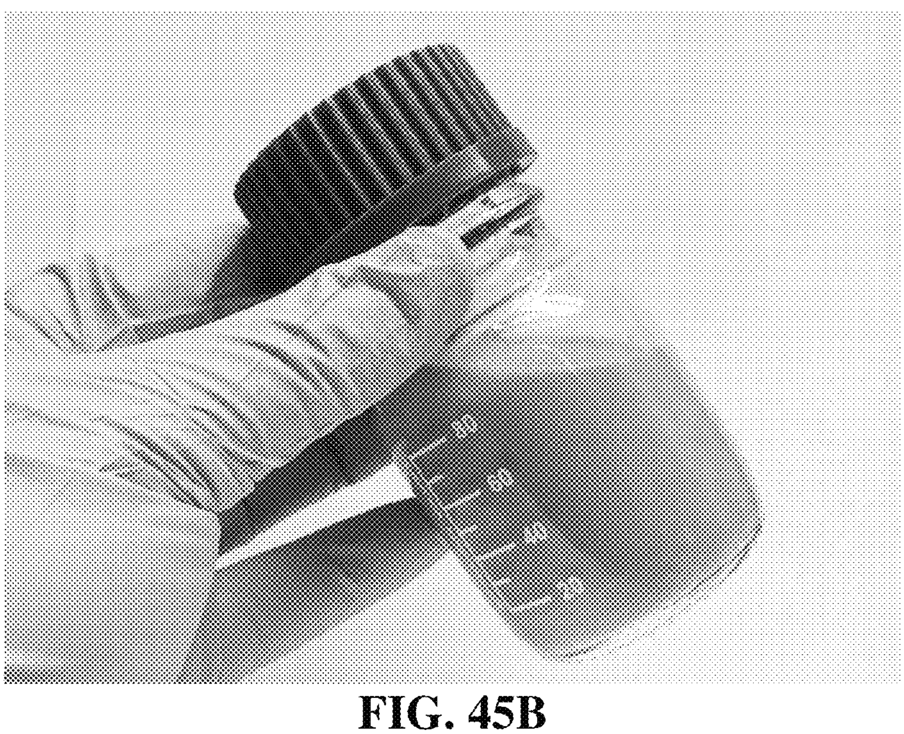
FIG. 45B shows a second image of an exemplary dispersion of silver nanoparticles formed by a first method of silver nanoparticle formation, in accordance with some embodiments of the present disclosure.
Figure 46A:
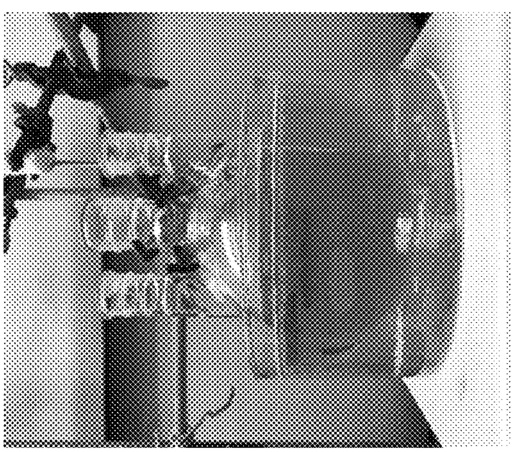
FIG. 46A shows an image of an exemplary first solution of silver nanoparticles heated to 100° C., in accordance with some embodiments of the present disclosure.
Figure 46B:
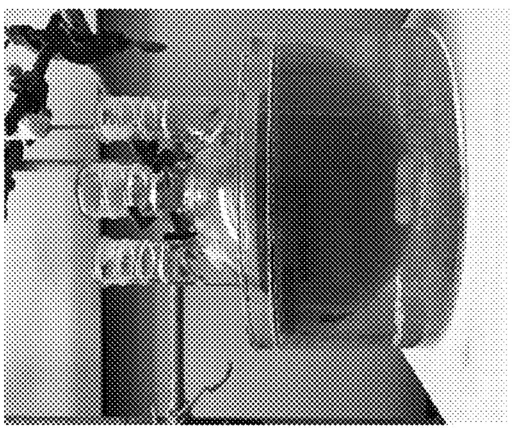
FIG. 46B shows an image of an exemplary first solution of silver nanoparticles heated to 110° C., in accordance with some embodiments of the present disclosure.
Figure 46C:
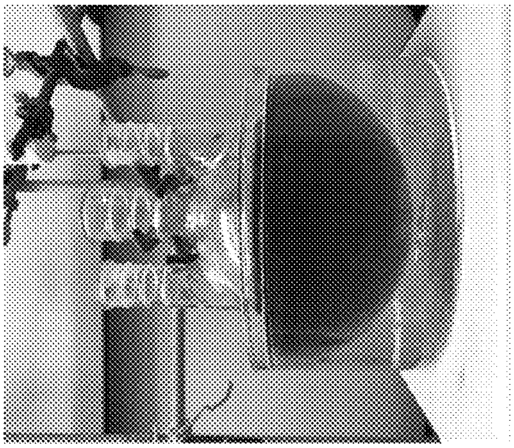
FIG. 46C shows an image of an exemplary first solution of silver nanoparticles heated to 120° C., in accordance with some embodiments of the present disclosure.
Figure 46D:
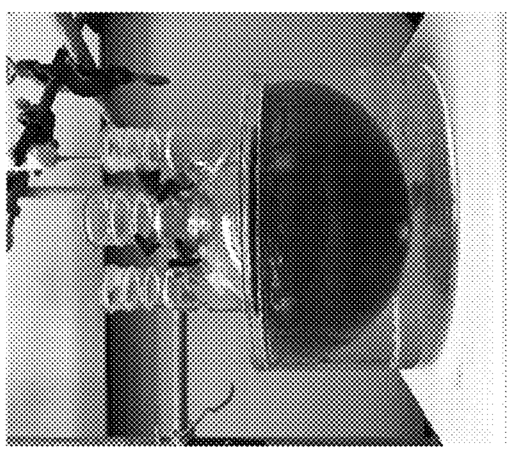
FIG. 46D shows an image of an exemplary first solution of silver nanoparticles heated to 130° C., in accordance with some embodiments of the present disclosure.
Figure 46E:
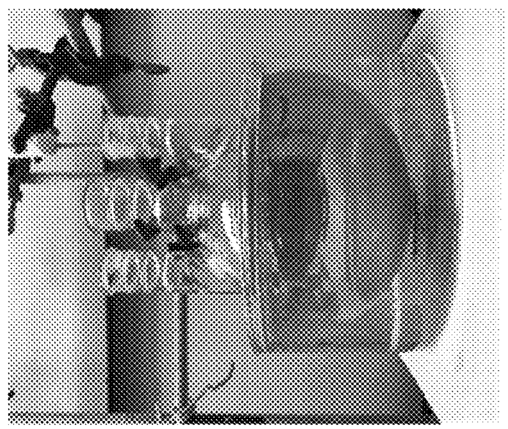
FIG. 46E shows an image of an exemplary first solution of silver nanoparticles heated to 145° C., in accordance with some embodiments of the present disclosure.
Figure 46F:
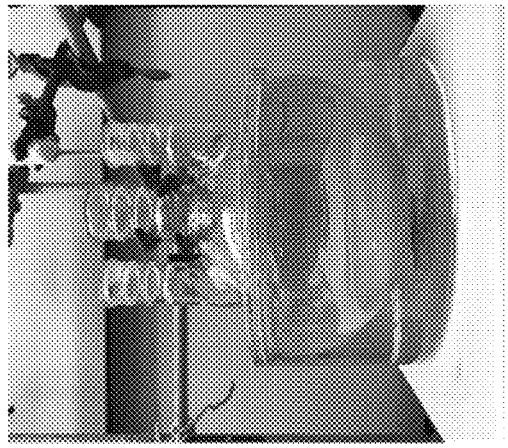
FIG. 46F shows an image of an exemplary first solution of silver nanoparticles heated to 160° C., in accordance with some embodiments of the present disclosure.

FIG. 45A shows a first image of an exemplary dispersion of silver nanoparticles formed by a first method of silver nanoparticle formation, in accordance with some embodiments of the present disclosure. FIG. 45B shows a second image of an exemplary dispersion of silver nanoparticles formed by a first method of silver nanoparticle formation, in accordance with some embodiments of the present disclosure. Optionally, in some embodiments, the method further comprises redispersing the first solution. The exemplary non-limiting dispersions in FIGS. 45A and 45B comprise a dispersion of the first solution in water. Optionally, in some embodiments, the first solution is redispersed in ethanol, isopropyl alcohol, N-methyl-2-pyrrolidone, cyclohexanone, terpineol, 3-methoxy-3-methyl-1-butanol, 4-hydroxyl-4-methyl-pentan-2-one, methyl isobutyl ketone, or any combination thereof.

FIG. 46A-46F show images of an exemplary apparatus for nanoparticle formation and exemplary first solutions of nanoparticles heated to different temperatures, in accordance with some embodiments. FIG. 46A-46F show images of exemplary first solutions of silver nanoparticles heated to 100° C., 110° C., 120° C., 130° C., 145° C., and 160° C., respectively, in accordance with some embodiments. Per FIG. 46A-46F, it can be seen that higher heating temperatures produce first solutions with silver nanoparticles that are more opaque and white, while lower heating temperatures produce first solutions with silver nanoparticles that are more translucent and yellow.

Figure 47:
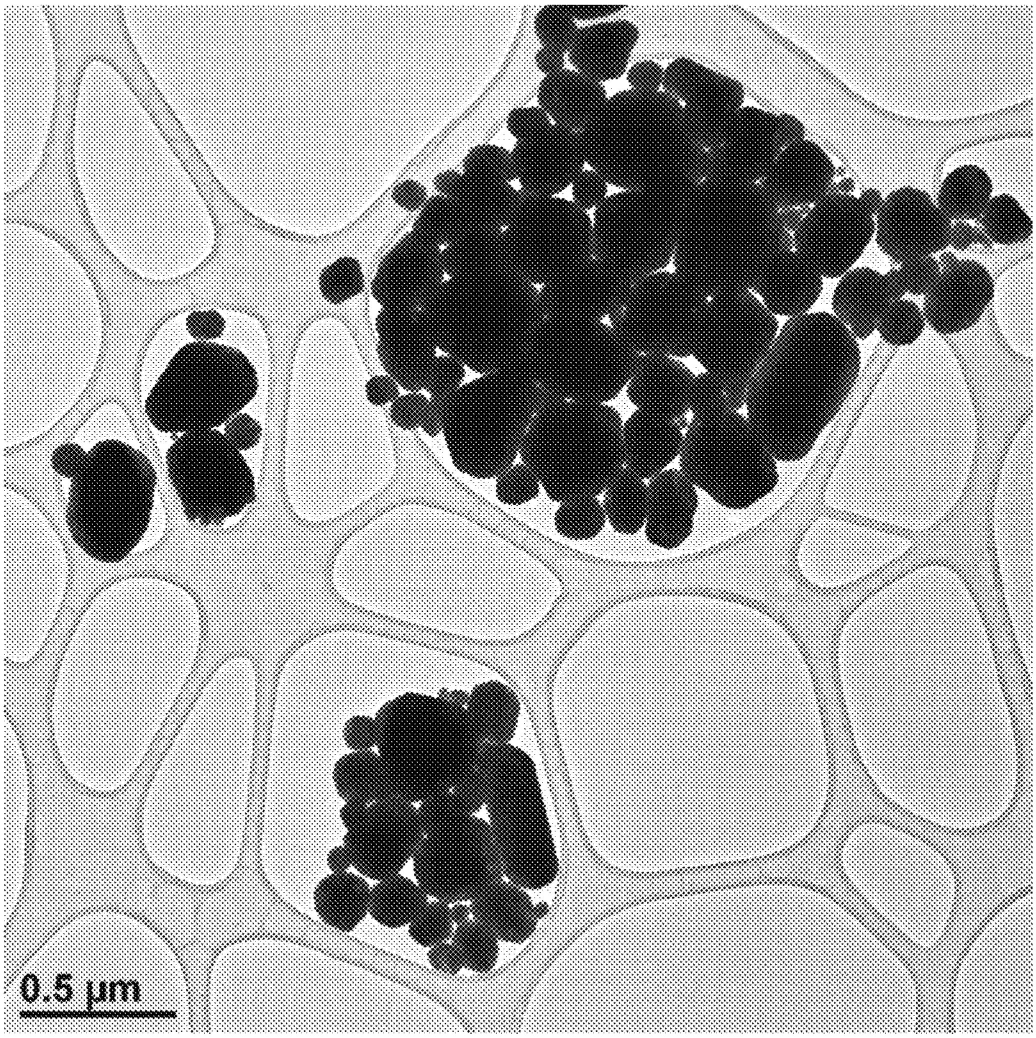
FIG. 47 shows a TEM image of exemplary silver nanoparticles formed by a second method of silver nanoparticle formation, in accordance with some embodiments of the present disclosure.

FIG. 47 shows a TEM image of exemplary silver nanoparticles formed by a second method of silver nanoparticle formation, in accordance with some embodiments of the present disclosure. In some embodiments, the second method of forming silver nanoparticles comprises: heating a secondary solvent; adding a silver-based solution and a polymer solution to the secondary solvent to form a first solution; stirring the first solution; heating the first solution; and washing the first solution. Optionally, in some embodiments, the silver-based solution and the polymer solution are added simultaneously to the secondary solvent. Optionally, in some embodiments, the silver-based solution and the polymer solution are added by a two-channel syringe to the secondary solvent. Optionally, in some embodiments, adding the silver-based solution and the polymer solution to the secondary solvent to form the first solution and stirring the first solution are performed simultaneously. Optionally, in some embodiments, the second method further comprises redispersing the first solution. Optionally, in some embodiments, the first solution is redispersed in water. Optionally, in some embodiments, the polymer solution prevents agglomeration of the silver nanoparticles.

Optionally, in some embodiments, the silver-based solution comprises a silver-based material comprising $AgNO_3$. Optionally, in some embodiments, the polymer solution comprises a synthetic polymer. Optionally, in some embodiments, the synthetic polymer comprises carboxymethyl cellulose, polyvinylidene fluoride, poly(vinyl alcohol), poly (vinyl pyrrolidone), poly(ethylene oxide), ethyl cellulose, or any combination thereof. Optionally, in some embodiments, the binder is a dispersant. Optionally, in some embodiments, the binder comprises carboxymethyl cellulose, polyvinylidene fluoride, poly(vinyl alcohol), poly(vinyl pyrrolidone), poly(ethylene oxide), ethyl cellulose, or any combination thereof. Optionally, in some embodiments, the secondary solvent comprises a glycol. Optionally, in some embodiments the glycol comprises ethylene glycol, polyethylene glycol 200, polyethylene glycol 400, propylene glycol, or any combination thereof.

Finally, provided herein are conductive silver-based films comprising a substrate and a conductive silver-based ink. Optionally, in some embodiments, the conductive silver-based ink comprises silver nanowires, silver nanoparticles, or both. Optionally, in some embodiments, the conductive silver-based ink is a conductive silver-based hydrate. In some embodiments, the silver nanoparticles are configured to be used in a conductive silver-based ink. Alternatively, in some embodiments, the silver nanoparticles are configured to be used as a conductive additive in a conductive graphene ink. Optionally, in some embodiments, the small size of the silver nanoparticle enables the conductive silver-based ink to be used by an inkjet printer or in an inkjet printing process.

Figure 48:
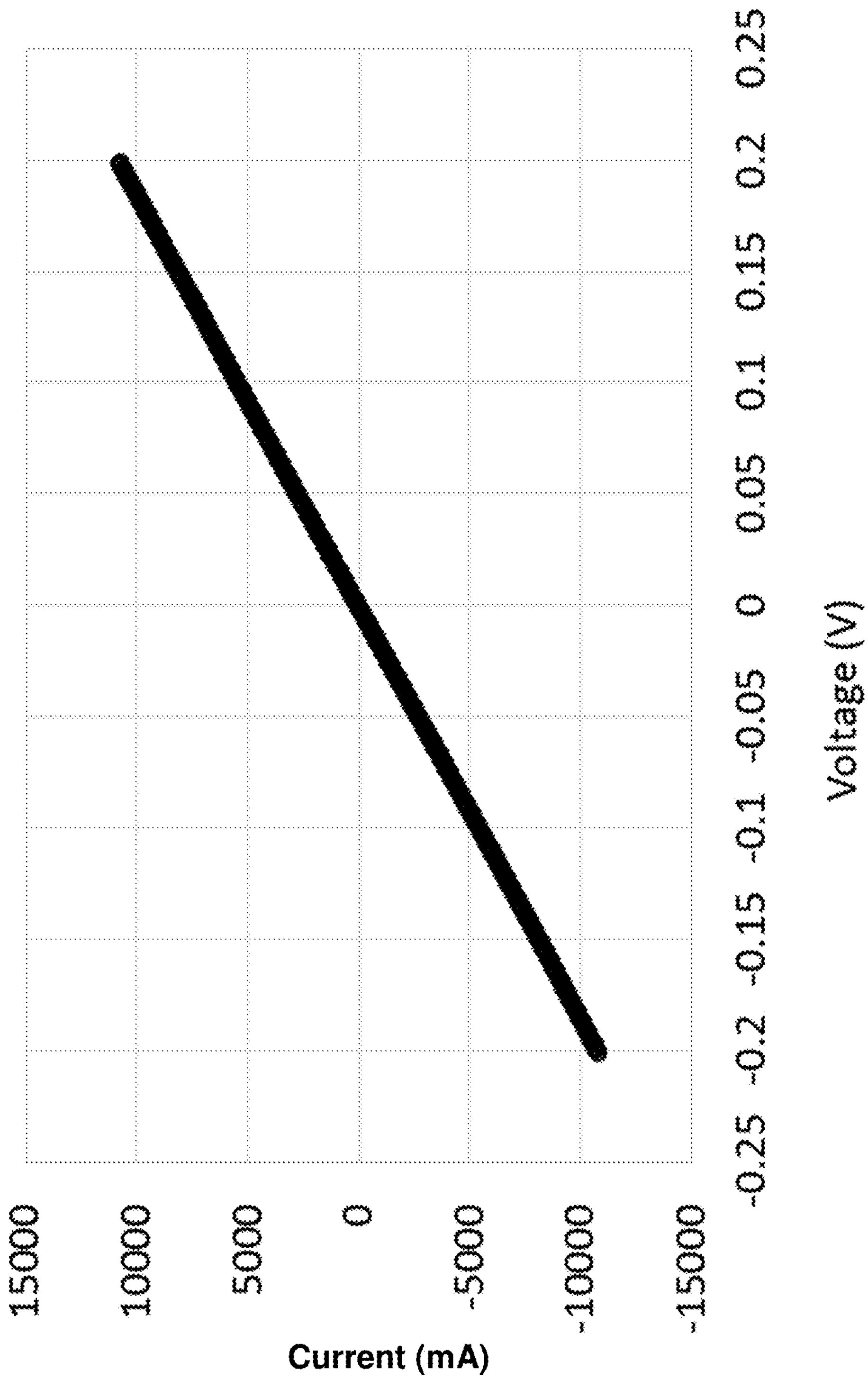
FIG. 48 shows an current-voltage curve of an exemplary film comprising an exemplary conductive graphene ink, in accordance with some embodiments of the present disclosure.

FIG. 48 shows an I-V curve of an exemplary film comprising an exemplary conductive silver-based ink, in accordance with some embodiments of the present disclosure. The I-V curve, per FIG. 48, indicates that the conductive silver-based inks formed by the methods herein exhibit high energy storage and transmission capability and are configured to increase the electrical performance of conductive silver-based inks and conductive films formed therewith. Additionally, exemplary films comprising the exemplary conductive silver-based inks herein exhibit a sheet resistance of about 7 μΩ·cm to about 28 μΩ·cm. In some embodiments, a conductive film formed from the conductive silver-based inks herein exhibit a sheet resistance of about 14 μΩ·cm.

Optionally, in some embodiments, the conductive silver-based ink comprises silver nanowires, wherein the conductive silver-based film has a sheet resistance of about 0.3 ohm/sq/mil to about 1.8 ohms/sq/mil. Optionally, in some embodiments, the conductive silver-based ink comprises silver nanoparticles, wherein the conductive film has a sheet resistance of about 0.01 ohm/sq/mil to about 0.04 ohm/sq/mil.

Terms and Definitions

Unless otherwise defined, all technical terms used herein have the same meaning as commonly understood by one of ordinary skill in the art. As used in this specification and the appended claims, the singular forms "a," "an," and "the" include plural references unless the context clearly dictates otherwise. Any reference to "or" herein is intended to encompass "and/or" unless otherwise stated.

As used herein, and unless otherwise defined, the term "about" refers to a range of values within plus and/or minus 10% of the specified value.

As used herein, and unless otherwise specified, the term RGO refers to reduced graphene oxide.

As used herein, and unless otherwise specified, the term SEM refers to a scanning electron microscopy.

As used herein, and unless otherwise specified, the term TEM refers to a transmission electron microscopy.

As used herein, and unless otherwise specified, the term RFID refers to radio frequency identification.

As used herein, the term "percolation threshold" refers to a mathematical concept representing the formation of long-range connectivity in random systems. Below the threshold a giant connected component does not exist; while above it, there exists a giant component of the order of system size.

As used herein, the term "molecular weight" refers to an average molecular weight, a peak average molecular weight, a number average molecular weight, or a weight average molecular weight.

While preferable embodiments of the present methods and devices taught herein have been shown and described herein, it will be obvious to those skilled in the art that such embodiments are provided by way of example only. Numerous variations, changes, and substitutions will now occur to those skilled in the art without departing from the methods and devices taught herein. It should be understood that various alternatives to the embodiments of the methods and devices taught herein described herein may be employed in practicing the methods and devices taught herein. It is intended that the following claims define the scope of the methods and devices taught herein and that methods and structures within the scope of these claims and their equivalents be covered thereby.

NON-LIMITING EXAMPLES

In one non-limiting example of silver nanowire synthesis, 50 mL of ethylene glycol was added to the reaction vessel with a stir bar. The vessel was then suspended in an oil bath and heated at 155° C. for 1 hour under magnetic stirring at 200 rpm. An amount of 400 μL of 4 mM $CuCl_2$/ethylene glycol solution were then added, and the solution was heated and stirred continuously for additional 15 minutes to ensure a homogenous solution. An amount of 15 mL of 0.147 M poly(vinyl pyrrolidone), sodium dodecyl sulfonate, vitamin B2, poly(vinyl alcohol), dextrin, and poly(methyl vinyl ether) with a molecular weight of 20,000 was then dissolved in an ethylene glycol solution and was then injected into the reaction vessel. Finally, 15 mL of 0.094 M $AgNO_3$/ethylene glycol solution was injected into the solution immediately or over the course of 15 minutes. The solution was allowed to react for 1 hour before it was cooled to room temperature. The silver nanowires were collected by centrifuging the solution at 3,000 rpm for 20 minutes and washing with ethanol. This washing process was repeated 3 times to remove excess ethylene glycol and poly(methyl vinyl ether). The final silver product was re-dispersed and stored in ethanol.

In another non-limiting example of silver nanowire synthesis, 500 mL of ethylene glycol was added to the reaction vessel to which a stir bar was added; the vessel was then suspended in an oil bath and heated at 120° C. for 1 hour under magnetic stirring (200 rpm). This was followed by the addition of 4 mL of 4 mM $CuCl_2$/ethylene glycol solution. The solution was then heated and stirred continuously for additional 15 minutes to ensure a homogenous solution. Then, 150 mL of 0.147 M poly(vinyl pyrrolidone) (molecular weight 20,000) dissolved in an ethylene glycol solution was injected into the reaction vessel using a burette. Lastly, 150 mL of 0.094 M $AgNO_3$/ethylene glycol solution was injected slowly to the hot solution; this step was accomplished using syringe pump where the solution was fed into the solution at a rate of 70 mL/hour. All of the $AgNO_3$ solution was injected in the course of 130 minutes. To allow for the growth of silver nanowires, the reaction temperature was then increased to 160° C. and maintained at this temperature for 1 hour. The resulting silver was collected by centrifugation at 5000 rpm for 10 minutes and washed with acetone. This washing process was repeated 2 times (one with water, the other with ethanol) to remove excess ethylene glycol and poly(vinyl pyrrolidone). The final silver product was re-dispersed and stored in ethanol.

In a non-limiting example of silver nanoparticle synthesis, silver nitrate ($AgNO_3$) was dissolved in ethylene glycol along with poly(vinyl pyrrolidone) (molecular weight=20,000). Then, 330 mL of ethylene glycol was mixed with 200 mL of 0.25 M $AgNO_3$ and 200 mL of poly(vinyl pyrrolidone) with concentrations from 0.027 M and up to 0.37 M in ethylene glycol. This solution was stirred in the reactor shown in the next slide, followed by heating at 160° C. When the final temperature is attained, the reaction was maintained at this temperature for 45 more minutes to allow for the growth of silver nanoparticles. After the completion of the reaction, the solution was cooled down to room temperature, and silver nanoparticles were collected by centrifugation and then washed with ethanol several times.

In another non-limiting example of silver nanoparticle synthesis, a precursor solution was injected into preheated solvent in the reactor. Ethylene glycol (330 mL) was added to a 1 L three-neck round bottom flask, heated with stirring in an oil bath at 160° C. for 1 hour. After 60 minutes, $AgNO_3$ (200 mL of a 0.25 M solution in ethylene glycol) and poly(vinyl pyrrolidone) (200 mL of a 0.37 M solution in ethylene glycol calculated based on molar mass of a repeating unit) were simultaneously added with a two-channel syringe pump at a rate of 20 mL/min to the stirring solution. The reactor was further heated to 160° C. and maintained at this temperature for 45 more minutes. Samples were washed with ethanol and re-dispersed in water for analysis

What is claimed is:

1. A conductive graphene ink comprising:

a) 20% to about 70% by mass of a binder solution comprising a binder and a first solvent; and b) a reduced graphene oxide dispersion comprising reduced graphene oxide, and a second solvent;

wherein the conductive graphene ink has a viscosity of at least about 1,000 centipoise.

2. The conductive graphene ink of claim 1, wherein at least one of the first solvent and the second solvent comprises water, ethanol, isopropyl alcohol, N-methyl-2-pyrrolidone, cyclohexanone, terpineol, 3-methoxy-3-methyl-1-butanol, 4-hydroxyl-4-methyl-pentan-2-one, methyl isobutyl ketone, or any combination thereof.

3. The conductive graphene ink of claim 1, wherein the binder comprises carboxymethyl cellulose, polyvinylidene fluoride, poly(vinyl alcohol), poly(vinyl pyrrolidone), poly (ethylene oxide), ethyl cellulose, or any combination thereof.

4. The conductive graphene ink of claim 1, wherein the conductive graphene ink has a viscosity of at most about 10,000 centipoise.

5. The conductive graphene ink of claim 1, wherein the conductive graphene ink has a C:O mass ratio of about 2:1 to about 40:1.

6. A method of forming a conductive graphene ink comprising:

forming a binder solution comprising:

heating a first solvent;

adding a binder to the first solvent;

mixing the binder and the first solvent; and cooling the binder and the first solvent;

forming a reduced graphene oxide dispersion comprising a second solvent and reduced graphene oxide;

forming a graphene solution comprising the binder solution and the reduced graphene oxide dispersion; and mixing the graphene solution under a vacuum degree of about −0.05 MPa to about −0.2 MPa to form a conductive graphene ink.

7. The method of claim 6, wherein at least one of the first solvent and the second solvent comprises water, ethanol, isopropyl alcohol, N-methyl-2-pyrrolidone, cyclohexanone, terpineol, 3-methoxy-3-methyl-1-butanol, 4-hydroxyl-4-methyl-pentan-2-one, methyl isobutyl ketone, or any combination thereof.

8. The method of claim 6, wherein the binder comprises carboxymethyl cellulose, polyvinylidene fluoride, poly(vinyl alcohol), poly(vinyl pyrrolidone), poly(ethylene oxide), ethyl cellulose, or any combination thereof.

9. The method of claim 6, wherein the first solvent is heated to a temperature of about 35° C. to about 125° C.

10. The method of claim 6, wherein the binder is added to the first solvent during the mixing of the binder and the first solvent, over a period of time of about 45 minutes to about 240 minutes.

11. The method of claim 6, wherein, after the binder is fully added to the first solvent, the binder and the first solvent are mixed for a period of time of about 7 minutes to about 30 minutes.

12. The method of claim 6, wherein the mixing of the graphene solution is performed with at least one of a stirring speed of about 15 rpm to about 125 rpm, and a dispersing speed of about 50 rpm to about 4,500 rpm.

13. The method of claim 6, wherein the graphene solution is mixed during one or more intervals, wherein each interval comprises a period of time of about 0.5 minutes to about 30 minutes.

14. The method of claim 6, wherein the binder and the first solvent are cooled to a temperature of about 10° C. to about 40° C.

* * * * *